US012433161B2

(12) United States Patent
Jung et al.

(10) Patent No.: US 12,433,161 B2
(45) **Date of Patent: *Sep. 30, 2025**

(54) PLURALITY OF HOST MATERIALS AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: So-Young Jung, Gyeonggi-do (KR); Su-Hyun Lee, Gyeonggi-do (KR); Mi-Ja Lee, Gyeonggi-do (KR); Sang-Hee Cho, Gyeonggi-do (KR); Doo-Hyeon Moon, Gyeonggi-do (KR)

(73) Assignee: DuPont Specialty Materials Korea Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/585,199

(22) Filed: Feb. 23, 2024

(65) Prior Publication Data

US 2024/0251674 A1 Jul. 25, 2024

Related U.S. Application Data

(63) Continuation of application No. 17/075,602, filed on Oct. 20, 2020, now Pat. No. 11,950,506.

(30) Foreign Application Priority Data

Nov. 6, 2019 (KR) ........................ 10-2019-0140757

(51) Int. Cl.

| | |
|---|---|
| ***H01L 51/50*** | (2006.01) |
| ***H10K 85/60*** | (2023.01) |
| *H10K 101/00* | (2023.01) |

(52) U.S. Cl.

CPC ....... *H10K 85/6572* (2023.02); *H10K 85/631* (2023.02); *H10K 85/6574* (2023.02); *H10K 85/6576* (2023.02); *H10K 2101/90* (2023.02)

(58) Field of Classification Search

None

See application file for complete search history.

(56) References Cited

U.S. PATENT DOCUMENTS

| | | | |
|---|---|---|---|
| 2019/0312212 | A1 | 10/2019 | Moon et al. |
| 2021/0028369 | A1 | 1/2021 | Kim et al. |
| 2021/0043848 | A1 | 2/2021 | Kim et al. |

FOREIGN PATENT DOCUMENTS

| | | |
|---|---|---|
| KR | 20140027030 A | 3/2014 |

OTHER PUBLICATIONS

Search Report from China National Intellectual Property Administration for China Patent application No. 202011162334.0; Application Date: Oct. 27, 2020.

Cited Reference from Japan Patent Office for Japan patent application No. 2020-179000; Application Date: 2020-179000.

*Primary Examiner* — Gregory D Clark

(74) *Attorney, Agent, or Firm* — G. Creston Campbell

(57) ABSTRACT

The present disclosure relates to a plurality of host materials comprising a first host material comprising a compound represented by formula 1, and a second host material comprising a compound represented by formula 2, and an organic electroluminescent device comprising the same. By comprising a specific combination of compounds as host materials, it is possible to provide an organic electroluminescent device having lower driving voltage, higher luminous efficiency, higher power efficiency, and/or superior lifespan characteristics compared to conventional organic electroluminescent devices.

8 Claims, No Drawings

PLURALITY OF HOST MATERIALS AND ORGANIC ELECTROLUMINESCENT DEVICE COMPRISING THE SAME

CROSS-REFERENCE TO RELATED APPLICATIONS

This application claims priority under 35 U.S.C. § 120 from U.S. patent application Ser. No. 17/075,602 filed Oct. 20, 2020, which is the Convention Filing of KR10-2019-0140757 filed Nov. 6, 2019, both of which are incorporated by reference herein in their entirety.

TECHNICAL FIELD

The present disclosure relates to a plurality of host materials and an organic electroluminescent device comprising the same.

BACKGROUND ART

A small molecular green organic electroluminescent device (OLED) was first developed by Tang, et al., of Eastman Kodak in 1987 by using TPD/Alq3 bi-layer consisting of a light-emitting layer and a charge transport layer. Thereafter, the development of OLEDs was rapidly effected and OLEDs have been commercialized. At present, OLEDs primarily use phosphorescent materials having excellent luminous efficiency in panel implementation. However, in many applications such as TVs and lightings, OLED lifetime is insufficient and higher efficiency of OLEDs is still required. Typically, the higher the luminance an OLED is, the shorter the lifespan of an OLED. Therefore, an OLED having high luminous efficiency and/or long lifespan characteristics is required for long time use and high resolution of a display.

In order to enhance luminous efficiency, driving voltage and/or lifespan, various materials or concepts for an organic layer of an organic electroluminescent device have been proposed. However, they were not satisfactory in practical use.

U.S. Pat. No. 8,987,715 discloses an organic electroluminescent device using a plurality of host materials comprising a compound having a carbazole moiety. However, said document does not specifically disclose an organic electroluminescent device using a compound having a fused carbazole moiety and a carbazole compound bonded with a heteroaryl containing a nitrogen atom as a plurality of host materials as in the present disclosure.

DISCLOSURE OF INVENTION

Technical Problem

The objective of the present disclosure is to provide an organic electroluminescent device having low driving voltage, high luminous efficiency, high power efficiency, and/or excellent lifespan characteristics by comprising the plurality of host materials comprising a specific combination of compounds.

Solution to Problem

As a result of intense studies, the present inventors found that the above objective can be achieved by a plurality of host materials comprising a first host material comprising a compound represented by the following formula 1, and a second host material comprising a compound represented by the following formula 2:

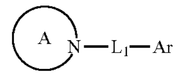

(1)

wherein

- $L_1$ represents a single bond, a substituted or unsubstituted (C1-C30)alkylene, a substituted or unsubstituted (C3-C30)cycloalkylene, a substituted or unsubstituted (C6-C30)arylene, or a substituted or unsubstituted (3- to 30-membered)heteroarylene;
- Ar represents deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $-NR_{11}R_{12}$, or $-SiR_{13}R_{14}R_{15}$;
- $R_{11}$ to $R_{15}$ each independently represent a substituted or unsubstituted (C1-C30)alkyl, a substituted or unsubstituted (C6-C30)aryl, or a substituted or unsubstituted (3- to 30-membered)heteroaryl;

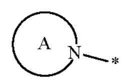

is represented by the following formula 1-1 or 1-2:

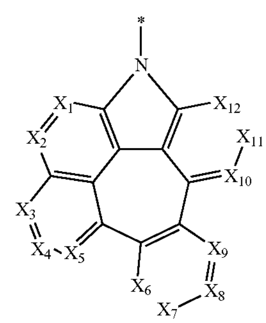

(1-1)

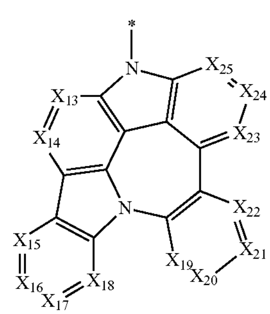

(1-2)

- $X_1$ to $X_{25}$ each independently represent N or $CR_a$;
- $R_a$ each independently represents hydrogen, deuterium, a halogen, a cyano, a substituted or unsubstituted (C1-

C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or adjacent $R_a$'s may be linked to each other to form a ring(s), and if two or more $R_a$'s are present, each of $R_a$ may be the same or different;

* represents a bonding site to $L_1$;

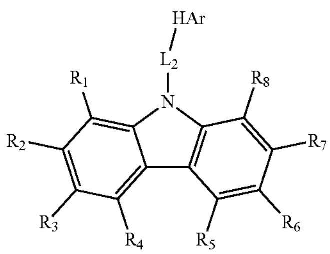

(2)

wherein

HAr represents a substituted or unsubstituted nitrogen-containing (3- to 30-membered)heteroaryl;

$L_2$ represents a single bond, or a (C6-C20)arylene unsubstituted or substituted with deuterium; and $R_1$ to $R_8$ each independently represent hydrogen, deuterium, or a (C6-C30)aryl unsubstituted or substituted with deuterium.

Advantageous Effects of Invention

By comprising a plurality of host materials according to the present disclosure, an organic electroluminescent device having lower driving voltage, higher luminous efficiency, higher power efficiency, and/or superior lifespan characteristics compared to conventional organic electroluminescent devices can be provided, and it is possible to produce a display device or a lighting device using the same.

MODE FOR THE INVENTION

Hereinafter, the present disclosure will be described in detail. However, the following description is intended to explain the invention and is not meant in any way to restrict the scope of the present disclosure.

The term "organic electroluminescent material" in the present disclosure means a material that may be used in an organic electroluminescent device, and may comprise at least one compound. The organic electroluminescent material may be comprised in any layer constituting an organic electroluminescent device as necessary. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

The term "a plurality of organic electroluminescent materials" in the present disclosure means an organic electroluminescent material comprising a combination of at least two compounds, which may be comprised in any layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of organic electroluminescent materials may be a combination of at least two compounds, which may be comprised in at least one layer of a hole injection layer, a hole transport layer, a hole auxiliary layer, a light-emitting auxiliary layer, an electron blocking layer, a light-emitting layer, an electron buffer layer, a hole blocking layer, an electron transport layer, and an electron injection layer. Such at least two compounds may be comprised in the same layer or different layers through methods used in the art, and for example may be mixture-evaporated or co-evaporated, or may be individually evaporated.

The term "a plurality of host materials" in the present disclosure means a host material comprising a combination of at least two compounds, which may be comprised in any light-emitting layer constituting an organic electroluminescent device. It may mean both a material before being comprised in an organic electroluminescent device (for example, before vapor deposition) and a material after being comprised in an organic electroluminescent device (for example, after vapor deposition). For example, a plurality of host materials of the present disclosure may be a combination of at least two host materials, and selectively may further comprise conventional materials comprised in an organic electroluminescent material. A plurality of host materials of the present disclosure may be comprised in any light-emitting layer constituting an organic electroluminescent device, and at least two compounds comprised in the plurality of host materials of the present disclosure may be comprised together in one light-emitting layer or may respectively be comprised in different light-emitting layers, through methods used in the art. For example, the at least two compounds may be mixture-evaporated or co-evaporated, or may be individually evaporated.

Herein, the term "(C1-C30)alkyl(ene)" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, iso-propyl, n-butyl, iso-butyl, tert-butyl, sec-butyl, etc. The term "(C2-C30)alkenyl" is meant to be a linear or branched alkenyl having 2 to 30 carbon atoms constituting the chain, in which the number of carbon atoms is preferably 2 to 20, and more preferably 2 to 10. The above alkenyl may include vinyl, 1-propenyl, 2-propenyl, 1-butenyl, 2-butenyl, 3-butenyl, 2-methylbut-2-enyl, etc. The term "(C2-C30)alkynyl" is meant to be a linear or branched alkynyl having 2 to 30 carbon atoms constituting the chain, in which the number of carbon atoms is preferably 2 to 20, and more preferably 2 to 10. The above alkynyl may include ethynyl, 1-propynyl, 2-propynyl, 1-butynyl, 2-butynyl, 3-butynyl, 1-methylpent-2-ynyl, etc. The term "(C3-C30)cycloalkyl(ene)" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, cyclopentylmethyl, cyclohexylmethyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30) aryl(ene)" is meant to be a monocyclic or fused ring radical derived from an aromatic hydrocarbon having 6 to 30 ring backbone carbon atoms, in which the number of the ring backbone carbon atoms is preferably 6 to 25, and more preferably 6 to 18. The above aryl(ene) may be partially saturated, and may comprise a spiro structure. The above aryl may include phenyl, biphenyl, terphenyl, naphthyl, binaphthyl, phenylnaphthyl, naphthylphenyl, phenylterphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, azulenyl, tetramethyldihydrophenanthrenyl, etc. More specifically, the above aryl may include phenyl, 1-naphthyl, 2-naphthyl, 1-anthryl, 2-anthryl, 9-anthryl, benzanthryl, 1-phenanthryl, 2-phenanthryl, 3-phenanthryl, 4-phenanthryl, 9-phenanthryl, naphthacenyl, pyrenyl, 1-chrysenyl, 2-chrysenyl, 3-chrysenyl, 4-chrysenyl, 5-chrysenyl, 6-chrysenyl, benzo[c]phenanthryl, benzo[g]chrysenyl, 1-triphenylenyl, 2-triphenylenyl, 3-triphenylenyl, 4-triphenylenyl, 1-fluorenyl, 2-fluorenyl, 3-fluorenyl, 4-fluorenyl, 9-fluorenyl, benzo[a]fluorenyl, benzo[b]fluorenyl, benzo[c]fluorenyl, dibenzofluorenyl, 2-biphenylyl, 3-biphenylyl, 4-biphenylyl, o-terphenyl, m-terphenyl-4-yl, m-terphenyl-3-yl, m-terphenyl-2-yl, p-terphenyl-4-yl, p-terphenyl-3-yl, p-terphenyl-2-yl, m-quaterphenyl, 3-fluoranthenyl, 4-fluoranthenyl, 8-fluoranthenyl, 9-fluoranthenyl, benzofluoranthenyl, o-tolyl, m-tolyl, p-tolyl, 2,3-xylyl, 3,4-xylyl, 2,5-xylyl, mesityl, o-cumenyl, m-cumenyl, p-cumenyl, p-t-butylphenyl, p-(2-phenylpropyl)phenyl, 4'-methylbiphenylyl, 4"-t-butyl-p-terphenyl-4-yl, 9,9-dimethyl-1-fluorenyl, 9,9-dimethyl-2-fluorenyl, 9,9-dimethyl-3-fluorenyl, 9,9-dimethyl-4-fluorenyl, 9,9-diphenyl-1-fluorenyl, 9,9-diphenyl-2-fluorenyl, 9,9-diphenyl-3-fluorenyl, 9,9-diphenyl-4-fluorenyl, 11,11-dimethyl-1-benzo[a]fluorenyl, 11,11-dimethyl-2-benzo[a]fluorenyl, 11,11-dimethyl-3-benzo[a]fluorenyl, 11,11-dimethyl-4-benzo[a]fluorenyl, 11,11-dimethyl-5-benzo[a]fluorenyl, 11,11-dimethyl-6-benzo[a]fluorenyl, 11,11-dimethyl-7-benzo[a]fluorenyl, 11,11-dimethyl-8-benzo[a]fluorenyl, 11,11-dimethyl-9-benzo[a]fluorenyl, 11,11-dimethyl-10-benzo[a]fluorenyl, 11,11-dimethyl-1-benzo[b]fluorenyl, 11,11-dimethyl-2-benzo[b]fluorenyl, 11,11-dimethyl-3-benzo[b]fluorenyl, 11,11-dimethyl-4-benzo[b]fluorenyl, 11,11-dimethyl-5-benzo[b]fluorenyl, 11,11-dimethyl-6-benzo[b]fluorenyl, 11,11-dimethyl-7-benzo[b]fluorenyl, 11,11-dimethyl-8-benzo[b]fluorenyl, 11,11-dimethyl-9-benzo[b]fluorenyl, 11,11-dimethyl-10-benzo[b]fluorenyl, 11,11-dimethyl-1-benzo[c]fluorenyl, 11,11-dimethyl-2-benzo[c]fluorenyl, 11,11-dimethyl-3-benzo[c]fluorenyl, 11,11-dimethyl-4-benzo[c]fluorenyl, 11,11-dimethyl-5-benzo[c]fluorenyl, 11,11-dimethyl-6-benzo[c]fluorenyl, 11,11-dimethyl-7-benzo[c]fluorenyl, 11,11-dimethyl-8-benzo[c]fluorenyl, 11,11-dimethyl-9-benzo[c]fluorenyl, 11,11-dimethyl-10-benzo[c]fluorenyl, 11,11-diphenyl-1-benzo[a]fluorenyl, 11,11-diphenyl-2-benzo[a]fluorenyl, 11,11-diphenyl-3-benzo[a]fluorenyl, 11,11-diphenyl-4-benzo[a]fluorenyl, 11,11-diphenyl-5-benzo[a]fluorenyl, 11,11-diphenyl-6-benzo[a]fluorenyl, 11,11-diphenyl-7-benzo[a]fluorenyl, 11,11-diphenyl-8-benzo[a]fluorenyl, 11,11-diphenyl-9-benzo[a]fluorenyl, 11,11-diphenyl-10-benzo[a]fluorenyl, 11,11-diphenyl-1-benzo[b]fluorenyl, 11,11-diphenyl-2-benzo[b]fluorenyl, 11,11-diphenyl-3-benzo[b]fluorenyl, 11,11-diphenyl-4-benzo[b]fluorenyl, 11,11-diphenyl-5-benzo[b]fluorenyl, 11,11-diphenyl-6-benzo[b]fluorenyl, 11,11-diphenyl-7-benzo[b]fluorenyl, 11,11-diphenyl-8-benzo[b]fluorenyl, 11,11-diphenyl-9-benzo[b]fluorenyl, 11,11-diphenyl-10-benzo[b]fluorenyl, 11,11-diphenyl-1-benzo[c]fluorenyl, 11,11-diphenyl-2-benzo[c]fluorenyl, 11,11-diphenyl-3-benzo[c]fluorenyl, 11,11-diphenyl-4-benzo[c]fluorenyl, 11,11-diphenyl-5-benzo[c]fluorenyl, 11,11-diphenyl-6-benzo[c]fluorenyl, 11,11-diphenyl-7-benzo[c]fluorenyl, 11,11-diphenyl-8-benzo[c]fluorenyl, 11,11-diphenyl-9-benzo[c]fluorenyl, 11,11-diphenyl-10-benzo[c]fluorenyl, 9,9,10,10-tetramethyl-9,10-dihydro-1-phenanthrenyl, 9,9,10,10-tetramethyl-9,10-dihydro-2-phenanthrenyl, 9,9,10,10-tetramethyl-9,10-dihydro-3-phenanthrenyl, 9,9,10,10-tetramethyl-9,10-dihydro-4-phenanthrenyl, etc.

The term "(3- to 30-membered)heteroaryl(ene)" is meant to be an aryl having 3 to 30 ring backbone atoms, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, pyridazinyl, etc., and a fused ring-type heteroaryl such as benzofuranyl, benzothiophenyl, isobenzofuranyl, dibenzofuranyl, dibenzothiophenyl, dibenzoselenophenyl, naphthobenzofuranyl, naphthobenzothiophenyl, benzofuroquinolyl, benzofuroquinazolinyl, benzofuronaphthyridinyl, benzofuropyrimidinyl, naphthofuropyrimidinyl, benzothienoquinolyl, benzothienoquinazolinyl, benzothienonaphthyridinyl, benzothienopyrimidinyl, naphthothienopyrimidinyl, pyrimidoindolyl, benzopyrimidoindolyl, benzofuropyrazinyl, naphthofuropyrazinyl, benzothienopyrazinyl, naphthothienopyrazinyl, pyrazinoindolyl, benzopyrazinoindolyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, benzoquinazolinyl, quinoxalinyl, benzoquinoxalinyl, naphthyridinyl, carbazolyl, benzocarbazolyl, dibenzocarbazolyl, phenoxazinyl, phenothiazinyl, phenanthridinyl, benzodioxolyl, dihydroacridinyl, benzotriazolephenazinnyl, imidazopyridyl, chromenoquinazolinyl, thiochromenoquinazolinyl, dimethylbenzopyrimidinyl, indolocarbazolyl, indenocarbazolyl, etc. More specifically, the above heteroaryl may include 1-pyrrolyl, 2-pyrrolyl, 3-pyrrolyl, pyrazinyl, 2-pyridinyl, 2-pyrimidinyl, 4-pyrimidinyl, 5-pyrimidinyl, 6-pyrimidinyl, 1,2,3-triazin-4-yl, 1,2,4-triazin-3-yl, 1,3,5-triazin-2-yl, 1-imidazolyl, 2-imidazolyl, 1-pyrazolyl, 1-indolidinyl, 2-indolidinyl, 3-indolidinyl, 5-indolidinyl, 6-indolidinyl, 7-indolidinyl, 8-indolidinyl, 2-imidazopyridinyl, 3-imidazopyridinyl, 5-imidazopyridinyl, 6-imidazopyridinyl, 7-imidazopyridinyl, 8-imidazopyridinyl, 3-pyridinyl, 4-pyridinyl, 1-indolyl, 2-indolyl, 3-indolyl, 4-indolyl, 5-indolyl, 6-indolyl, 7-indolyl, 1-isoindolyl, 2-isoindolyl, 3-isoindolyl, 4-isoindolyl, 5-isoindolyl, 6-isoindolyl, 7-isoindolyl, 2-furyl, 3-furyl, 2-benzofuranyl, 3-benzofuranyl, 4-benzofuranyl, 5-benzofuranyl, 6-benzofuranyl, 7-benzofuranyl, 1-isobenzofuranyl, 3-isobenzofuranyl, 4-isobenzofuranyl, 5-isobenzofuranyl, 6-isobenzofuranyl, 7-isobenzofuranyl, 2-quinolyl, 3-quinolyl, 4-quinolyl, 5-quinolyl, 6-quinolyl, 7-quinolyl, 8-quinolyl, 1-isoquinolyl, 3-isoquinolyl, 4-isoquinolyl, 5-isoquinolyl, 6-isoquinolyl, 7-isoquinolyl, 8-isoquinolyl, 2-quinoxalinyl, 5-quinoxalinyl, 6-quinoxalinyl, 1-carbazolyl, 2-carbazolyl, 3-carbazolyl, 4-carbazolyl, 9-carbazolyl, azacarbazolyl-1-yl, azacarbazolyl-2-yl, azacarbazolyl-3-yl, azacarbazolyl-4-yl, azacarbazolyl-5-yl, azacarbazolyl-6-yl, azacarbazolyl-7-yl, azacarbazolyl-8-yl, azacarbazolyl-9-yl, 1-phenanthridinyl, 2-phenanthridinyl, 3-phenanthridinyl, 4-phenanthridinyl, 6-phenanthridinyl, 7-phenanthridinyl, 8-phenanthridinyl, 9-phenanthridinyl, 10-phenanthridinyl, 1-acridinyl, 2-acridinyl, 3-acridinyl, 4-acridinyl, 9-acridinyl, 2-oxazolyl, 4-oxazolyl, 5-oxazolyl, 2-oxadiazolyl, 5-oxadiazolyl, 3-furazanyl, 2-thienyl, 3-thienyl, 2-methylpyrrol-1-yl, 2-methylpyrrol-3-yl, 2-methylpyrrol-4-yl, 2-methylpyrrol-5-yl, 3-methylpyrrol-1-yl, 3-methylpyrrol-2-yl, 3-methylpyrrol-4-yl, 3-methylpyrrol-5-yl, 2-t-butylpyrrol-4-yl, 3-(2-phenylpropyl)pyrrol-1-yl, 2-methyl-1-indolyl, 4-methyl-1-indolyl, 2-methyl-3-indolyl, 4-methyl-3-indolyl, 2-t-butyl-1-indolyl, 4-t-butyl-1-indolyl, 2-t-butyl-3-indolyl, 4-t-butyl-3-indolyl, 1-dibenzofuranyl, 2-dibenzofuranyl, 3-dibenzofuranyl, 4-dibenzofuranyl, 1-dibenzothiophenyl, 2-dibenzothiophenyl, 3-dibenzothiophenyl, 4-dibenzothiophenyl, 1-naphtho-[1,2-b]-benzofuranyl, 2-naphtho-[1,2-b]-benzofuranyl, 3-naphtho-[1,2-b]-benzofuranyl, 4-naphtho-[1,2-b]-benzofuranyl, 5-naphtho-[1,2-b]-benzofuranyl, 6-naphtho-[1,2-b]-benzofuranyl, 7-naphtho-[1,2-b]-benzofuranyl, 8-naphtho-[1,2-b]-benzofuranyl, 9-naphtho-[1,2-b]-benzofuranyl, 10-naphtho-[1,2-b]-benzofuranyl, 1-naphtho-[2,3-b]-benzofuranyl, 2-naphtho-[2,3-b]-benzofuranyl, 3-naphtho-[2,3-b]-benzofuranyl, 4-naphtho-[2,3-b]-benzofuranyl, 5-naphtho-[2,3-b]-benzofuranyl, 6-naphtho-[2,3-b]-benzofuranyl, 7-naphtho-[2,3-b]-benzofuranyl, 8-naphtho-[2,3-b]-benzofuranyl, 9-naphtho-[2,3-b]-benzofuranyl, 10-naphtho-[2,3-b]-benzofuranyl, 1-naphtho-[2,1-b]-benzofuranyl, 2-naphtho-[2,1-b]-benzofuranyl, 3-naphtho-[2,1-b]-benzofuranyl, 4-naphtho-[2,1-b]-benzofuranyl, 5-naphtho-[2,1-b]-benzofuranyl, 6-naphtho-[2,1-b]-benzofuranyl, 7-naphtho-[2,1-b]-benzofuranyl, 8-naphtho-[2,1-b]-benzofuranyl, 9-naphtho-[2,1-b]-benzofuranyl, 10-naphtho-[2,1-b]-benzofuranyl, 1-naphtho-[1,2-b]-benzothiophenyl, 2-naphtho-[1,2-b]-benzothiophenyl, 3-naphtho-[1,2-b]-benzothiophenyl, 4-naphtho-[1,2-b]-benzothiophenyl, 5-naphtho-[1,2-b]-benzothiophenyl, 6-naphtho-[1,2-b]-benzothiophenyl, 7-naphtho-[1,2-b]-benzothiophenyl, 8-naphtho-[1,2-b]-benzothiophenyl, 9-naphtho-[1,2-b]-benzothiophenyl, 10-naphtho-[1,2-b]-benzothiophenyl, 1-naphtho-[2,3-b]-benzothiophenyl, 2-naphtho-[2,3-b]-benzothiophenyl, 3-naphtho-[2,3-b]-benzothiophenyl, 4-naphtho-[2,3-b]-benzothiophenyl, 5-naphtho-[2,3-b]-benzothiophenyl, 1-naphtho-[2,1-b]-benzothiophenyl, 2-naphtho-[2,1-b]-benzothiophenyl, 3-naphtho-[2,1-b]-benzothiophenyl, 4-naphtho-[2,1-b]-benzothiophenyl, 5-naphtho-[2,1-b]-benzothiophenyl, 6-naphtho-[2,1-b]-benzothiophenyl, 7-naphtho-[2,1-b]-benzothiophenyl, 8-naphtho-[2,1-b]-benzothiophenyl, 9-naphtho-[2,1-b]-benzothiophenyl, 10-naphtho-[2,1-b]-benzothiophenyl, 2-benzofuro[3,2-d]pyrimidinyl, 6-benzofuro[3,2-d]pyrimidinyl, 7-benzofuro[3,2-d]pyrimidinyl, 8-benzofuro[3,2-d]pyrimidinyl, 9-benzofuro[3,2-d]pyrimidinyl, 2-benzothio[3,2-d]pyrimidinyl, 6-benzothio[3,2-d]pyrimidinyl, 7-benzothio[3,2-d]pyrimidinyl, 8-benzothio[3,2-d]pyrimidinyl, 9-benzothio[3,2-d]pyrimidinyl, 2-benzofuro[3,2-d]pyrazinyl, 6-benzofuro[3,2-d]pyrazinyl, 7-benzofuro[3,2-d]pyrazinyl, 8-benzofuro[3,2-d]pyrazinyl, 9-benzofuro[3,2-d]pyrazinyl, 2-benzothio[3,2-d]pyrazinyl, 6-benzothio[3,2-d]pyrazinyl, 7-benzothio[3,2-d]pyrazinyl, 8-benzothio[3,2-d]pyrazinyl, 9-benzothio[3,2-d]pyrazinyl, 1-silafluorenyl, 2-silafluorenyl, 3-silafluorenyl, 4-silafluorenyl, 1-germafluorenyl, 2-germafluorenyl, 3-germafluorenyl, 4-germafluorenyl, 1-dibenzoselenophenyl, 2-dibenzoselenophenyl, 3-dibenzoselenophenyl, 4-dibenzoselenophenyl, etc. Furthermore, "halogen" includes F, Cl, Br, and I.

In addition, "ortho (o-)," "meta (m-)," and "para (p-)" are prefixes, which represent the relative positions of substituents respectively. Ortho indicates that two substituents are adjacent to each other, and for example, when two substituents in a benzene derivative occupy positions 1 and 2, it is called an ortho position. Meta indicates that two substituents are at positions 1 and 3, and for example, when two substituents in a benzene derivative occupy positions 1 and 3, it is called a meta position. Para indicates that two substituents are at positions 1 and 4, and for example, when two substituents in a benzene derivative occupy positions 1 and 4, it is called a para position.

Herein, "substituted" in the expression "substituted or unsubstituted" means that a hydrogen atom in a certain functional group is replaced with another atom or another functional group, i.e., a substituent, including two or more substituents are bonded. For example, "a substituent wherein two or more substituents are bonded" may be a pyridine-triazine. That is, a pyridine-triazine may be a heteroaryl, and even comprehended to be a substituent wherein two heteroaryls are bonded. The substituents of the substituted alkyl, the substituted alkylene, the substituted aryl, the substituted arylene, the substituted heteroaryl, the substituted heteroarylene, the substituted cycloalkyl, the substituted cycloalkylene, the substituted cycloalkenyl, the substituted heterocycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino in the formulas of the present disclosure, each independently are at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered) heteroaryl unsubstituted or substituted with a (C6-C30)aryl(s); a (C6-C30)aryl unsubstituted or substituted with at least one of deuterium, a (C1-C30)alkyl(s), a (3- to 30-membered)heteroaryl(s), and a di(C6-C30)arylamino(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl; a (C6-C30)arylphosphine; a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituents each independently are at least one selected from deuterium, a (C1-C6)alkyl, and a (C6-C20)aryl unsubstituted or substituted with deuterium. Specifically, the substituents each independently may be at least one selected from deuterium, methyl, phenyl, naphthyl, biphenyl, terphenyl, phenyl substituted with deuterium, naphthylphenyl, naphthyl substituted with deuterium, and phenylnaphthyl.

In the formulas of the present disclosure, if a substituent is linked to an adjacent substituent to form a ring or two adjacent substituents are linked to each other to form a ring, the ring may be a substituted or unsubstituted, mono- or polycyclic, (3- to 30-membered) alicyclic or aromatic ring, or the combination thereof, which two or more adjacent substituents are linked to form. In addition, the formed ring may contain at least one heteroatom selected from B, N, O, S, Si, and P, preferably at least one heteroatom selected from N, O, and S. According to one embodiment of the present disclosure, the number of the ring backbone atoms is 5 to 20. According to another embodiment of the present disclosure, the number of the ring backbone atoms is 5 to 15. For example, the fused ring may be a substituted or unsubstituted dibenzothiophene ring, a substituted or unsubstituted dibenzofuran ring, a substituted or unsubstituted naphthalene ring, a substituted or unsubstituted phenanthrene ring, a substituted or unsubstituted fluorene ring, a substituted or unsubstituted benzothiophene ring, a substituted or unsubstituted benzofuran ring, a substituted or unsubstituted indole ring, a substituted or unsubstituted indene ring, a substituted or unsubstituted benzene ring, or a substituted or unsubstituted carbazole ring.

In the formulas of the present disclosure, heteroaryl or heteroarylene may, each independently, contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (5- to 30-membered)heteroaryl, a substituted or unsubstituted (C3-C30)cycloalkyl, a substituted or unsubstituted (C1-C30)alkoxy, a substituted or unsubstituted tri (C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, and a substituted or unsubstituted (C1-C30)alkyl(C6-C30)arylamino.

The plurality of host materials according to one embodiment of the present disclosure comprises a first host material comprising the compound represented by formula 1 and a second host material comprising the compound represented by formula 2, and may be comprised in a light-emitting layer of an organic electroluminescent device according to one embodiment of the present disclosure.

Hereinafter, the compound represented by formula 1 will be described in more detail.

In formula 1, $L_1$ represents a single bond, a substituted or unsubstituted (C1-C30)alkylene, a substituted or unsubstituted (C3-C30)cycloalkylene, a substituted or unsubstituted (C6-C30)arylene, or a substituted or unsubstituted (3- to 30-membered)heteroarylene. According to one embodiment of the present disclosure, $L_1$ represents a single bond, a substituted or unsubstituted (C6-C15)arylene, or a substituted or unsubstituted (5- to 20-membered)heteroarylene. According to another embodiment of the present disclosure, $L_1$ represents a single bond, an unsubstituted (C6-C15) arylene, or a (5- to 20-membered)heteroarylene unsubstituted or substituted with a (C6-C15)aryl(s). Specifically, $L_1$ may represent a single bond, phenylene, naphthylene, biphenylene, quinolylene, quinazolinylene, quinoxalinylene, naphthrydinylene, carbazolylene, dibenzofuranylene, benzofuropyrimidinylene, benzoquinazolinylene, benzoquinoxalinylene, phenylquinazolinylene, phenylquinoxalinylene, etc.

In formula 1, Ar represents deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, —$NR_{11}R_{12}$, or —$SiR_{13}R_{14}R_{15}$. According to one embodiment of the present disclosure, Ar represents a substituted or unsubstituted (C6-C30)aryl, a substituted or unsubstituted (5- to 20-membered)heteroaryl, or —$NR_{11}R_{12}$. According to another embodiment of the present disclosure, Ar represents a (C6-C30)aryl unsubstituted or substituted with a (C1-C6)-alkyl(s), a (5- to 20-membered)heteroaryl unsubstituted or substituted with a (C6-C12)aryl(s), or —$NR_{11}R_{12}$. Specifically, Ar may represent phenyl, naphthyl, biphenyl, phenylnaphthyl, terphenyl, spirobifluorenyl, dimethylfluorenyl, dimethylbenzofluorenyl, carbazolyl, dibenzofuranyl, dibenzothiophenyl, diphenyltriazinyl, phenylpyridyl, diphenylpyrimidinyl, phenylquinolyl, diphenylquinazolinyl, biphenylquinazolinyl, phenylquinoxalinyl, diphenylquinoxalinyl, naphthylquinoxalinyl, phenylnaphthyridinyl, phenylcarbazolyl, phenyldibenzofuranyl, phenylbenzofuropyrimidinyl, phenylbenzoquinoxalinyl, diphenylamino, phenylnaphthylamino, phenylbiphenylamino, etc.

Herein, $R_{11}$ to $R_{15}$ each independently represent a substituted or unsubstituted (C1-C30)alkyl, a substituted or unsubstituted (C6-C30)aryl, or a substituted or unsubstituted (3- to 30-membered)heteroaryl. According to one embodiment of the present disclosure, $R_{11}$ to $R_{15}$ each independently represent a substituted or unsubstituted (C6-C15)aryl. According to another embodiment of the present disclosure, $R_{11}$ to $R_{15}$ each independently represent an unsubstituted (C6-C15) aryl. Specifically, $R_{11}$ to $R_{15}$ may each independently represent phenyl, naphthyl, biphenyl, etc.

In formulas 1-1 and 1-2, $X_1$ to $X_{25}$ each independently represent N or $CR_a$. According to one embodiment of the present disclosure, $X_1$ to $X_{25}$ may all independently represent $CR_a$.

Herein, $R_a$ each independently represents hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or adjacent $R_a$'s may be linked to each other to form a ring(s), and if two or more $R_a$'s are present, each of $R_a$ may be the same or different. According to one embodiment of the present disclosure, $R_a$ each independently represents hydrogen, or a substituted or unsubstituted (C6-C12)aryl; or adjacent $R_a$'s may be linked to each other to form a ring(s). According to another embodiment of the present disclosure, $R_a$ each independently represents hydrogen, or an unsubstituted (C6-C12)aryl; or adjacent $R_a$'s may be linked to each other to form a ring(s). Specifically, $R_a$ each independently may represent hydrogen, phenyl, etc.; or adjacent $R_a$'s may be linked to each other to form a benzene ring, etc.

In formula 1, * represents a bonding site to $L_1$.

Formula 1-1 may be represented by the following formula 1-1-1.

(1-1-1)

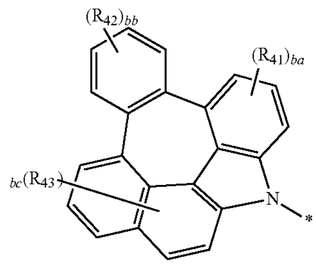

wherein $R_{41}$ to $R_{43}$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s); and ba represents an integer of 1 to 3, bb represents an integer of 1 to 4, bc represents an integer of 1 to 5, where if ba, bb, and bc are an integer of 2 or more, each of $R_{41}$, each of $R_{42}$, and each of $R_{43}$ may be the same or different.

Formula 1-2 may be represented by the following formula 1-2-1.

(1-2-1)

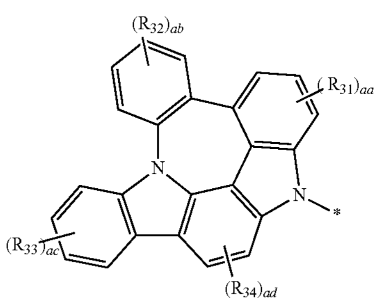

wherein $R_{31}$ to $R_{34}$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s); and aa represents an integer of 1 to 3, ab and ac each independently represent an integer of 1 to 4, ad represents 1 or 2, where if aa, ab, ac, and ad are an integer of 2 or more, each of $R_{31}$, each of $R_{32}$, each of $R_{33}$, and each of $R_{34}$ may be the same or different.

The compound represented by formula 1 may be at least one selected from the following compounds, but is not limited thereto.

H1-1

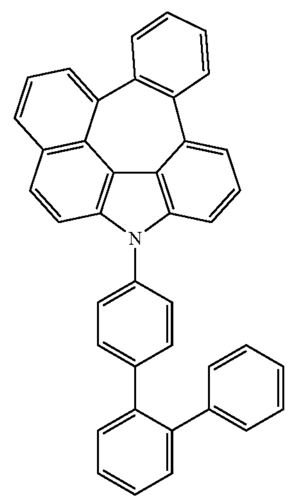

H1-2

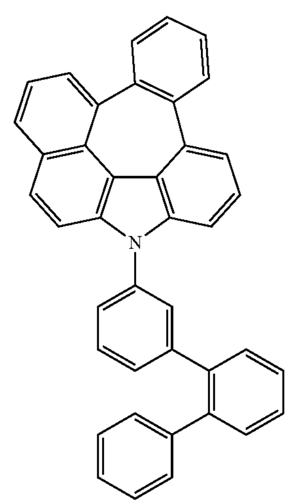

-continued
H1-3
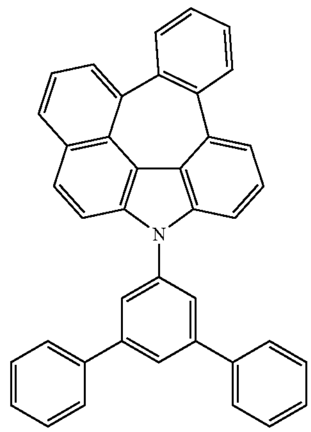
H1-4
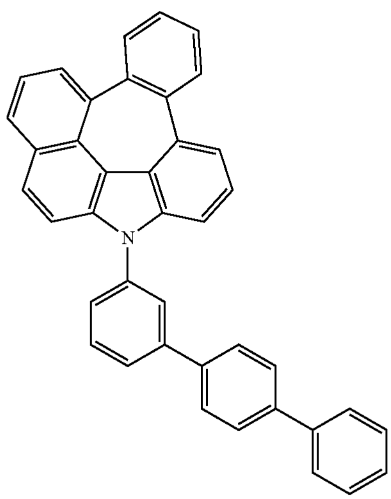
H1-5
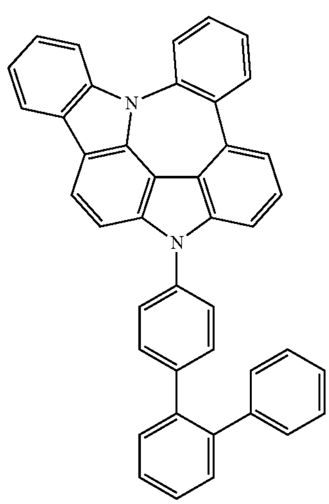
-continued
H1-6
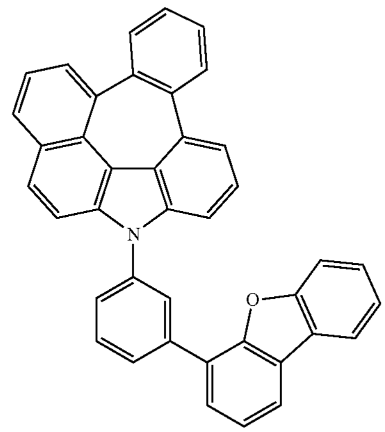
H1-7
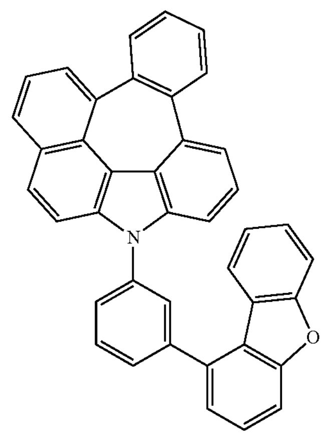
H1-8
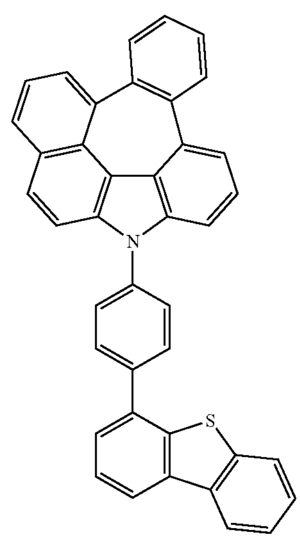

-continued
H1-9
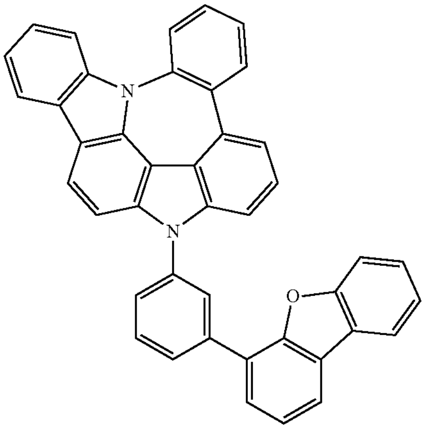
H11-10
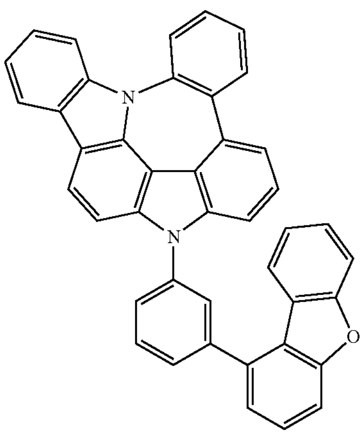
H1-11
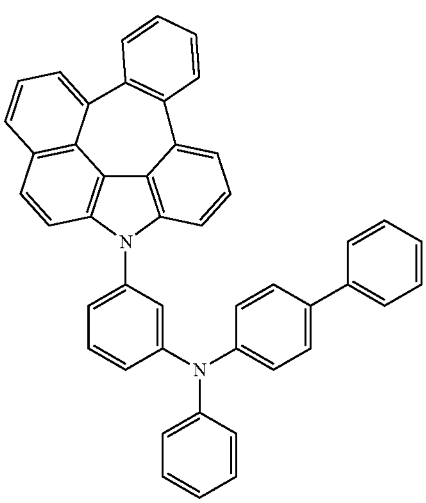
-continued
H1-12
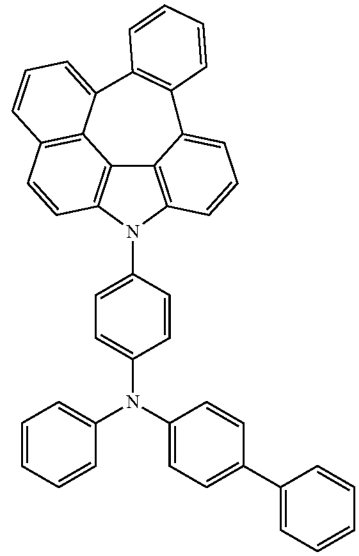
H1-13
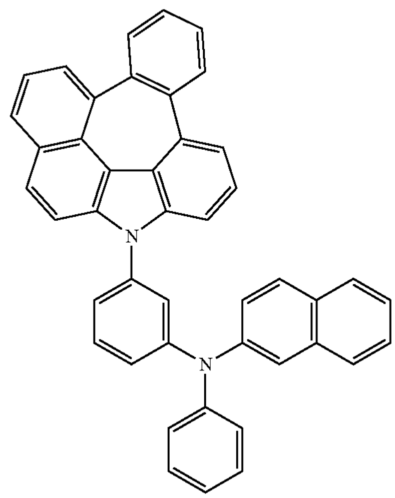
H1-14
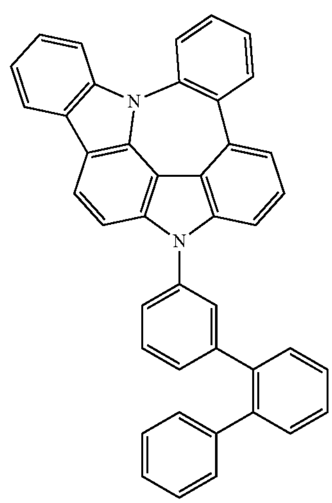

H1-15
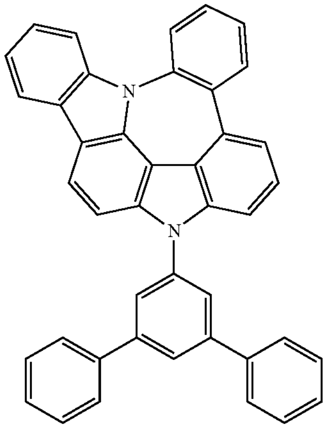
H1-16
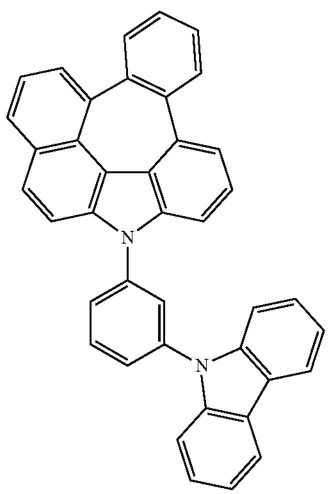
H1-17
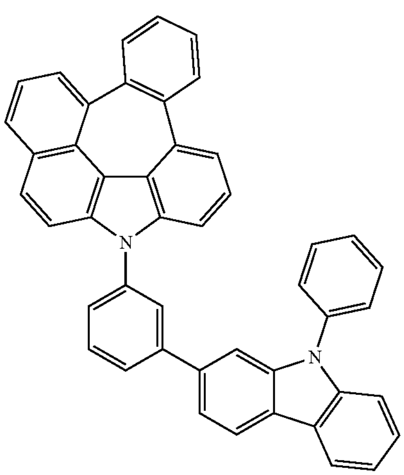
H1-18
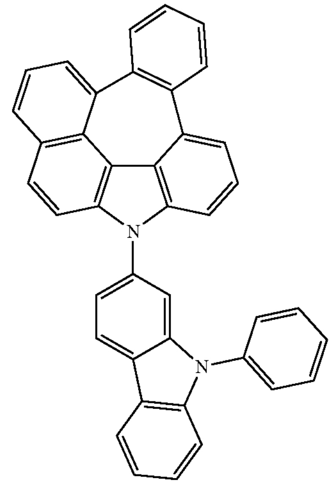
H1-19
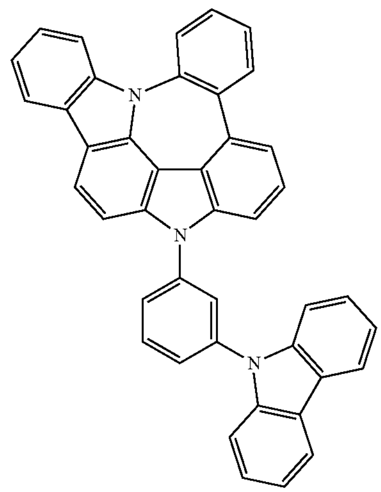
H1-20
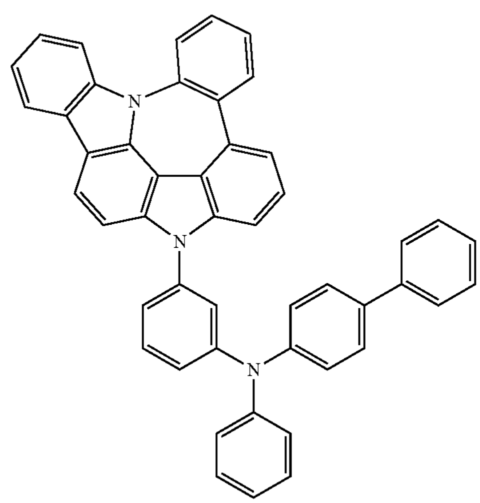

-continued
H1-21
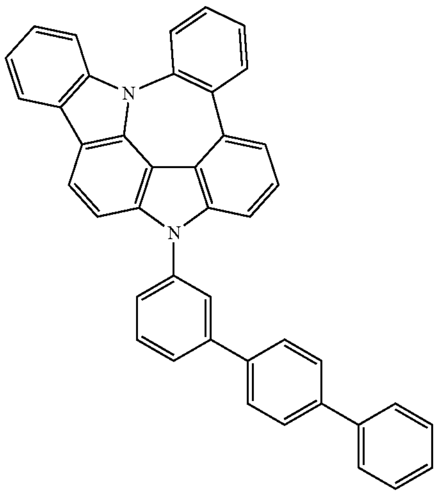
H1-22
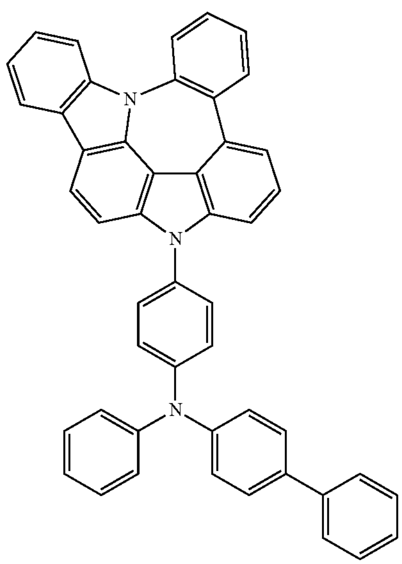
H1-23
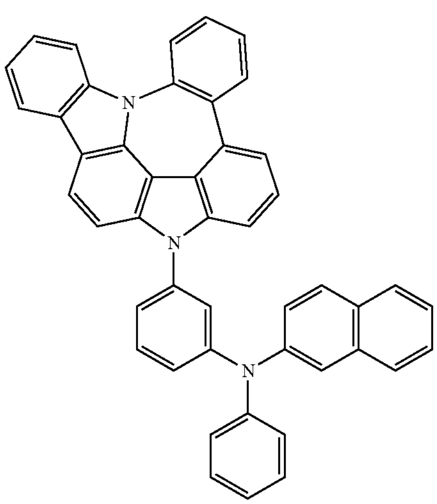
-continued
H1-24
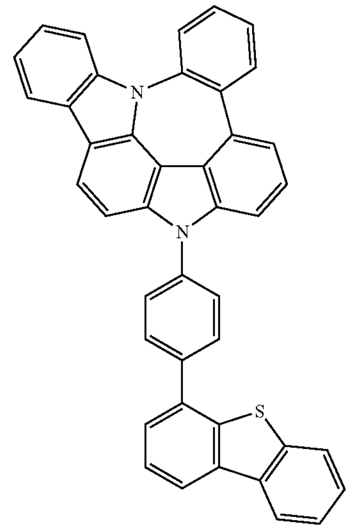
H1-25
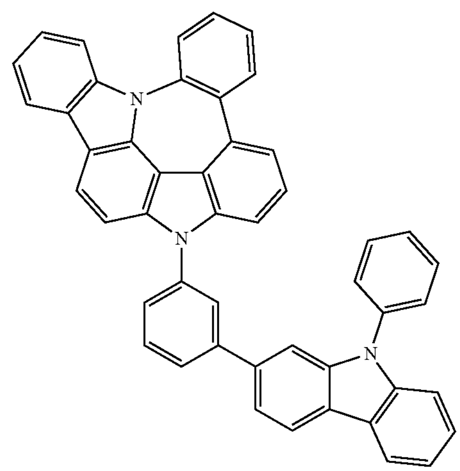
H1-26
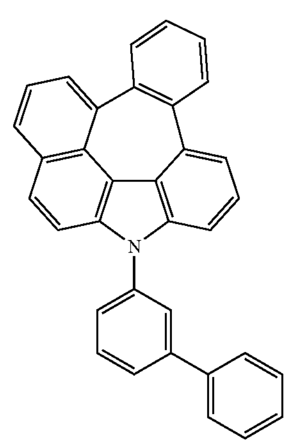

-continued
H-27
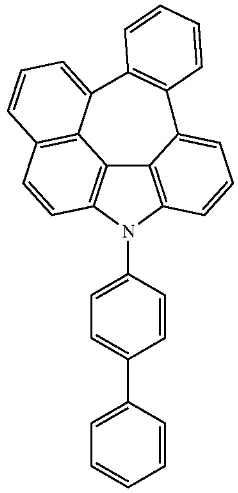
H1-28
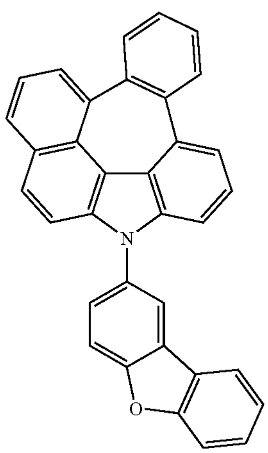
H1-29
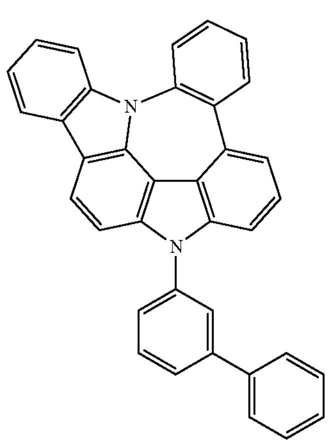
-continued
H1-30
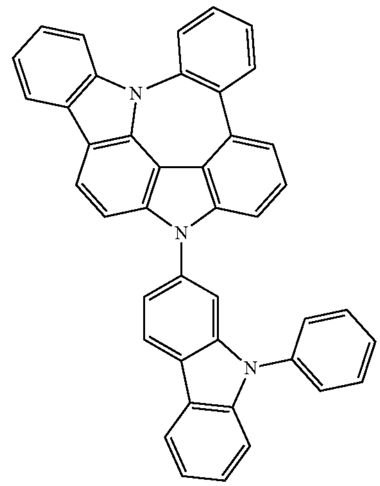
H1-31
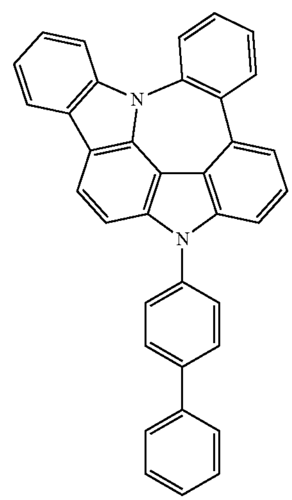
H1-32
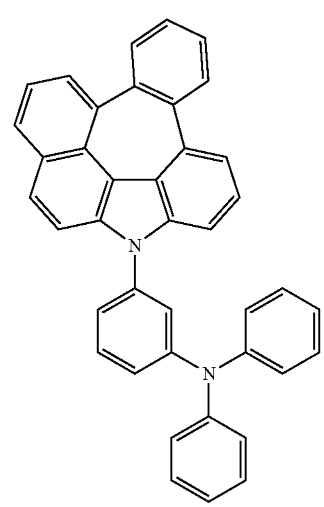

H1-33
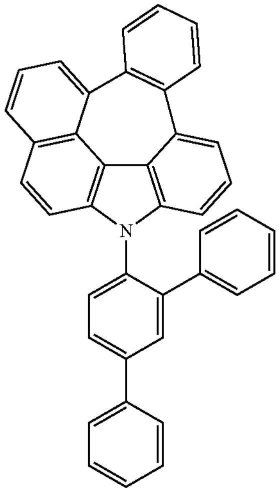
H1-34
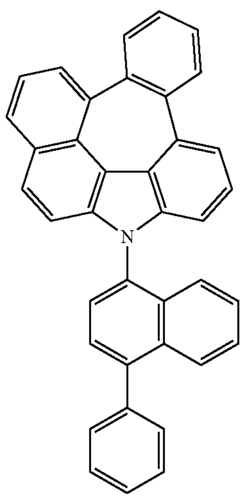
H1-35
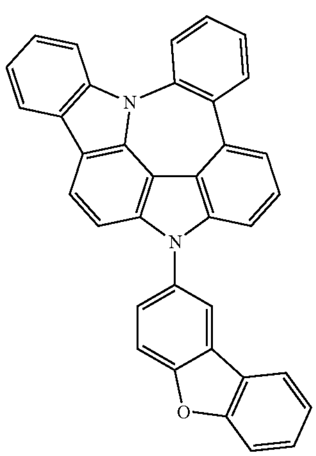
H1-36
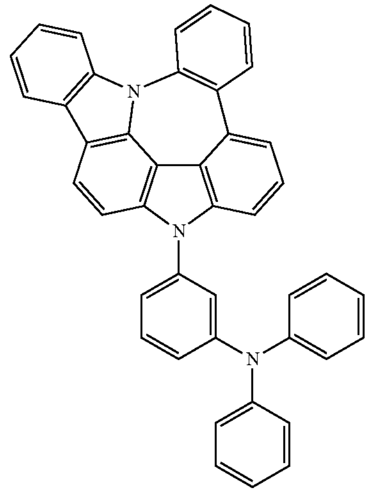
H1-37
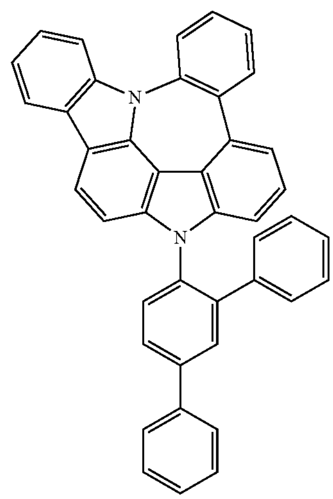
H1-38
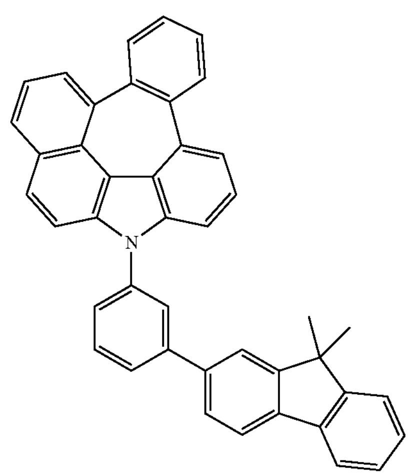

-continued
H1-39
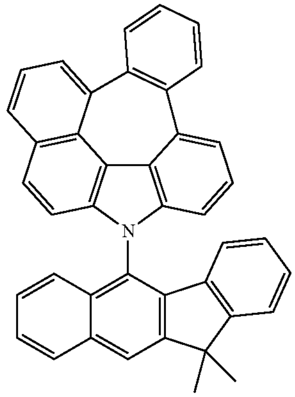
H1-40
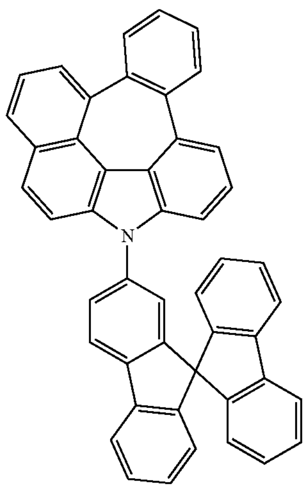
H1-41
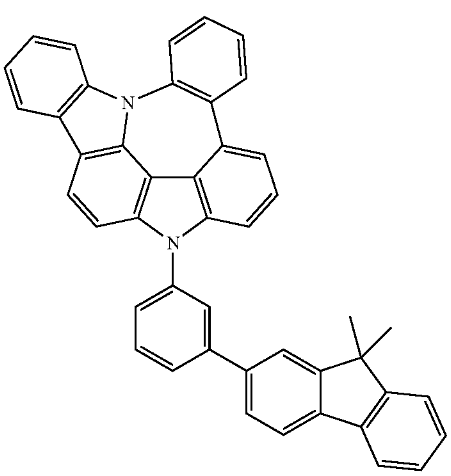
-continued
H1-42
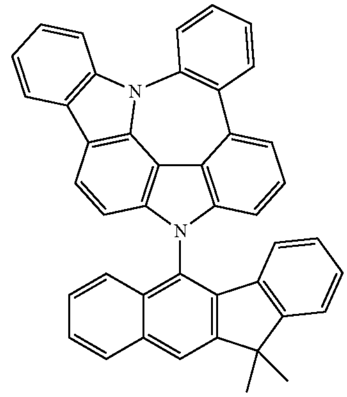
H1-43
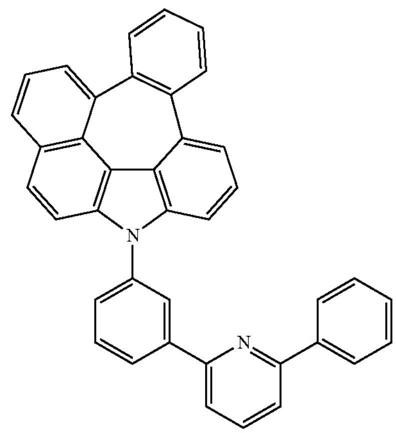
H1-44
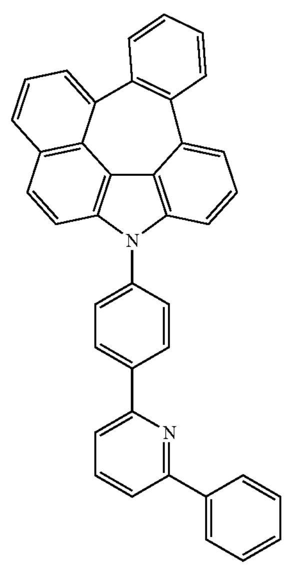

-continued
H1-45
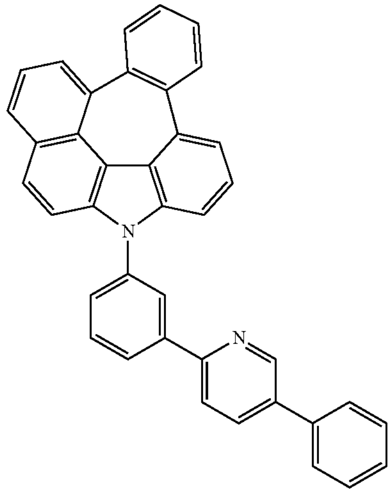
H1-46
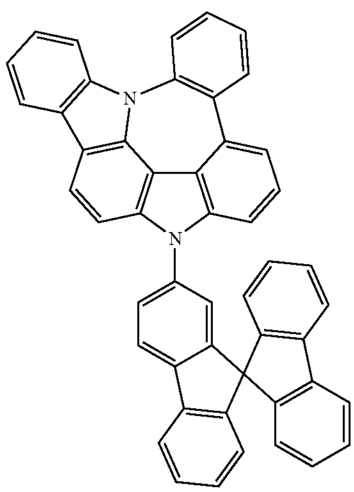
H1-47
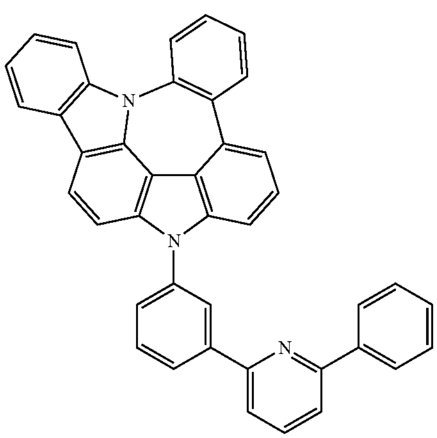
-continued
H1-48
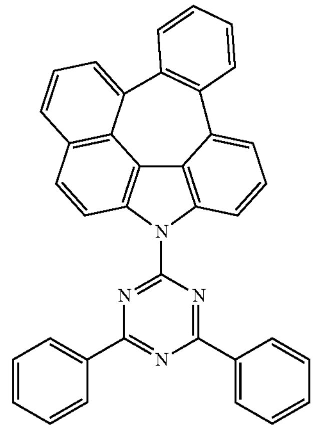
H1-49
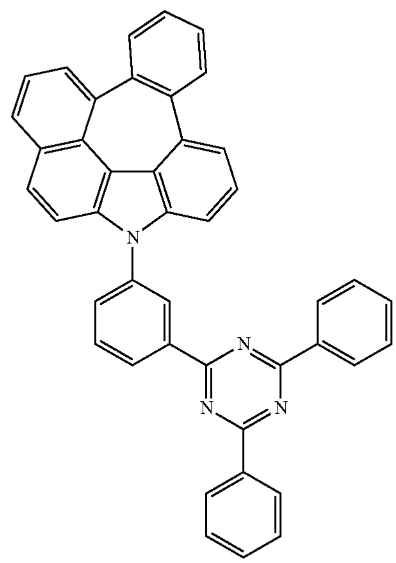
H1-50
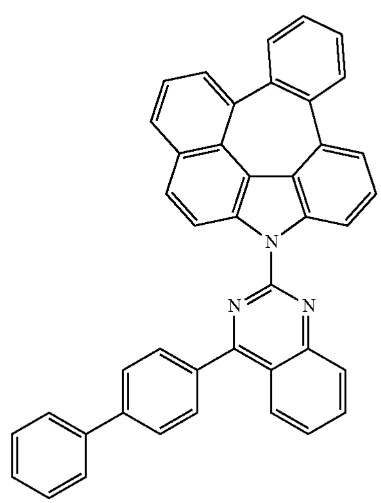

-continued
H1-51
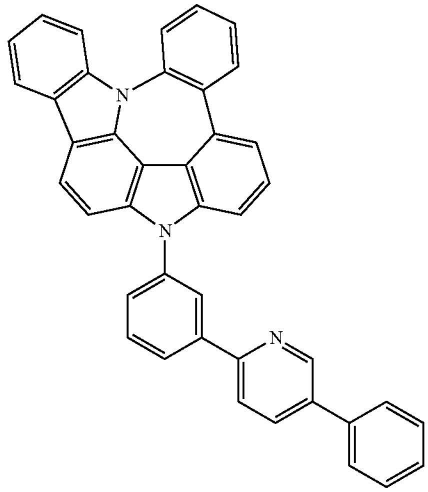
H1-52
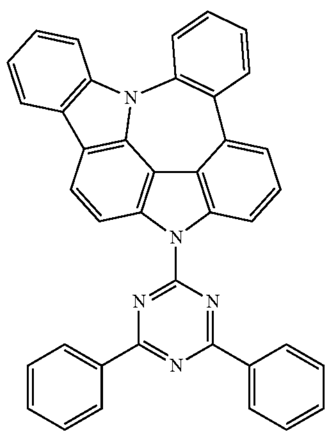
H1-53
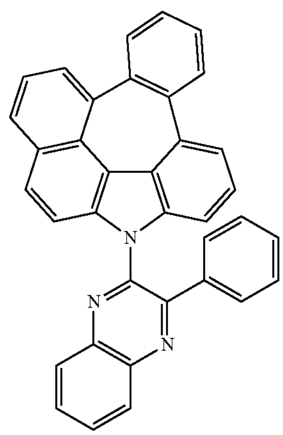
-continued
H1-54
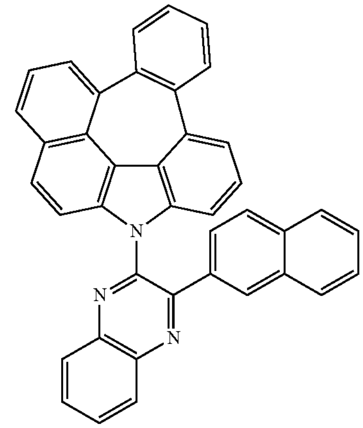
H1-55
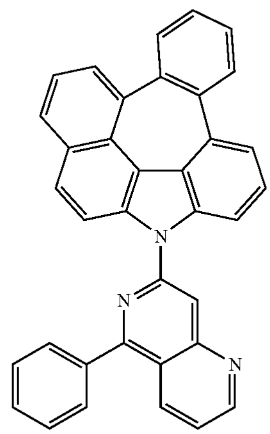
H1-56
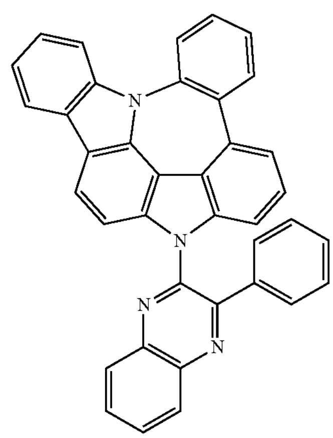

-continued
H1-57
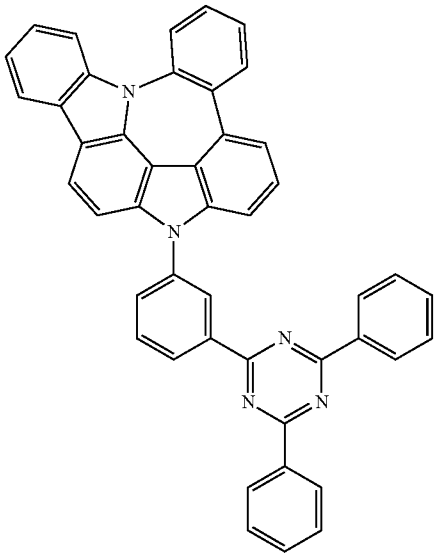
H1-58
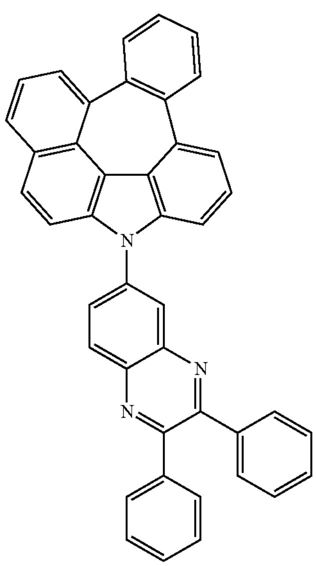
-continued
H1-59
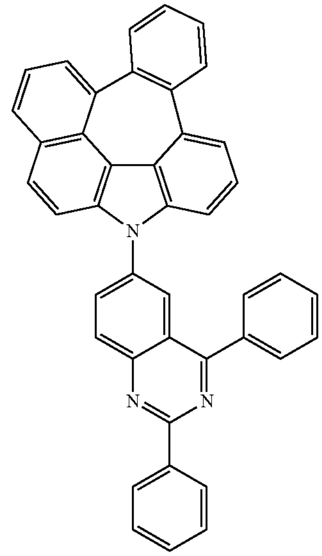
H1-60
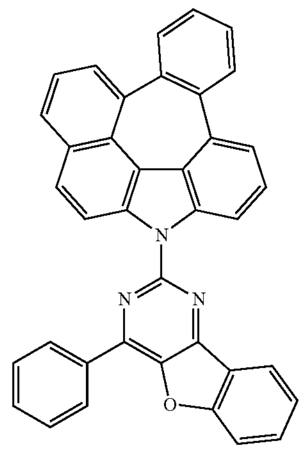
H1-61
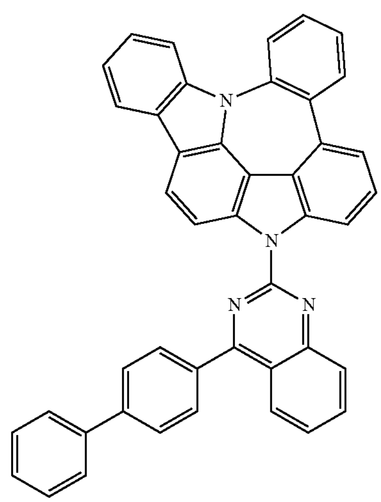

-continued
H1-62
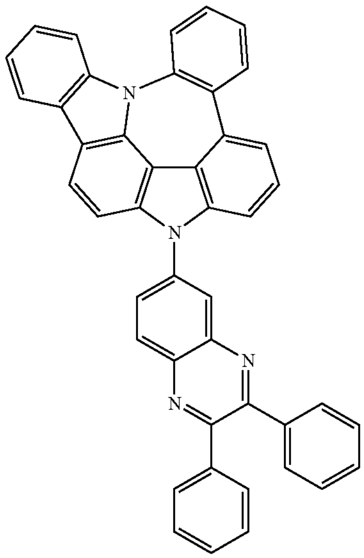
H1-63
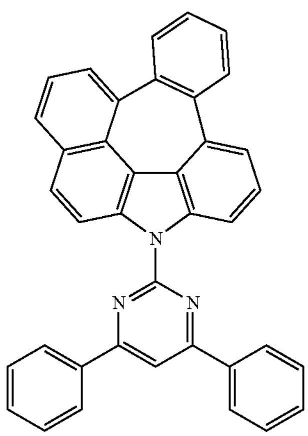
H1-64
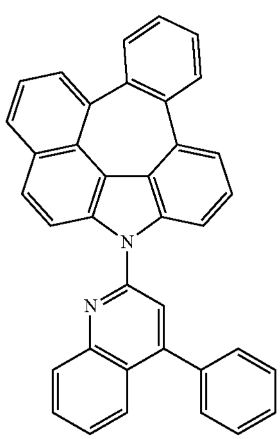
-continued
H1-65
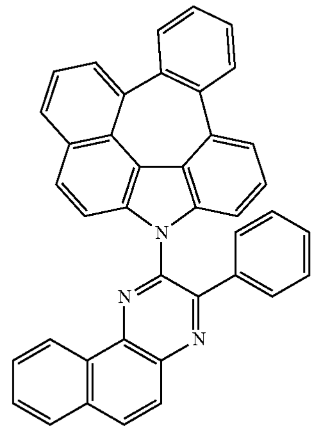
H1-66
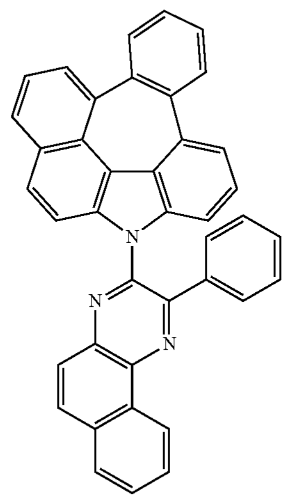
H1-67
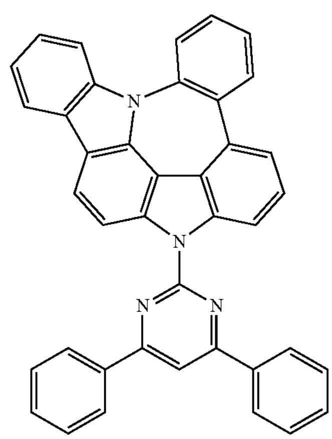

H1-68
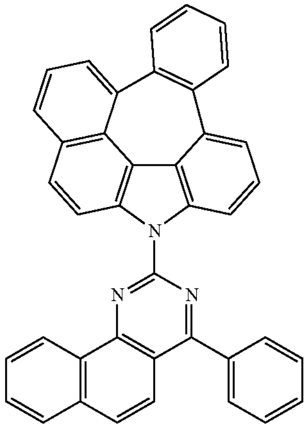
H1-69
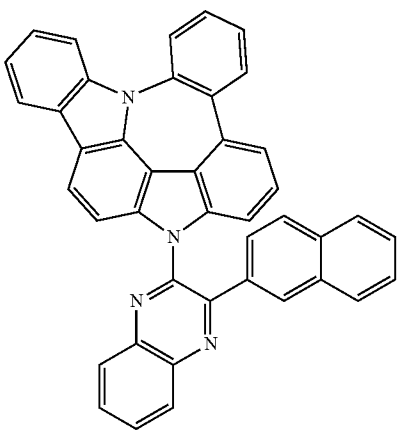
H1-70
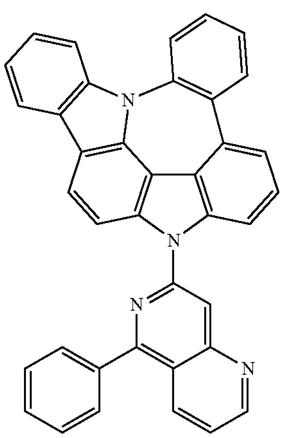
H1-71
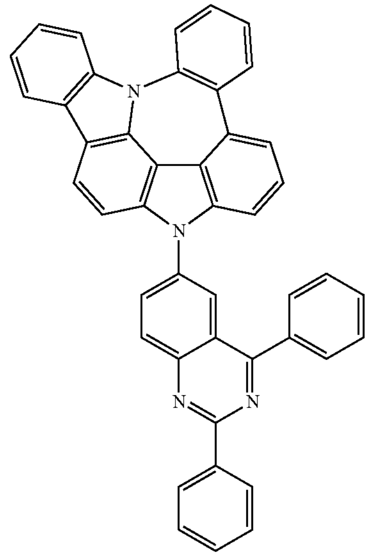
H1-72
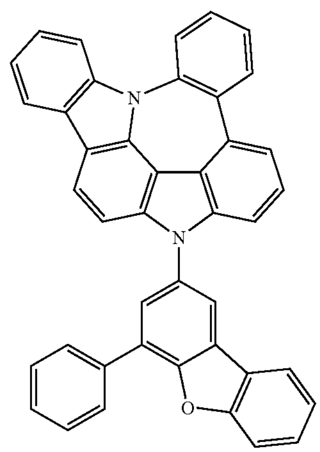
H1-73
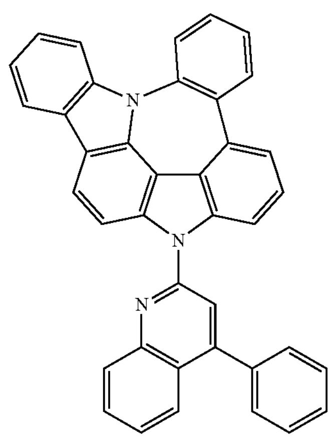

H1-74
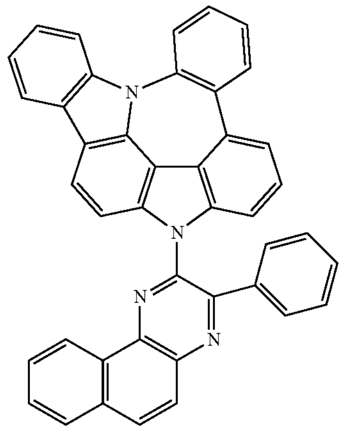
H1-75
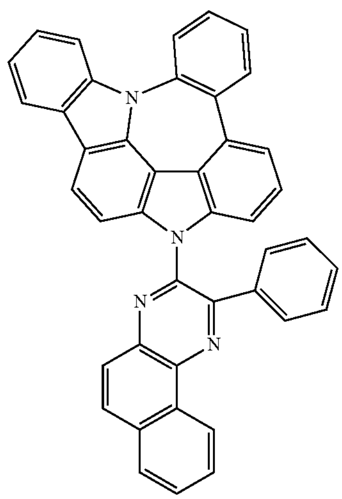
H1-76
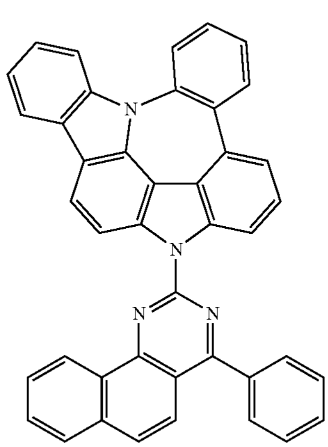
H1-77
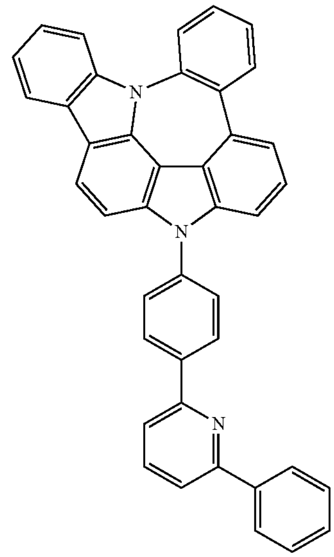
H1-78
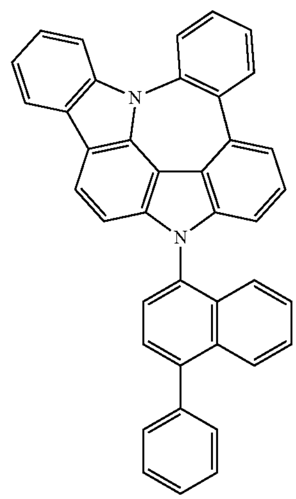
H1-79
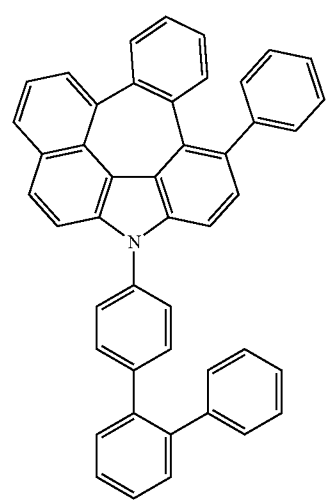

H1-80
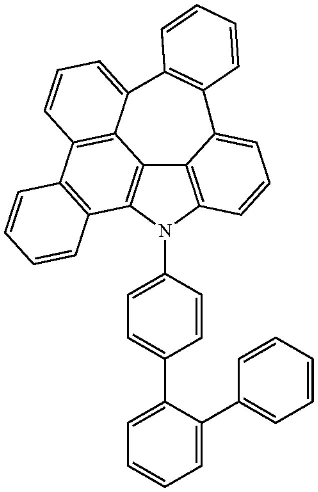
H1-81
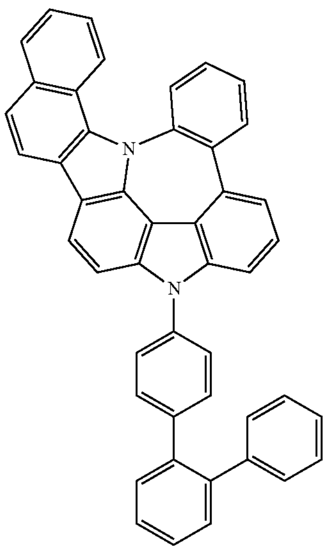
H1-82
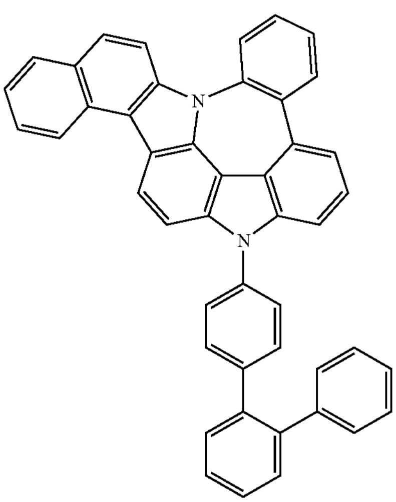
H1-83
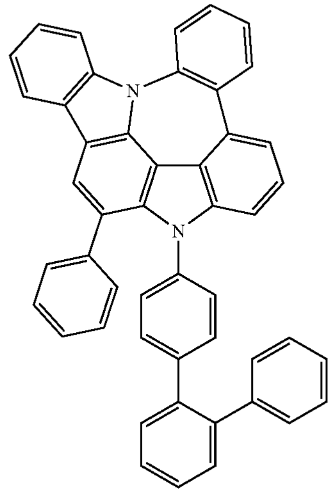
H1-84
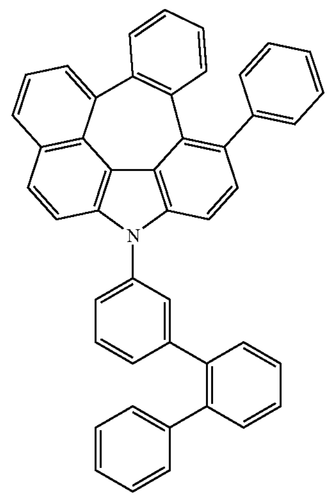
H1-85
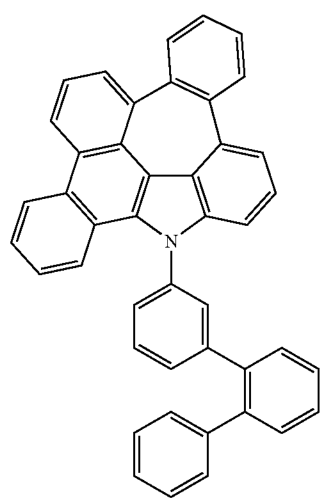

-continued
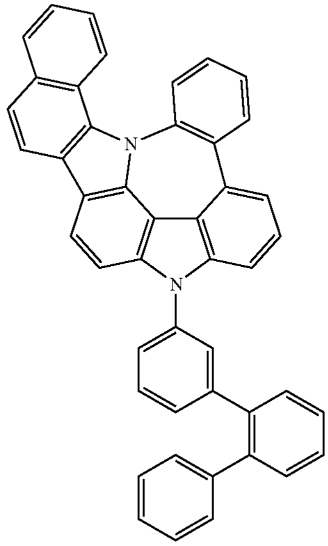
H1-86
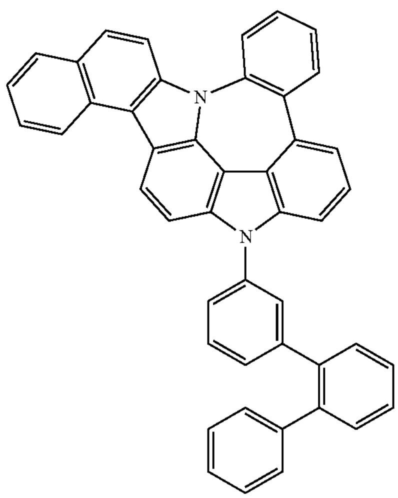
H1-87
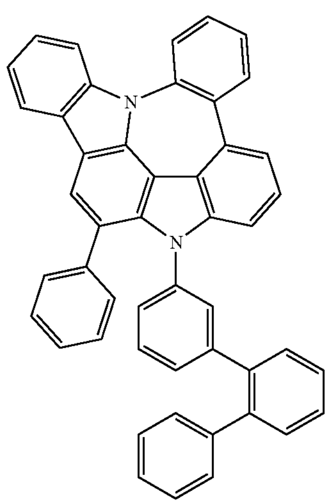
H1-88
-continued
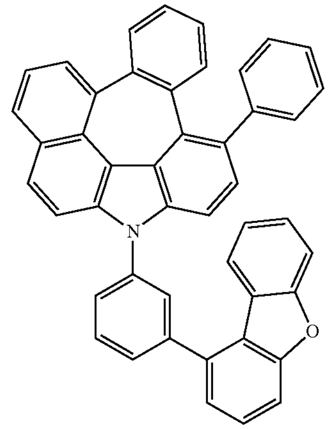
H1-89
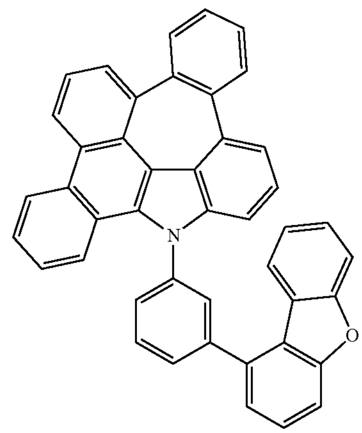
H1-90
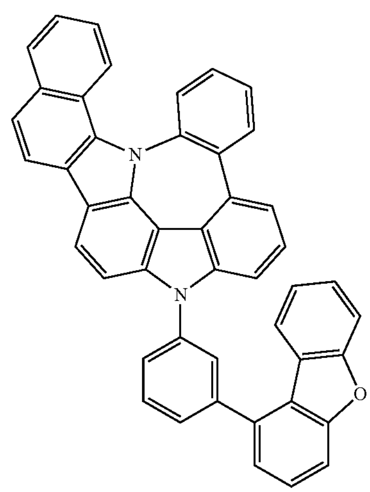
H1-91

H1-92
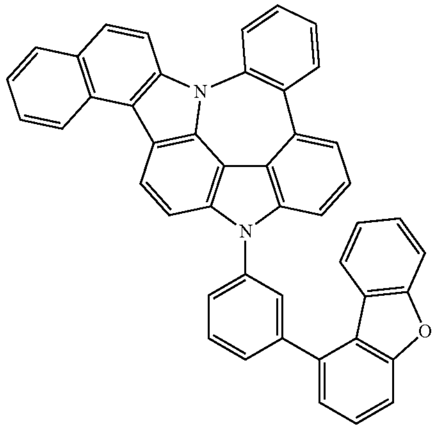
H1-93
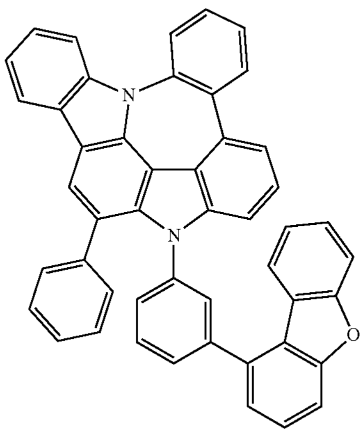
H1-94
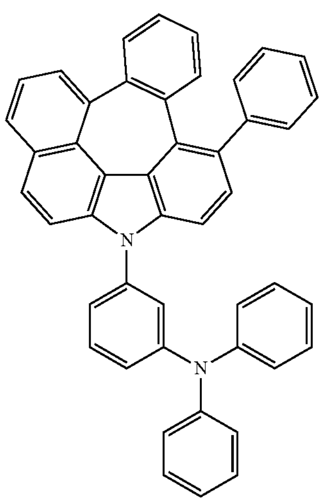
H1-95
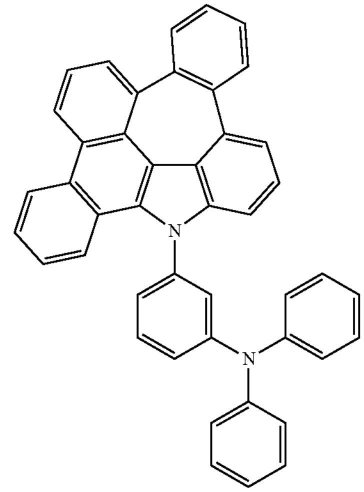
H1-96
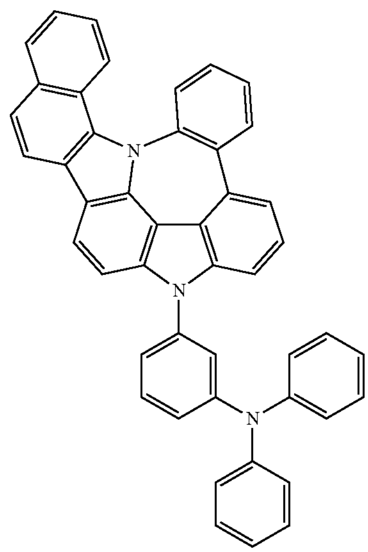
H1-97
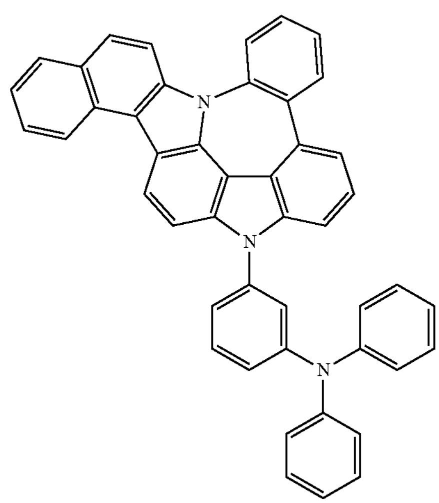

-continued
H1-98
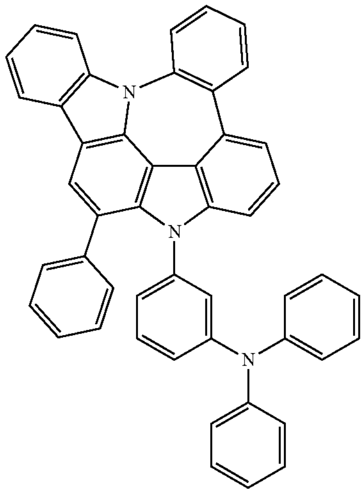
H1-99
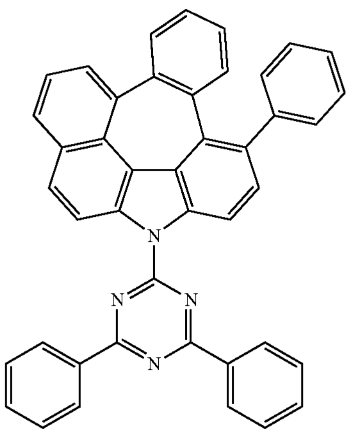
H1-100
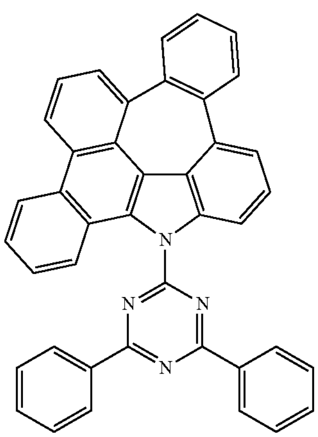
-continued
H1-101
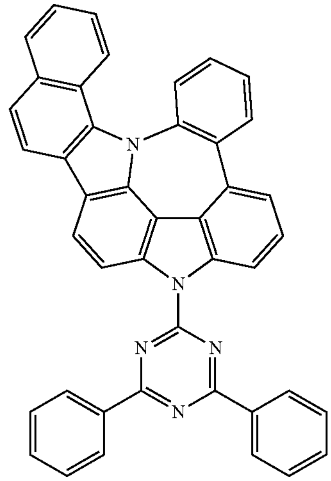
H1-102
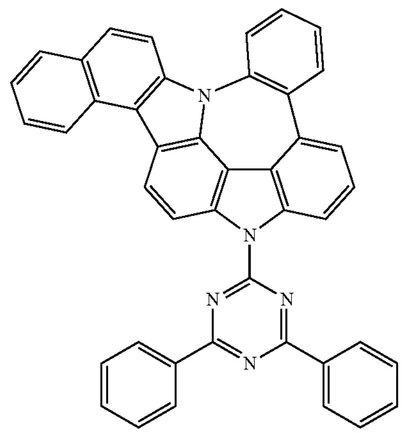
H1-103
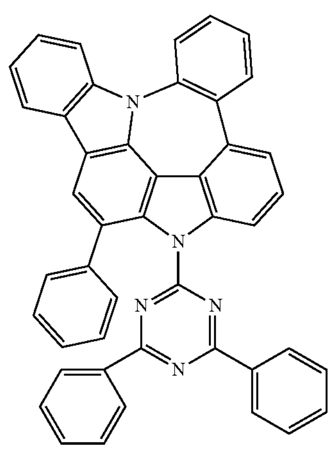

-continued
H1-104
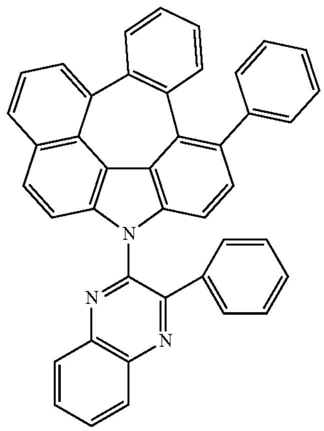
H1-105
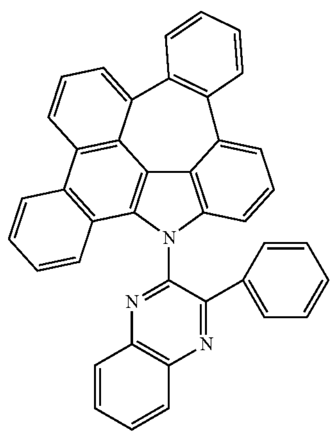
H1-106
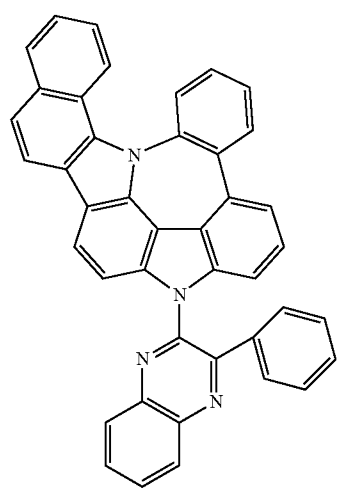
-continued
H1-107
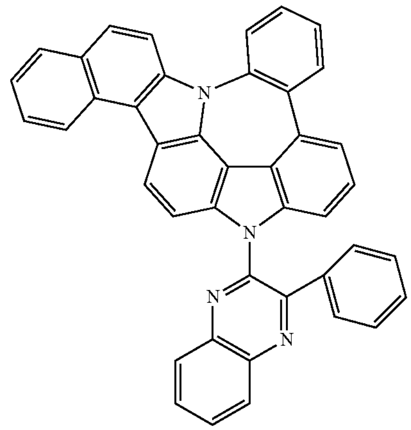
H1-108
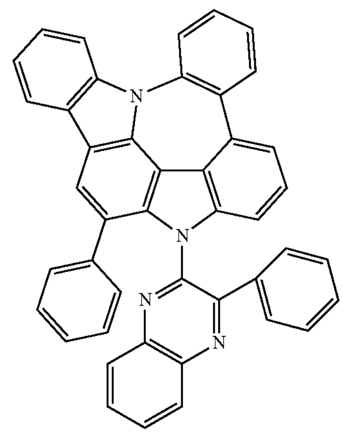
H1-109
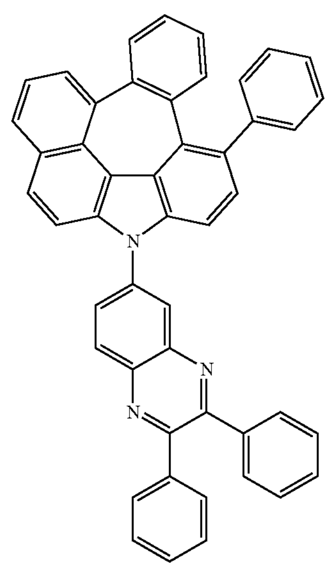

-continued
H1-110
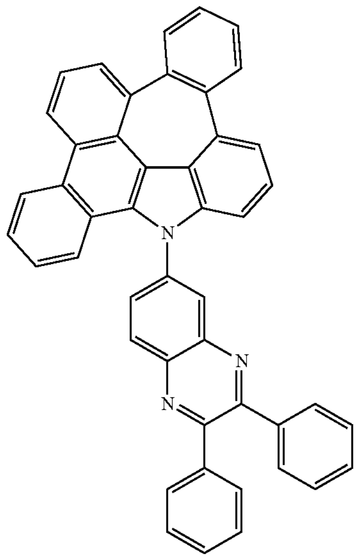
H1-111
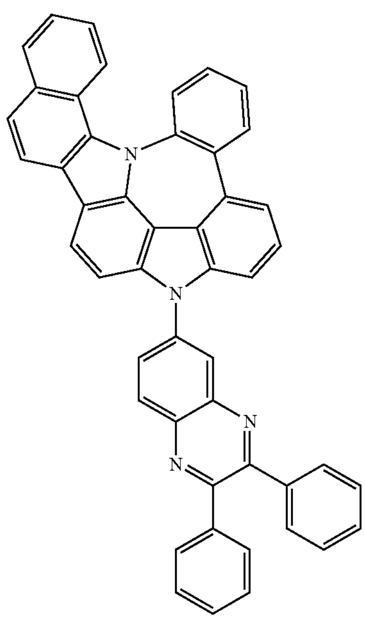
-continued
H1-112
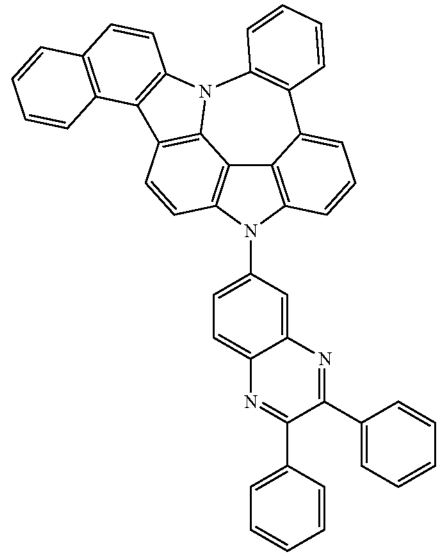
H1-113
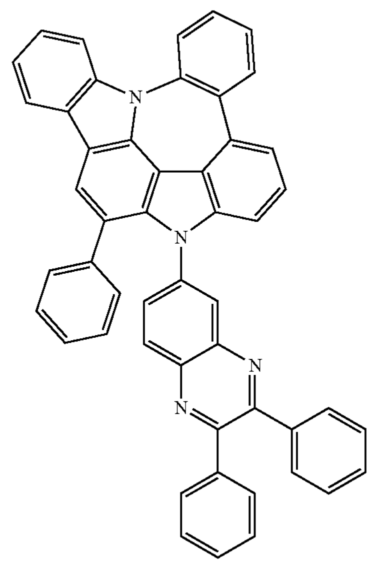
H1-114
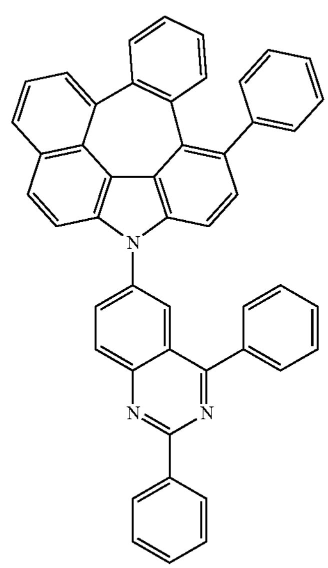

-continued
H1-115
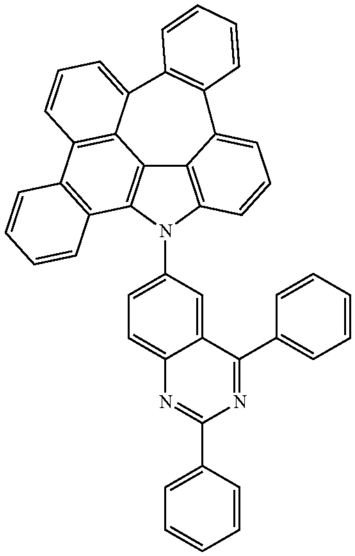
H1-116
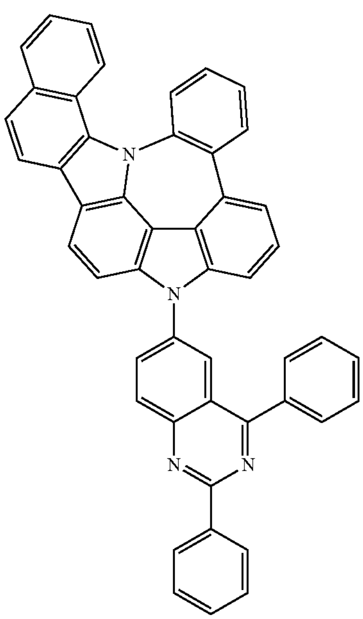
-continued
H1-117
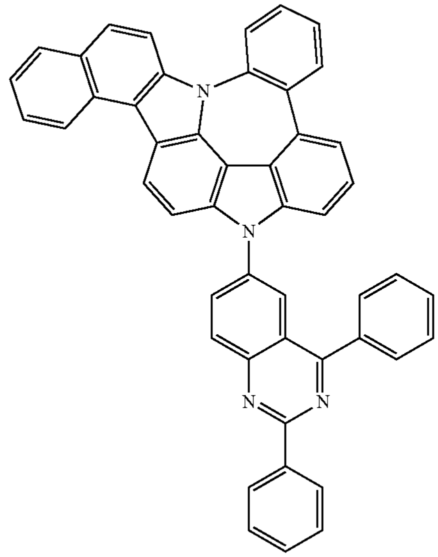
H1-118
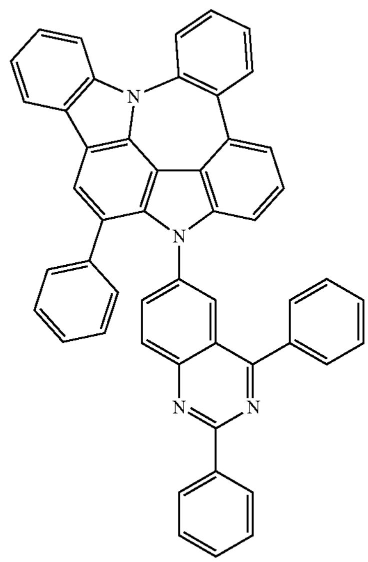
H1-119
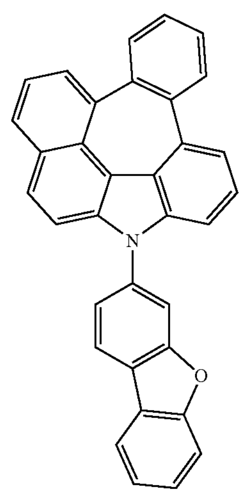

-continued

H1-120

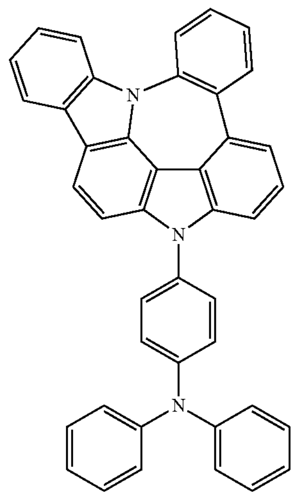

H1-121

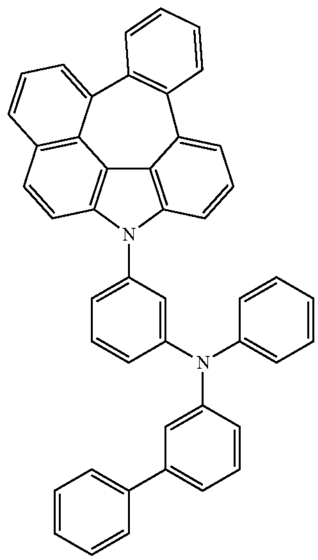

H1-122

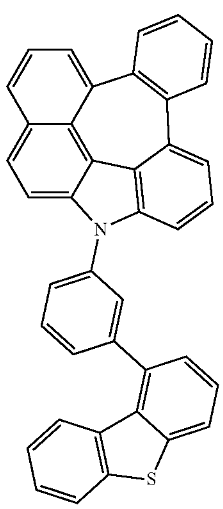

Hereinafter, the compound represented by formula 2 will be described in more detail.

In formula 2, HAr represents a substituted or unsubstituted nitrogen-containing (3- to 30-membered)heteroaryl.

According to one embodiment of the present disclosure, HAr represents a substituted or unsubstituted nitrogen-containing (5- to 15-membered)heteroaryl. According to another embodiment of the present disclosure, HAr represents a nitrogen-containing (5- to 15-membered)heteroaryl unsubstituted or substituted with a (C6-C20)aryl(s) which is unsubstituted or substituted with deuterium. Specifically, HAr may represent a substituted or unsubstituted triazinyl, a substituted or unsubstituted pyridyl, a substituted or unsubstituted pyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, a substituted or unsubstituted benzothienopyrimidinyl, etc. In addition, for example, HAr may represent a substituted triazinyl wherein the substituent is at least one, preferably two selected from phenyl, naphthyl, biphenyl, terphenyl, phenyl substituted with deuterium, naphthylphenyl, naphthyl substituted with deuterium, phenylnaphthyl, etc.

In formula 2, $L_2$ represents a single bond, or a (C6-C20) arylene unsubstituted or substituted with deuterium. According to one embodiment of the present disclosure, $L_2$ represents a single bond, or a (C6-C18)arylene unsubstituted or substituted with deuterium. Specifically, $L_2$ may represent a single bond, a phenylene unsubstituted or substituted with deuterium, a naphthylene unsubstituted or substituted with deuterium, a biphenylene unsubstituted or substituted with deuterium, a terphenylene unsubstituted or substituted with deuterium, a phenylene-naphthylene unsubstituted or substituted with deuterium, etc.

In formula 2, $R_1$ to $R_8$ each independently represent hydrogen, deuterium, or a (C6-C30)aryl unsubstituted or substituted with deuterium. According to one embodiment of the present disclosure, $R_1$ to $R_8$ each independently represent hydrogen, deuterium, or a (C6-C18)aryl unsubstituted or substituted with deuterium. Specifically, $R_1$ to $R_8$ each independently may represent hydrogen, deuterium, phenyl, naphthyl, biphenyl, phenyl substituted with deuterium, etc.

The compound represented by formula 2 may be at least one selected from the following compounds, but is not limited thereto.

H2-1

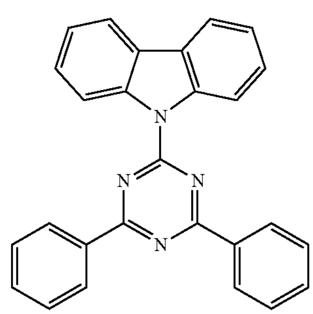

-continued
H2-2
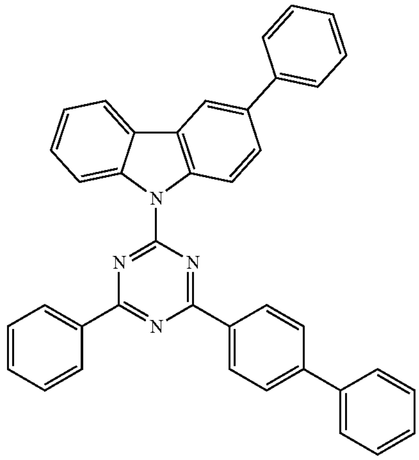
H2-3
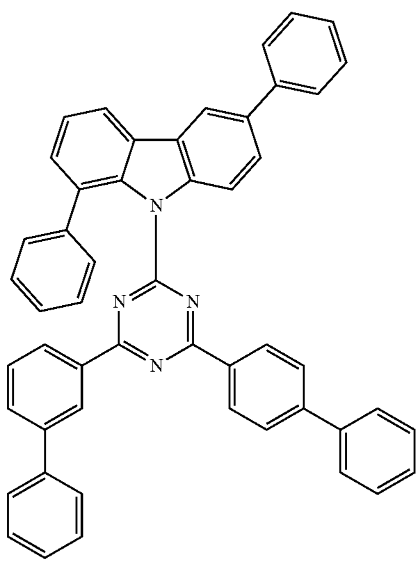
H2-4
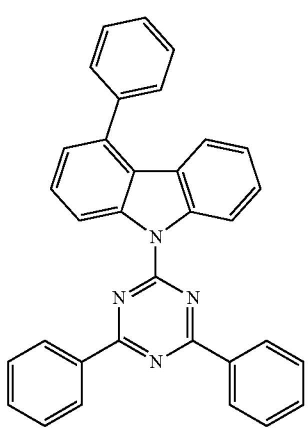
-continued
H2-5
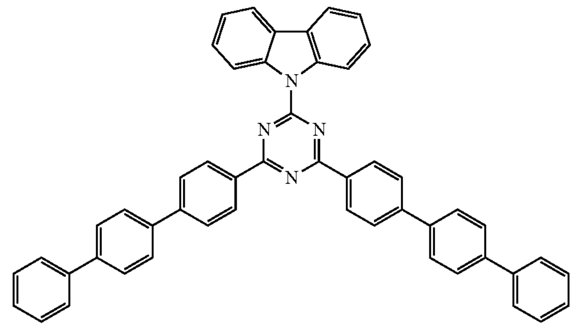
H2-6
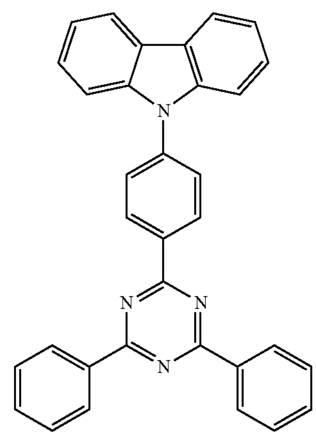
H2-7
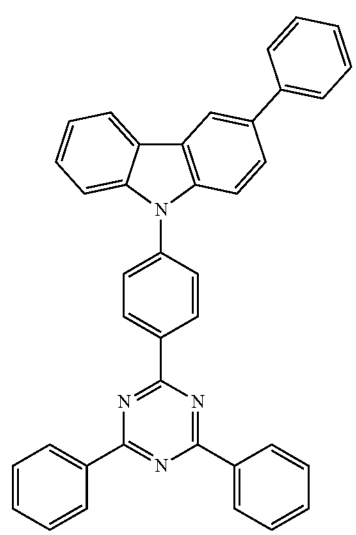

-continued
H2-8
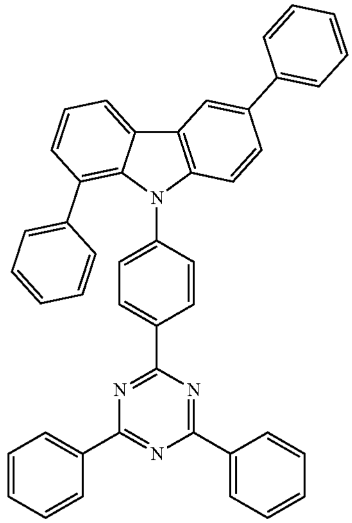
H2-9
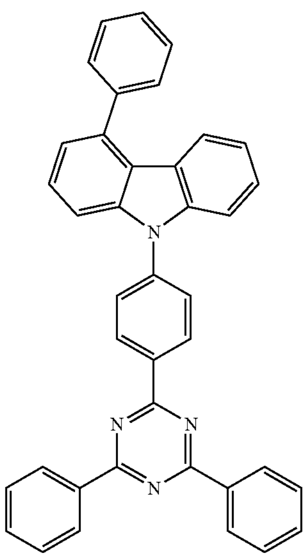
H2-10
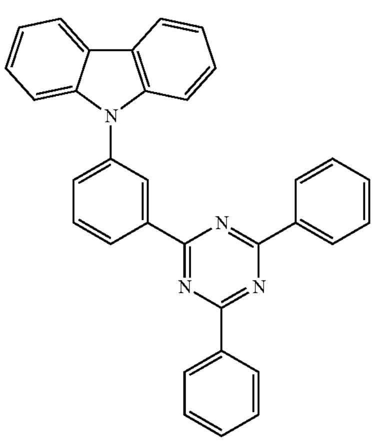
-continued
H2-11
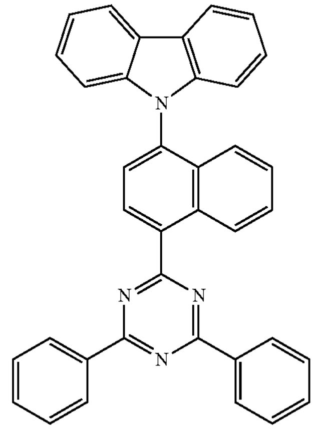
H2-12
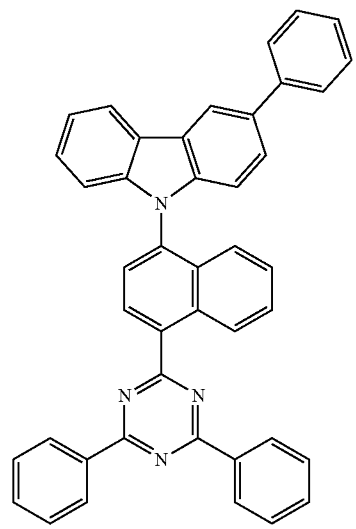
H2-13
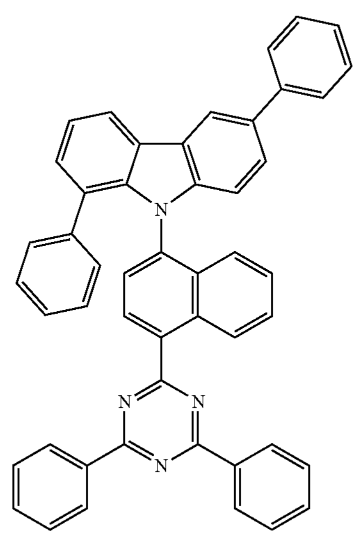

-continued
H2-14
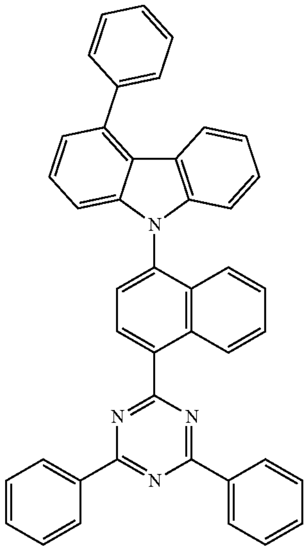
H2-15
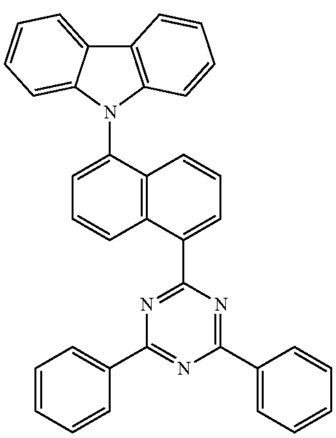
H2-16
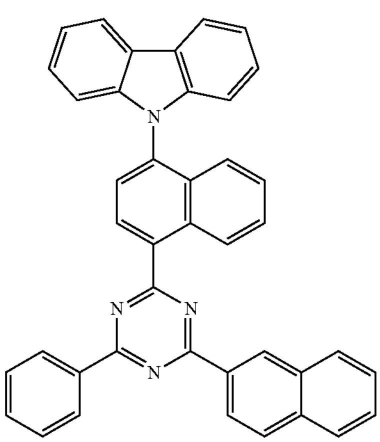
-continued
H2-17
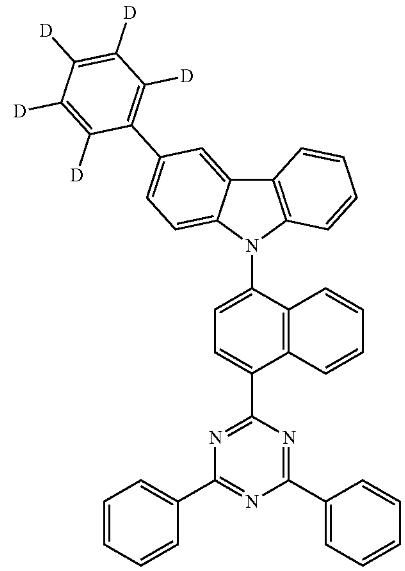
H2-18
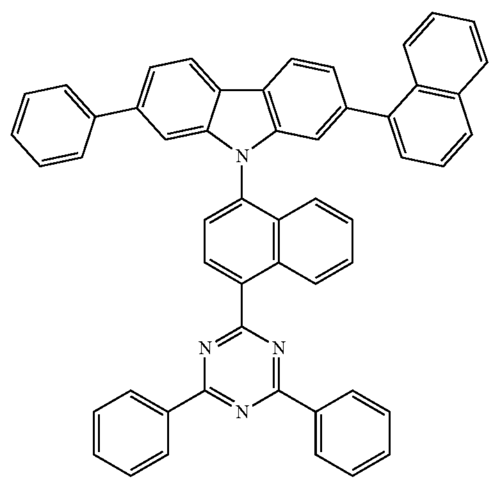
H2-19
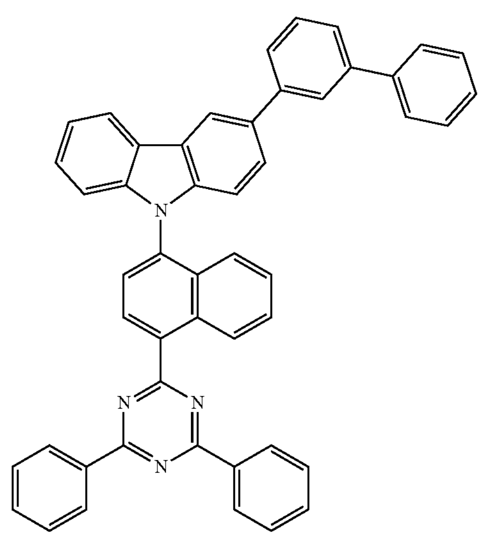

-continued
H2-20
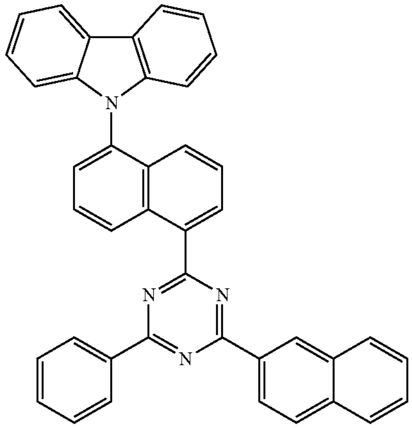
H2-21
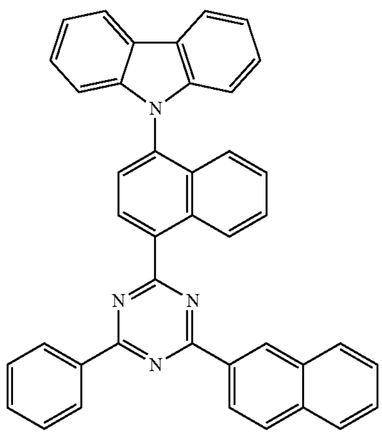
H2-22
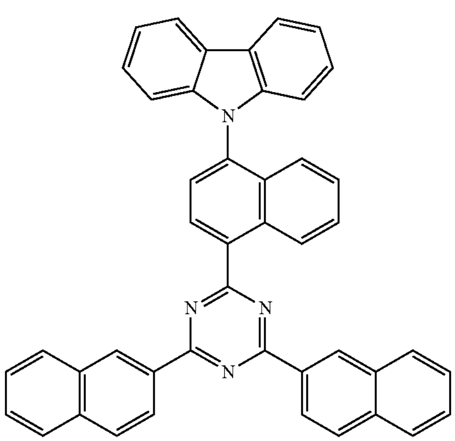
-continued
H2-23
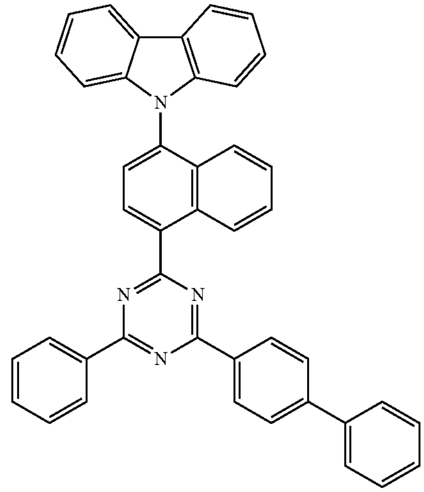
H2-24
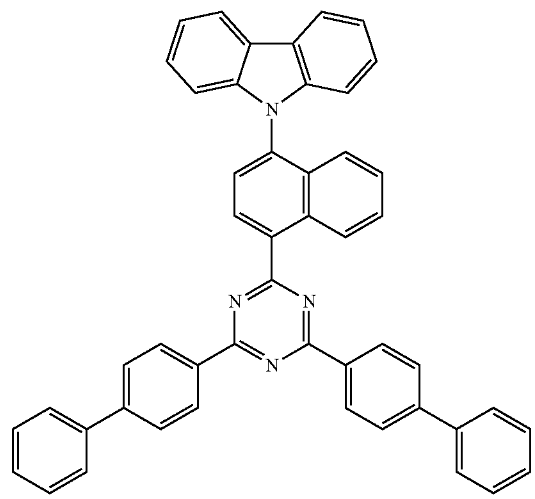
H2-25
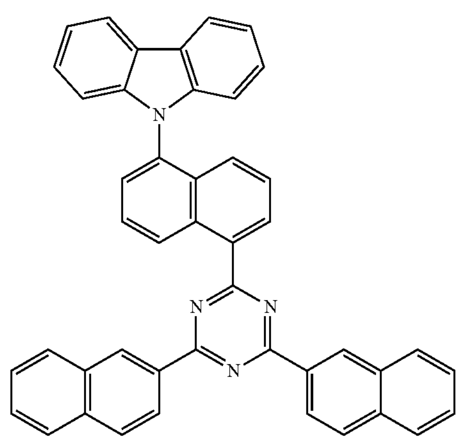

-continued
H2-26
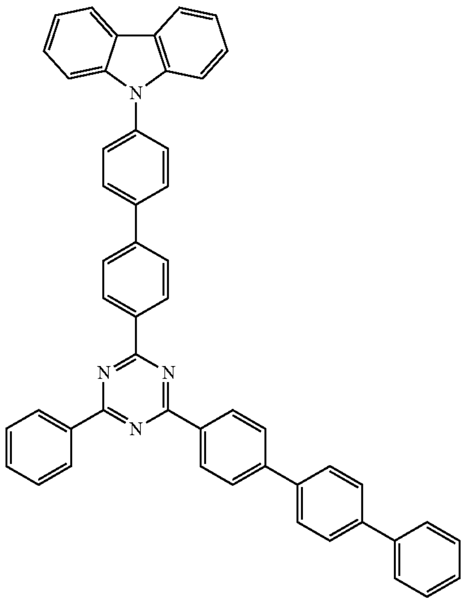
H2-27
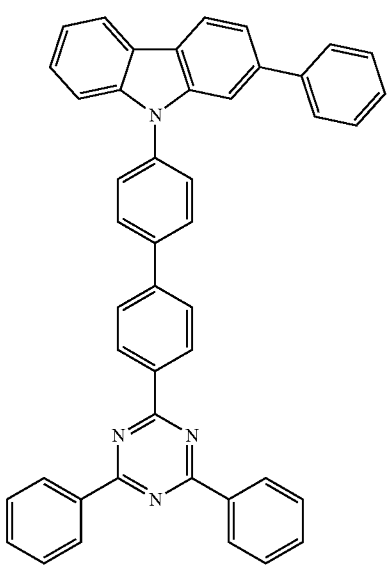
-continued
H2-28
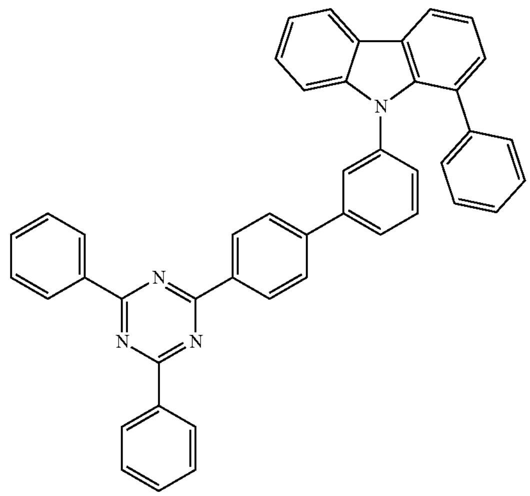
H2-29
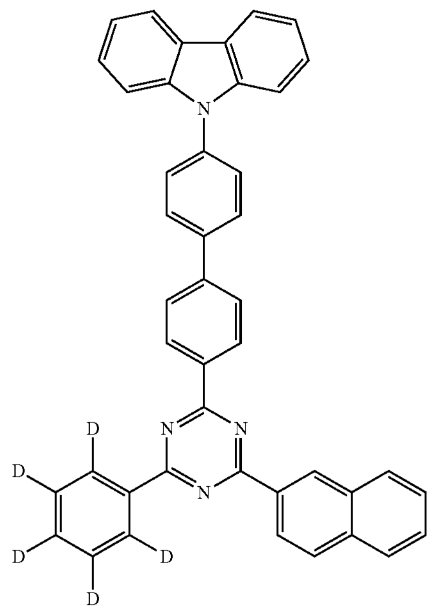
H2-30
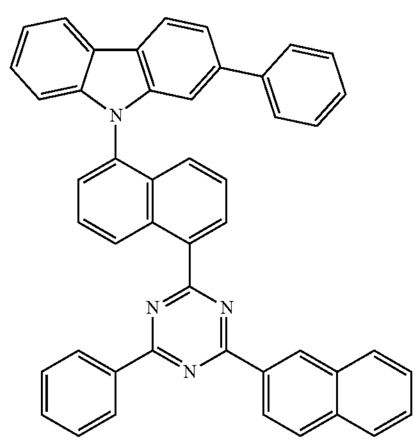

-continued
H2-31
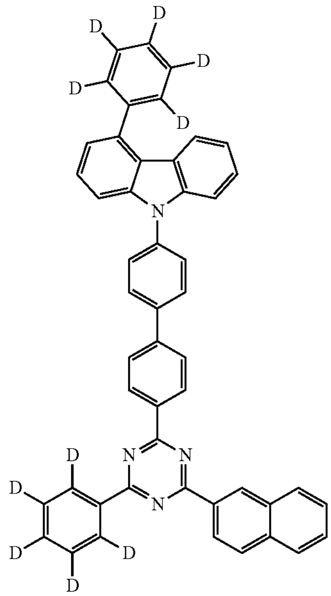
H2-32
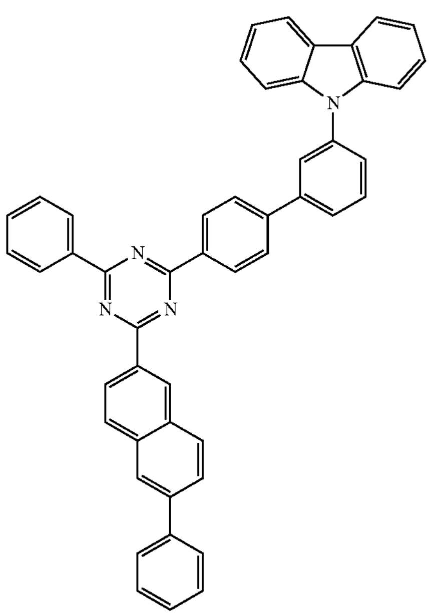
-continued
H2-33
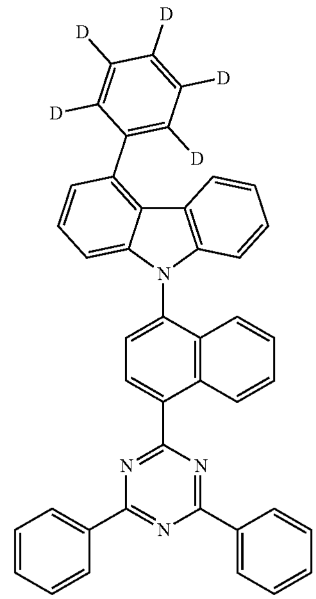
H2-34
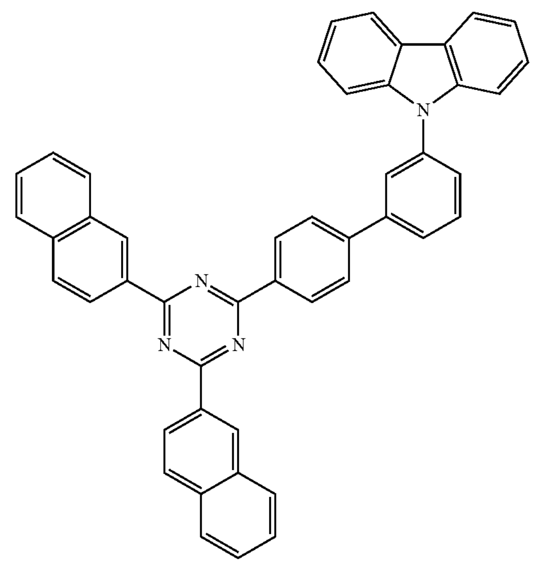
H2-35
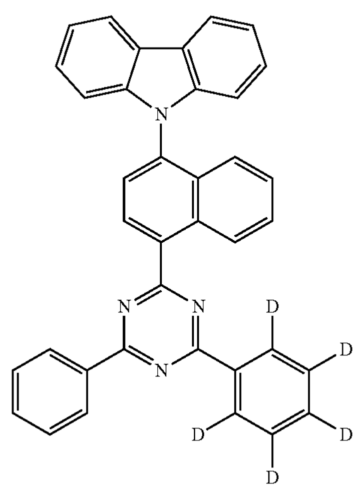

-continued
H2-36
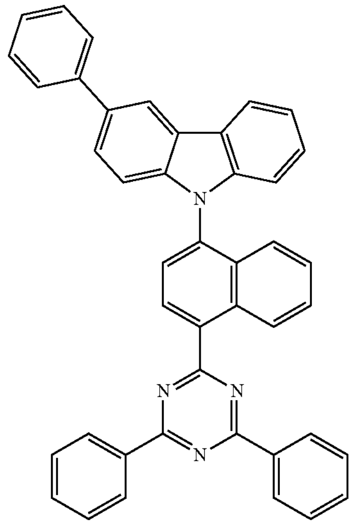
H2-37
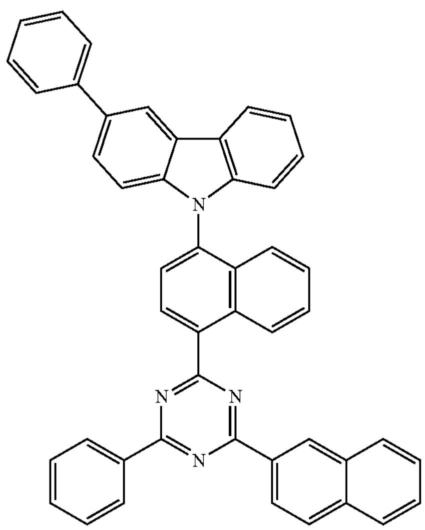
H2-38
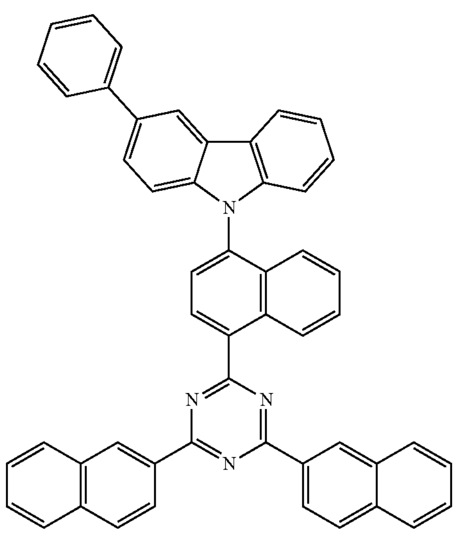
-continued
H2-39
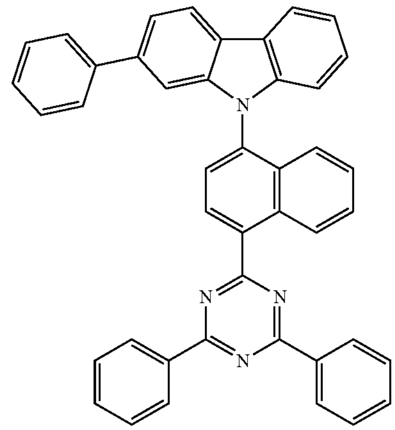
H2-40
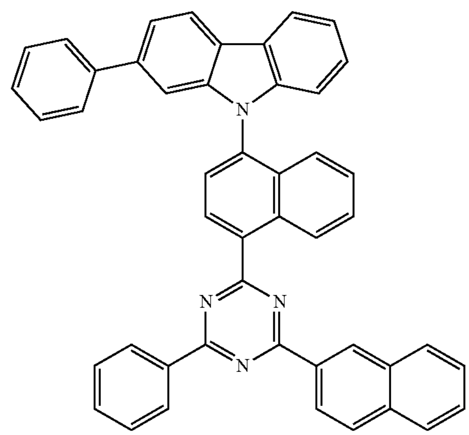
H2-41
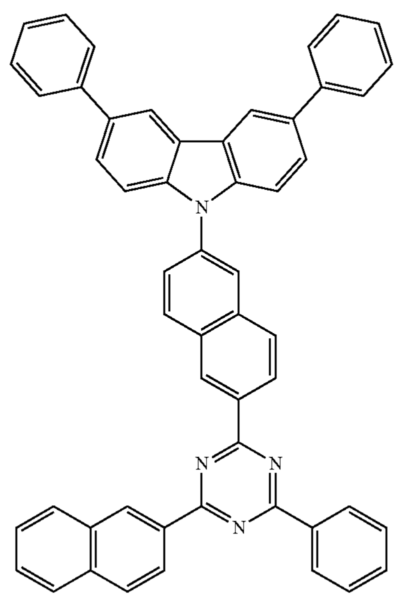

-continued
H2-42
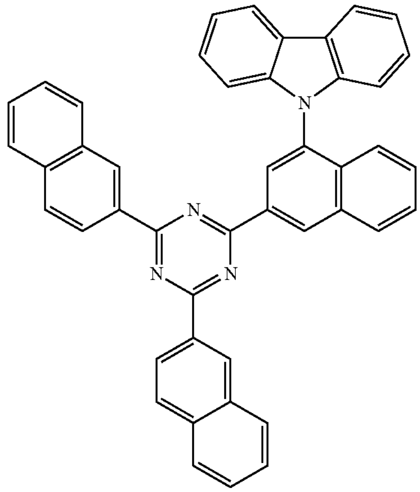
H2-43
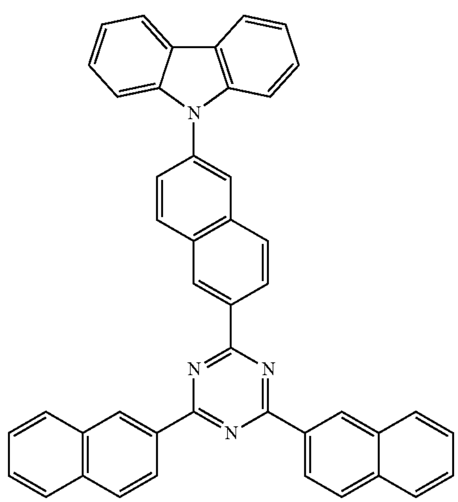
H2-44
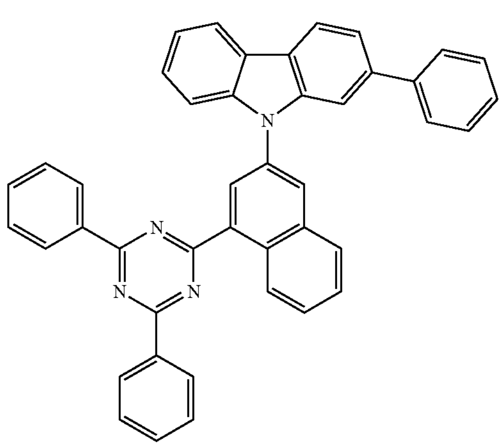
-continued
H2-45
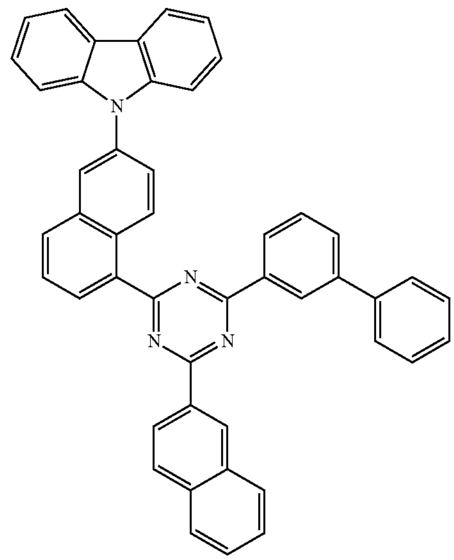
H2-46
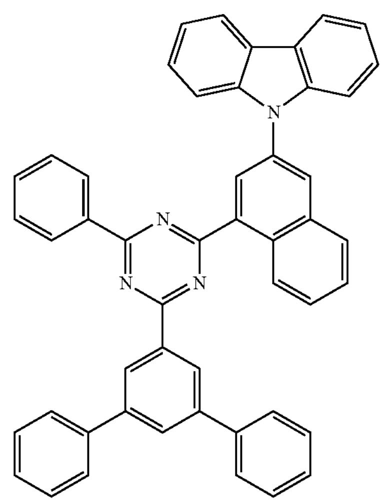
H2-47
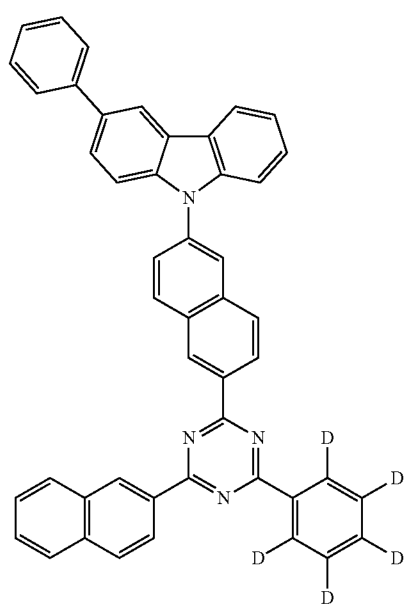

-continued
H2-48
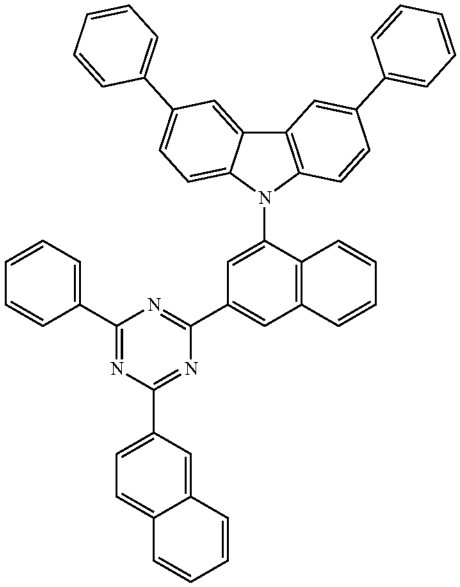
H2-49
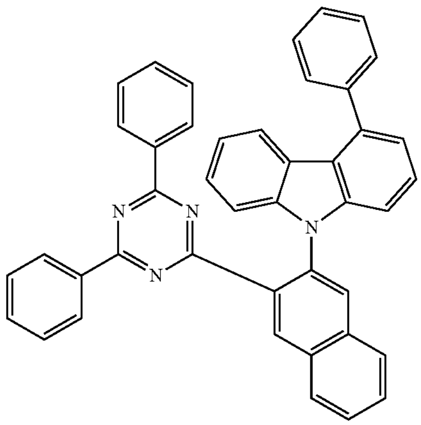
H2-50
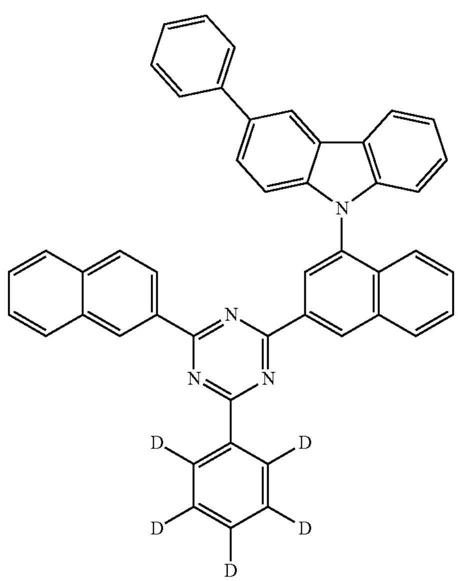
-continued
H2-51
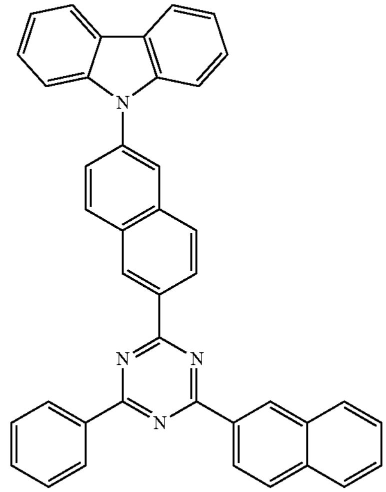
H2-52
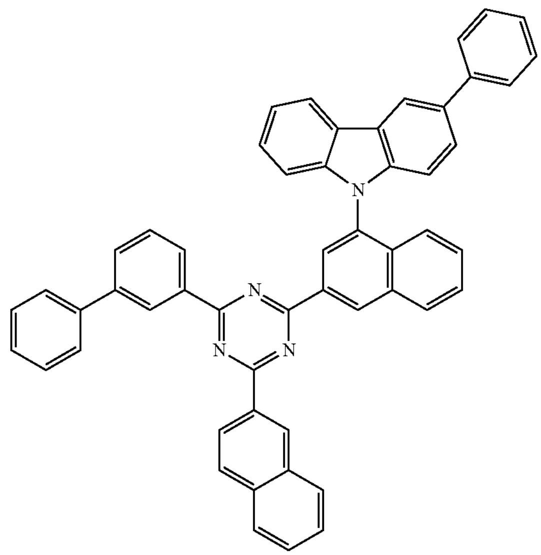
H2-53
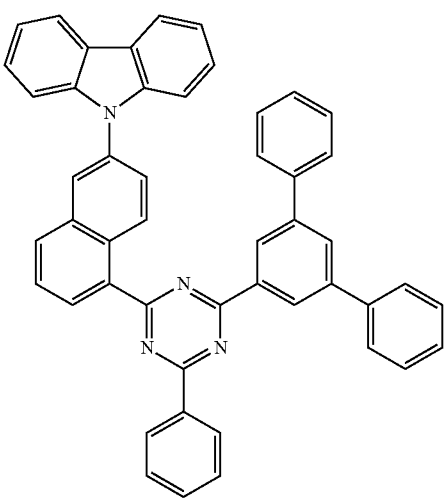

-continued
H2-54
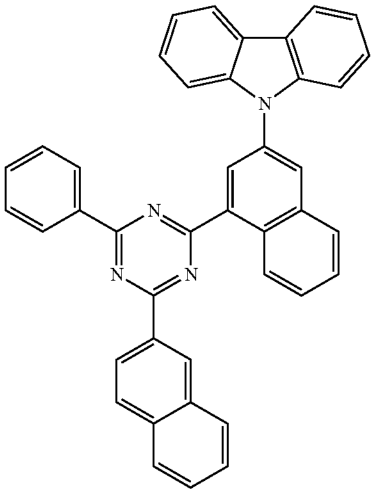
H2-55
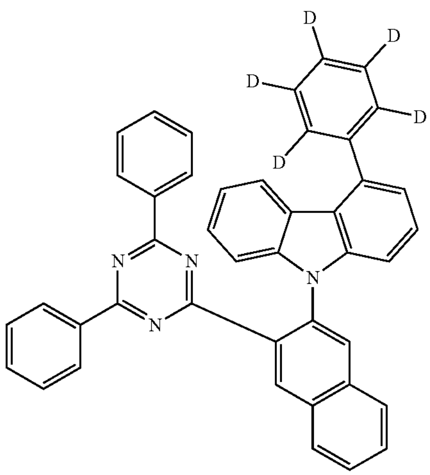
H2-56
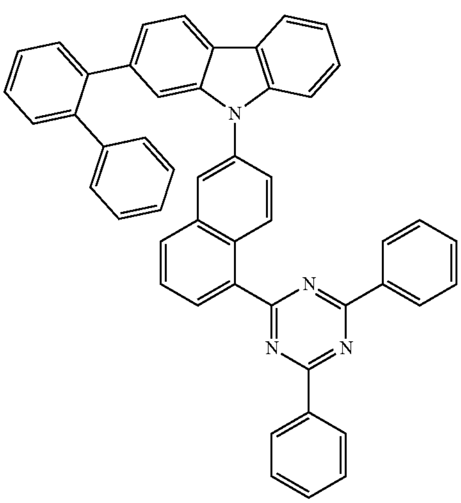
-continued
H2-57
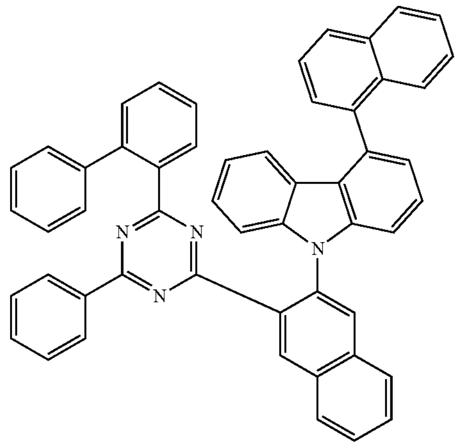
H2-58
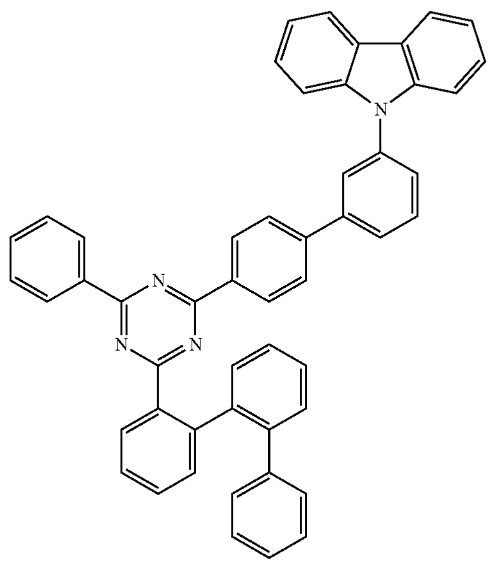
H2-59
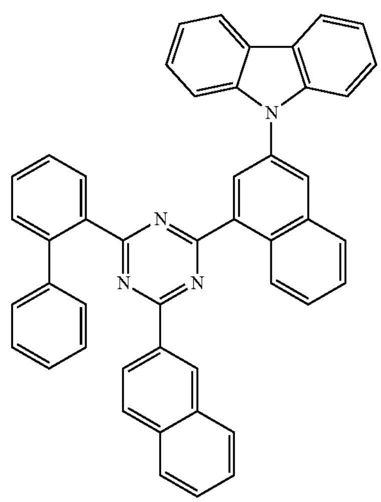

-continued
H2-60
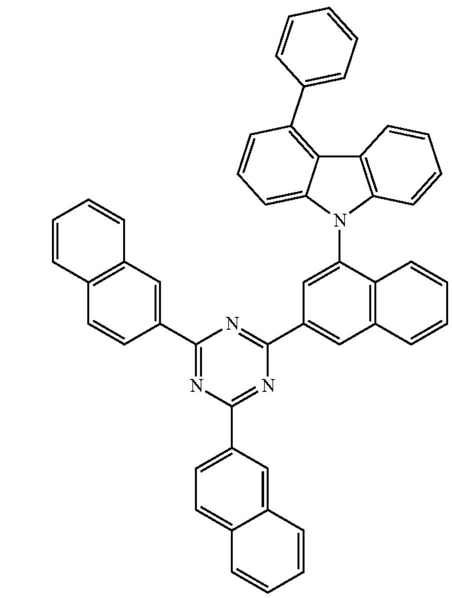
H2-61
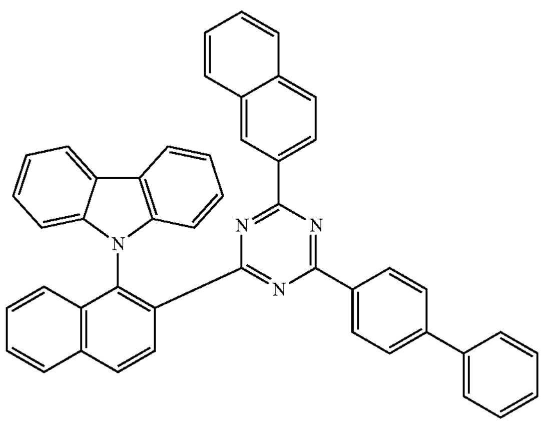
H2-62
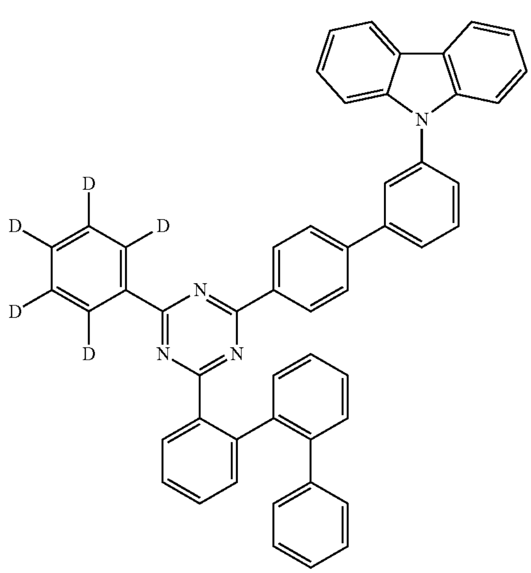
-continued
H2-63
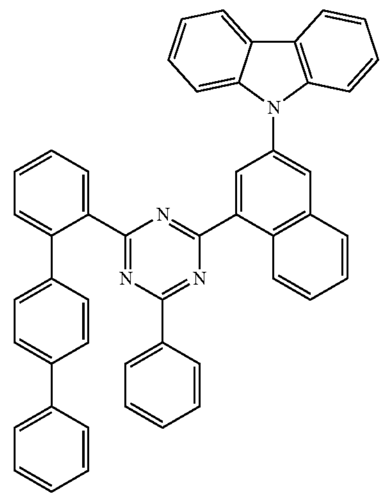
H2-64
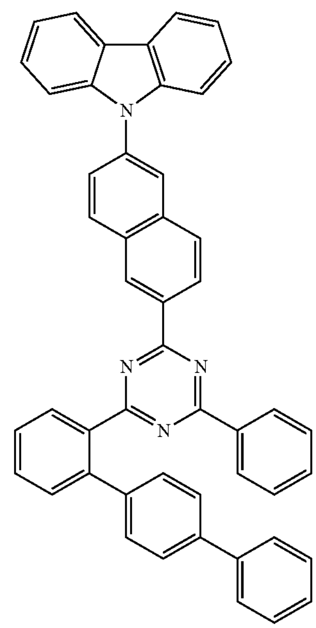
H2-65
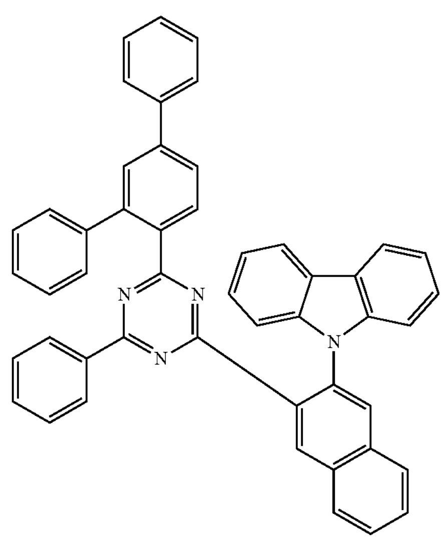

-continued
H2-66
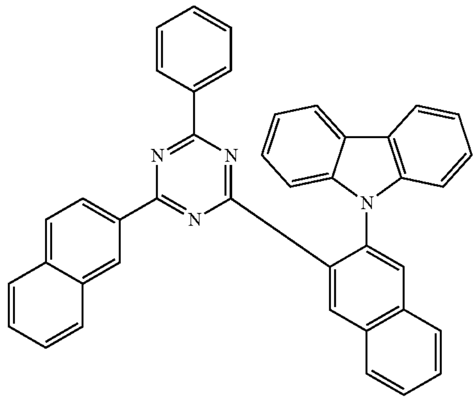
H2-67
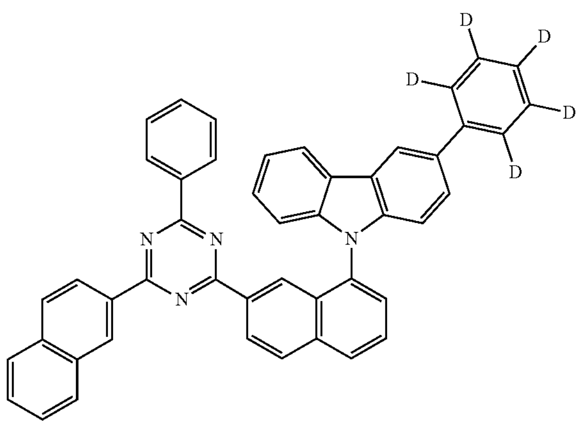
H2-68
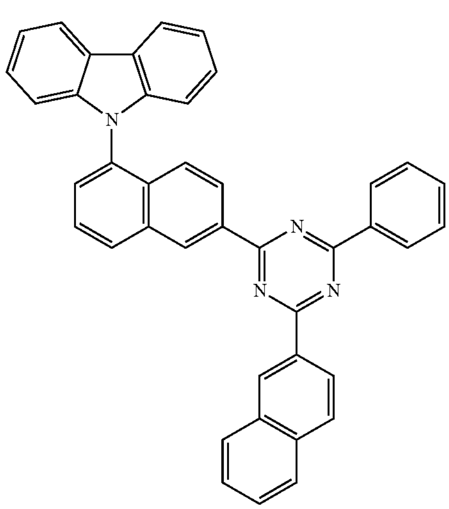
-continued
H2-69
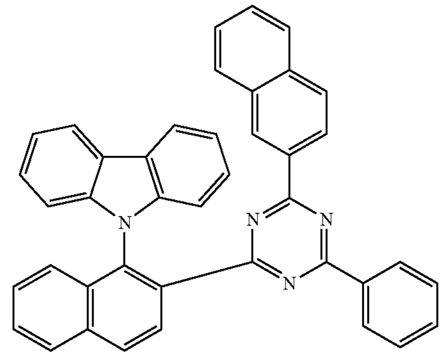
H2-70
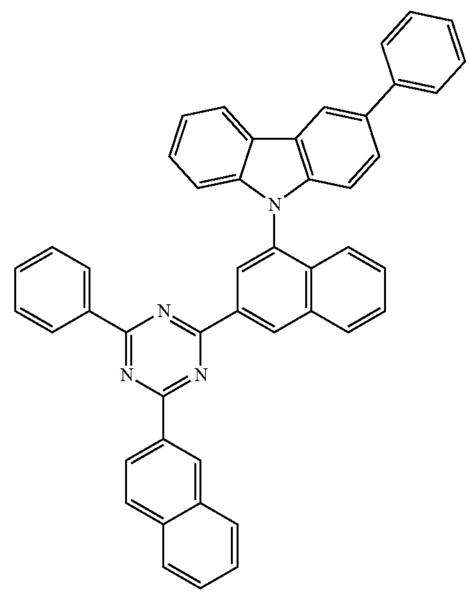
H2-71
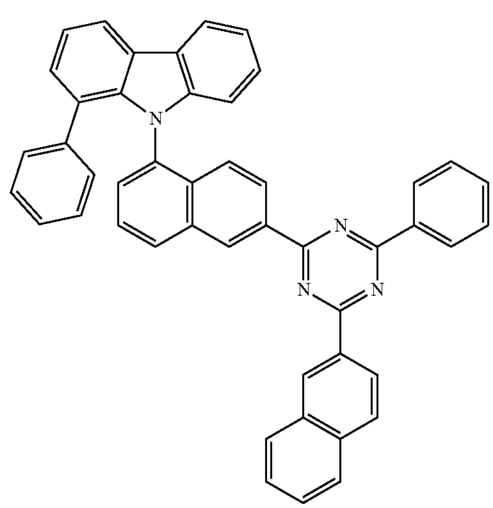

-continued
H2-72
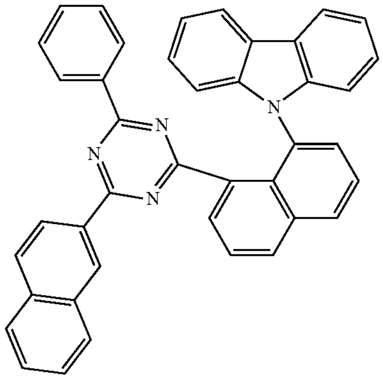
H2-73
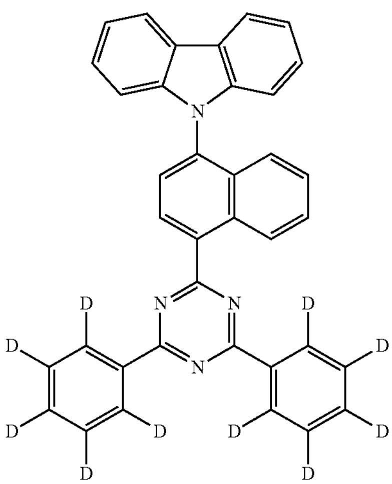
H2-74
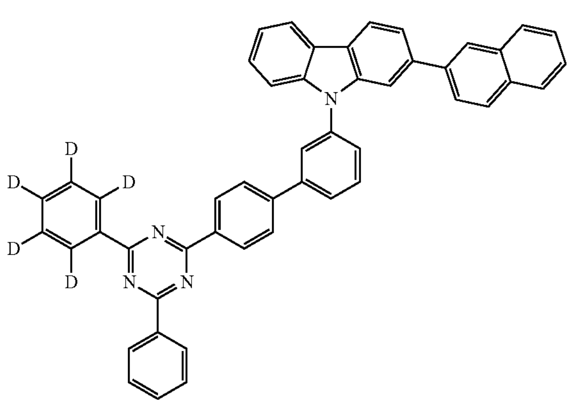
-continued
H2-75
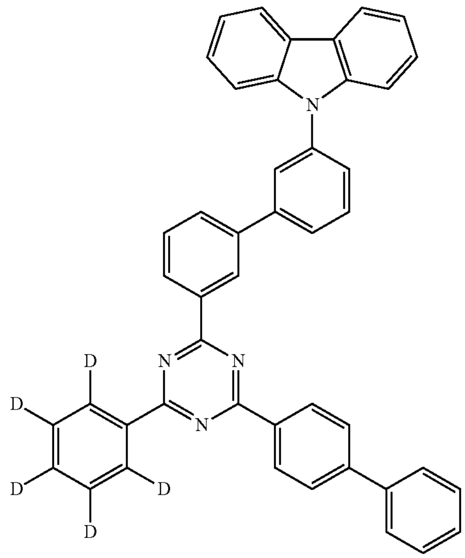
H2-76
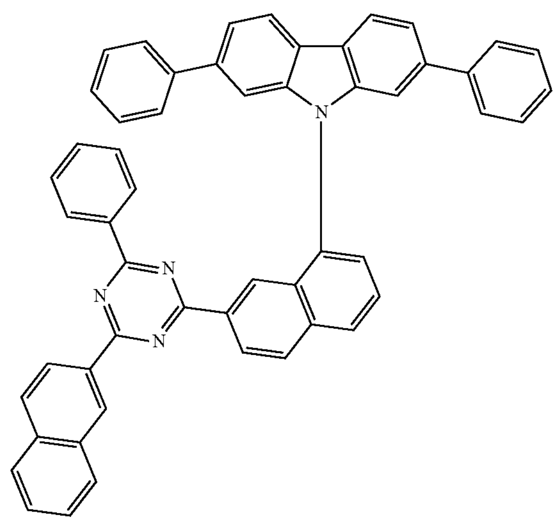
H2-77
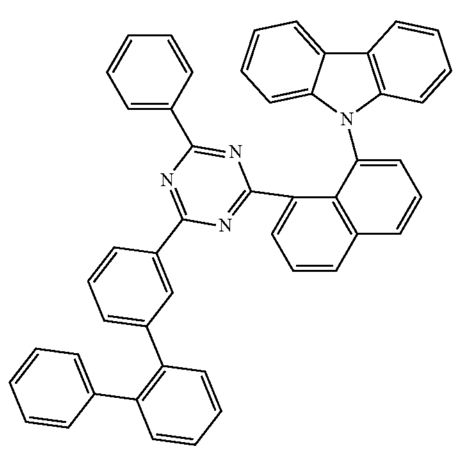

-continued
H2-78
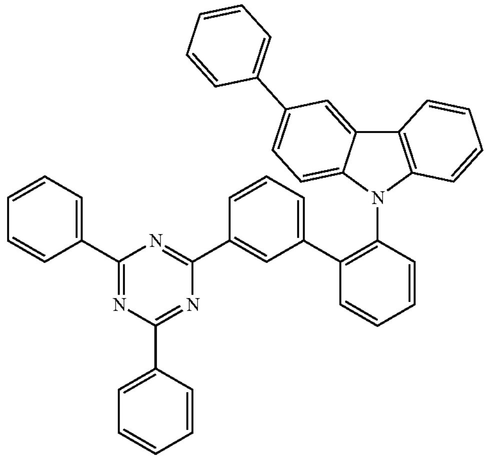
H2-79
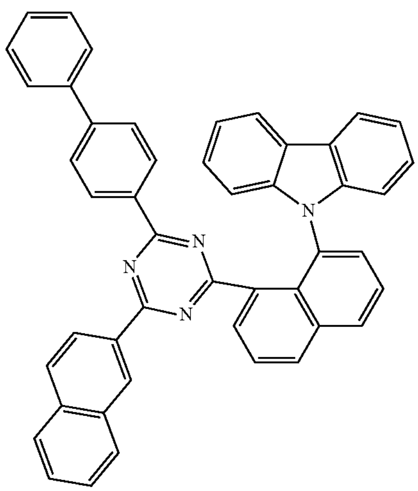
H2-80
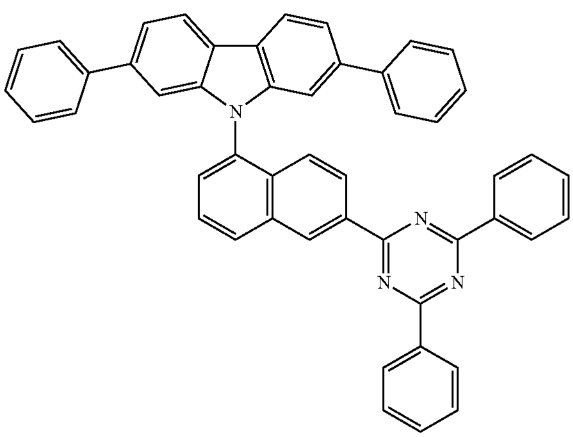
-continued
H2-81
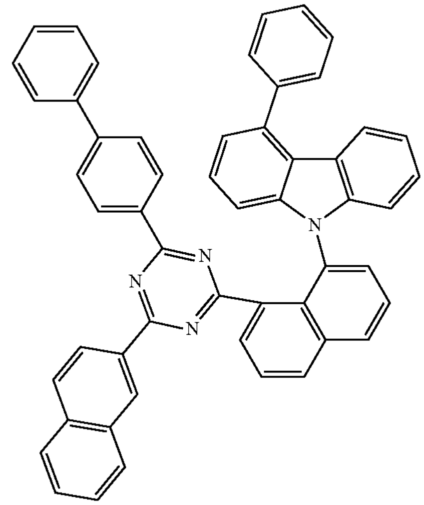
H2-82
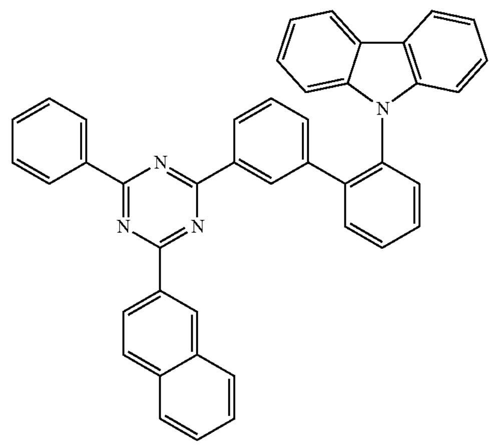
H2-83
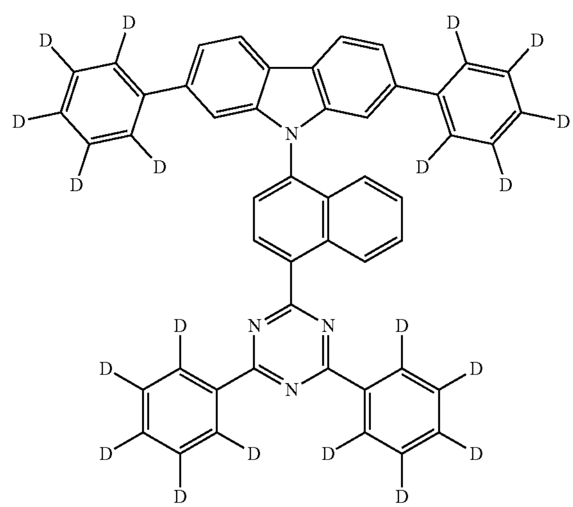

H2-84
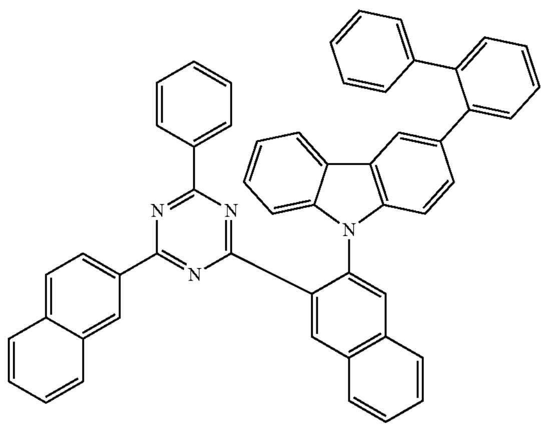
H2-85
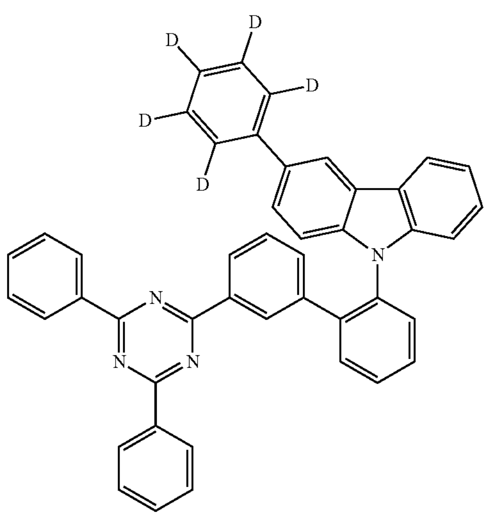
H2-86
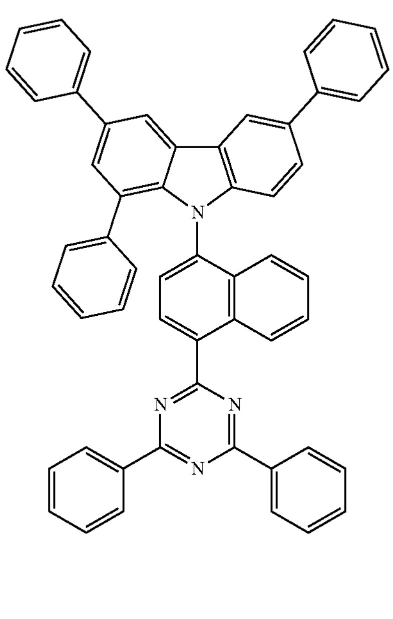
H2-87
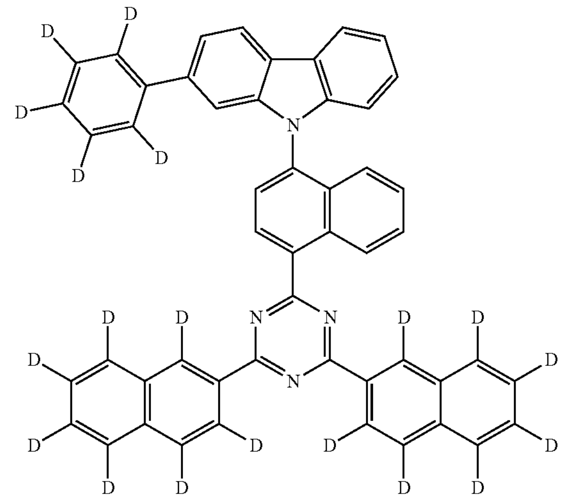
H2-88
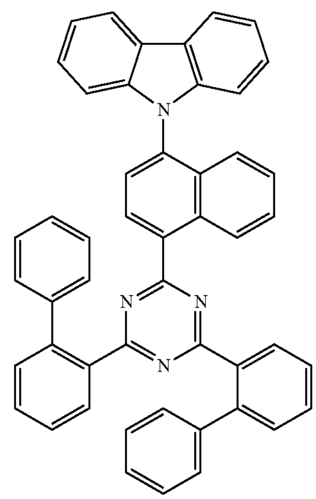
H2-89
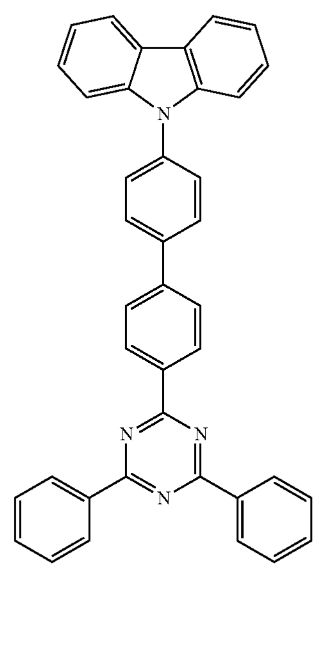

-continued
H2-90
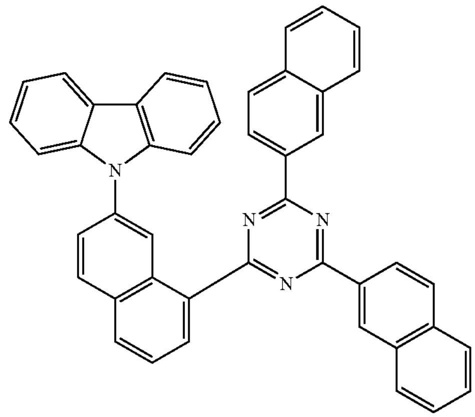
H2-91
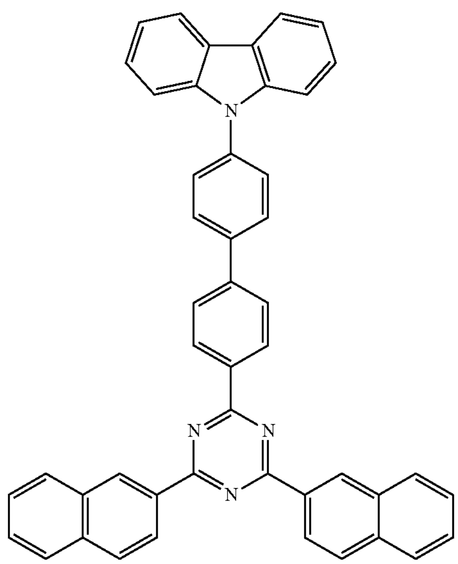
H2-92
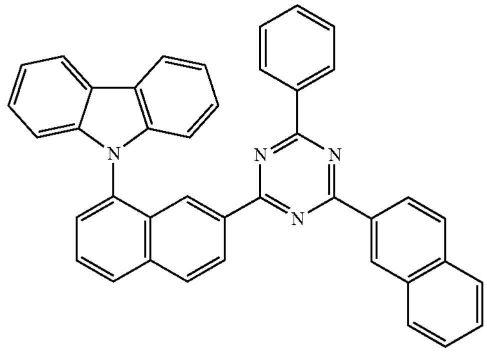
-continued
H2-93
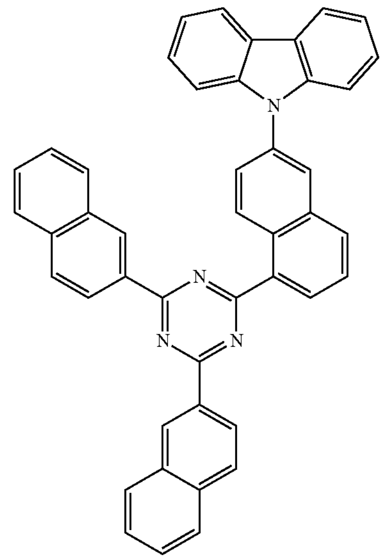
H2-94
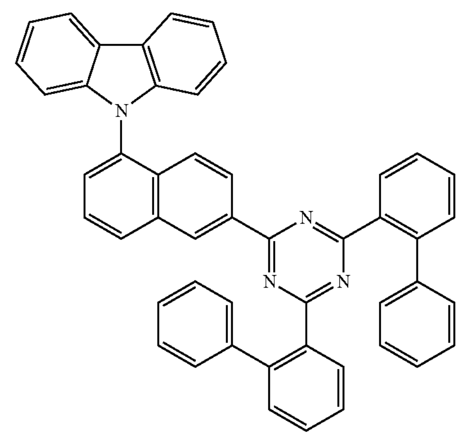
H2-95
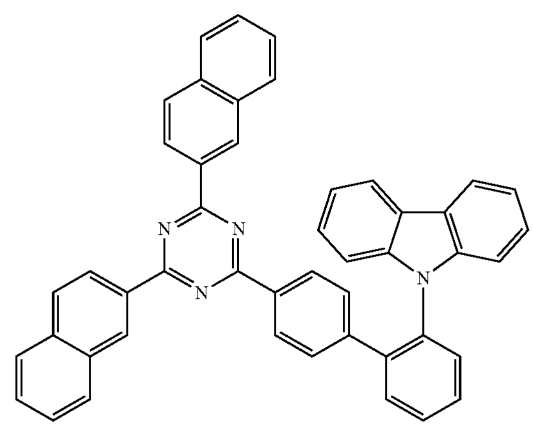

-continued
H2-96
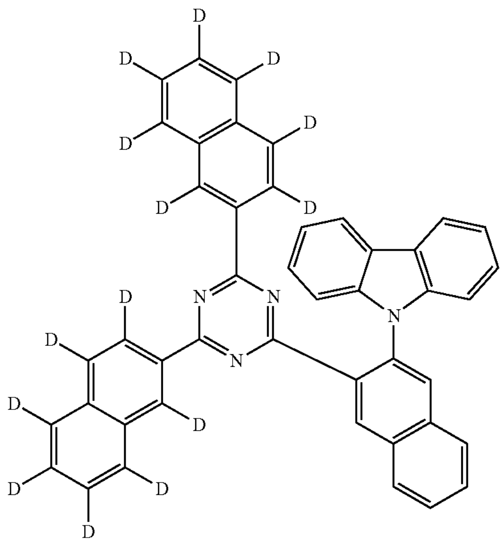
H2-97
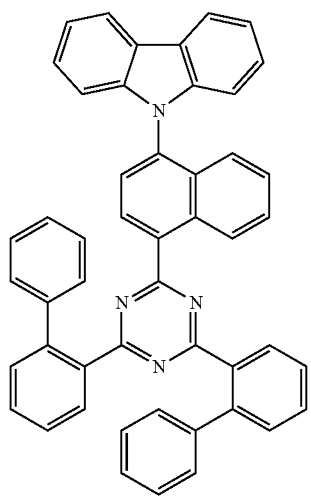
H2-98
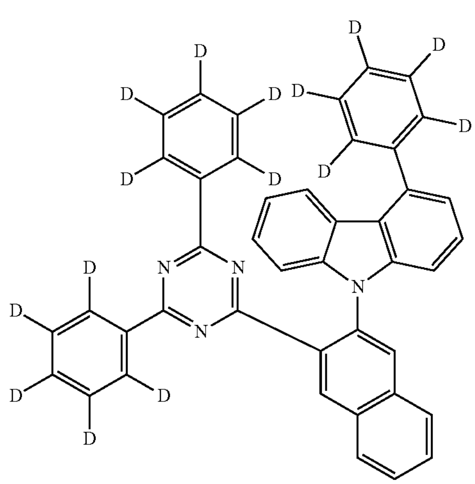
-continued
H2-99
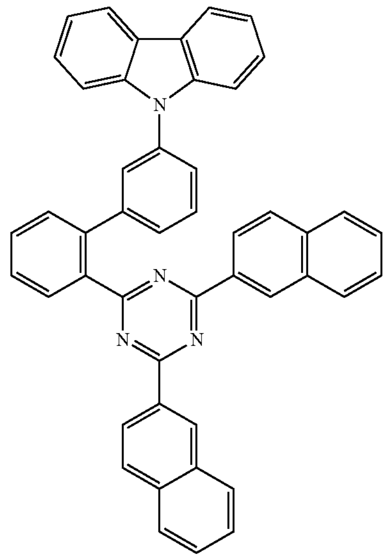
H2-100
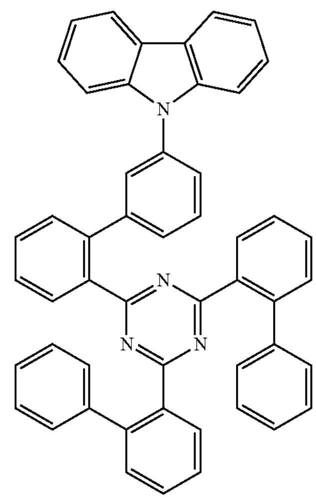
H2-101
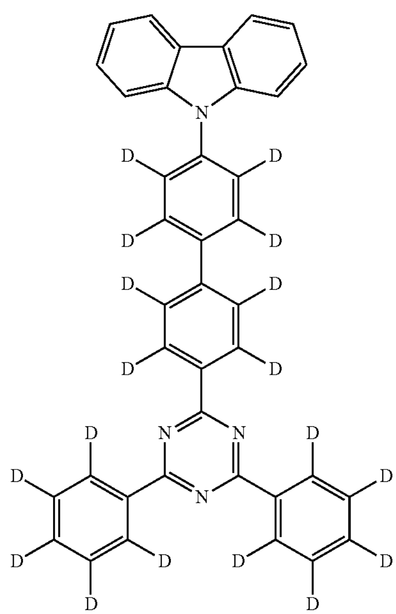

-continued
H2-102
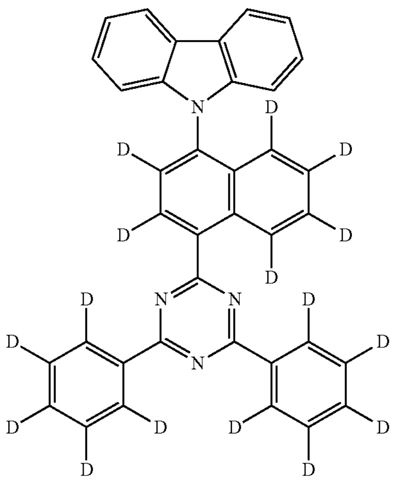
H2-103
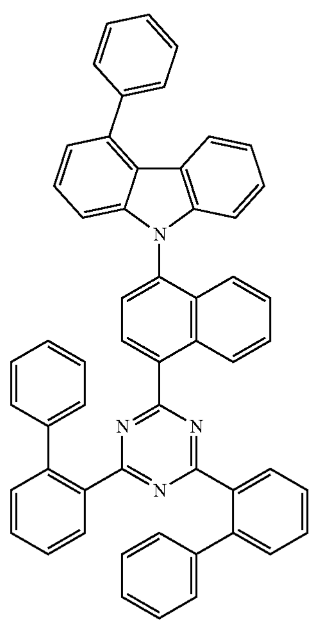
H2-104
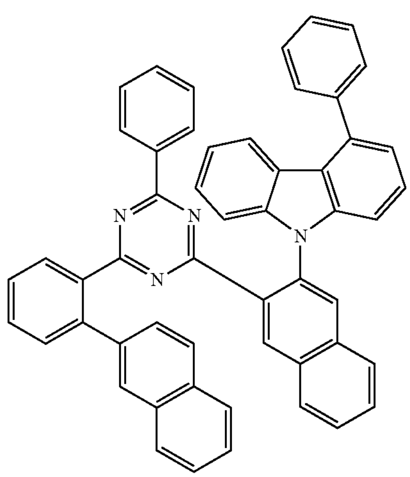
-continued
H2-105
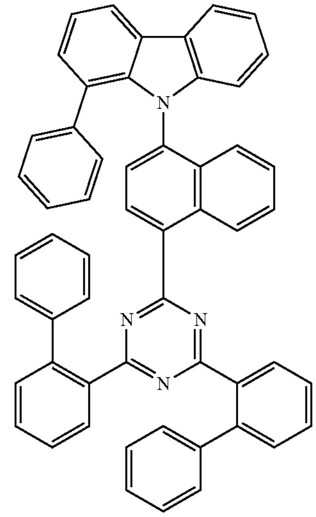
H2-106
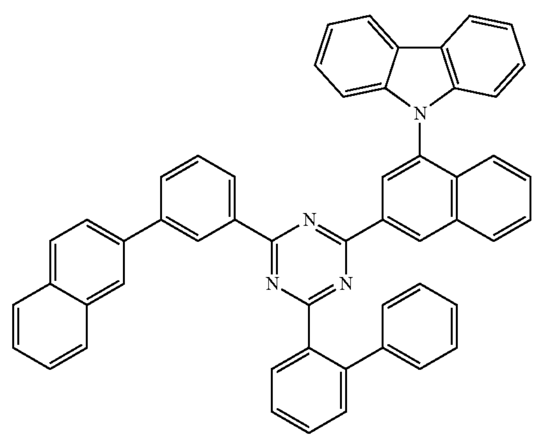
H2-107
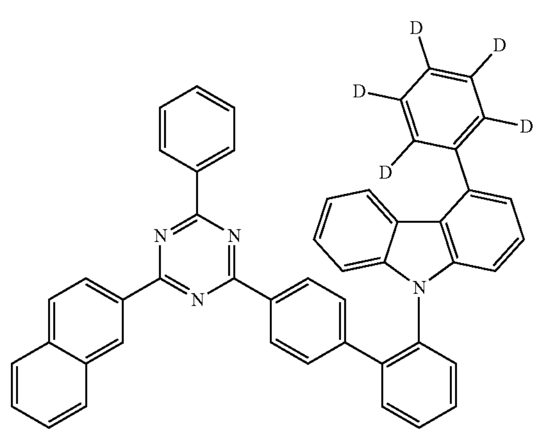

-continued
H2-108
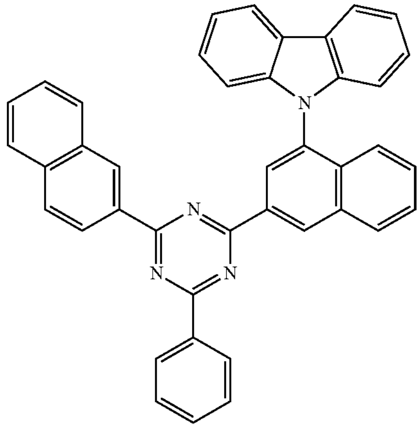
H2-109
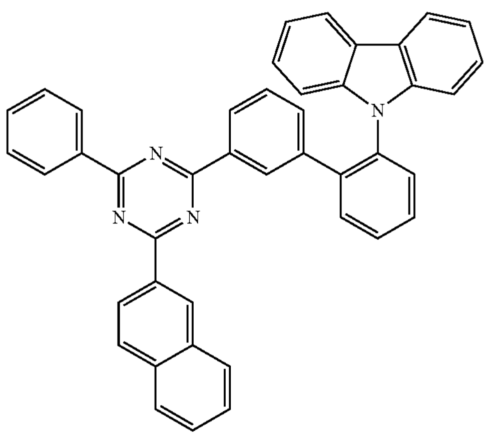
H2-110
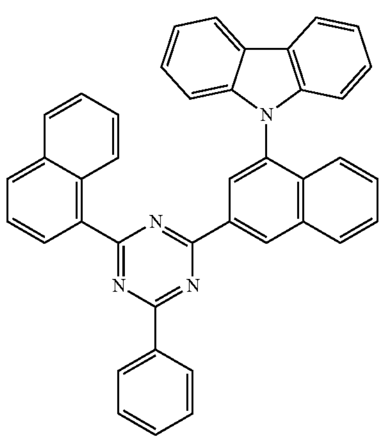
-continued
H2-111
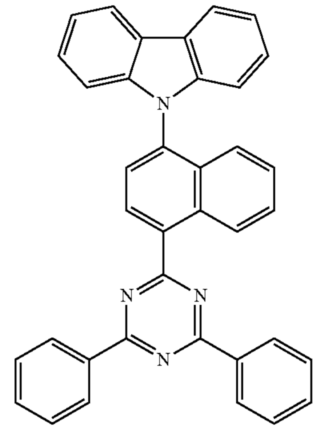
H2-112
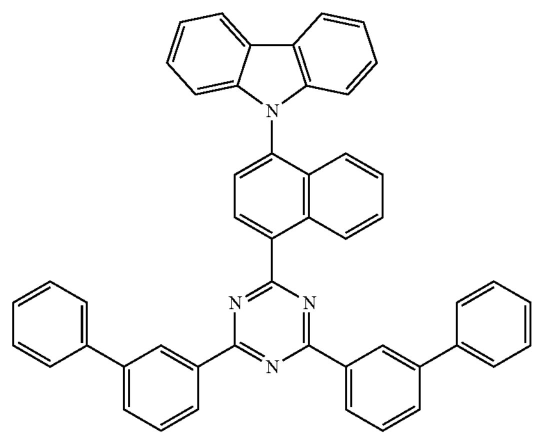
H2-113
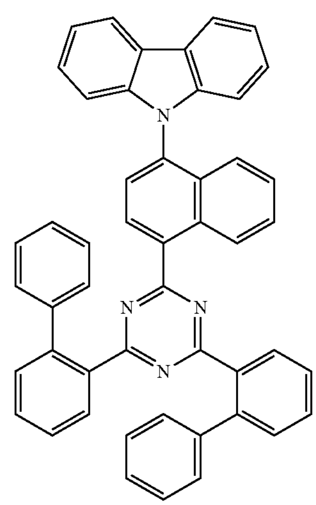

-continued
H2-114
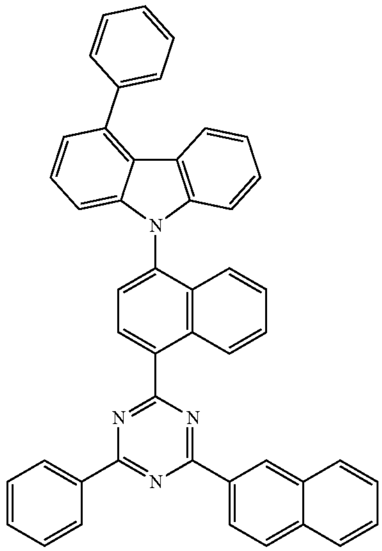
H2-115
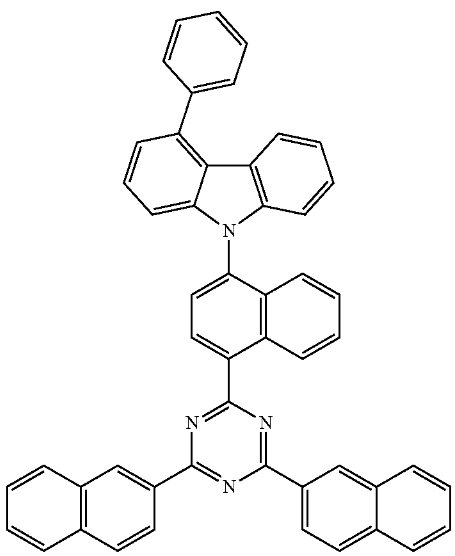
H2-116
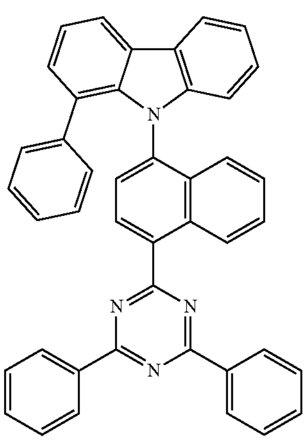
-continued
H2-117
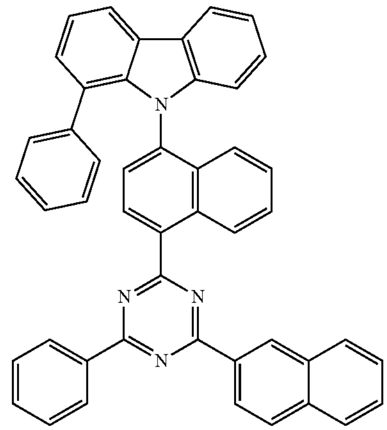
H2-118
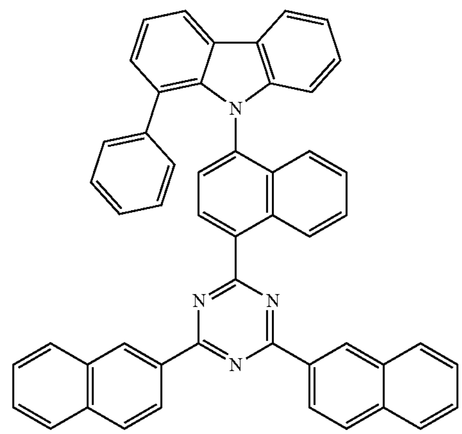
H2-119
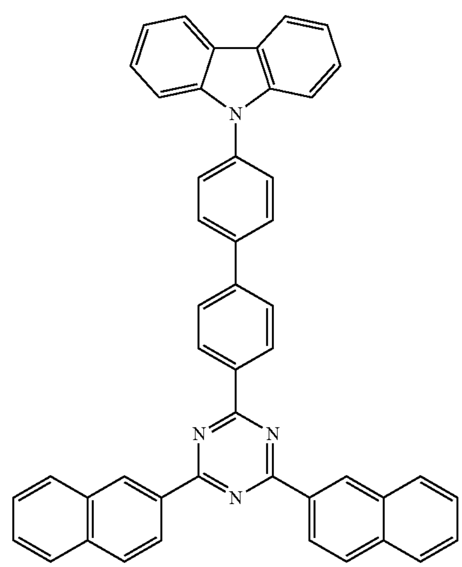

-continued
H2-120
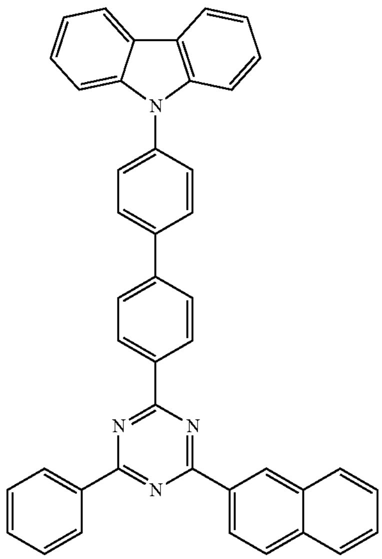
H2-121
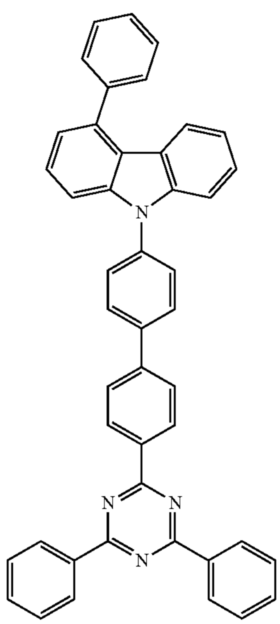
-continued
H2-122
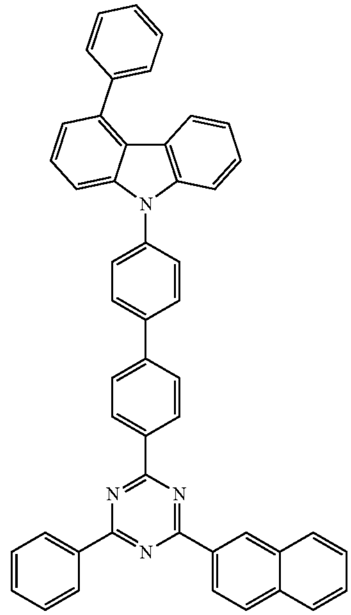
H2-123
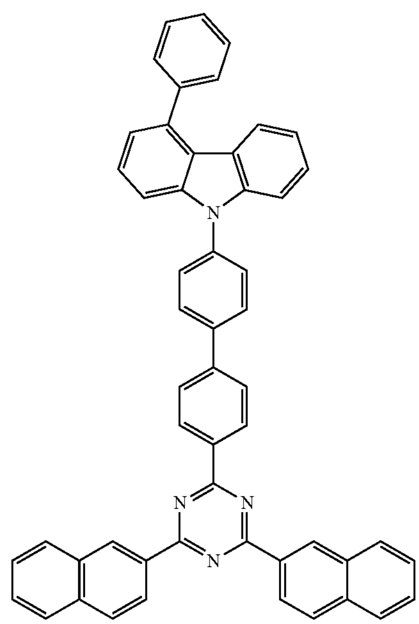

-continued
H2-124
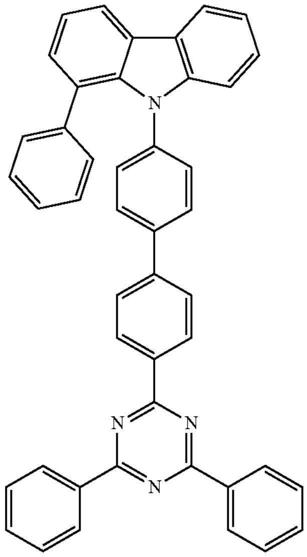
H2-125
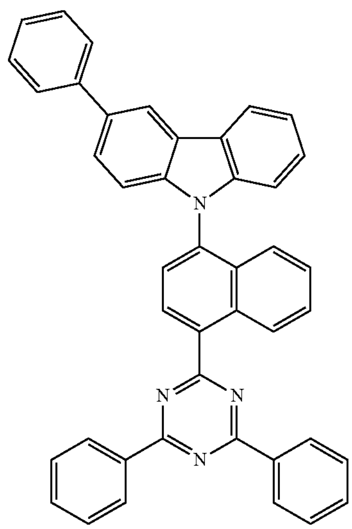
H2-126
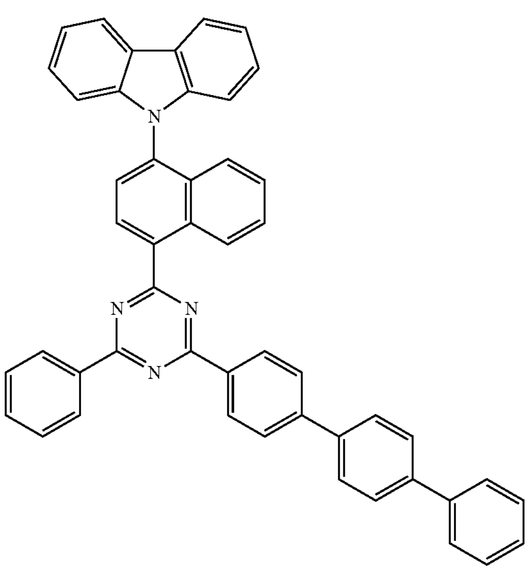
-continued
H2-127
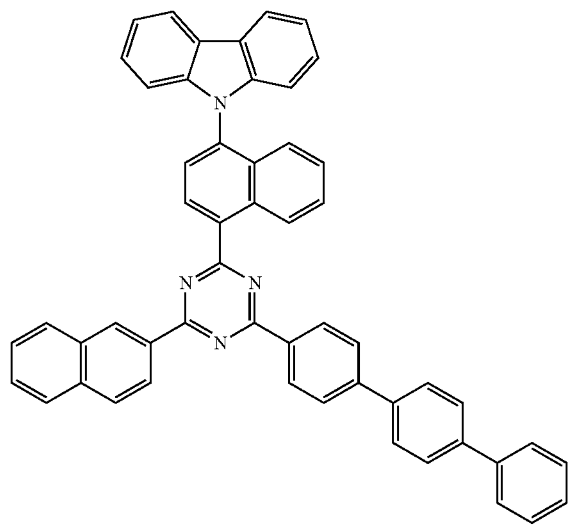
H2-128
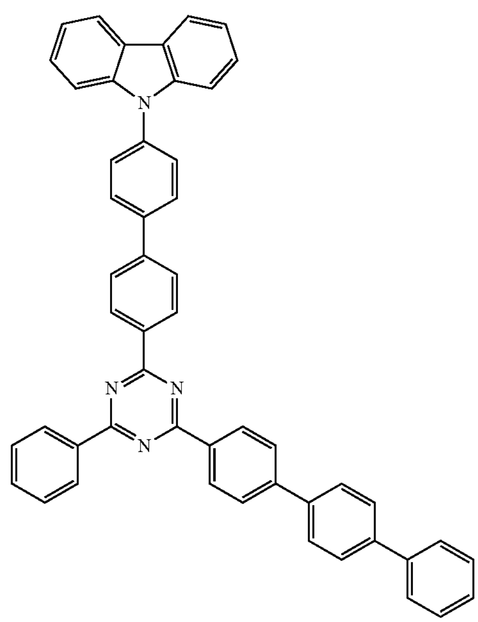

-continued
H2-129
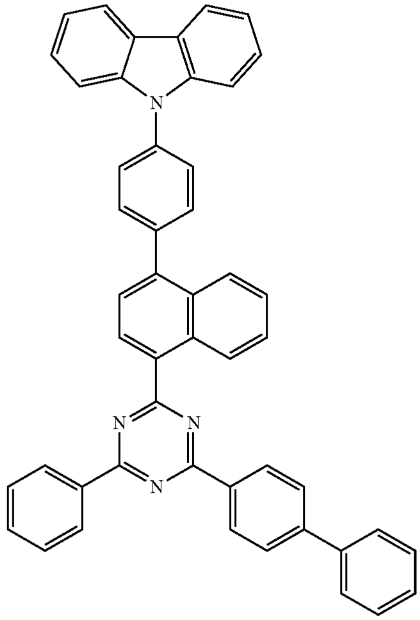
H2-130
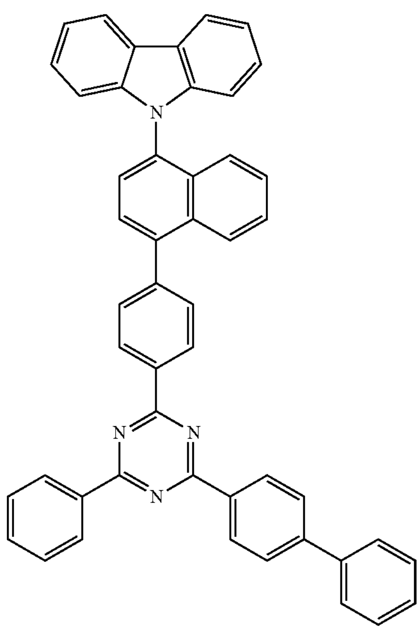
-continued
H2-131
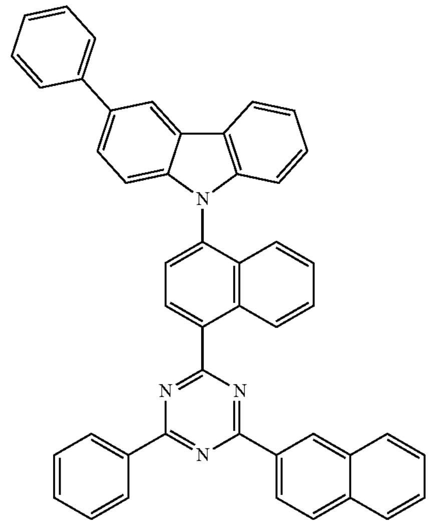
H2-132
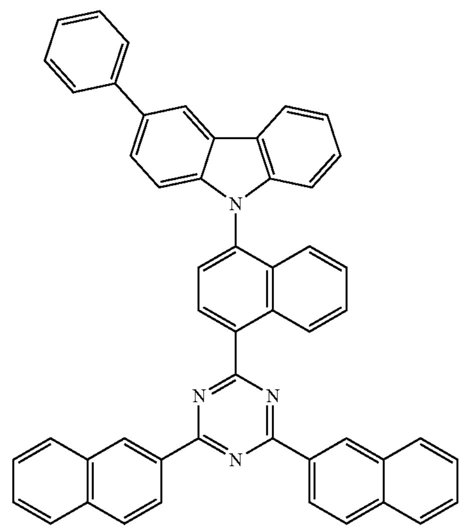
H2-133
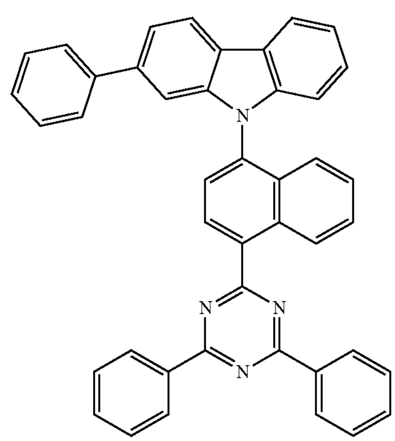

-continued
H2-134
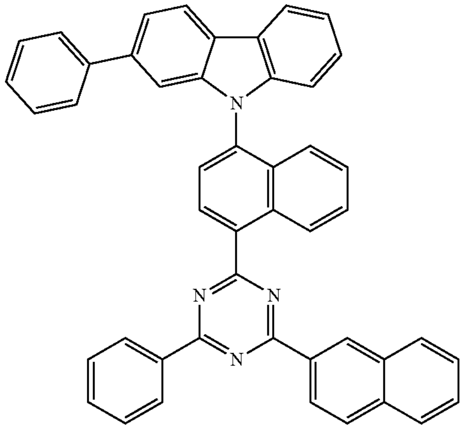
H2-135
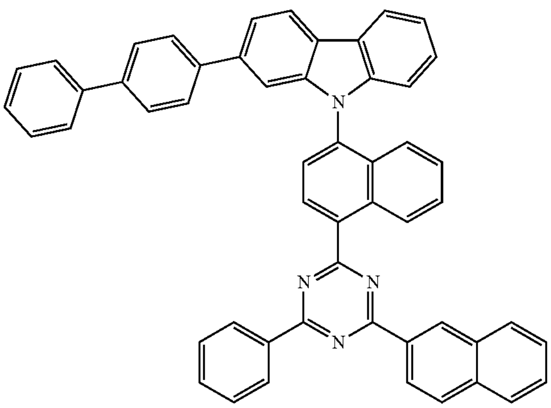
H2-136
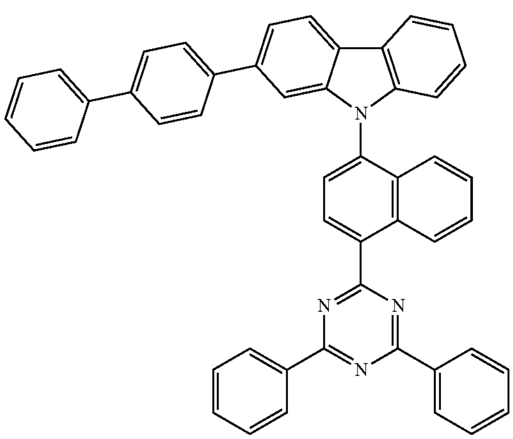
-continued
H2-137
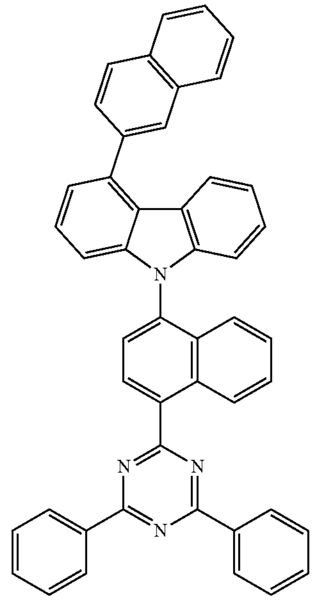
H2-138
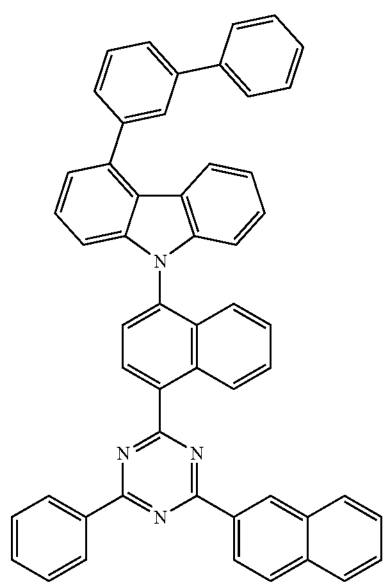

-continued

H2-139

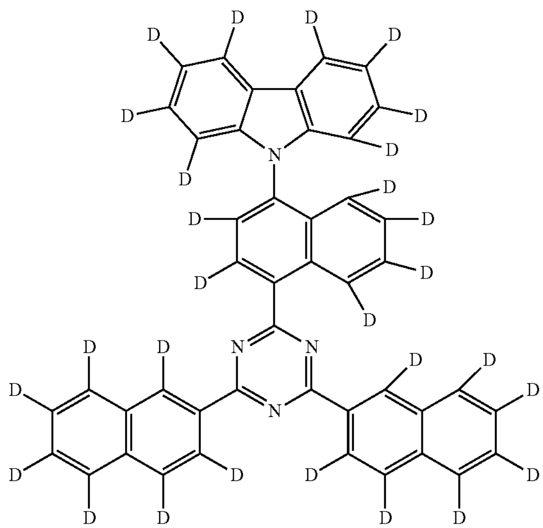

At least one of compounds H1-1 to H1-122 and at least one of compounds H2-1 to H2-139 may be combined and used in an organic electroluminescent device.

The compound represented by formula 1 of the present disclosure may be produced by a synthetic method known to one skilled in the art, and for example, according to the methods disclosed in Korean Patent Application Laying-Open Nos. 2018-0099510 (Sep. 5, 2018), 2018-0012709 (Feb. 6, 2018), etc.

The compound represented by formula 2 of the present disclosure may be produced by a synthetic method known to one skilled in the art, and for example, according to the following reaction scheme, but is not limited thereto:

[Reaction Scheme]

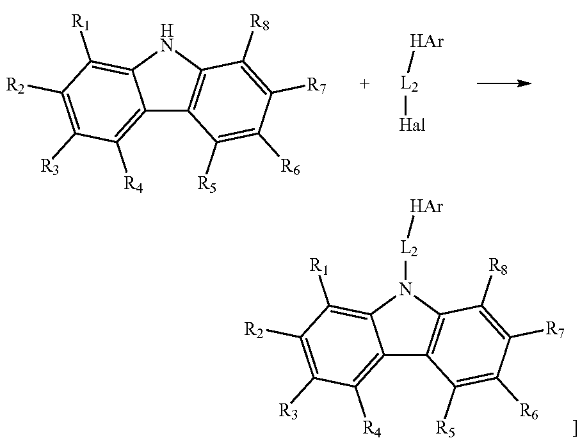

In the reaction scheme, $R_1$ to $R_8$, $L_2$, and HAr are as defined in formula 2, and Hal represents a halogen.

Although illustrative synthesis examples of the compound represented by formula 2 are described above, one skilled in the art will be able to readily understand that all of them are based on a Suzuki cross-coupling reaction, Wittig reaction, a Miyaura borylation reaction, an Ullmann reaction, a Buchwald-Hartwig cross-coupling reaction, an N-arylation reaction, an H-mont-mediated etherification reaction, an Intramolecular acid-induced cyclization reaction, a Pd(II)-catalyzed oxidative cyclization reaction, a Grignard reaction, a Heck reaction, a Cyclic Dehydration reaction, an $SN_1$ substitution reaction, an $SN_2$ substitution reaction, a Phosphine-mediated reductive cyclization reaction, etc., and the reactions above proceed even when substituents which are defined in formula 2 above, but are not specified in the specific synthesis examples, are bonded.

The organic electroluminescent device of the present disclosure may comprise a first electrode, a second electrode, and at least one organic layer between the first and second electrodes.

One of the first and second electrodes may be an anode, and the other may be a cathode. The organic layer may comprise a light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer. The second electrode may be a transflective electrode or a reflective electrode and may be a top emission type, a bottom emission type, or both-sides emission type according to the kinds of the material. In addition, the hole injection layer may be further doped with a p-dopant and the electron injection layer may also be further doped with an n-dopant.

The organic electroluminescent device according to the present disclosure may comprise an anode, a cathode, and at least one organic layer between the anode and cathode in which the organic layer may comprise a plurality of organic electroluminescent materials, including the compound represented by formula 1 as the first organic electroluminescent material, and the compound represented by formula 2 as the second organic electroluminescent material. According to one embodiment of the present disclosure, the organic electroluminescent device according to the present disclosure may comprise an anode, a cathode, and at least one light-emitting layer between the anode and cathode in which the light-emitting layer may comprise the compound represented by formula 1 and the compound represented by formula 2.

The light-emitting layer includes a host and a dopant, in which the host includes a plurality of host materials and the compound represented by formula 1 may be included as the first host compound of the plurality of host materials, and the compound represented by formula 2 may be included as the second host compound of the plurality of host materials. The weight ratio of the first host compound and the second host compound is about 1:99 to about 99:1, preferably about 10:90 to about 90:10, more preferably about 30:70 to about 70:30, even more preferably about 40:60 to about 60:40, and most preferably about 50:50.

Herein, the light-emitting layer is a layer from which light is emitted, and may be a single layer or a multi-layer of which two or more layers are stacked. All of the first host material and the second host material may be included in one layer, or the first host material and the second host material may be included in respective different light-emitting layers. According to one embodiment of the present disclosure, the doping concentration of the dopant compound with respect to the host compound in the light-emitting layer may be less than 20 wt %.

The organic electroluminescent device of the present disclosure may further comprise at least one layer selected from a hole injection layer, a hole transport layer, a hole auxiliary layer, a light-emitting auxiliary layer, an electron transport layer, an electron injection layer, an interlayer, an electron buffer layer, a hole blocking layer, and an electron blocking layer. According to one embodiment of the present disclosure, the organic electroluminescent device of the present disclosure may further comprise an amine-based compound besides the plurality of host materials of the present disclosure as at least one of a hole injection material, a hole transport material, a hole auxiliary material, a light-emitting material, a light-emitting auxiliary material, and an electron blocking material. Further, according to one embodiment of the present disclosure, the organic electroluminescent device of the present disclosure may further comprise an azine-based compound besides the plurality of host materials of the present disclosure as at least one of an electron transport material, an electron injection material, an electron buffer material, and a hole blocking material.

The plurality of host materials according to the present disclosure may be used as light-emitting materials for a white organic light-emitting device. The white organic light-emitting device has been suggested to have various structures such as a side-by-side method or a stacking method according to the arrangement of R (red), G (green) or YG (yellowish green), and B (blue) light-emitting units, or color conversion material (CCM) method, etc. In addition, the plurality of host materials according to an embodiment of the present disclosure may also be used in an organic electroluminescent device comprising a quantum dot (QD).

A hole injection layer, a hole transport layer, an electron blocking layer, or a combination thereof can be used between the anode and the light-emitting layer. The hole injection layer may be multilayers in order to lower the hole injection barrier (or hole injection voltage) from the anode to the hole transport layer or the electron blocking layer, wherein each of the multilayers may use two compounds simultaneously. In addition, the electron blocking layer may be placed between the hole transport layer (or hole injection layer) and the light-emitting layer, and may block overflow of electrons from the light-emitting layer and confine the excitons in the light-emitting layer to prevent light leakage. The hole transport layer or the electron blocking layer may also be multilayers, wherein each of the multilayers may use a plurality of compounds.

An electron buffer layer, a hole blocking layer, an electron transport layer, an electron injection layer, or a combination thereof can be used between the light-emitting layer and the cathode. The electron buffer layer may be multilayers in order to control the injection of the electron and improve the interfacial properties between the light-emitting layer and the electron injection layer, wherein each of the multilayers may use two compounds simultaneously. The hole blocking layer or the electron transport layer may also be multilayers, wherein each of the multilayers may use a plurality of compounds.

The dopant comprised in the organic electroluminescent device of the present disclosure may be at least one phosphorescent or fluorescent dopant, and is preferably at least one phosphorescent dopant. The phosphorescent dopant material applied to the organic electroluminescent device of the present disclosure is not particularly limited, but may be preferably metallated complex compounds of iridium (Ir), osmium (Os), copper (Cu), and platinum (Pt), more preferably ortho-metallated complex compounds of iridium (Ir), osmium (Os), copper (Cu), and platinum (Pt), and even more preferably ortho-metallated iridium complex compounds.

The dopant comprised in the organic electroluminescent device of the present disclosure may comprise a compound represented by the following formula 101, but is not limited thereto.

(101)

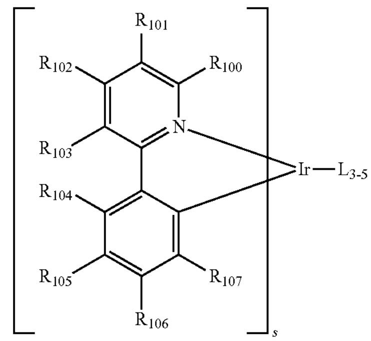

In formula 101, L is selected from the following structures 1 and 2:

[Structure 1]

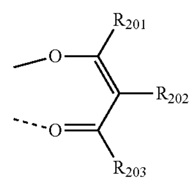

[Structure 2]

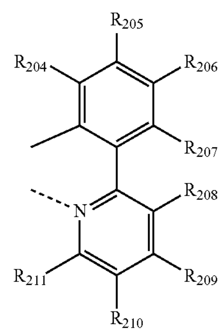

$R_{100}$ to $R_{103}$, each independently, represent hydrogen, deuterium, a halogen, a (C1-C30)alkyl unsubstituted or substituted with a halogen(s), a substituted or unsubstituted (C3-C30)cycloalkyl, a substituted or unsubstituted (C6-C30)aryl, a cyano, a substituted or unsubstituted (3- to 30-membered)heteroaryl, or a substituted or unsubstituted (C1-C30)alkoxy; or may be linked to an adjacent substituent to form a ring(s), e.g., a substituted or unsubstituted, quinoline, benzofuropyridine, benzothienopyridine, indenopyridine, benzofuroquinoline, benzothienoquinoline, or indenoquinoline ring, together with pyridine;

$R_{104}$ to $R_{107}$, each independently, represent hydrogen, deuterium, a halogen, a (C1-C30)alkyl unsubstituted or substituted with a halogen(s), a substituted or unsubstituted (C3-C30)cycloalkyl, a substituted or unsubstituted (C6-C30)aryl, a substituted or unsubstituted (3- to 30-membered)heteroaryl, a cyano, or a substituted or unsubstituted (C1-C30)alkoxy; or may be linked to an adjacent substituent to form a ring(s), e.g., a substituted or unsubstituted, naphthyl, fluorene, dibenzothiophene, dibenzofuran, indenopyridine, benzofuropyridine, or benzothienopyridine ring, together with benzene;

$R_{201}$ to $R_{211}$, each independently, represent hydrogen, deuterium, a halogen, a (C1-C30)alkyl unsubstituted or substituted with a halogen(s), a substituted or unsubstituted (C3-C30)cycloalkyl, or a substituted or unsubstituted (C6-C30)aryl; or may be linked to an adjacent substituent to form a ring(s); and
s represents an integer of 1 to 3.
The specific examples of the dopant compound are as follows, but are not limited thereto.
D-1
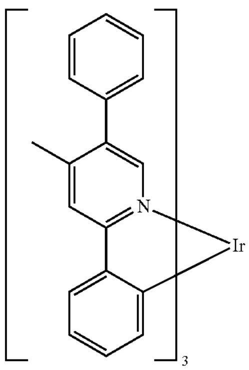
D-2
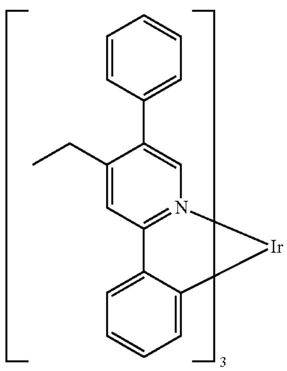
D-3
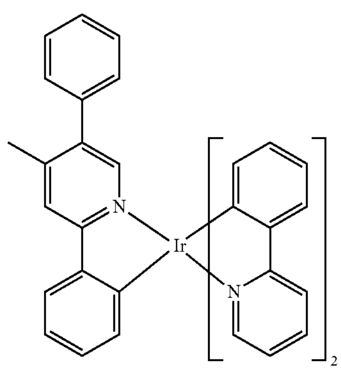
D-4
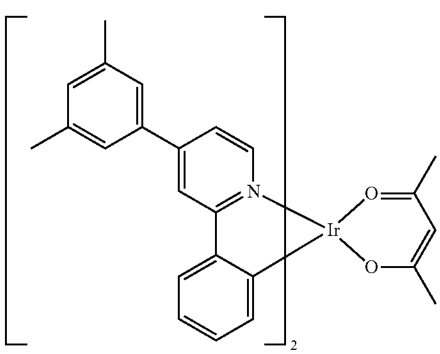
-continued
D-5
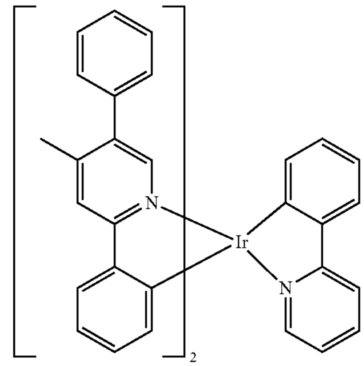
D-6
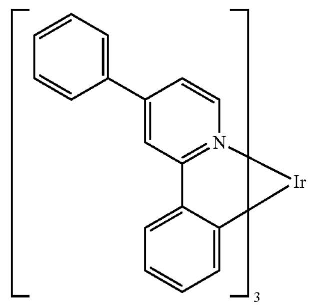
D-7
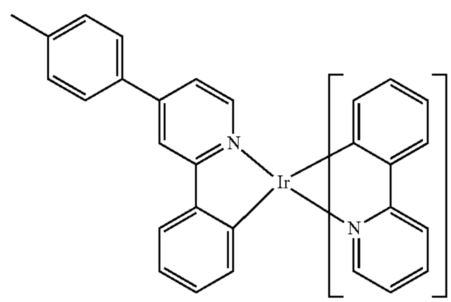
D-8
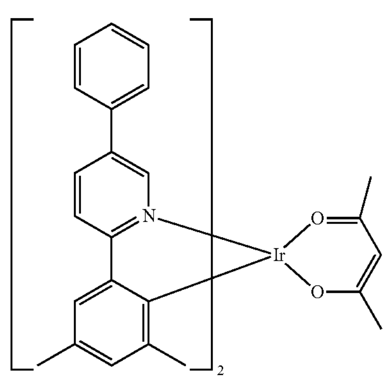

-continued
D-9
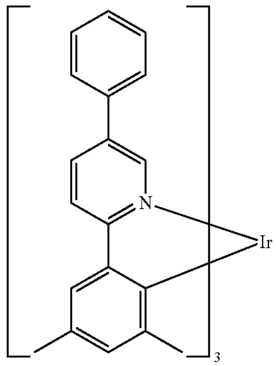
D-10
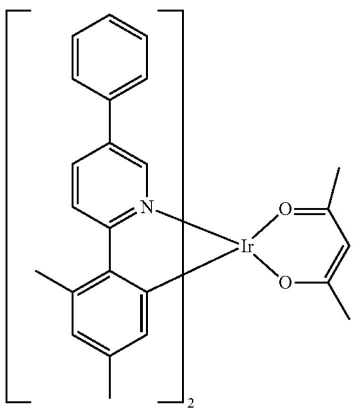
D-11
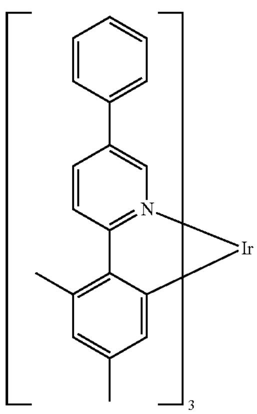
D-12
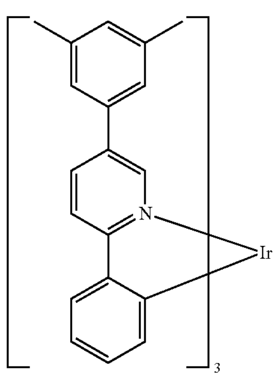
-continued
D-13
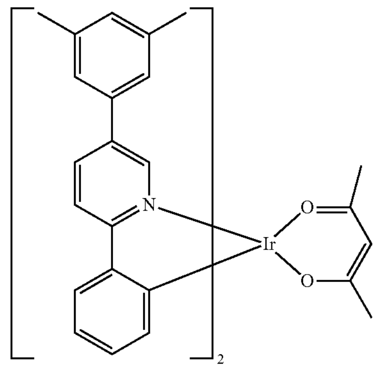
D-14
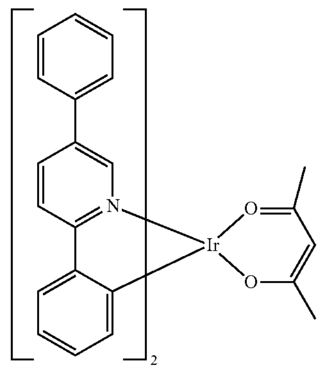
D-15
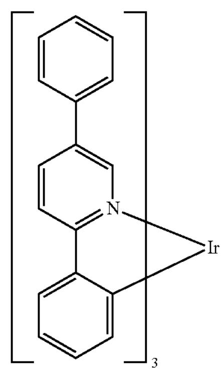
D-16
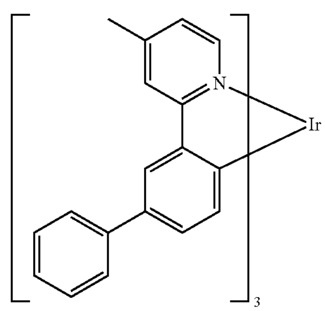

-continued
D-17
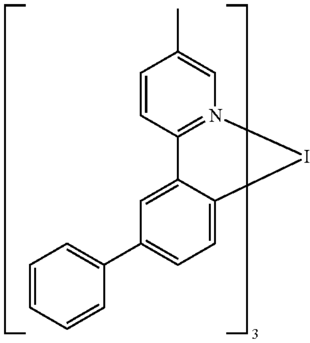
D-18
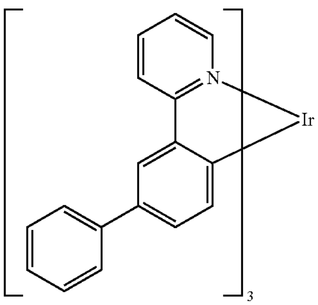
D-19
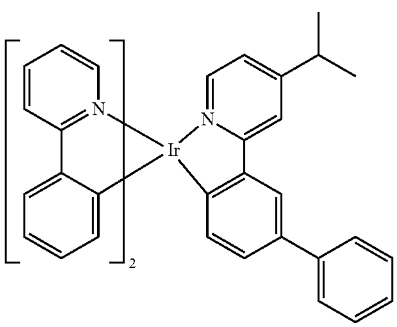
D-20
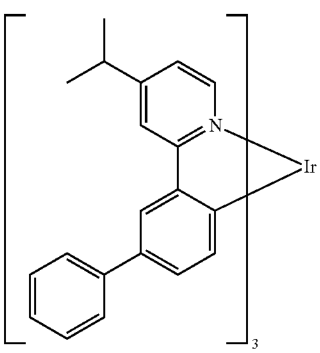
-continued
D-21
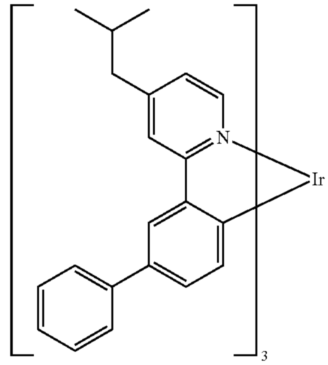
D-22
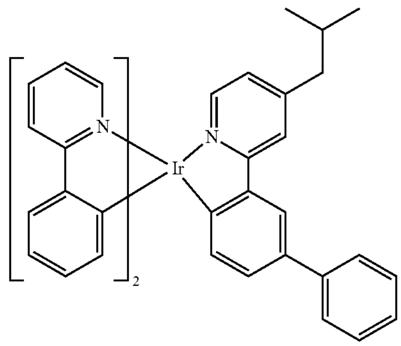
D-23
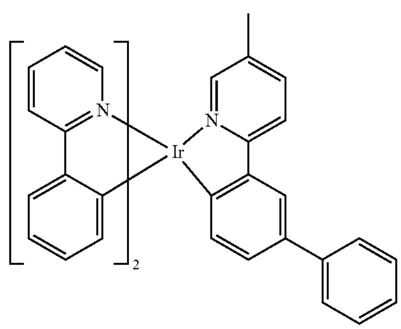
D-24
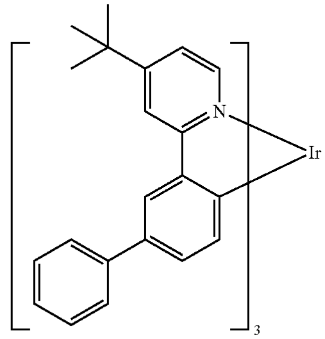

-continued
D-25
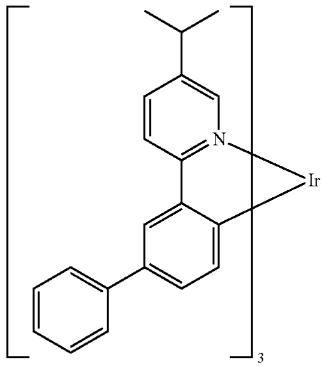
D-26
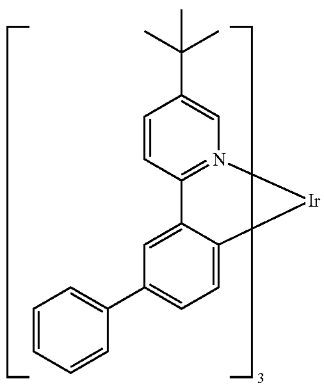
D-27
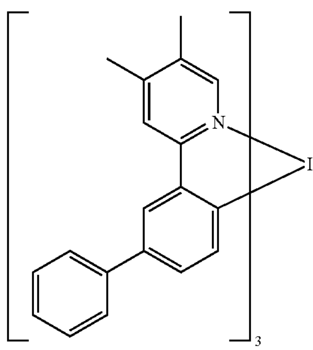
D-28
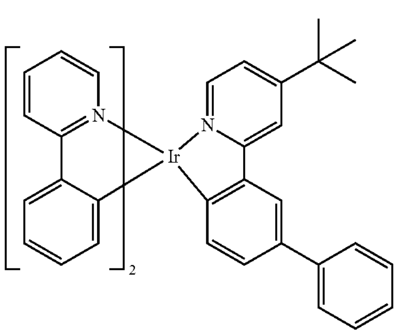
-continued
D-29
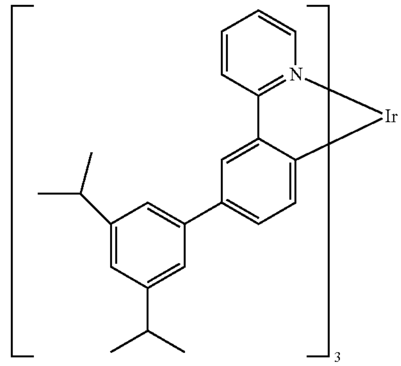
D-30
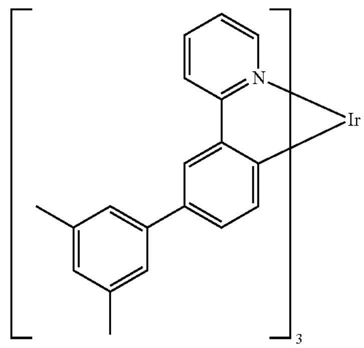
D-31
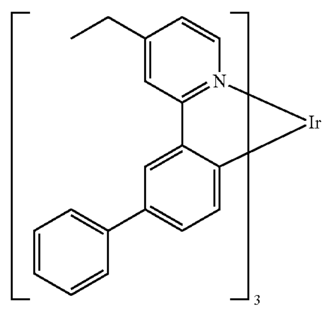
D-32
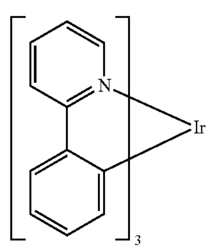
D-33
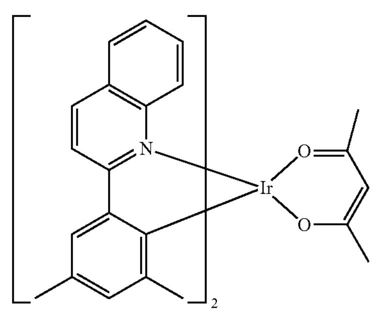

-continued
D-34
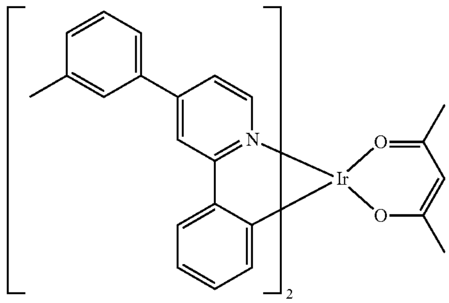
D-35
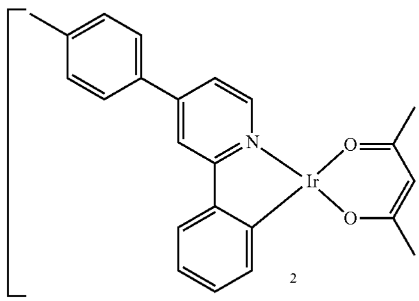
D-36
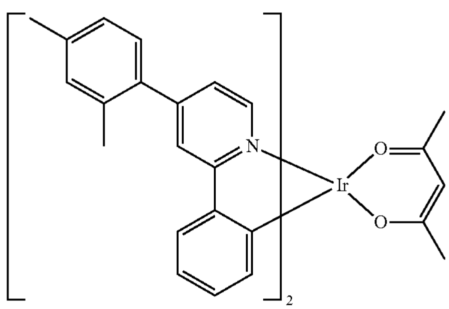
D-37
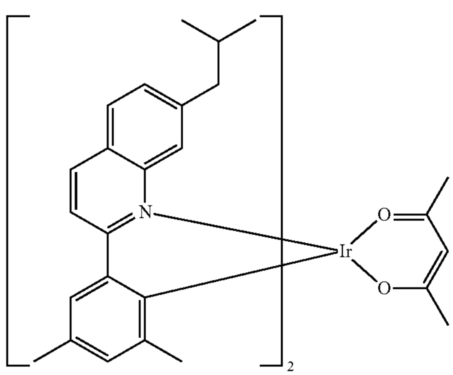
D-38
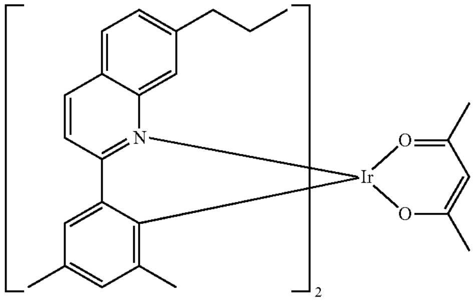
-continued
D-39
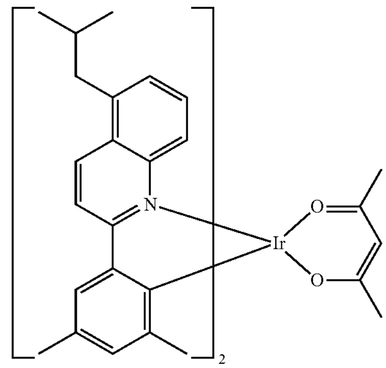
D-40
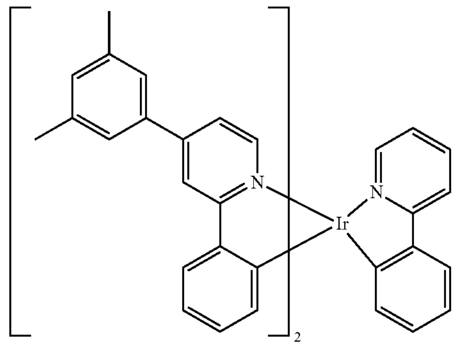
D-41
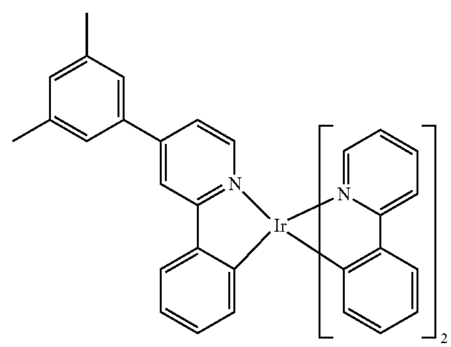
D-42
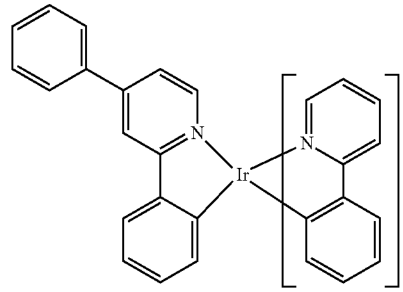

-continued
D-43
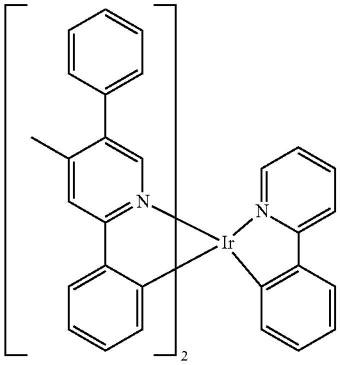
D-44
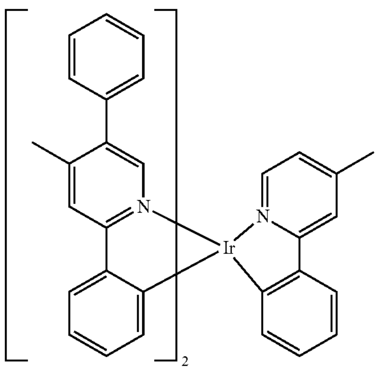
D-45
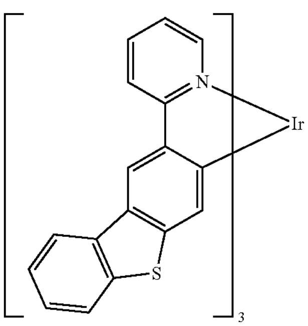
D-46
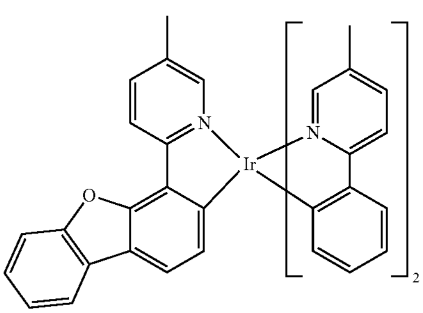
-continued
D-47
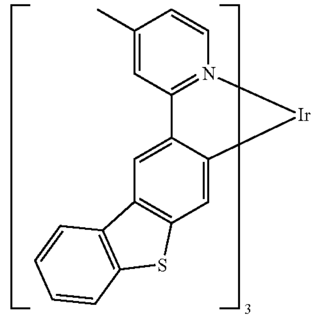
D-48
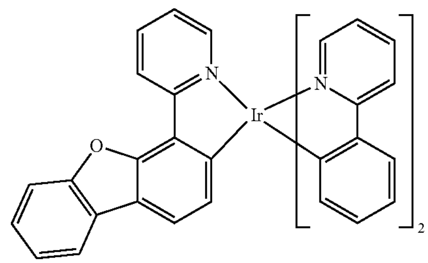
D-49
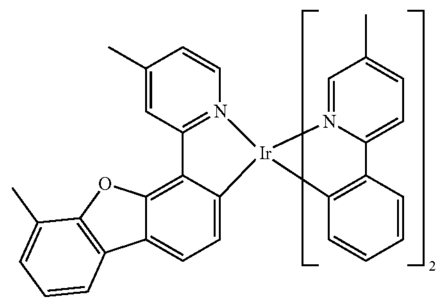
D-50
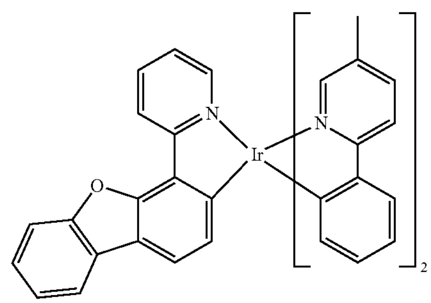
D-51
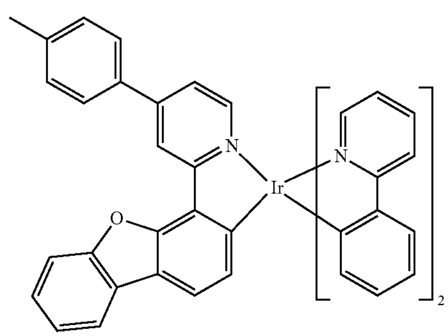

-continued
D-52
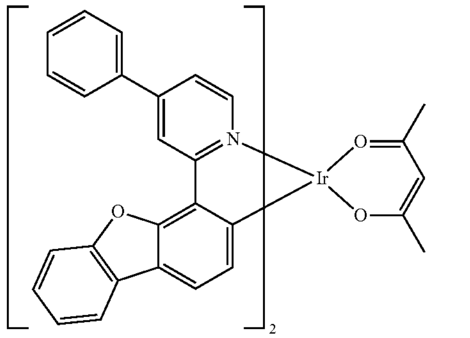
D-53
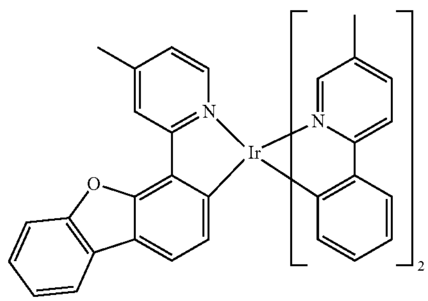
D-54
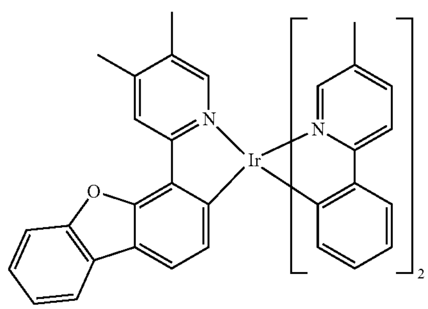
D-55
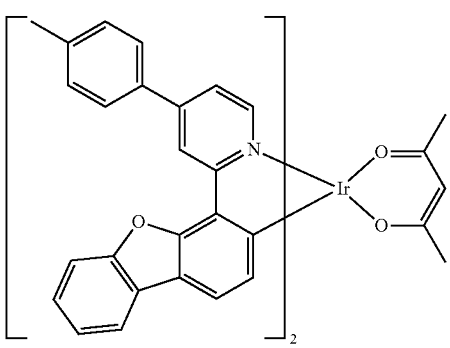
D-56
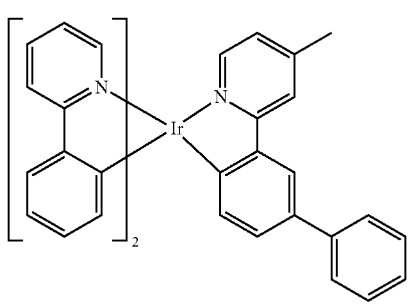
-continued
D-57
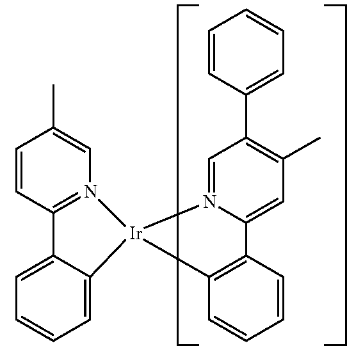
D-58
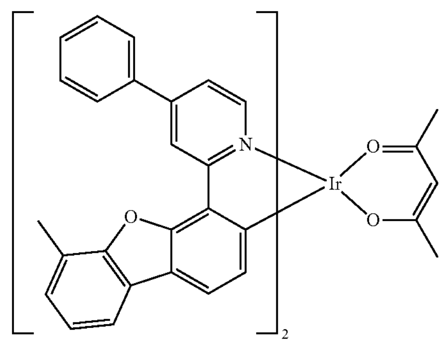
D-59
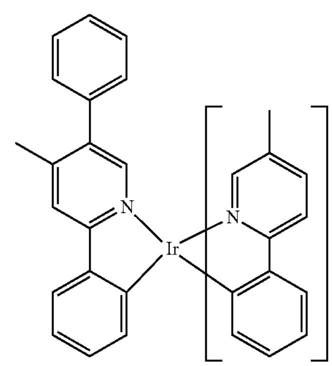
D-60
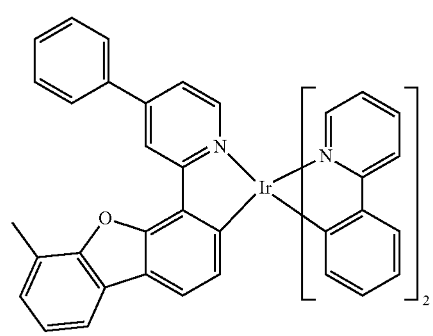

-continued
D-61
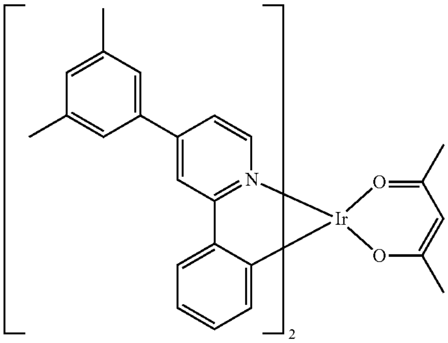
D-62
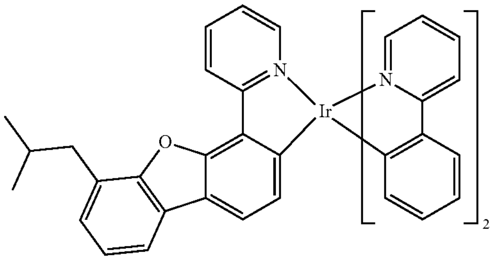
D-63
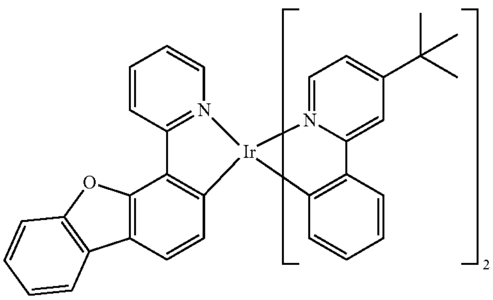
D-64
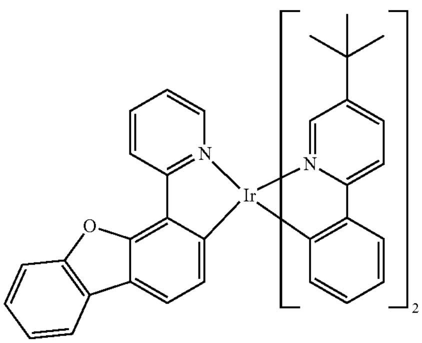
D-65
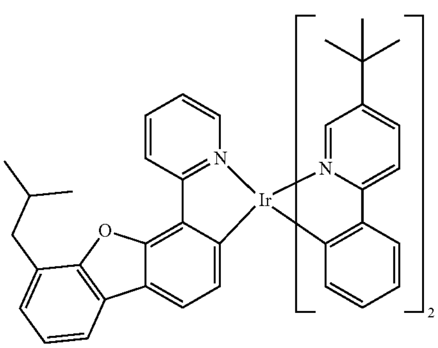
-continued
D-66
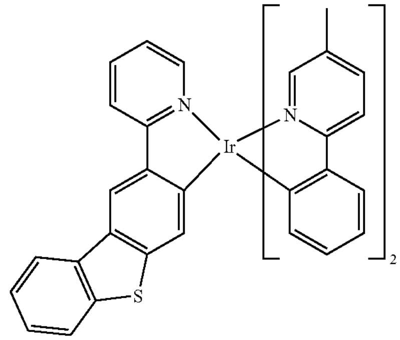
D-67
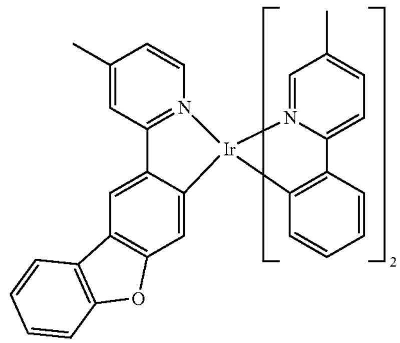
D-68
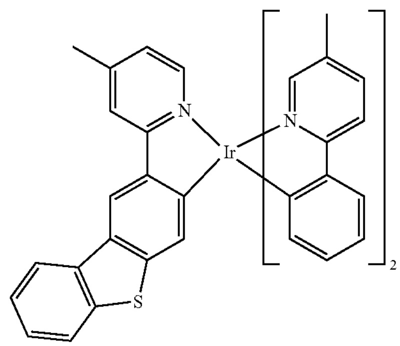
D-69
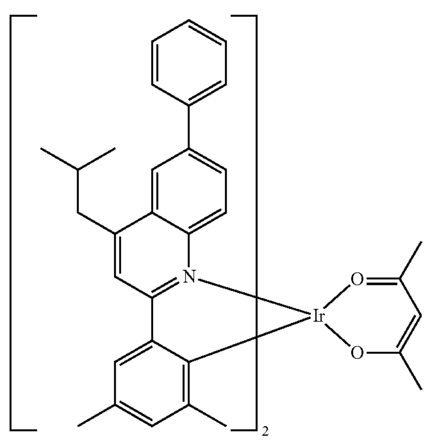

-continued
D-70
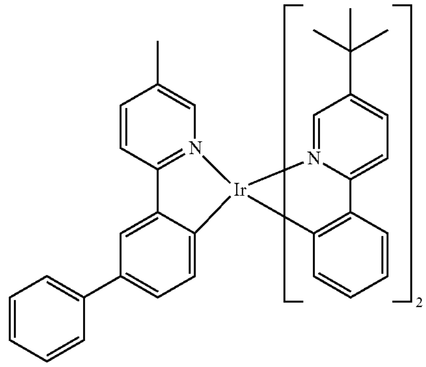
D-71
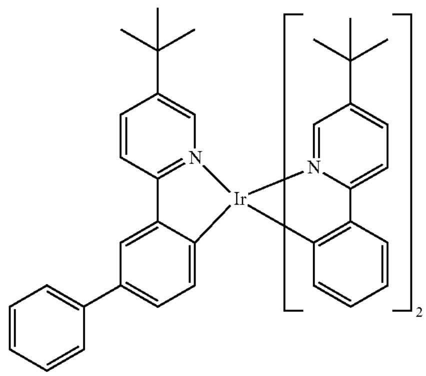
D-72
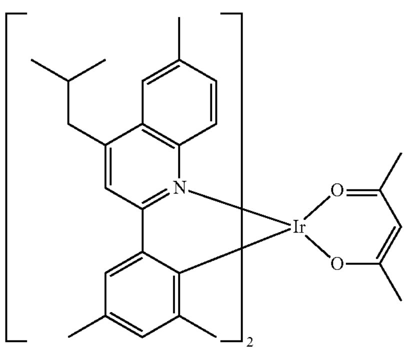
D-73
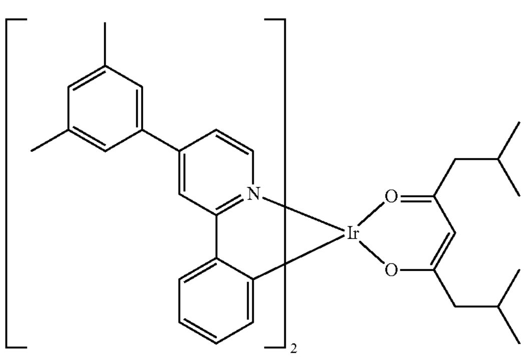
-continued
D-74
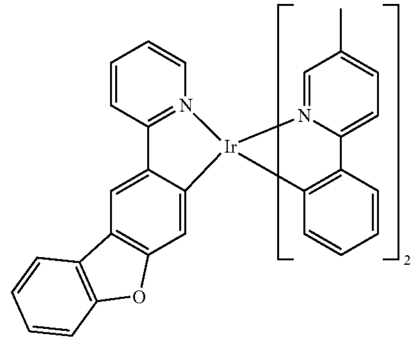
D-75
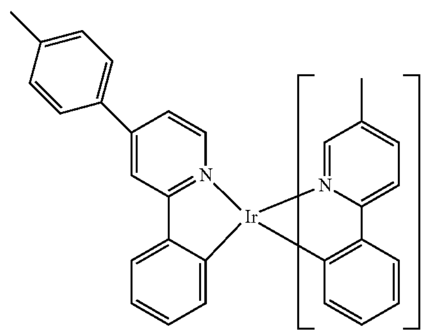
D-76
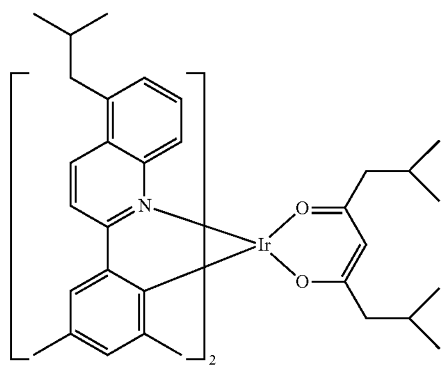
D-77
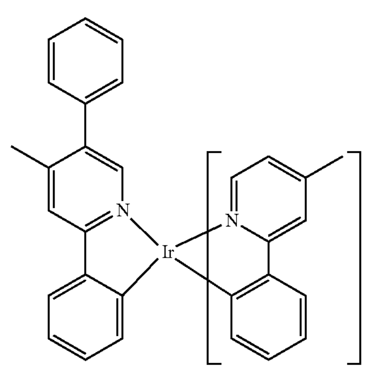

D-78
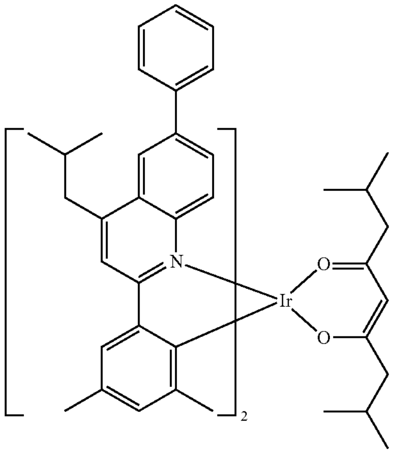
D-79
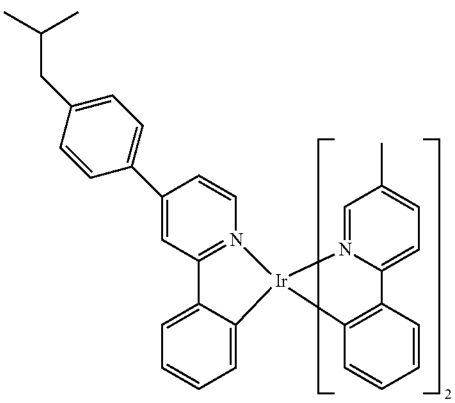
D-80
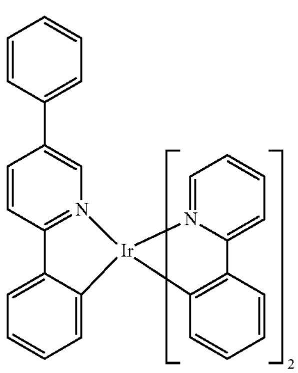
D-81
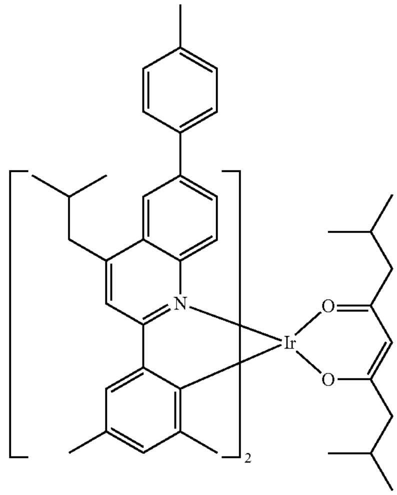
D-82
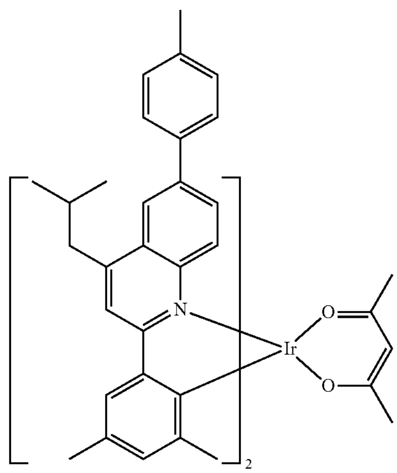
D-83
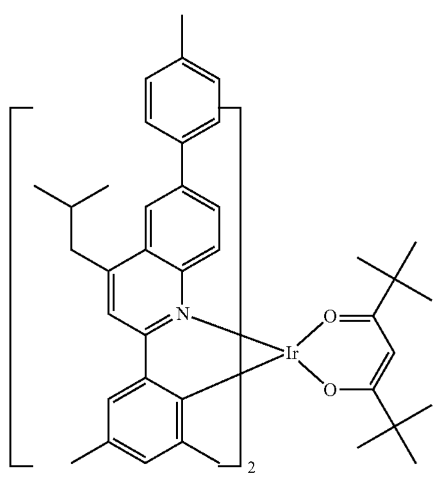

-continued
D-84
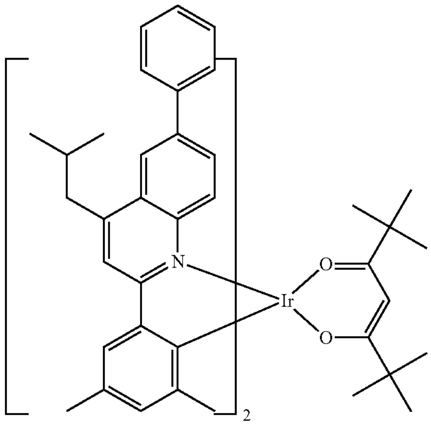
D-85
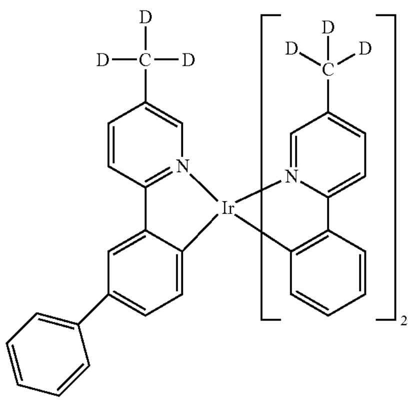
D-86
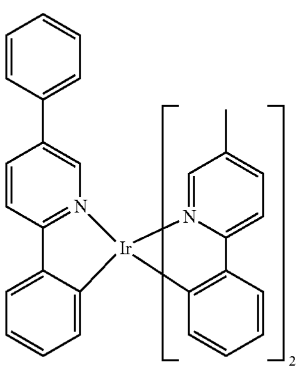
D-87
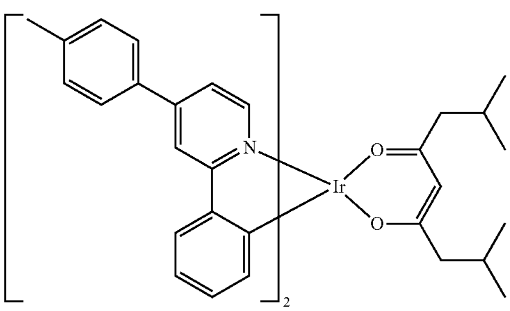
-continued
D-88
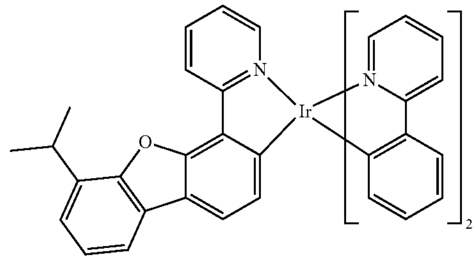
D-89
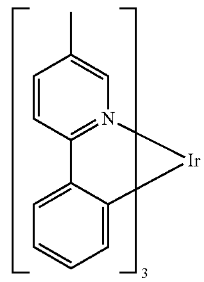
D-90
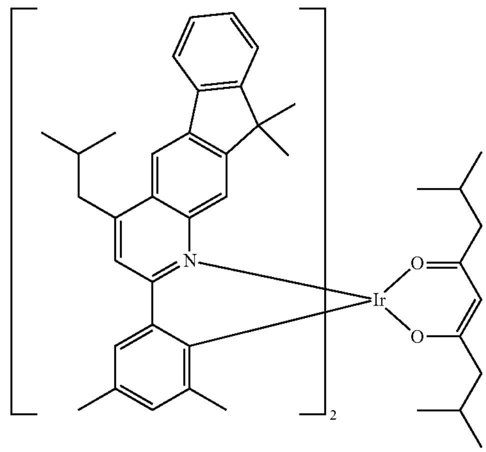
D-91
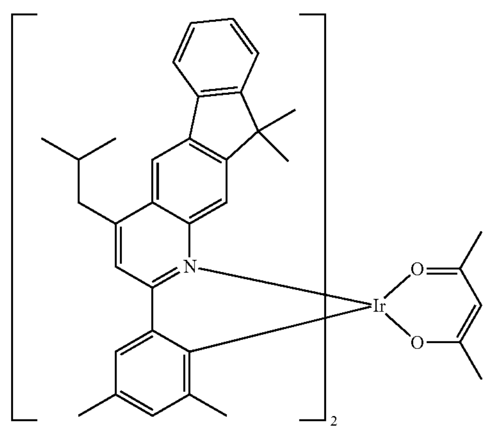

-continued
D-92
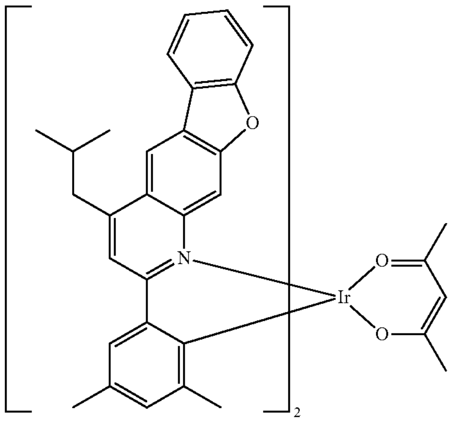
D-93
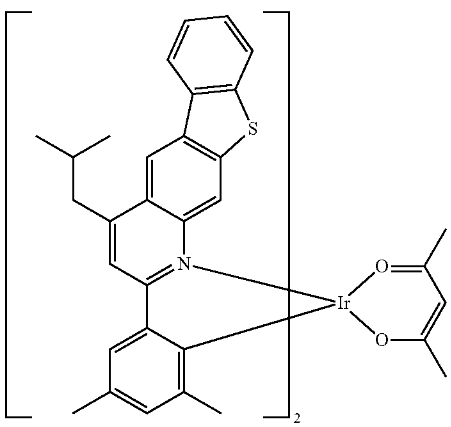
D-94
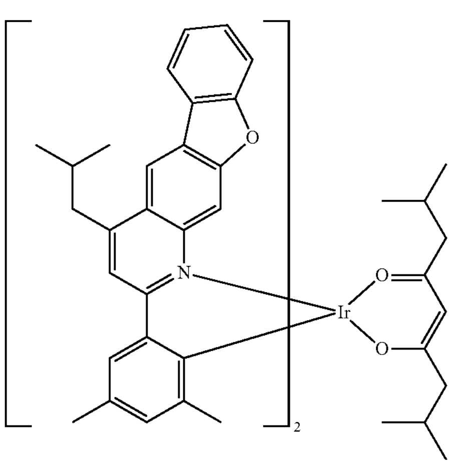
-continued
D-95
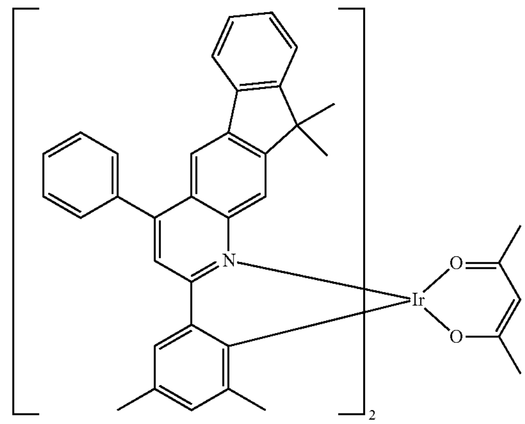
D-96
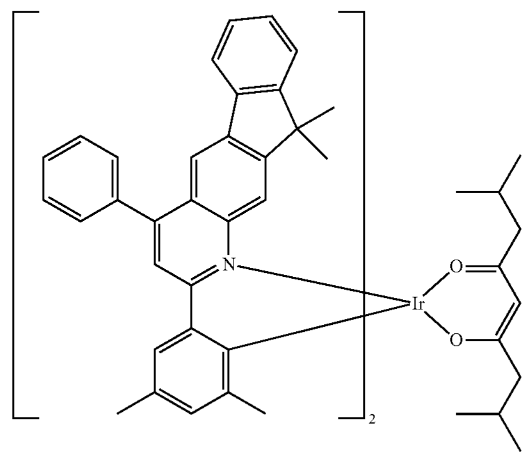
D-97
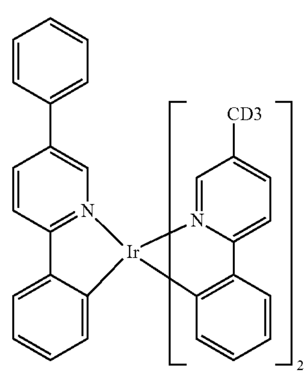
D-98
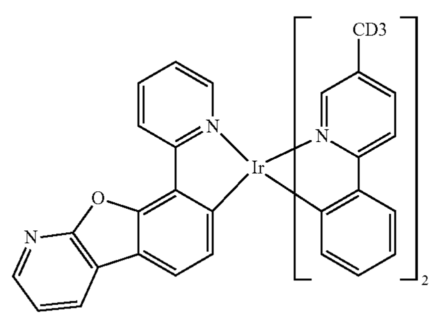

D-99
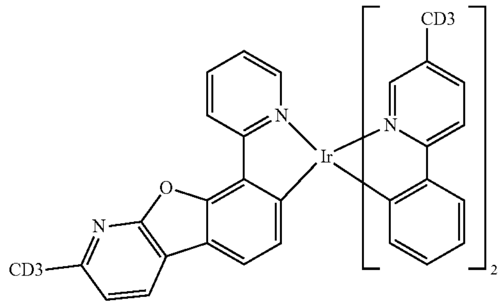
D-100
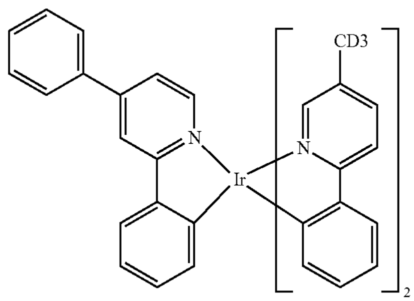
D-101
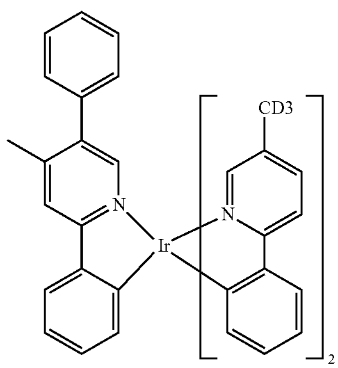
D-102
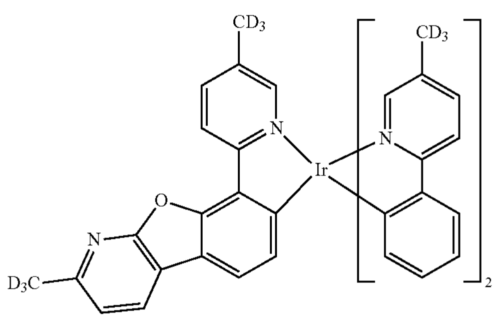
D-103
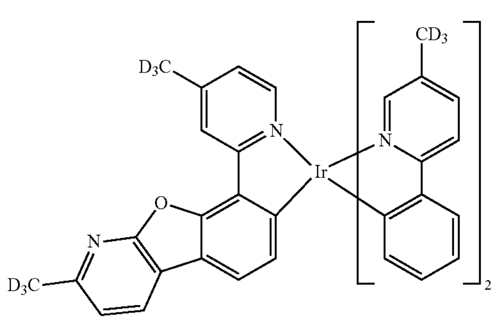
D-104
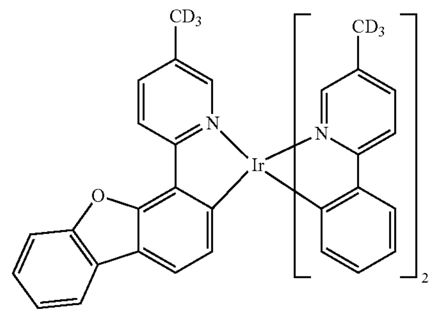
D-105
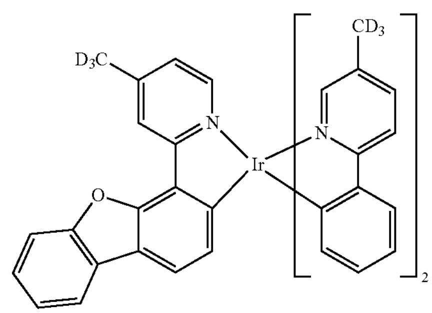
D-106
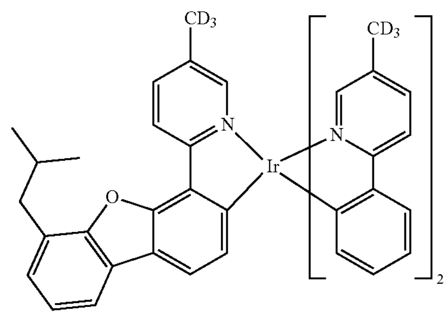
D-107
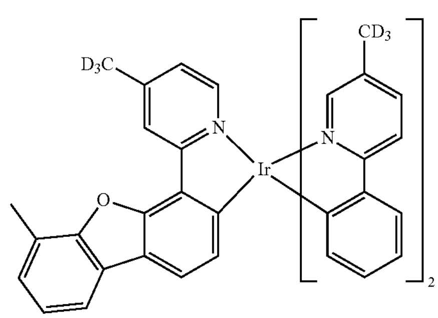
D-108
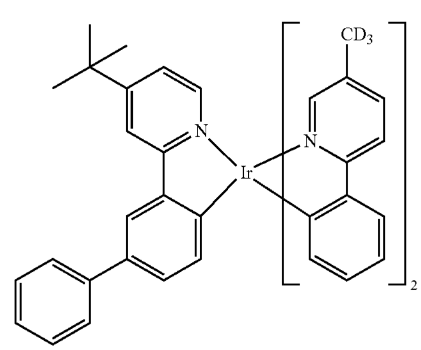

-continued
D-109
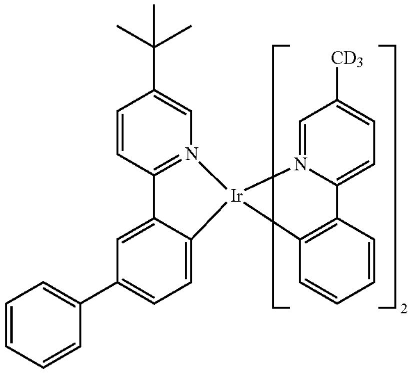
D-110
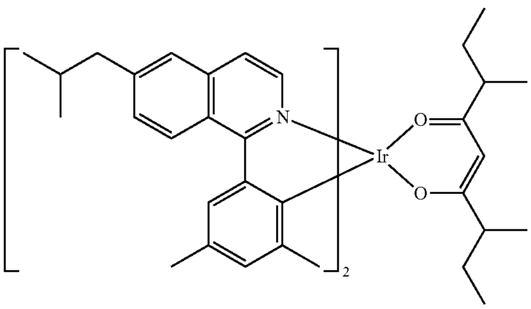
D-111
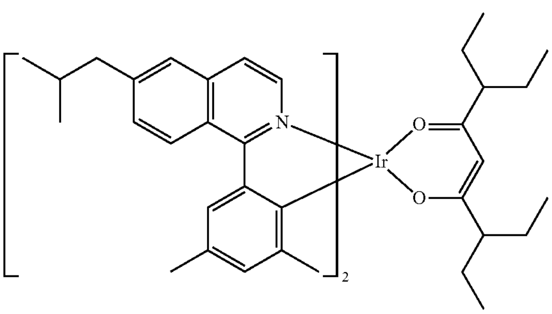
D-112
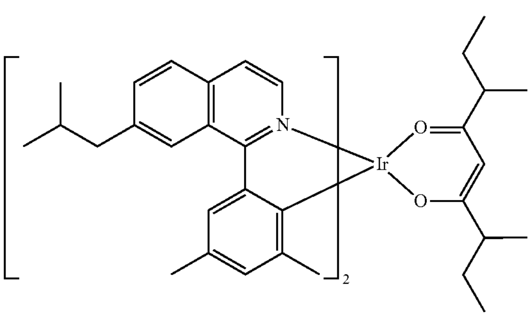
-continued
D-113
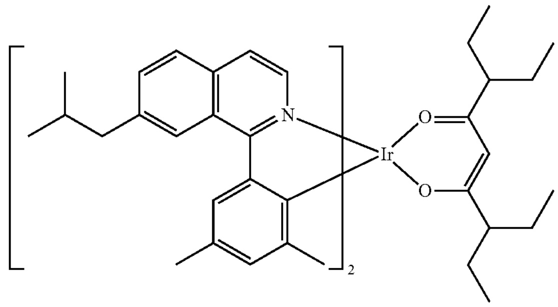
D-114
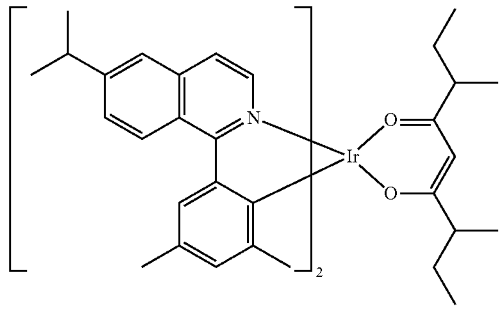
D-115
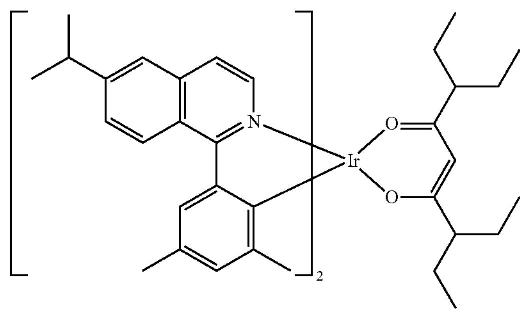
D-116
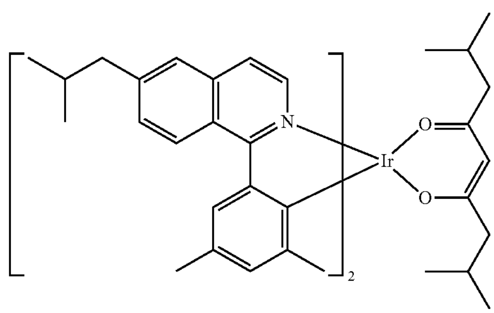
D-117
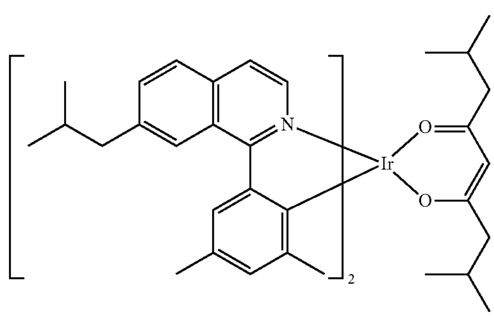

-continued

D-118

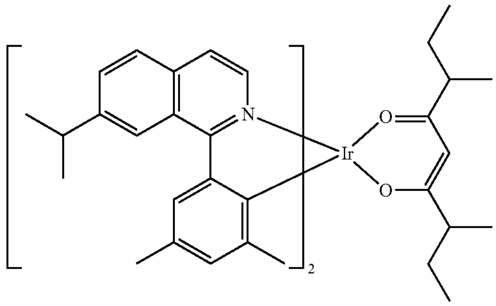

D-119

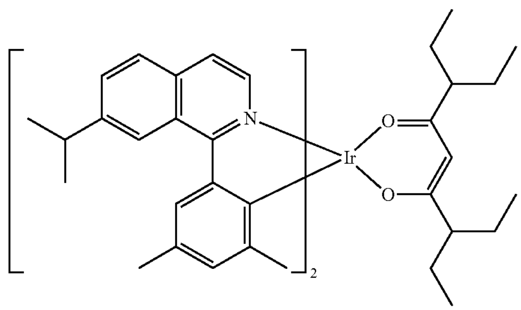

In order to form each layer of the organic electroluminescent device of the present disclosure, dry film-forming methods such as vacuum evaporation, sputtering, plasma, ion plating methods, etc., or wet film-forming methods such as ink jet printing, nozzle printing, slot coating, spin coating, dip coating, flow coating methods, etc., can be used.

When using a wet film-forming method, a thin film can be formed by dissolving or diffusing materials forming each layer into any suitable solvent such as ethanol, chloroform, tetrahydrofuran, dioxane, etc. The solvent can be any solvent where the materials forming each layer can be dissolved or diffused, and where there are no problems in film-formation capability.

The first and the second host compounds of the present disclosure may be film-formed by the above-listed methods, commonly by a co-evaporation process or a mixture-evaporation process. The co-evaporation is a mixed deposition method in which two or more materials are placed in a respective individual crucible source and a current is applied to both cells at the same time to evaporate the materials. The mixture-evaporation is a mixed deposition method in which two or more materials are mixed in one crucible source before evaporating them, and a current is applied to the cell to evaporate the materials. Further, if the first and the second host compounds are present in the same layer or different layers in an organic electroluminescent device, the two host compounds may individually form films. For example, the second host compound may be deposited after depositing the first host compound.

The present disclosure may provide a display device by using the plurality of host materials including the compound represented by formula 1 and the compound represented by formula 2. That is, by using the plurality of host materials of the present disclosure, it is possible to manufacture a display system or a lighting system. Specifically, by using the plurality of host materials of the present disclosure, a display system, for example, for white organic light emitting devices, smart phones, tablets, notebooks, PCs, TVs, or cars; or a lighting system, for example an outdoor or indoor lighting system, can be produced.

Hereinafter, the preparation method of the compounds of the present disclosure and the properties thereof, and the properties of an organic electroluminescent device comprising the plurality of host materials of the present disclosure will be explained in detail with reference to the representative compounds of the present disclosure. However, the present disclosure is not limited by the following examples.

Synthetic Example 1: Preparation of Compound H1-49

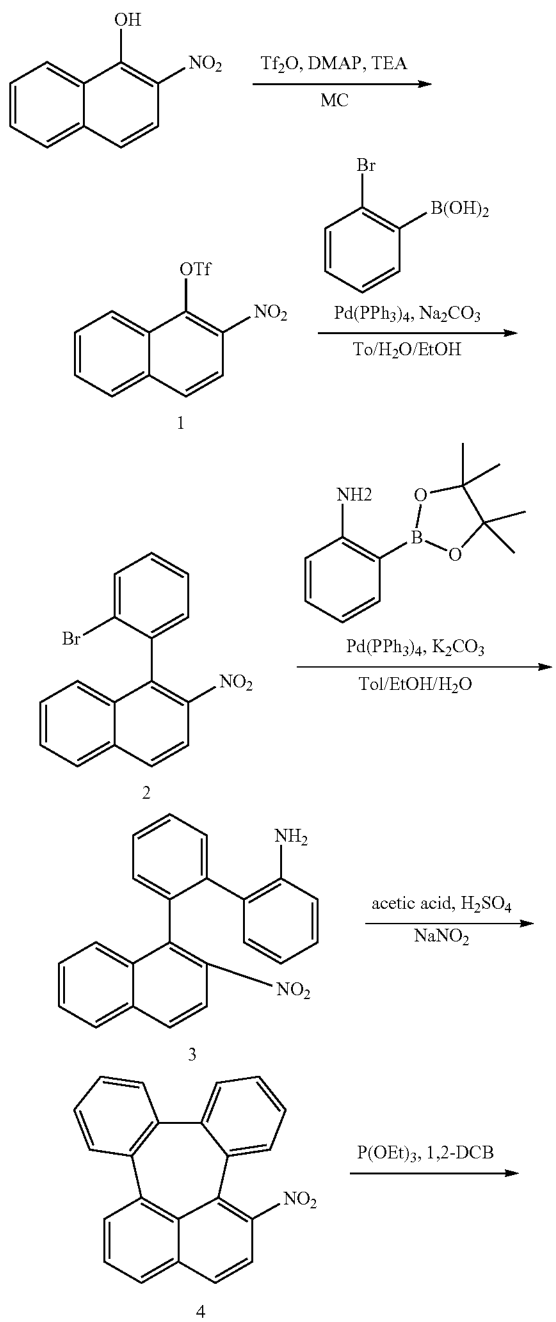

-continued

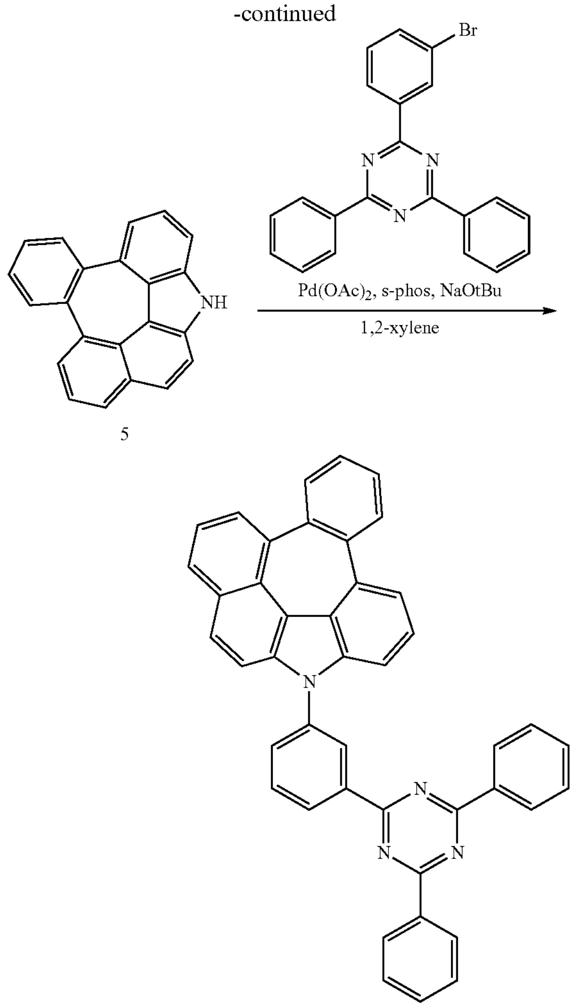

5

H1-49

1) Preparation of Compound 1

2-nitro-1-naphthol (70 g, 370 mmol), dimethylaminopyridine (DMAP) (4.5 g, 37 mmol), and methylene chloride (MC) 1800 mL were introduced into a flask and dissolved. Triethylamine (TEA) (62 mL, 444 mmol) was added thereto dropwise at 0° C. and stirred for 20 minutes. Trifluoromethanesulfonic acid anhydride (125.3 g, 444 mmol) was slowly added to the product dropwise at the same temperature and stirred for 1 hour. After completion of the reaction, an organic layer was extracted with MC, and the residual moisture was removed by using magnesium sulfate. The residue was dried, and separated by column chromatography to obtain compound 1 (96.2 g, yield: 81%).

2) Preparation of Compound 2

Compound 1 (96.2 g, 299 mmol), 2-bromophenylboronic acid (72.1 g, 359 mmol), tetrakis(triphenylphosphine)palladium(0) (17.3 g, 15 mmol), sodium carbonate (79.3 g, 749 mmol), toluene 1400 mL, ethanol 350 mL, and water 350 mL were introduced into a flask and dissolved, and then the mixture was refluxed for 1 hour. After completion of the reaction, an organic layer was extracted with ethyl acetate, and the residual moisture was removed by using magnesium sulfate. The residue was dried, and separated by column chromatography to obtain compound 2 (98 g, yield: 99%).

3) Preparation of Compound 3

Compound 2 (98 g, 299 mmol), 2-aminophenylboronic acid pinacol ester (78.5 g, 358 mmol), tetrakis(triphenylphosphine)palladium(0) (17.2 g, 15 mmol), potassium carbonate (103 g, 747 mmol), toluene 1300 mL, ethanol 350 mL, and water 350 mL were introduced into a flask and dissolved, and then the mixture was refluxed for 20 hours. After completion of the reaction, an organic layer was extracted with ethyl acetate, and the residual moisture was removed by using magnesium sulfate. The residue was dried, and separated by column chromatography to obtain compound 3 (54 g, yield: 53%).

4) Preparation of Compound 4

Compound 3 (25 g, 73 mmol), acetic acid 250 mL, and sulfuric acid 25 mL were introduced into a flask and dissolved. Sodium nitrite (6.5 g, 95 mmol) was slowly added thereto dropwise at 0° C. and stirred for 40 minutes. After completion of the reaction, the product was added to water dropwise and filtered to remove moisture. The residue was dried, and separated by column chromatography to obtain compound 4 (2 g, yield: 8.4%).

5) Preparation of Compound 5

Compound 4 (4.7 g, 15 mmol), triethylphosphite 48 mL, and 1,2-dichlorobenzene 48 mL were introduced into a flask and dissolved, and then the mixture was refluxed for 3 hours. After completion of the reaction, the product was distilled under reduced pressure, an organic layer was extracted with ethyl acetate, and the residual moisture was removed by using magnesium sulfate. The residue was dried, and separated by column chromatography to obtain compound 5 (2.7 g, yield: 63%).

6) Preparation of Compound H1-49

Compound 5 (2.1 g, 7 mmol), 2-(3-bromophenyl)-4,6-diphenyl-1,3,5-triazine (3.1 g, 8 mmol), palladium(II) acetate (0.81 g, 0.36 mmol), 2-dicyclohexylphosphino-2',6'-dimethoxybiphenyl (S-Phos) (0.3 g, 0.7 mmol), sodium tert-butoxide (1.7 g, 18 mmol), and 1,2-xylene 72 mL were introduced into a flask and dissolved, and then the mixture was refluxed for 4 hours. After completion of the reaction, the product was distilled under reduced pressure, an organic layer was extracted with ethyl acetate, and the residual moisture was removed by using magnesium sulfate. The residue was dried, and separated by column chromatography to obtain compound H1-49 (2.5 g, yield: 58%).

| Compound | MW | UV | PL | M.P. | Tg |
|---|---|---|---|---|---|
| H1-49 | 598.71 | 308 nm | 495 nm | 285° C. | 132.37° C. |

Synthetic Example 2: Preparation of Compound H1-6

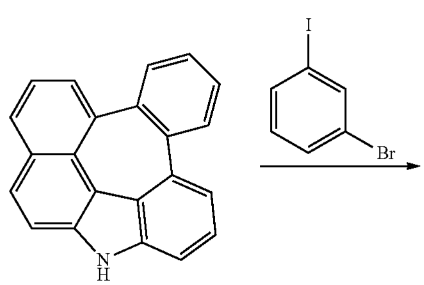

5

-continued

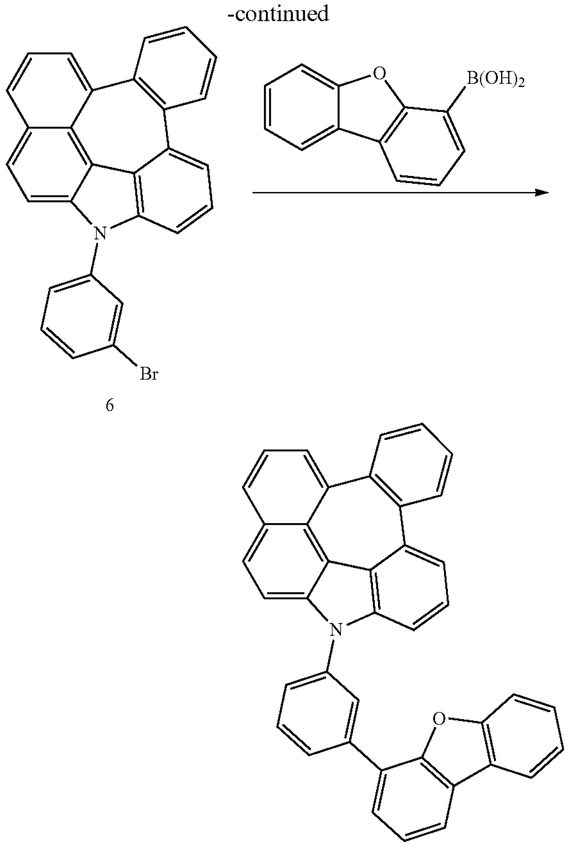

6

H1-6

1) Preparation of Compound 6

Compound 5 (9 g, 30.89 mmol), 1-bromo-3-iodobenzene (10.6 g, 61.78 mmol), CuI (3 g, 15.44 mmol), ethylenediamine (EDA) (1.8 g, 30.89 mmol), $K_3PO_4$ (16.4 g, 77.22 mmol), and toluene 155 mL were introduced into a flask and dissolved, and then the mixture was stirred under reflux for 1 day. After completion of the reaction, the product was cooled to room temperature, and the produced solid was filtered under reduced pressure. The filtered solid was dissolved in $CHCl_3$ and extracted with MC/Hex, and was then separated by column chromatography to obtain compound 6 (10 g, yield: 75%).

2) Preparation of Compound H1-6

Compound 6 (5.7 g, 12.77 mmol), dibenzo[b,d]furan-4-yl boronic acid (2.9 g, 14.05 mmol), $Pd(PPh_3)_4$ (0.73 g, 0.638 mmol), $K_2CO_3$ (3.5 g, 25.54 mmol), toluene 50 mL, ethanol 13 mL, and purified water 13 mL were introduced into a flask and dissolved, and then the mixture was stirred under reflux for 2 hours. After completion of the reaction, the product was cooled to room temperature, and the produced solid was filtered under reduced pressure. The filtered solid was dissolved in $CHCl_3$ and extracted with MC/Hex, and was then separated by column chromatography to obtain compound H1-6 (2.9 g, yield: 43%).

$^1$H NMR (600 MHz, DMSO-d6, δ) 8.232-8.206 (m, 3H), 8.111-8.098 (d, 1H), 7.962-7.946 (m, 1H), 7.929-7.903 (m, 3H), 7.896-7.882 (d, 1H), 7.806-7.802 (d, 2H), 7.783-7.759 (t, 2H), 7.738-7.723 (d, 1H) 7.635-7.620 (m, 1H), 7.581-7.548 (m, 2H), 7.513-7.440 (m, 6H)

| Compound | MW | Tg | M.P. |
|---|---|---|---|
| H1-6 | 533.6 | 119° C. | 208° C. |

Synthetic Example 3: Preparation of Compound H1-7

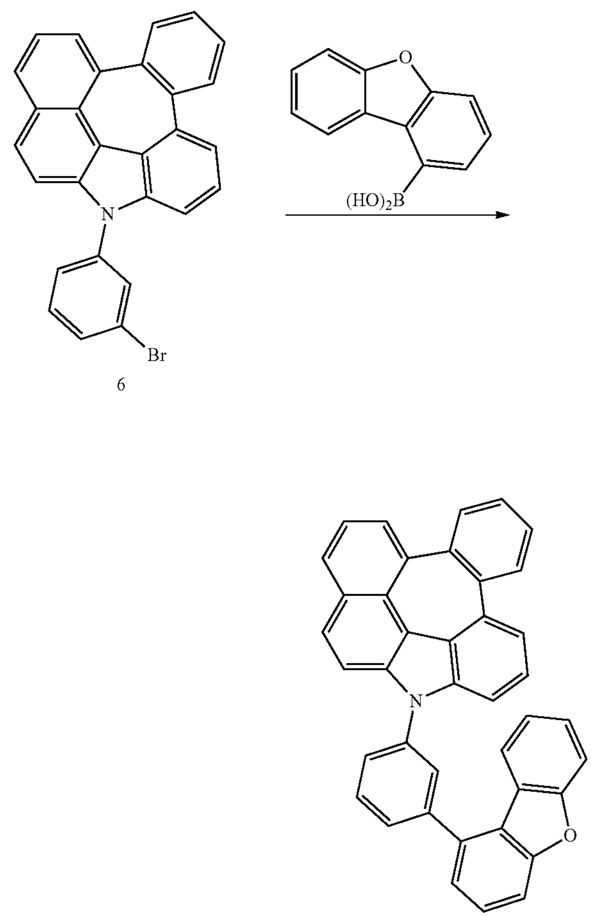

6

H1-7

Compound 6 (6.6 g, 14.78 mmol), dibenzo[b,d]furan-1-yl boronic acid (3.4 g, 16.24 mmol), $Pd(PPh_3)_4$ (0.85 g, 0.739 mmol), $K_2CO_3$ (4 g, 29.57 mmol), toluene 60 mL, ethanol 15 mL, and purified water 15 mL were introduced into a flask and dissolved, and then the mixture was stirred under reflux for 1 day. After completion of the reaction, the product was cooled to room temperature, and the produced solid was filtered under reduced pressure. The filtered solid was dissolved in $CHCl_3$ and extracted with MC/Hex, and was then separated by column chromatography to obtain compound H1-7 (3.5 g, yield: 45%).

$^1$H NMR (600 MHz, DMSO, δ) 7.953-7.927 (m, 2H), 7.896-7.872 (t, 2H), 7.848-7.810 (m, 3H), 7.793-7.746 (m, 4H), 7.656-7.601 (m, 4H), 7.539-7.511 (t, 1H), 7.485-7.443 (m, 4H), 7.419-7.393 (t, 1H), 7.369-7.356 (d, 1H), 7.294-7.269 (t, 1H)

Synthetic Example 4: Preparation of Compound H1-1

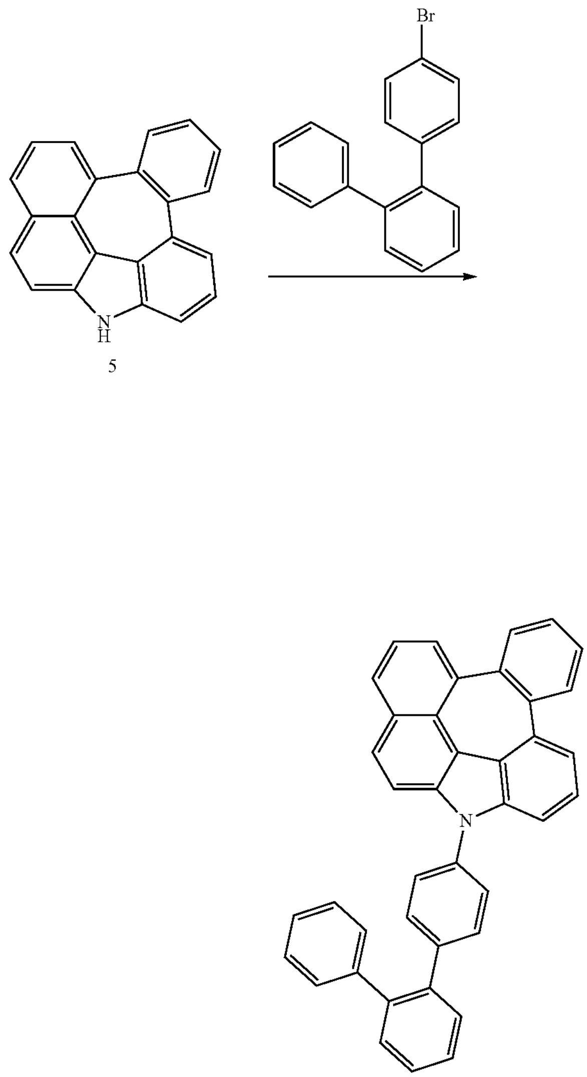

H1-1

Compound 5 (5 g, 17.16 mmol), 4-bromo-1,1':2',1"-terphenyl (5.3 g, 17.16 mmol), $Pd_2(dba)_3$ (0.8 g, 0.858 mmol), s-phos (0.7 g, 1.716 mmol), NaOt-Bu (5 g, 51.48 mmol), and o-xylene 86 mL were introduced into a flask and dissolved, and then the mixture was stirred under reflux for 2 hours. After completion of the reaction, the product was cooled to room temperature, and the produced solid was filtered under reduced pressure. The filtered solid was dissolved in $CHCl_3$ and extracted with MC/Hex, and was then separated by column chromatography to obtain compound H1-1 (2.4 g, yield: 26%).

$^1$H NMR (DMSO-$d_6$) δ: 7.92-7.88 (m, 1H), 7.87-7.83 (m, 1H), 7.79 (d, J=9.1 Hz, 1H), 7.74 (t, J=8.3 Hz, 2H), 7.59-7.54 (m, 2H), 7.53-7.49 (m, 2H), 7.48-7.41 (m, 6H), 7.38 (d, J=2.3 Hz, 1H), 7.36 (d, J=2.1 Hz, 2H), 7.34-7.31 (m, 2H), 7.30-7.25 (m, 2H), 7.21-7.17 (m, 2H), 7.12 (dd, J=8.1, 0.6 Hz, 1H)

Synthetic Example 5: Preparation of Compound H1-122

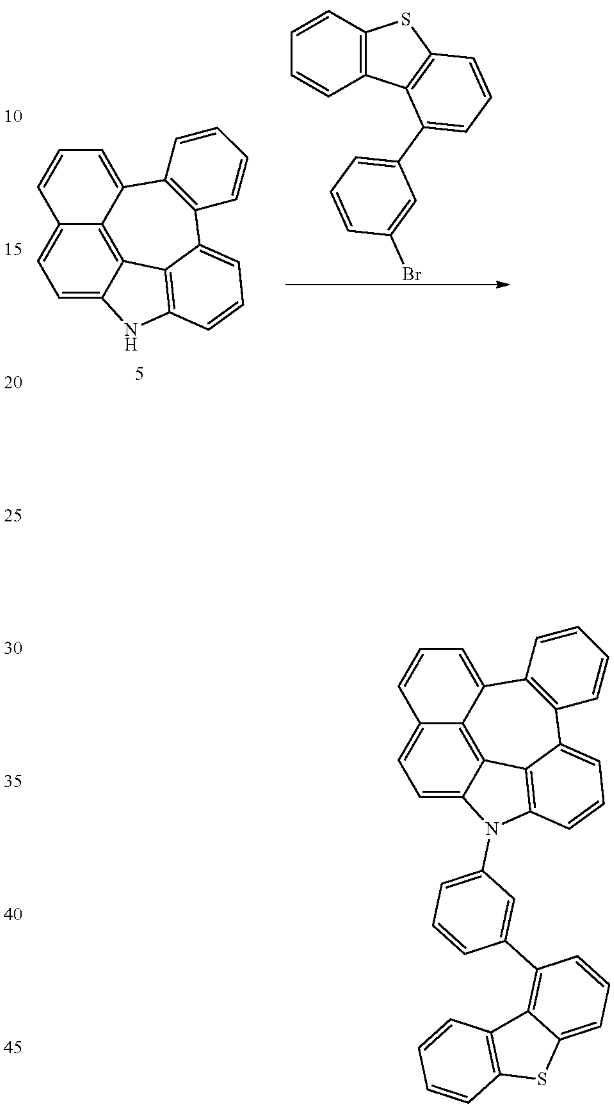

H1-122

Compound 5 (5 g, 17.16 mmol), 1-(3-bromophenyl) dibenzo[b,d]thiophene (7 g, 20.59 mmol), CuI (0.16 g, 0.858 mmol), ethylenediamine (EDA) (1 g, 17.16 mmol), $K_3PO_4$ (9.1 g, 42.90 mmol), and o-xylene 90 mL were introduced into a flask and dissolved, and then the mixture was stirred under reflux for 2 hours. After completion of the reaction, the product was cooled to room temperature, and the produced solid was filtered under reduced pressure. The filtered solid was dissolved in $CHCl_3$ and extracted with MC/Hex, and was then separated by column chromatography to obtain compound H1-122 (2.2 g, yield: 22%).

$^1$H NMR (DMSO-$d_6$) δ: 8.09 (dd, J=8.0, 1.1 Hz, 1H), 8.04 (ddd, J=8.0, 1.1, 0.7 Hz, 1H), 7.92-7.87 (m, 2H), 7.85-7.82 (m, 1H), 7.80 (ddd, J=8.0, 2.1, 1.2 Hz, 1H), 7.78-7.71 (m, 3H), 7.68-7.63 (m, 2H), 7.60-7.52 (m, 3H), 7.48-7.38 (m, 5H), 7.36-7.24 (m, 4H)

Synthetic Example 6: Preparation of Compound H1-16

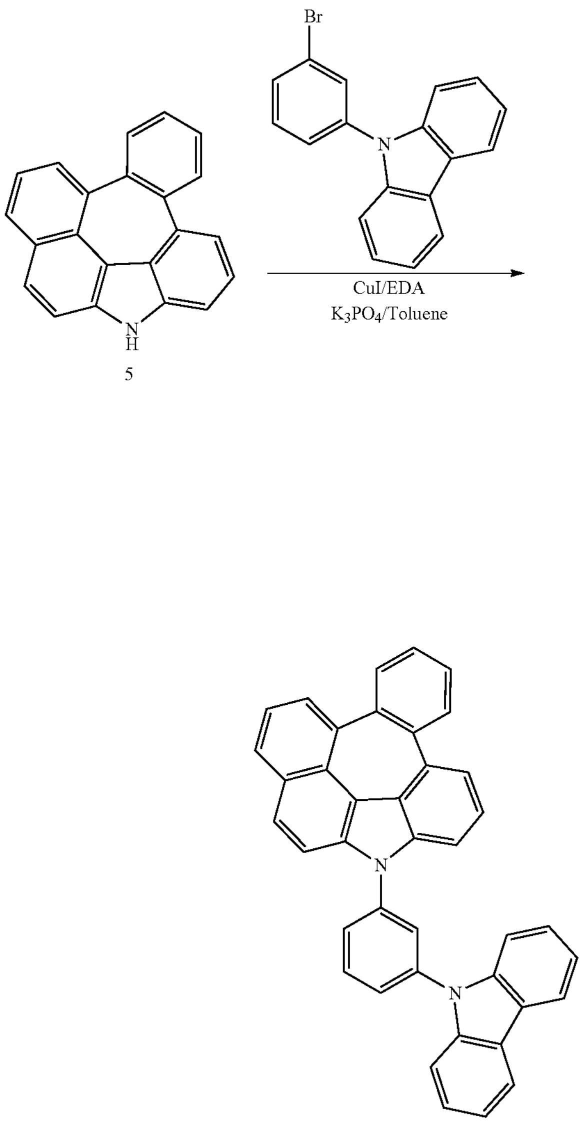

H1-16

Compound 5 (4.0 g, 14 mmol), 9-(3-bromophenyl)-9H-carbazole (4.87 g, 15 mmol), CuI (1.307 g, 7 mmol), EDA (1.647 g, 27 mmol), and $K_3PO_4$ (5.83 g, 27 mmol) were added to toluene 70 mL dropwise in a flask, and then the mixture was stirred under reflux at 180° C. for 4 hours. After completion of the reaction, the product was extracted with ethylacetate (EA) and dried with $MgSO_4$. The residue was separated by column chromatography and methanol was added thereto. The produced solid was filtered under reduced pressure to obtain compound H1-16 (2.3 g, yield: 31.5%).

$^1$H NMR (600 MHz, DMSO-d6, δ) 8.27 (d, J=7.8 Hz, 2H), 8.01 (t, J=8.0 Hz, 1H), 7.95-7.92 (m, 1H), 7.91-7.84 (m, 4H), 7.83 (d, J=6.9 Hz, 1H), 7.81-7.77 (m, 2H), 7.66 (d, J=8.9 Hz, 1H), 7.63-7.57 (m, 3H), 7.51-7.44 (m, 5H), 7.44-7.40 (m, 2H), 7.35-7.30 (m, 2H)

Synthetic Example 7: Preparation of Compound H1-104

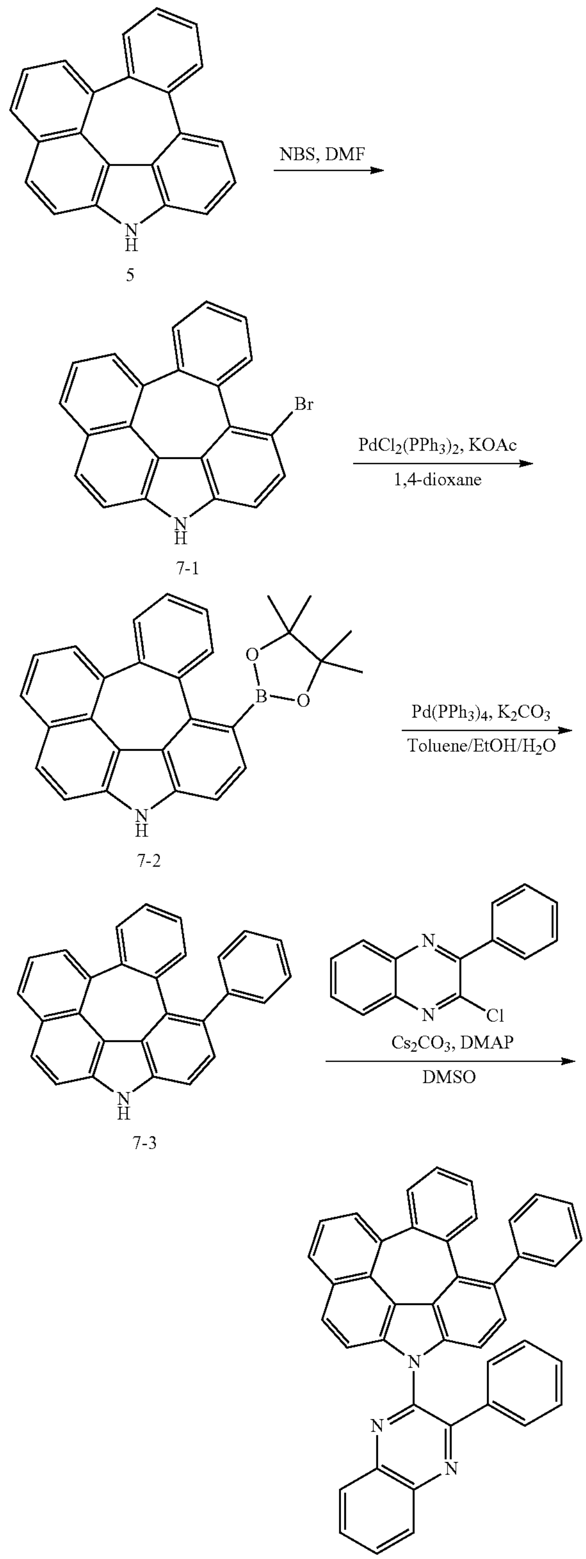

H1-104

1) Preparation of Compound 7-1

Compound 5 (70 g, 240 mmol), N-bromosuccinimide (NBS) (40.6 g, 255 mmol), and dimethylformamide (DMF) 1200 mL were introduced into a flask and dissolved, and then the mixture was stirred for 3 hours at 0° C. After completion of the reaction, an organic layer was extracted with ethyl acetate, and the residual moisture was removed by using magnesium sulfate. The residue was dried, and separated by column chromatography to obtain compound 7-1 (68 g, yield: 76%).

2) Preparation of Compound 7-2

Compound 7-1 (47.3 g, 127 mmol), bis(pinacolato)diboron (42 g, 166 mmol), bis(triphenylphosphine)palladium dichloride(II) (4.5 g, 6.4 mmol), potassium acetate (25 g, 255 mmol), and 1,4-dioxane 635 mL were introduced into a flask and dissolved, and then the mixture was refluxed for 4 hours. After completion of the reaction, the product was distilled under reduced pressure, an organic layer was extracted with ethyl acetate, and the residual moisture was removed by using magnesium sulfate. The residue was dried, and separated by column chromatography to obtain compound 7-2 (31.5 g, yield: 59%).

3) Preparation of Compound 7-3

Compound 7-2 (4.5 g, 10.7 mmol), 1-bromobenzene (1.9 g, 11.85 mmol), tetrakis(triphenylphosphine)palladium(0) (0.63 g, 0.54 mmol), potassium carbonate (3.7 g, 26.95 mmol), toluene 54 mL, ethanol 13 mL, and water 13 mL were introduced into a flask and dissolved, and then the mixture was refluxed for 12 hours. After completion of the reaction, an organic layer was extracted with ethyl acetate, and the residual moisture was removed by using magnesium sulfate. The residue was dried, and separated by column chromatography to obtain compound 7-3 (2.2 g, yield: 56%).

4) Preparation of Compound H1-104

Compound 7-3 (2.2 g, 5.9 mmol), 2-chloro-3-phenylquinoxaline (1.58 g, 6.57 mmol), cesium carbonate (3.89 g, 11.96 mmol), 4-dimethylaminopyridine (0.36 g, 2.99 mmol), and dimethyl sulfoxide (DMSO) 30 mL were introduced into a flask and dissolved, and then the mixture was stirred for 4 hours at 100° C. After completion of the reaction, the product was cooled to room temperature, and distilled water was added thereto. An organic layer was extracted with ethyl acetate, and the residual moisture was removed by using magnesium sulfate. The residue was dried, and separated by column chromatography to obtain compound H1-104 (2.9 g, yield: 85%).

| Compound | MW | M.P. | Tg |
|---|---|---|---|
| H1-104 | 571.68 | 210° C. | 167° C. |

Synthetic Example 8: Preparation of Compound H1-11

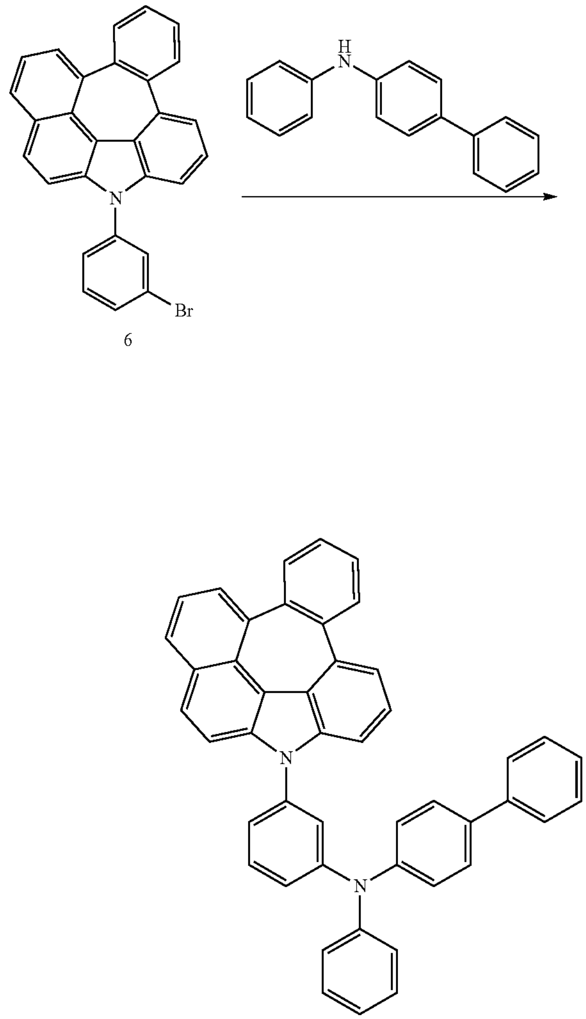

6

H1-11

Compound 6 (5.0 g, 11.2 mmol), N-phenyl-[1,1'-biphenyl]-4-amine (3.0 g, 12.3 mmol), $Pd_2(dba)_3$ (0.5 g, 0.56 mmol), s-phos (0.46 g, 1.12 mmol), NaOtBu (2.7 g, 28 mmol), and toluene 60 mL were introduced into a flask and dissolved, and then the mixture was stirred under reflux for 6 hours. After completion of the reaction, the mixture was cooled to room temperature and stirred, and MeOH was added thereto to obtain a solid. The produced solid was filtered under reduced pressure. The filtered solid was extracted with MC/Hex, and was then separated by column chromatography to obtain compound H1-11 (2.3 g, yield: 34%).

| Compound | MW | M.P. |
|---|---|---|
| H1-11 | 610.8 | 132° C. |

Synthetic Example 9: Preparation of Compound H1-120

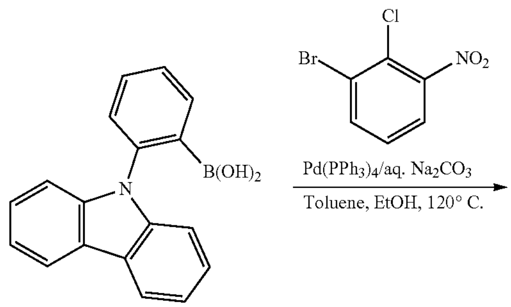

S1

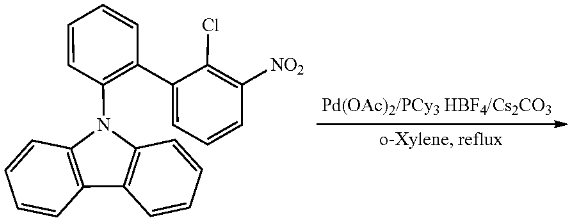

S2

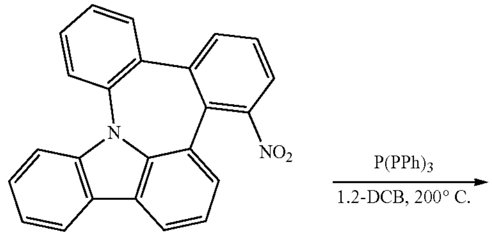

S3

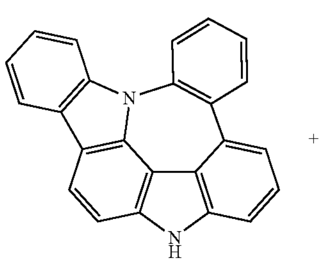

S4

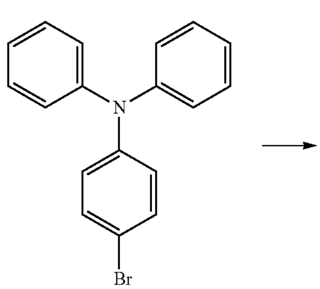

-continued

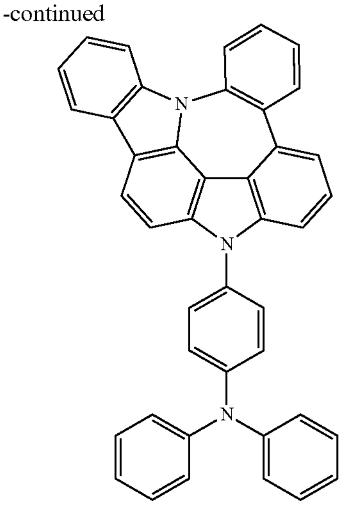

H1-120

1) Preparation of Compound S2

Compound S1 (36 g, 125.38 mmol), 3-bromo-2-chloronitrobenzene (27 g, 113.98 mmol), tetrakis(triphenylphosphine)palladium (4 g, 3.42 mmol), sodium carbonate (30 g, 284.95 mmol), toluene 570 mL, ethanol 140 mL, and distilled water 140 mL were introduced into a reaction vessel, and then the mixture was stirred at 120° C. for 3 hours. After completion of the reaction, the mixture was cooled to room temperature and extracted with ethyl acetate. The extracted organic layer was dried with magnesium sulfate and the solvent was removed with a rotary evaporator. The residue was purified by column chromatography to obtain compound S2 (30 g, yield: 66%).

2) Preparation of Compound S3

Compound S2 (27 g, 68.20 mmol), palladium(II) acetate (1.5 g, 6.82 mmol), tricyclohexylphosphonium tetrafluoroborate (5.0 g, 13.64 mmol), cesium carbonate (66 g, 204.60 mmol), and o-xylene 340 mL were introduced into a reaction vessel, and then the mixture was stirred under reflux for 2 hours. After completion of the reaction, the mixture was washed with distilled water and extracted with ethyl acetate. The extracted organic layer was dried with magnesium sulfate and the solvent was removed with a rotary evaporator. The residue was purified by column chromatography to obtain compound S3 (24.8 g, yield: 100%).

3) Preparation of Compound S4

Compound S3 (24.8 g, 68.20 mmol), triethylphosphite (176 mL, 0.4 M), and 1,2-dichlorobenzene (DCB) 341 mL were introduced into a reaction vessel, and then the mixture was stirred at 150° C. for 4 hours. After completion of the reaction, the mixture was distilled under reduced pressure and triethylphosphite was removed. The residue was washed with distilled water and extracted with ethyl acetate. The extracted organic layer was dried with magnesium sulfate and the solvent was removed with a rotary evaporator. The residue was purified by column chromatography to obtain compound S4 (16.4 g, yield: 70%).

4) Preparation of Compound H1-120

Compound S4 (5.0 g, 15.2 mmol), 4-bromo-N,N-diphenylaniline (5.4 g, 16.7 mmol), $Pd_2(dba)_3$ (0.7 g, 0.76 mmol), s-phos (0.6 g, 1.52 mmol), NaOtBu (2.9 g, 30.4 mmol), and o-xylene 80 mL were introduced into a flask and dissolved, and then the mixture was stirred under reflux for 4 hours. After completion of the reaction, the mixture was cooled to room temperature and stirred, and MeOH was added thereto to obtain a solid. The produced solid was filtered under reduced pressure. The filtered solid was extracted with MC/Hex, and was then separated by column chromatography to obtain compound H1-120 (4.0 g, yield: 46%).

| Compound | MW | M.P. |
|---|---|---|
| H1-120 | 573.7 | 317° C. |

Synthetic Example 10: Preparation of Compound H1-121

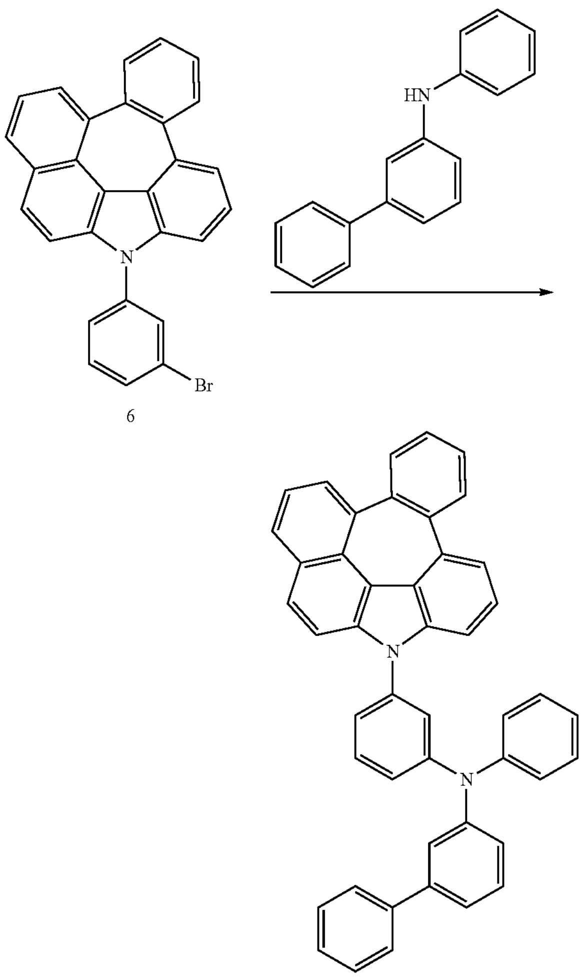

H1-121

Compound 6 (14.0 g, 31.4 mmol), N-phenyl-[1,1'-biphenyl]-3-amine (7.78 g, 31.7 mmol), $Pd_2(dba)_3$ (1.44 g, 1.57 mmol), t-$Bu_3P$ (635 mg, 3.14 mmol), t-BuONa (6.04 g, 62.8 mmol), and toluene 160 mL were introduced into a flask and dissolved, and then the mixture was stirred under reflux for 2 hours. After completion of the reaction, the mixture was cooled to room temperature and extracted with distilled water and EA. The extracted organic layer was distilled under reduced pressure and extracted with MC/Hex, and was then separated by column chromatography to obtain compound H1-121 (14.6 g, yield: 76%).

| Compound | MW | M.P. |
|---|---|---|
| H1-121 | 610.7 | 141° C. |

Synthetic Example 11: Preparation of Compound H1-119

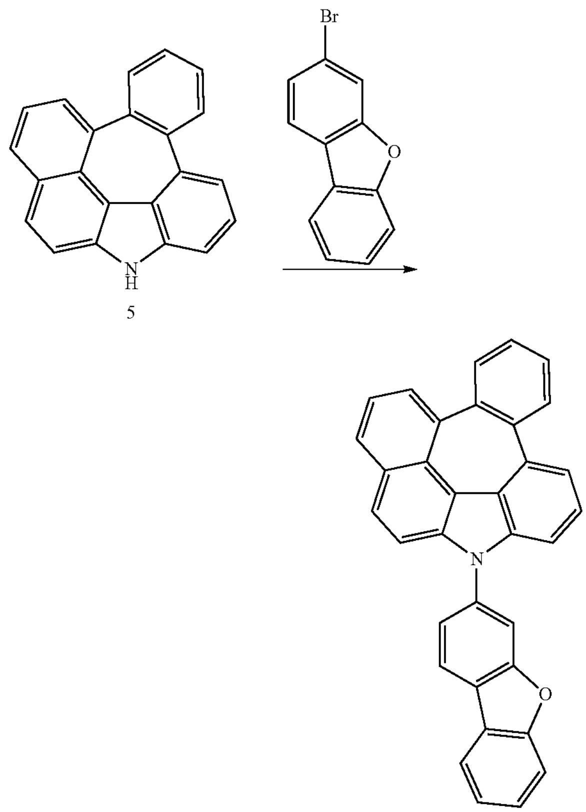

H1-119

Compound 5 (10 g, 34.3 mmol), 3-bromodibenzo[b,d]furan (12.7 g, 51.45 mmol), CuI (3.3 g, 17.15 mmol), ethylenediamine (EDA) (4.6 mL, 68.8 mmol), $K_3PO_4$ (21.8 g, 102.9 mmol), and toluene 170 mL were introduced into a flask and dissolved, and then the mixture was stirred under reflux for 12 hours. After completion of the reaction, the mixture was cooled to room temperature and stirred, and MeOH was added thereto to obtain a solid. The produced solid was filtered under reduced pressure. The filtered solid was extracted with MC/Hex, and was then separated by column chromatography to obtain compound H1-119 (8.3 g, yield: 53%).

| Compound | MW | M.P. |
|---|---|---|
| H1-119 | 457.53 | 255.4° C. |

Synthetic Example 12: Preparation of Compound H1-12

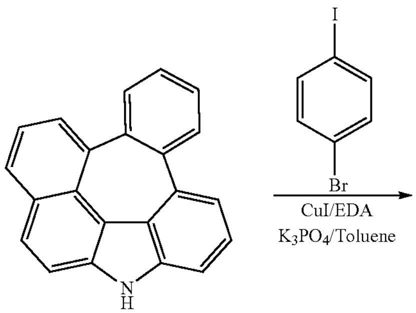

5

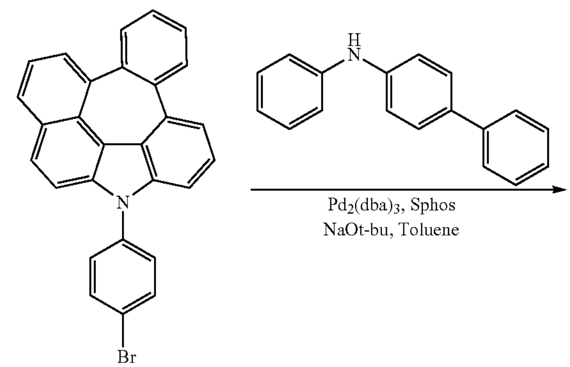

12-1

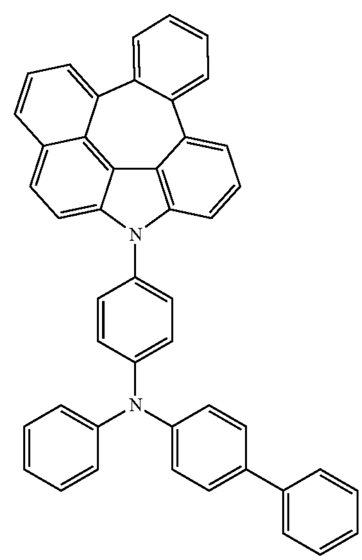

H1-12

1) Preparation of Compound 12-1

Compound 5 (10.0 g, 34.3 mmol), 1-bromo-4-iodobenzene (14.6 g, 51.5 mmol), CuI (3.28 g, 17.2 mmol), EDA (4.12 g, 68.6 mmol), $K_3PO_4$ (14.6 g, 68.6 mmol), and toluene 170 mL were introduced into a flask, and then the mixture was stirred under reflux at 145° C. for 3 hours. After completion of the reaction, the product was extracted with MC and dried with $MgSO_4$. The residue was separated by column chromatography and MeOH was added thereto. The produced solid was filtered under reduced pressure to obtain compound 12-1 (9.0 g, yield: 59%).

2) Preparation of Compound H1-12

Compound 12-1 (5.0 g, 11 mmol), N-phenyl-[1,1'-biphenyl]-4-amine (3.3 g, 13 mmol), $Pd_2(dba)_3$ (0.513 g, 0.56 mmol), s-phos (0.460 g, 1 mmol), NaOt-Bu (2.691 g, 28 mmol), and toluene 60 mL were introduced into a flask, and then the mixture was stirred under reflux at 100° C. for 0.5 hours. After completion of the reaction, the product was extracted with MC and dried with $MgSO_4$. The residue was separated by column chromatography and MeOH was added thereto. The produced solid was filtered under reduced pressure to obtain compound H1-12 (1.3 g, yield: 19%).

| Compound | MW | M.P. |
|---|---|---|
| H1-12 | 610.76 | 168° C. |

Synthetic Example 13: Preparation of Compound H1-35

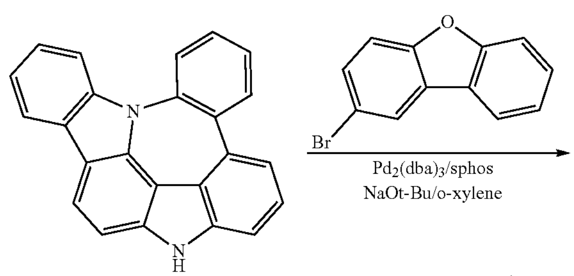

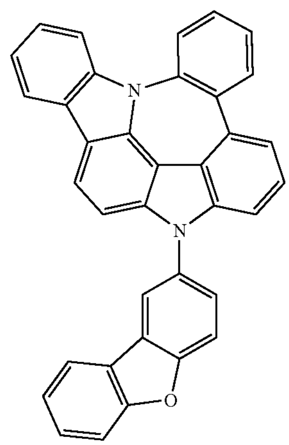

H1-35

14H-7b,14-diazadibenzo[3,4:5,6]azuleno[7,8,1-lma]fluorene (5.0 g, 15.1 mmol), 2-bromodibenzo[b,d]furan (4.1 g, 16.6 mmol), $Pd_2(dba)_3$ (0.691 g, 0.755 mmol), s-phos (0.620 g, 1.51 mmol), NaOtBu (3.63 g, 37.8 mmol), and o-xylene 75 mL were introduced into a flask and dissolved, and then the mixture was stirred under reflux for 6 hours. After completion of the reaction, the mixture was cooled to room temperature and stirred, and MeOH was added thereto to obtain a solid. The produced solid was filtered under reduced pressure. The filtered solid was extracted with MC/Hex, and was then separated by column chromatography to obtain compound H1-35 (1.9 g, yield: 25%).

| Compound | MW | M.P. |
|---|---|---|
| H1-35 | 496.56 | 280° C. |

Synthetic Example 14: Preparation of Compound H2-22

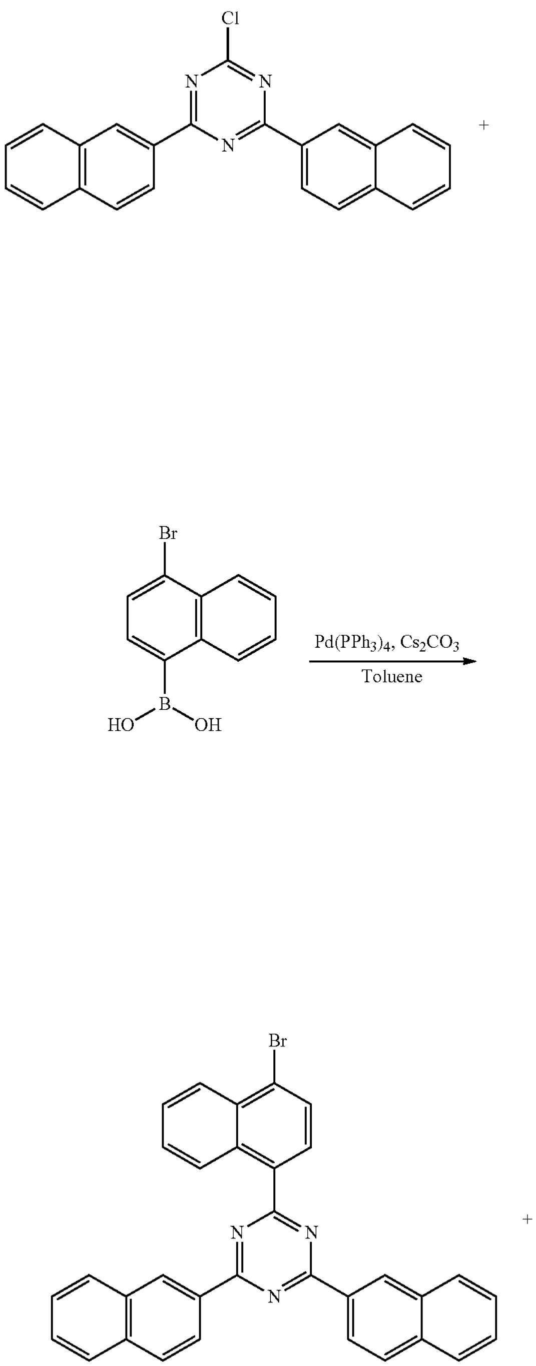

14-1

-continued

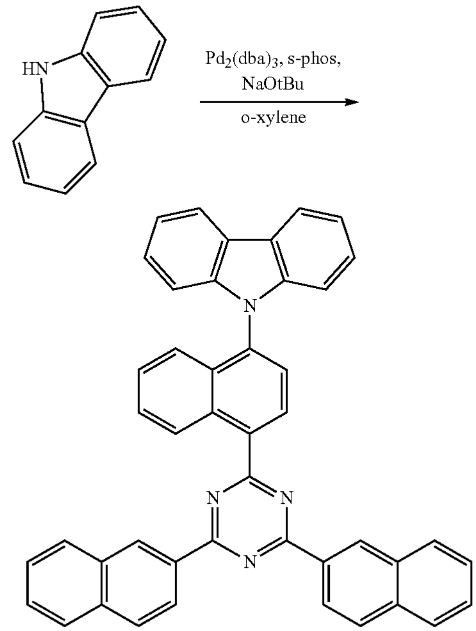

H2-22

1) Preparation of Compound 14-1

2-chloro-4,6-di(naphthalen-2-yl)-1,3,5-triazine (20 g, 79.7 mmol), (4-bromonaphthalen-1-yl)boronic acid (32.2 g, 87.7 mmol), $Pd(PPh_3)_4$ (4.6 g, 3.985 mmol), $Cs_2CO_3$ (65 g, 199.25 mmol), and toluene 400 mL were introduced into a flask and dissolved, and then the mixture was stirred under reflux for 4 hours. After completion of the reaction, the product was cooled to room temperature, an organic layer was extracted with ethyl acetate, and the residual moisture was removed by using magnesium sulfate. The residue was dried, and separated by column chromatography to obtain compound 14-1 (30 g, yield: 74%).

2) Preparation of Compound H2-22

Compound 14-1 (10 g, 19.7 mmol), 9H-carbazole (3.0 g, 17.9 mmol), tris(dibenzylideneacetone)dipalladium(0) (0.8 g, 0.9 mmol), s-phos (0.73 g, 1.79 mmol), sodium tert-butoxide (4.3 g, 44.75 mmol), and xylene 90 mL were introduced into a flask and dissolved, and then the mixture was stirred under refluxed for 4 hours. After completion of the reaction, the mixture was extracted with ethyl acetate, and separated by column chromatography to obtain compound H2-22 (1.5 g, yield: 13%).

| Compound | MW | M.P. |
|---|---|---|
| H2-22 | 624.75 | 265° C. |

Synthetic Example 15: Preparation of Compound H2-115

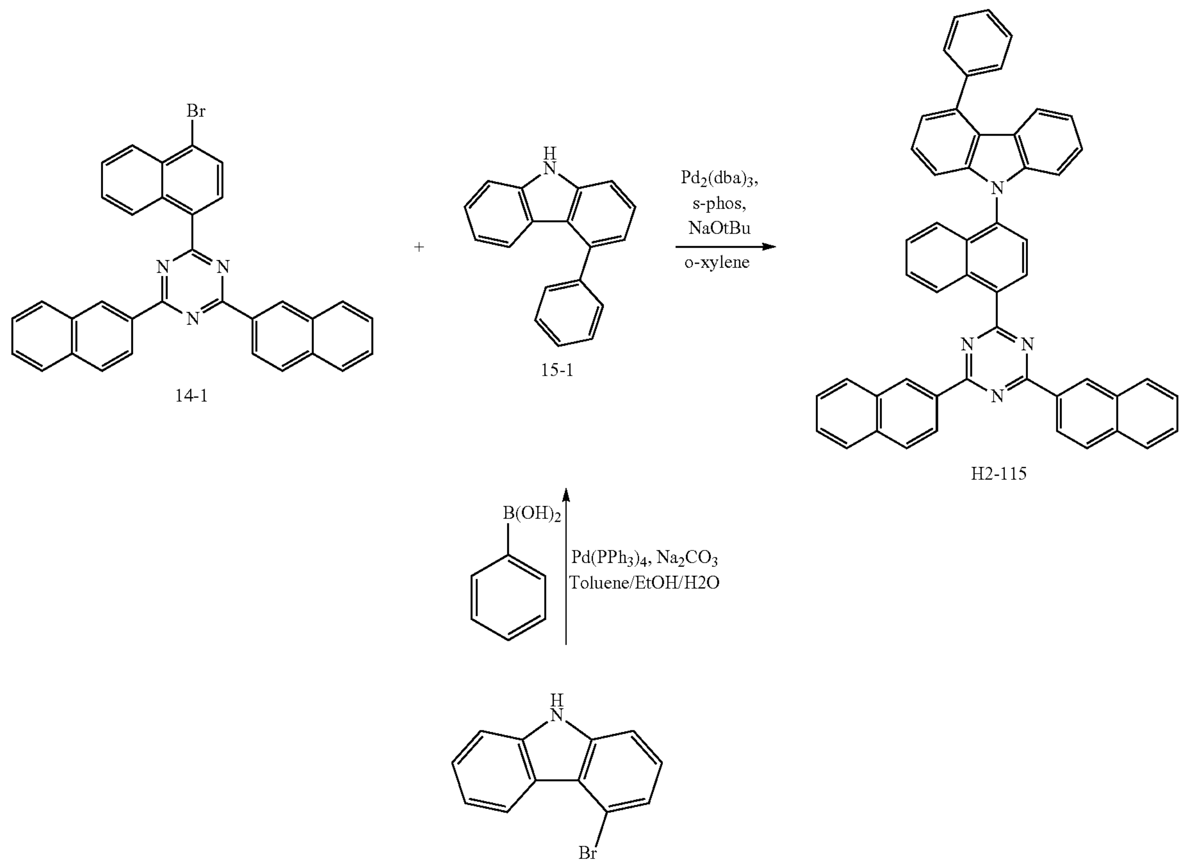

1) Preparation of Compound 15-1

4-bromo-9H-carbazole (10 g, 40.6 mmol), phenylboronic acid (6.2 g, 48.7 mmol), $Pd(PPh_3)_4$ (2.3 g, 2.03 mmol), $Na_2CO_3$ (13 g, 121.8 mmol), toluene 200 mL, ethanol 100 mL, and water 100 mL were introduced into a flask and dissolved, and then the mixture was stirred under reflux for 3 hours. After completion of the reaction, the product was cooled to room temperature, an organic layer was extracted with ethyl acetate, and the residual moisture was removed by using magnesium sulfate. The residue was dried, and separated by column chromatography to obtain compound 15-1 (9 g, yield: 91%).

2) Preparation of Compound H2-115

Compound 14-1 (8.5 g, 13.5 mmol), compound 15-1 (3.0 g, 12.3 mmol), $Pd_2(dba)_3$ (0.56 g, 0.615 mmol), s-phos (0.51 g, 1.23 mmol), NaOtBu (2.9 g, 30.75 mmol), and o-xylene 60 mL were introduced into a flask and dissolved, and then the mixture was stirred under refluxed for 4 hours. After completion of the reaction, the mixture was extracted with ethyl acetate, and separated by column chromatography to obtain compound H2-115 (2.8 g, yield: 32.5%).

| Compound | MW | M.P. |
|---|---|---|
| H2-115 | 700.85 | 260.3° C. |

Synthetic Example 16: Preparation of Compound H2-14

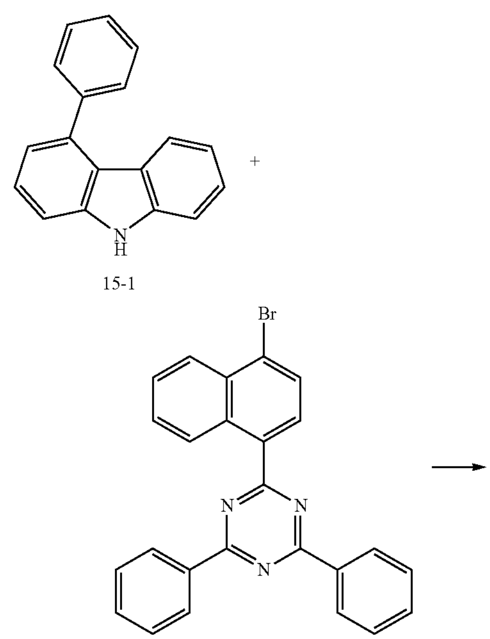

-continued

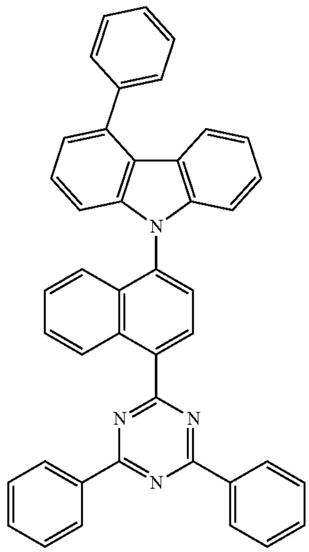

H2-14

Compound 15-1 (3.0 g, 12.3 mmol), 2-(4-bromonaphthalen-1-yl)-4,6-diphenyl-1,3,5-triazine (5.4 g, 12.3 mmol), $Pd_2(dba)_3$ (0.56 g, 0.62 mmol), s-phos (0.51 g, 1.23 mmol), NaOtBu (2.4 g, 24.7 mmol), and o-xylene 62 mL were introduced into a flask and dissolved, and then the mixture was stirred under refluxed for 6 hours. After completion of the reaction, the product was was cooled to room temperature and stirred, and MeOH was added thereto to obtain a solid. The produced solid was filtered under reduced pressure. The filtered solid was extracted with MC/Hex, and was then separated by column chromatography to obtain compound H2-14 (3.3 g, yield: 45%).

| Compound | MW | M.P. |
|---|---|---|
| H2-14 | 600.71 | 254° C. |

Synthetic Example 17: Preparation of Compound H2-11

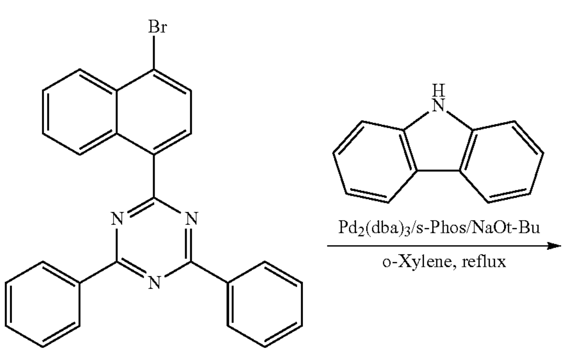

-continued

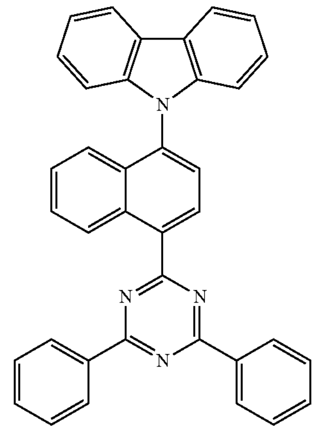

H2-11

2-(4-bromonaphthalen-1-yl)-4,6-diphenyl-1,3,5-triazine (8.0 g, 16.4 mmol), 9H-carbazole (3.0 g, 18.0 mmol), $Pd_2(dba)_3$ (0.8 g, 0.8 mmol), s-phos (0.7 g, 1.64 mmol), NaOtBu (2.4 g, 24.6 mmol), and o-xylene 82 mL were introduced into a flask and dissolved, and then the mixture was stirred under refluxed for 4 hours. After completion of the reaction, the mixture was extracted with ethyl acetate, and separated by column chromatography to obtain compound H2-11 (6.0 g, yield: 69%).

| Compound | MW | M.P. |
|---|---|---|
| H2-11 | 524.63 | 245° C. |

Synthetic Example 18: Preparation of Compound H2-116

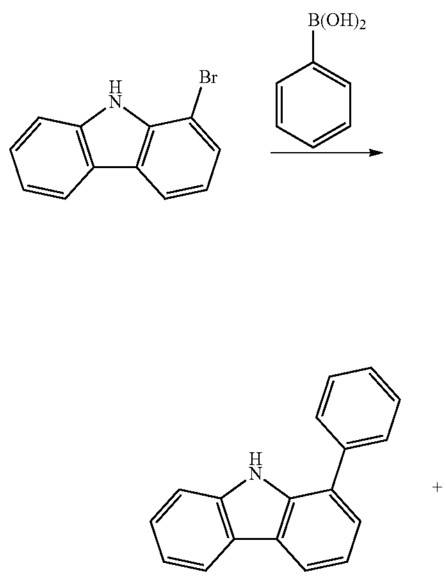

18-1

-continued

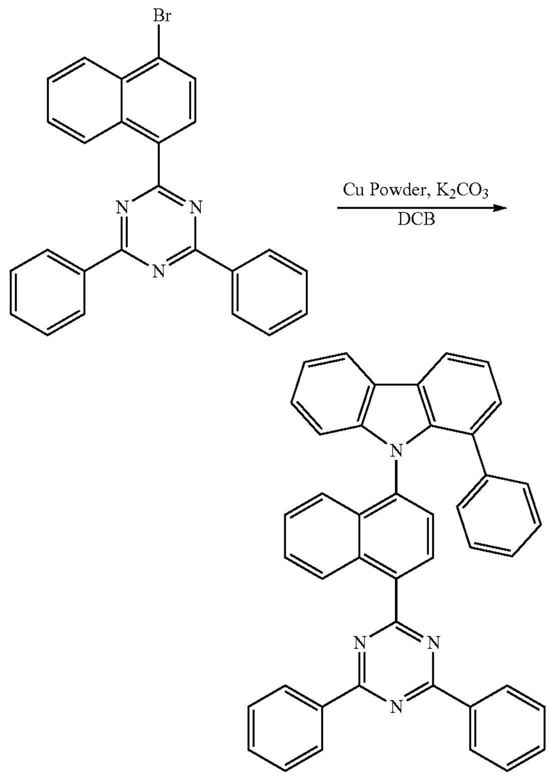

H2-116

1) Preparation of Compound 18-1

1-bromo-9H-carbazole (10 g, 40.6 mmol), phenylboronic acid (6.2 g, 48.7 mmol), $Pd(PPh_3)_4$ (2.3 g, 2.03 mmol), $Na_2CO_3$ (13 g, 121.8 mmol), toluene 200 mL, ethanol 100 mL, and water 100 mL were introduced into a flask and dissolved, and then the mixture was stirred under reflux for 3 hours. After completion of the reaction, the product was cooled to room temperature, an organic layer was extracted with ethyl acetate, and the residual moisture was removed by using magnesium sulfate. The residue was dried, and separated by column chromatography to obtain compound 18-1 (9 g, yield: 96%).

2) Preparation of Compound H2-116

Compound 18-1 (3.0 g, 12.3 mmol), 2-(4-bromonaphthalen-1-yl)-4,6-diphenyl-1,3,5-triazine (8 g, 18.5 mmol), Cu powder (0.39 g, 6.15 mmol), $K_2CO_3$ (3.4 g, 24.6 mmol), and DCB 60 mL were introduced into a flask and dissolved, and then the mixture was stirred under refluxed for 24 hours. After completion of the reaction, the product was cooled to room temperature and stirred, and MeOH was added thereto to obtain a solid. The produced solid was filtered under reduced pressure. The filtered solid was extracted with MC/Hex, and was then separated by column chromatography to obtain compound H2-116 (1.1 g, yield: 14.8%).

| Compound | MW | M.P. |
|---|---|---|
| H2-116 | 600.23 | 227° C. |

Device Examples 1 and 2: Producing a Red OLED Deposited with the Plurality of Host Materials According to the Present Disclosure as Hosts OLEDs according to the present disclosure were produced. A transparent electrode indium tin oxide (ITO) thin film (10 Ω/sq) on a glass substrate for an OLED (GEOMATEC CO., LTD., Japan) was subjected to an ultrasonic washing with acetone and isoprolyl alcohol, sequentially, and then was stored in isopropyl alcohol. The ITO substrate was then mounted on a substrate holder of a vacuum vapor deposition apparatus. Compound HI-1 of Table 2 was introduced into a cell of the vacuum vapor deposition apparatus, and compound HT-1 was then introduced into another cell, and then the two materials were evaporated at a different rate to deposit compound HI-1 in a doping amount of 3 wt % based on the total amount of compound HI-1 and compound HT-1, thereby forming a hole injection layer having a thickness of 10 nm on the ITO substrate. Next, compound HT-1 was then deposited on the hole injection layer to form a first hole transport layer having a thickness of 80 nm. Compound HT-2 was then introduced into another cell of the vacuum vapor deposition apparatus and was evaporated by applying an electric current to the cell, thereby forming a second hole transport layer having a thickness of 60 nm on the first hole transport layer. After forming the hole injection layer and the hole transport layers, a light-emitting layer was formed thereon as follows: The first host compound and the second host compound shown in Table 1 below were introduced into two cells of the vacuum vapor deposition apparatus as hosts, and compound D-71 was introduced into another cell as a dopant. The two host materials were evaporated at a rate of 1:1 and the dopant material was simultaneously evaporated at a different rate, and the dopant was deposited in a doping amount of 3 wt % based on the total amount of the hosts and the dopant to form a light-emitting layer having a thickness of 40 nm on the second hole transport layer. Compound ETL-1 and compound EIL-1 were introduced into two cells and evaporated at a weight ratio of 50:50 to form an electron transport layer having a thickness of 35 nm on the light-emitting layer. After depositing compound EI-1 as an electron injection layer having a thickness of 2 nm on the electron transport layer, an AI cathode having a thickness of 80 nm was deposited on the electron injection layer by another vacuum vapor deposition apparatus. Thus, an OLED was produced. All the materials used for producing the OLED were purified by vacuum sublimation at $10^{-6}$ torr.

Comparative Examples 1 and 2: Producing an OLED Comprising the Comparative Compound as a Host OLEDs were produced in the same manner as in Device Examples 1 and 2, except that the compounds shown in Table 1 below were used alone as a host of the light-emitting layer.

The driving voltage, the luminous efficiency, and the emission color at a luminance of 1,000 nit, and the time taken for luminance to decrease from 100% to 95% at a luminance of 5,500 nit (lifespan; T95) of the OLEDs produced in Device Examples 1 and 2, and Comparative Examples 1 and 2 are provided in Table 1 below.

TABLE 1

| | First Host | Second Host | Driving Voltage [V] | Luminous Efficiency [cd/A] | Emission Color | Lifespan T95 [hr] |
|---|---|---|---|---|---|---|
| Comparative Example 1 | — | H2-22 | 3.5 | 24.7 | Red | 57.5 |
| Comparative Example 2 | — | H2-115 | 4.0 | 25.6 | Red | 45.9 |
| Device Example 1 | H1-12 | H2-22 | 2.8 | 31.4 | Red | 455 |
| Device Example 2 | H1-22 | H2-115 | 3.1 | 32.6 | Red | 777 |

From Table 1 above, it can be seen that the OLEDs comprising a specific combination of compounds according to the present disclosure as host materials show lower driving voltage and higher luminous efficiency, and particularly much improved lifespan compared to the OLEDs using a single host material (Comparative Examples 1 and 2).

In the present disclosure, the deposition temperature can be lowered by reducing the molecular weight by simplifying the structure compared to, for example, a biscarbazole derivative in the second host compound. Meanwhile, although not intended to be limited by theory, the second host compound has a slow hole mobility due to a very deep HOMO and a fast electron mobility due to a triazine moiety. There is a need to improve the efficiency and lifespan that may fall due to the imbalance between holes and electrons. For this, it is considered that device performance can be improved by combining with a first host compound having a fast hole mobility. Although not intended to be limited as a theory, in the present disclosure, by using a combination of the first and second host compounds, the formation of excitons in the light-emitting layer can be increased to achieve high luminous efficiency and long lifespan. In addition, high power efficiency can be obtained due to low driving voltage and high luminous efficiency. The present disclosure can contribute to providing the high luminous efficiency required industrially in a red host by having such excellent properties.

TABLE 2

Hole Injection Layer/Hole Transport Layer

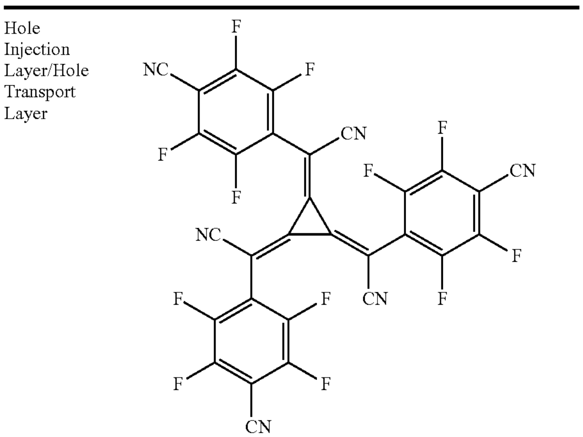

HI-1

TABLE 2-continued

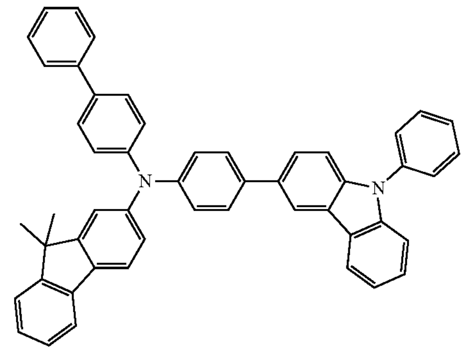

HT-1

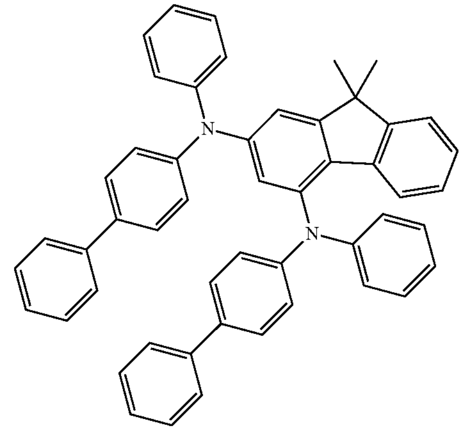

HT-2

Light-Emitting Layer

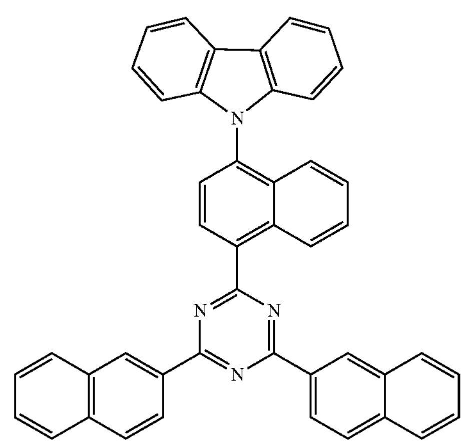

H2-22

TABLE 2-continued

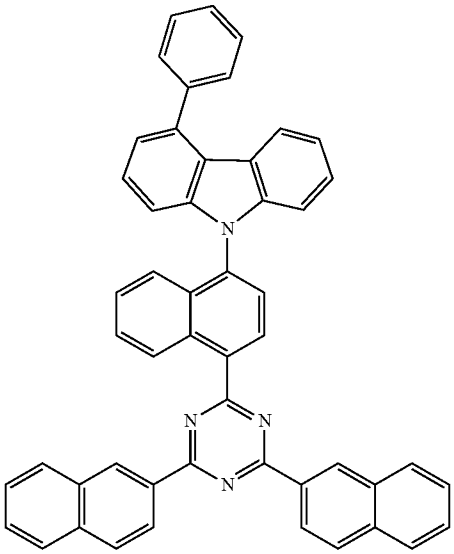

H2-115

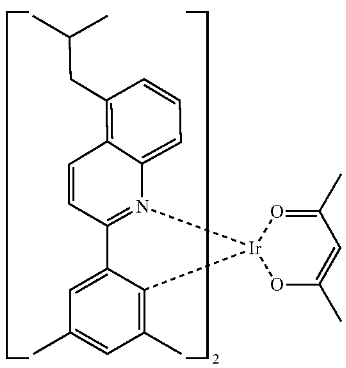

D-71

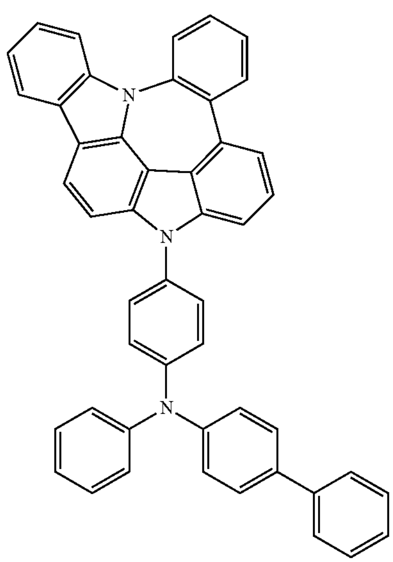

H1-22

TABLE 2-continued

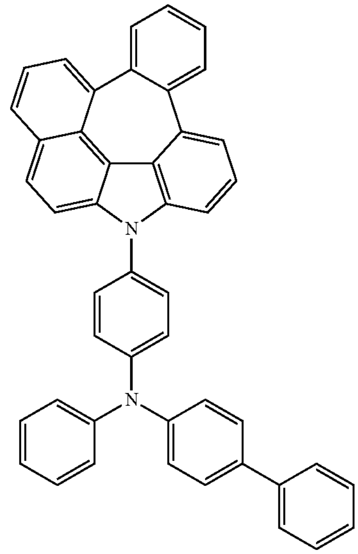

H1-12

Electron Transport Layer/ Electron Injection Layer

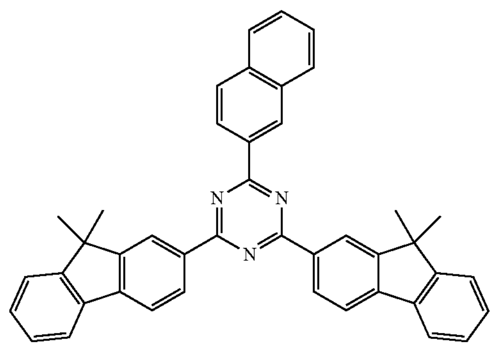

ET-1

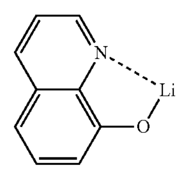

EI-1

The invention claimed is:

1. A plurality of host materials comprising a first host material comprising a compound represented by the following formula 1, and a second host material comprising a compound represented by the following formula 2:

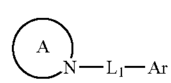

(1)

wherein $L_1$ represents a single bond, a substituted or unsubstituted (C1-C30)alkylene, a substituted or unsubstituted (C3-C30)cycloalkylene, a substituted or unsubstituted (C6-C30)arylene, or a substituted or unsubstituted (3- to 30-membered)heteroarylene;

Ar represents deuterium, a halogen, a cyano, a substituted or unsubstituted (C1-C30)alkyl, a substituted or unsubstituted (C3-C30)cycloalkyl, a substituted or unsubstituted (C3-C30)cycloalkenyl, a substituted or unsubstituted (3- to 7-membered)heterocycloalkyl, a substituted or unsubstituted (C6-C30)aryl, a substituted or unsubstituted (3- to 30-membered)heteroaryl, $—NR_{11}R_{12}$, or $—SiR_{13}R_{14}R_{15}$;

$R_{11}$ to $R_{15}$ each independently represent a substituted or unsubstituted (C1-C30)alkyl, a substituted or unsubstituted (C6-C30)aryl, or a substituted or unsubstituted (3- to 30-membered) heteroaryl;

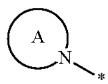

is represented by the following formula 1-1:

(1-1)

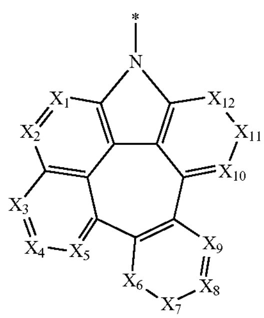

$X_1$ to $X_{12}$ each independently represent N or $CR_a$;

$R_a$ each independently represents hydrogen, deuterium, a halogen, a cyano, a substituted or unsubstituted (C1-C30)alkyl, a substituted or unsubstituted (C6-C30)aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri (C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or adjacent $R_a$'s may be linked to each other to form a ring(s), and if two or more $R_a$'s are present, each of $R_a$ may be the same or different;

* represents a bonding site to $L_1$;

(2)

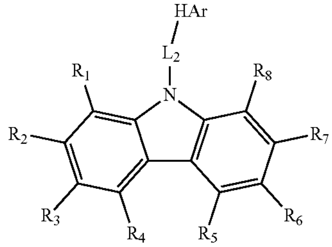

wherein

HAr represents a substituted or unsubstituted nitrogen-containing (3- to 30-membered) heteroaryl;

$L_2$ represents a single bond, or a (C6-C20)arylene unsubstituted or substituted with deuterium; and $R_1$ to $R_8$ each independently represent hydrogen, deuterium, or a (C6-C30)aryl unsubstituted or substituted with deuterium; with the proviso that any one of $R_1$ to $R_8$ may not be fused with an adjacent $R_1$ to $R_8$ to form a ring.

2. The plurality of host materials according to claim 1, wherein the substituents of the substituted alkyl, the substituted alkylene, the substituted aryl, the substituted arylene, the substituted heteroaryl, the substituted heteroarylene, the substituted cycloalkyl, the substituted cycloalkylene, the substituted cycloalkenyl, the substituted heterocycloalkyl, the substituted alkoxy, the substituted trialkylsilyl, the substituted dialkylarylsilyl, the substituted alkyldiarylsilyl, the substituted triarylsilyl, the substituted mono- or di-alkylamino, the substituted mono- or di-arylamino, and the substituted alkylarylamino in $L_1$, Ar, $R_{11}$ to $R_{15}$, $R_a$, and HAr each independently are at least one selected from the group consisting of deuterium; a halogen; a cyano; a carboxyl; a nitro; a hydroxyl; a phosphine oxide; a (C1-C30)alkyl; a halo(C1-C30)alkyl; a (C2-C30)alkenyl; a (C2-C30)alkynyl; a (C1-C30)alkoxy; a (C1-C30)alkylthio; a (C3-C30)cycloalkyl; a (C3-C30)cycloalkenyl; a (3- to 7-membered)heterocycloalkyl; a (C6-C30)aryloxy; a (C6-C30)arylthio; a (3- to 30-membered)heteroaryl unsubstituted or substituted with a (C6-C30)aryl(s); a (C6-C30)aryl unsubstituted or substituted with at least one of deuterium, a (C1-C30)alkyl(s), a (3- to 30-membered) heteroaryl(s), and a di-(C6-C30)arylamino(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl (C6-C30)arylamino; a (C1-C30)alkylcarbonyl; a (C1-C30) alkoxycarbonyl; a (C6-C30)arylcarbonyl; a (C6-C30) arylphosphine; a di(C6-C30)arylboronyl; a di(C1-C30) alkylboronyl; a (C1-C30)alkyl(C6-C30)arylboronyl; a (C6-C30)aryl(C1-C30)alkyl; and a (C1-C30)alkyl(C6-C30)aryl.

3. The plurality of host materials according to claim 1, wherein formula 1-1 is represented by the following formula 1-1-1:

(1-1-1)

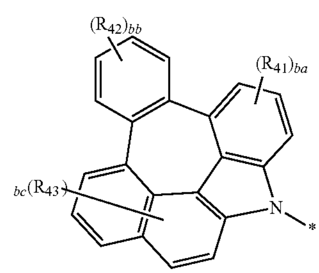

wherein $R_{41}$ to $R_{43}$ each independently represent hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30)cycloalkyl, a substituted or unsubstituted (C1-C30)alkoxy, a substituted or unsubstituted tri(C1-C30)alkylsilyl, a substituted or unsubstituted di(C1-

C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl(C6-C30)arylamino; or may be linked to an adjacent substituent to form a ring(s); and ba represents an integer of 1 to 3, bb represents an integer of 1 to 4, bc represents an integer of 1 to 5, where if ba, bb, and bc are an integer of 2 or more, each of $R_{41}$, each of $R_{42}$, and each of $R_{43}$ may be the same or different.

4. The plurality of host materials according to claim 1, wherein HAr of formula 2 represents a substituted or unsubstituted triazinyl, a substituted or unsubstituted pyridyl, a substituted or unsubstituted pyrimidinyl, a substituted or unsubstituted quinazolinyl, a substituted or unsubstituted benzoquinazolinyl, a substituted or unsubstituted quinoxalinyl, a substituted or unsubstituted benzoquinoxalinyl, a substituted or unsubstituted quinolyl, a substituted or unsubstituted benzoquinolyl, a substituted or unsubstituted isoquinolyl, a substituted or unsubstituted benzoisoquinolyl, a substituted or unsubstituted triazolyl, a substituted or unsubstituted pyrazolyl, a substituted or unsubstituted naphthyridinyl, or a substituted or unsubstituted benzothienopyrimidinyl.

5. The plurality of host materials according to claim 1, wherein $L_2$ of formula 2 represents a single bond, a phenylene unsubstituted or substituted with deuterium, a naphthylene unsubstituted or substituted with deuterium, a biphenylene unsubstituted or substituted with deuterium, a terphenylene unsubstituted or substituted with deuterium, or a phenylene-naphthylene unsubstituted or substituted with deuterium.

6. The plurality of host materials according to claim 1, wherein the compound represented by formula 1 is at least one selected from the following compounds:

H1-1

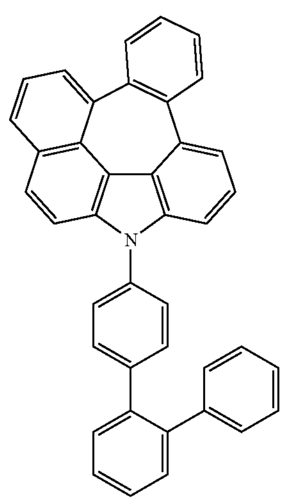

-continued

H1-2

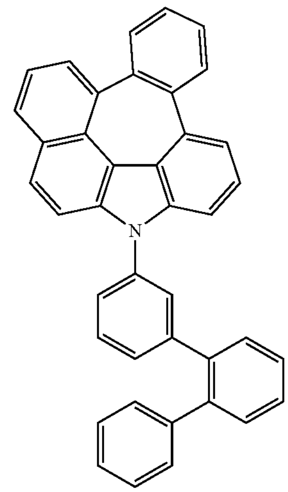

H1-3

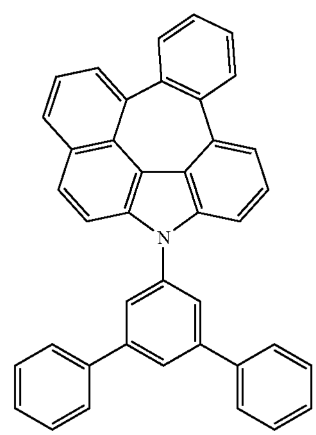

H1-4

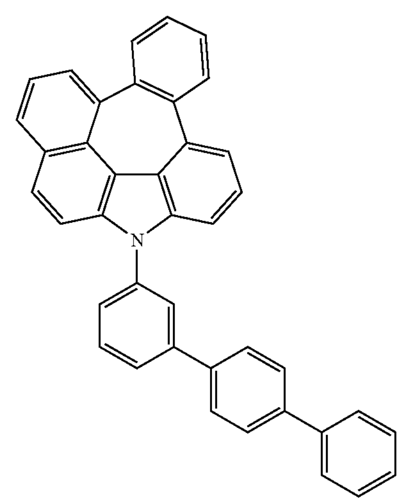

-continued
H1-6
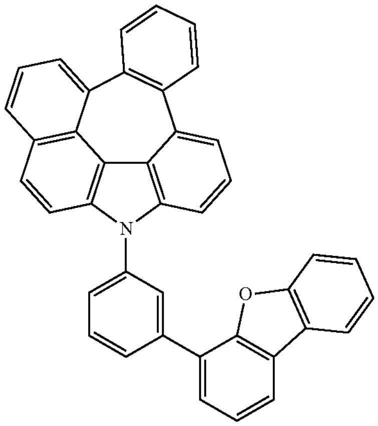
H1-7
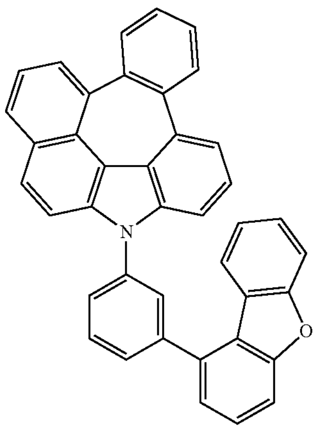
H1-8
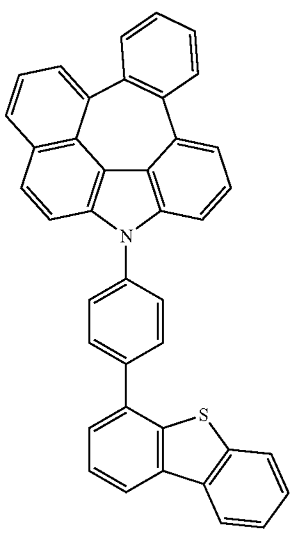
-continued
H1-11
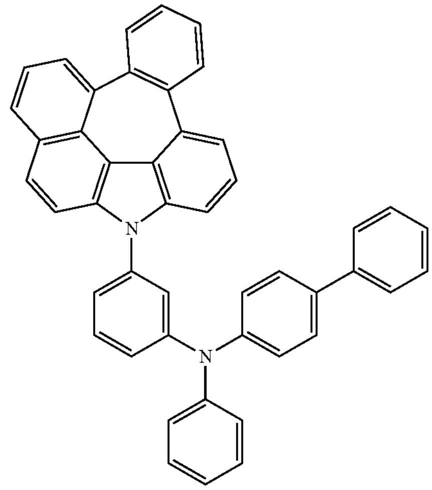
H1-12
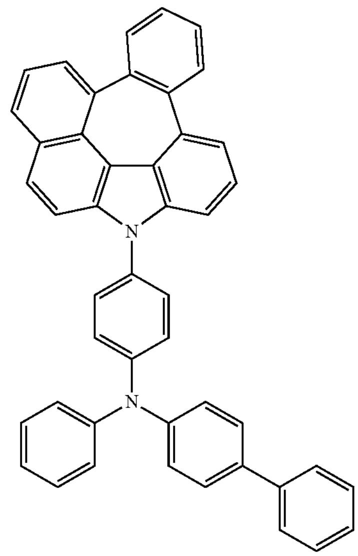
H1-13
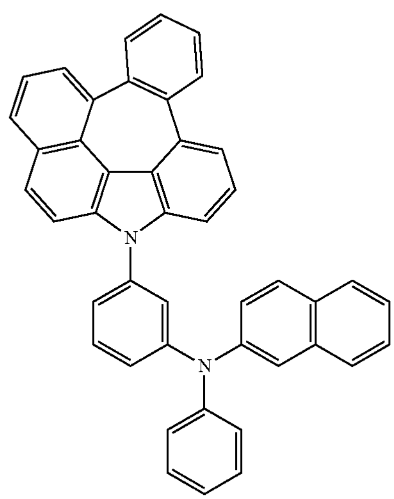

-continued
H1-16
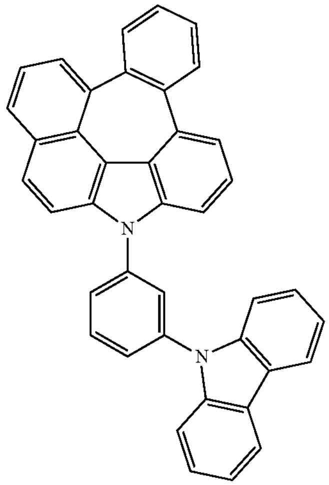
H1-17
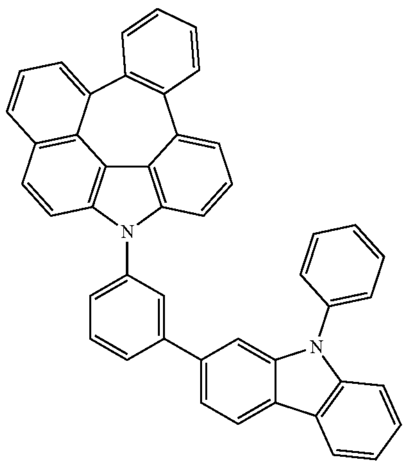
H1-18
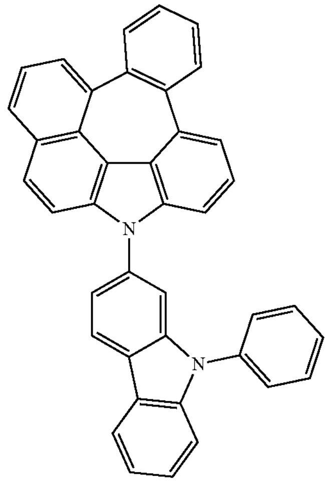
-continued
H1-26
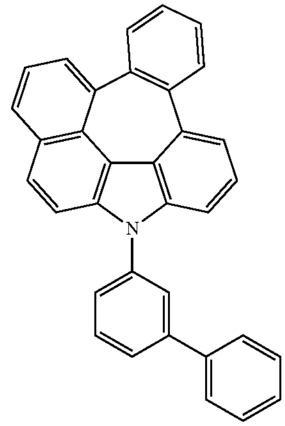
H1-27
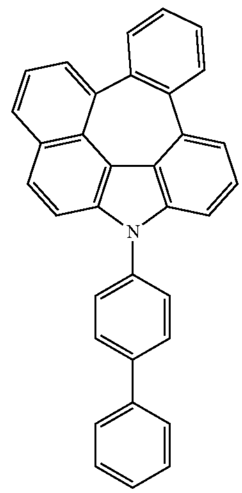
H1-28
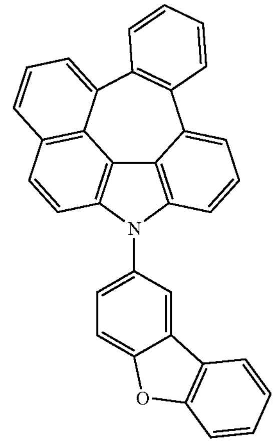

-continued
H1-32
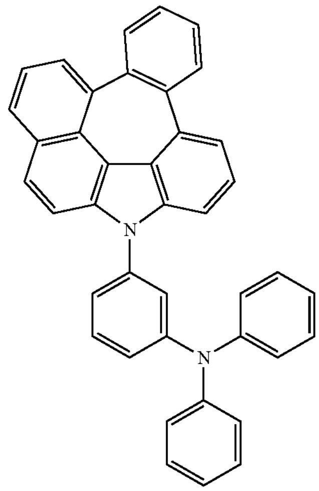
H1-33
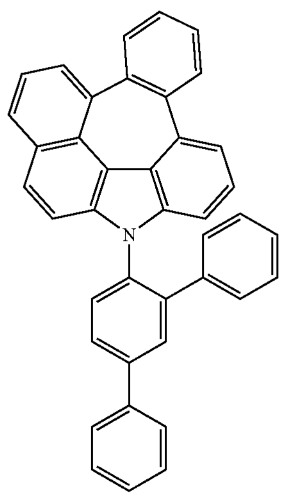
H1-34
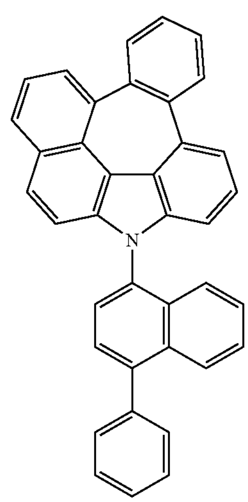
-continued
H1-38
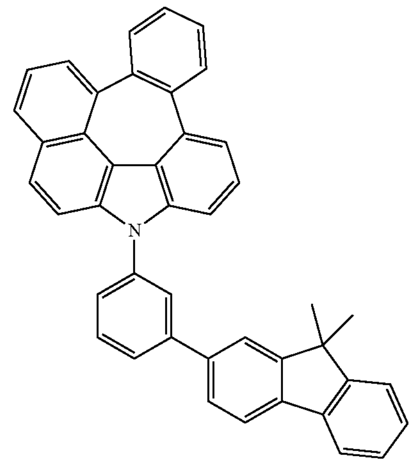
H1-39
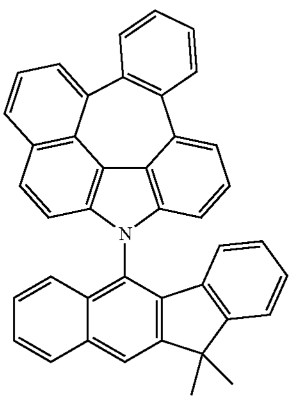
H1-40
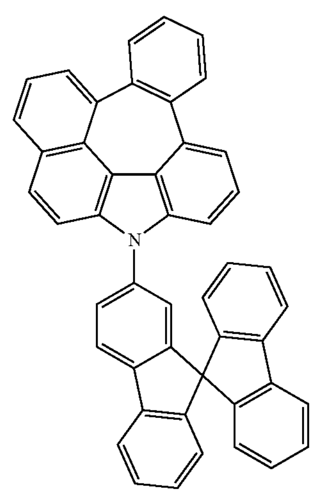

-continued
H1-43
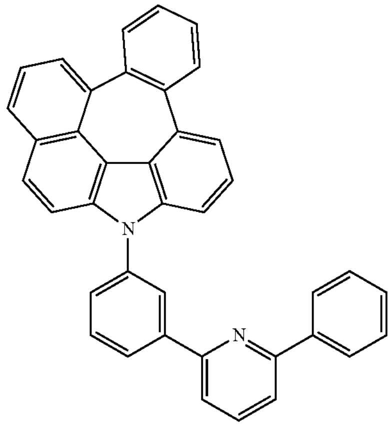
H1-44
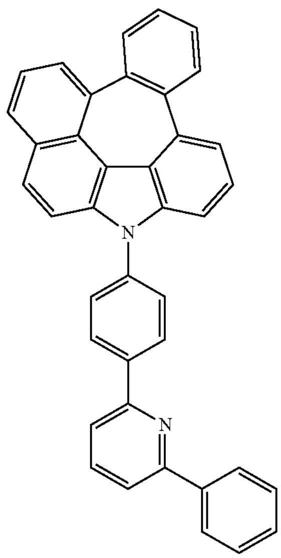
H1-45
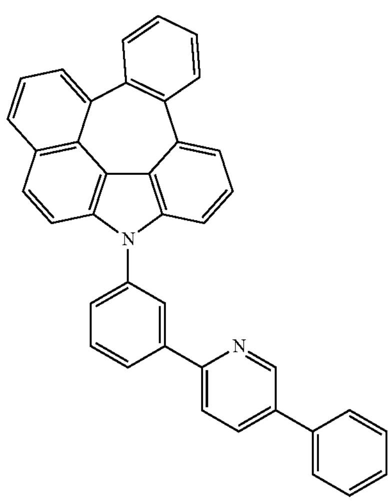
-continued
H1-48
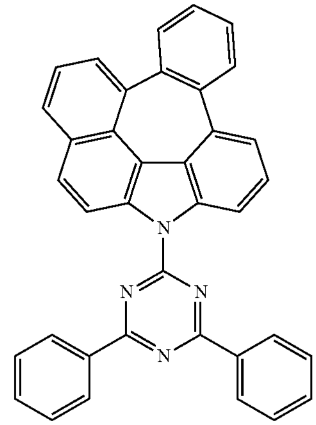
H1-49
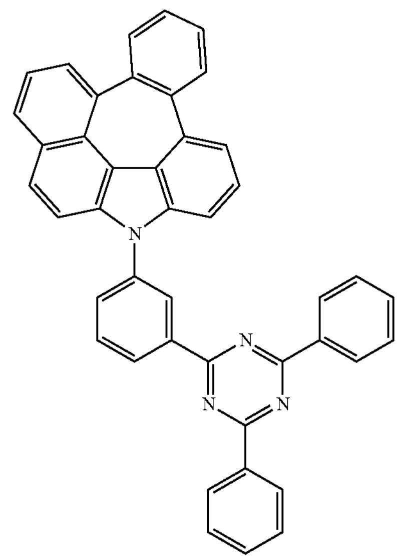
H1-50
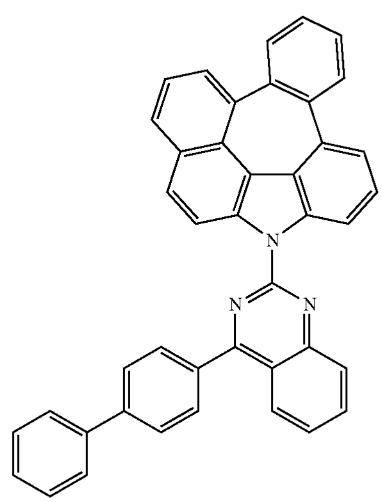

H1-53
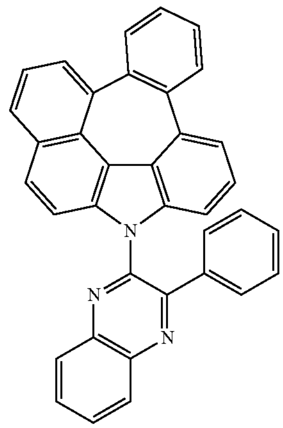
H1-54
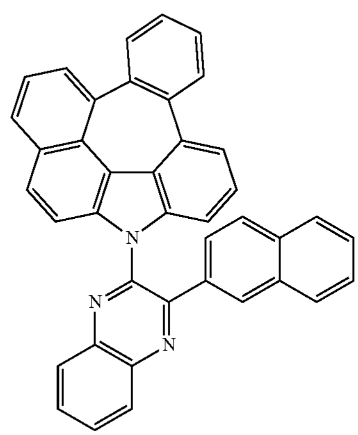
H1-55
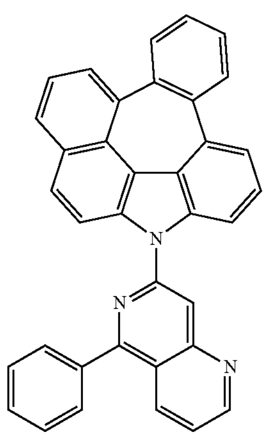
H1-58
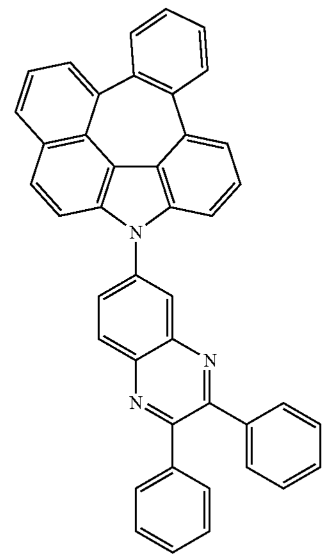
H1-59
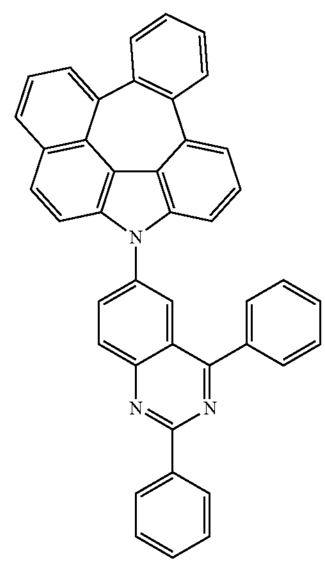
H1-60
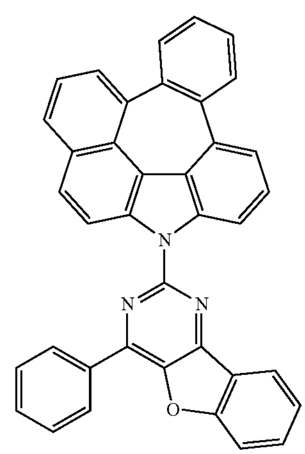

-continued
H1-63
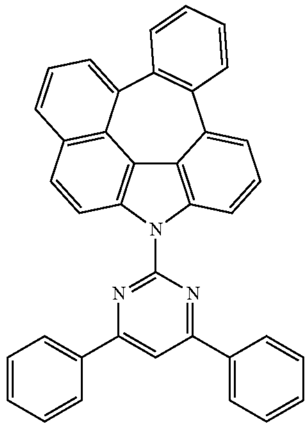
H1-64
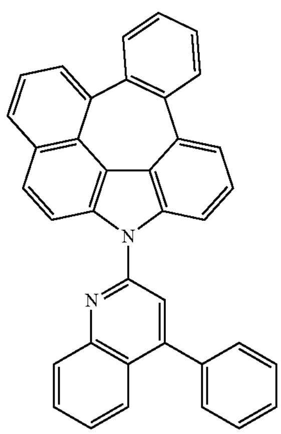
H1-65
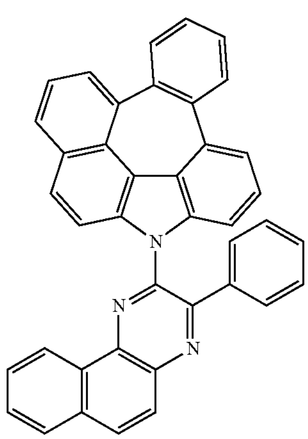
-continued
H1-66
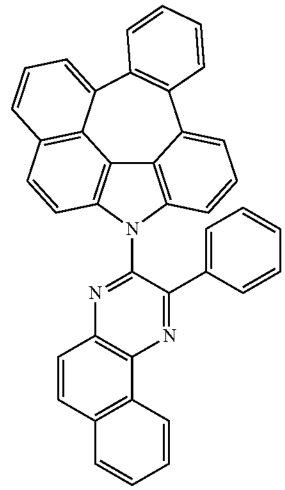
H1-68
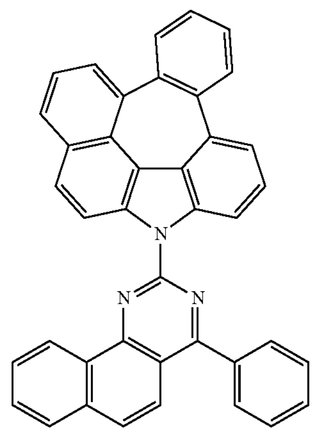
H1-79
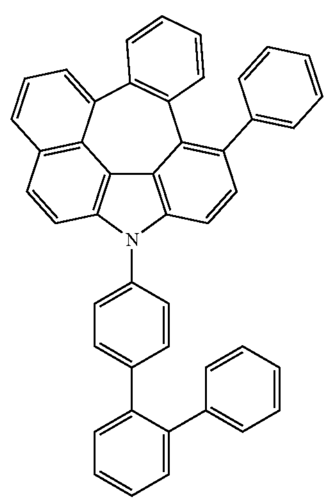

-continued
H1-80
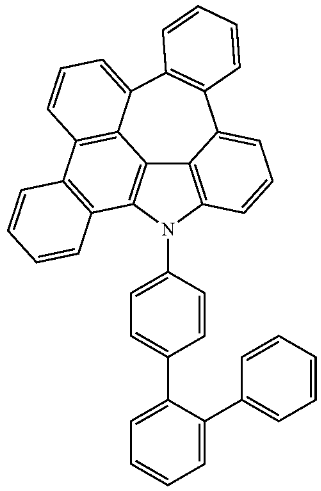
H1-84
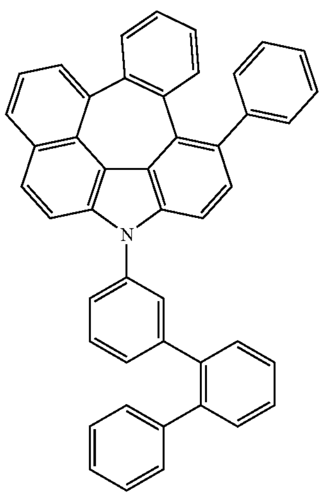
H1-85
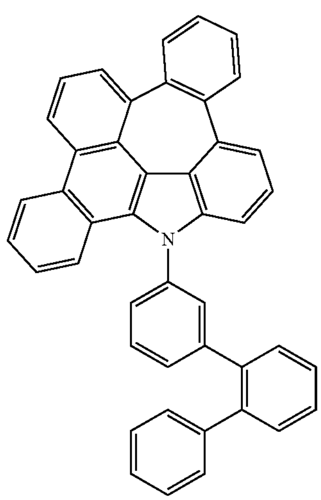
-continued
H1-89
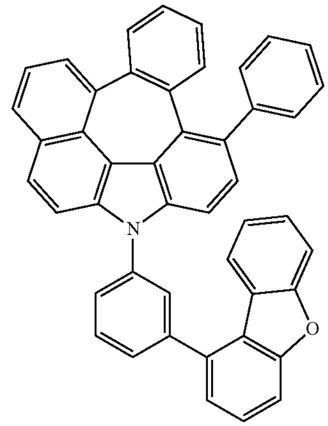
H1-90
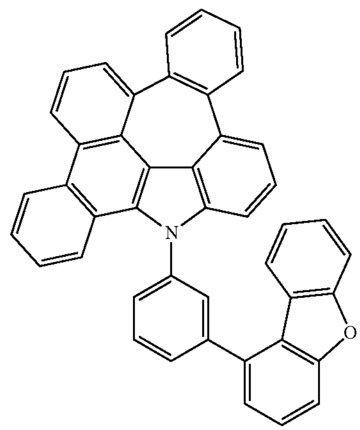
H1-94
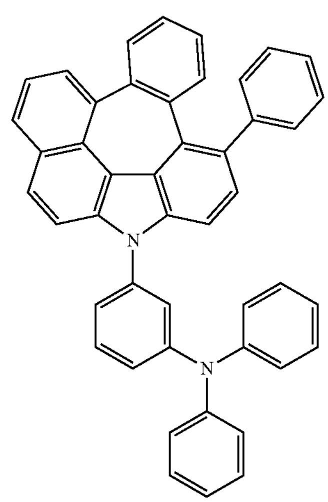

-continued
H1-95
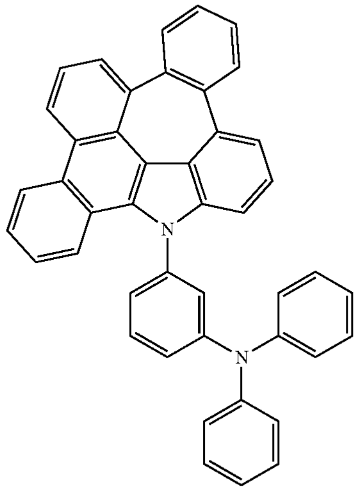
H1-99
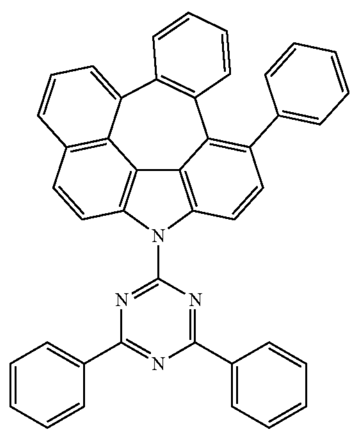
H1-100
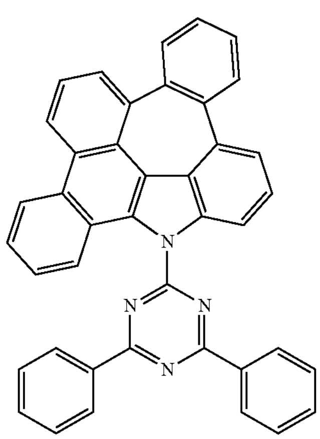
-continued
H1-104
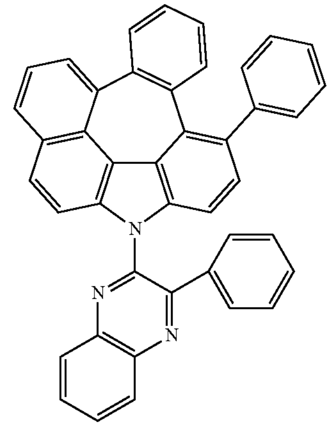
H1-105
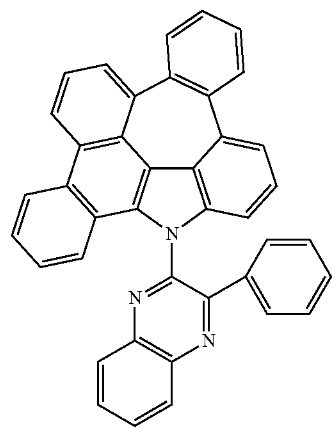
H1-109
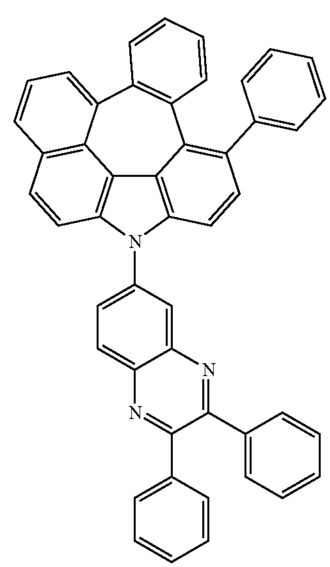

-continued
H1-110
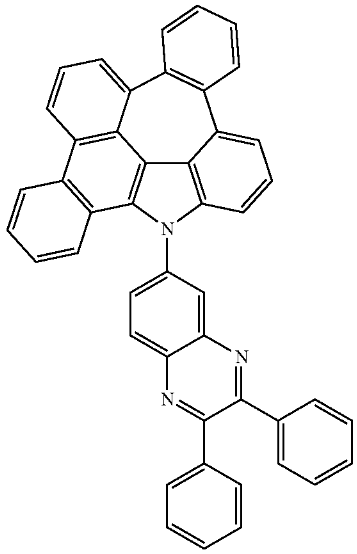
H1-114
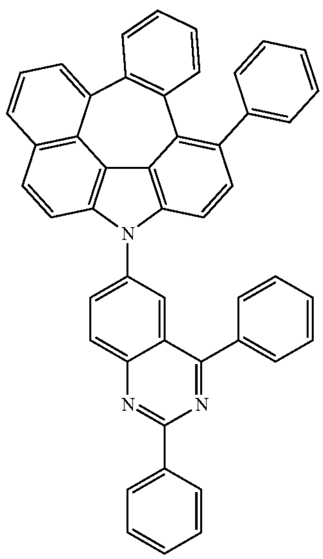
H1-115
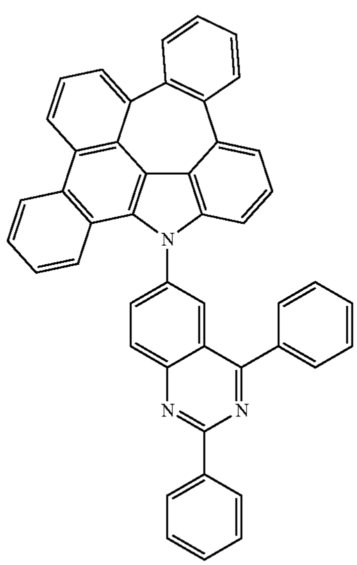
-continued
H1-119
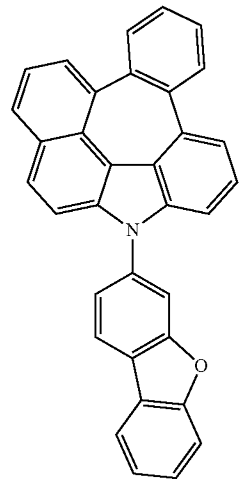
H1-121
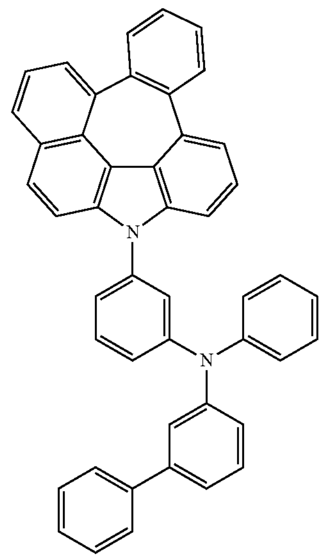
and
H1-122
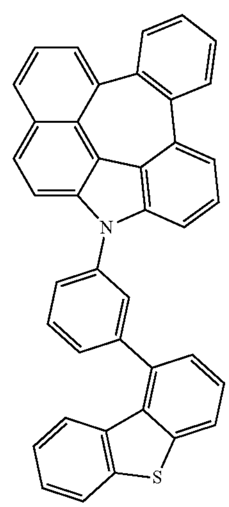
.
7. The plurality of host materials according to claim 1, wherein the compound represented by formula 2 is at least one selected from the following compounds:

H2-1
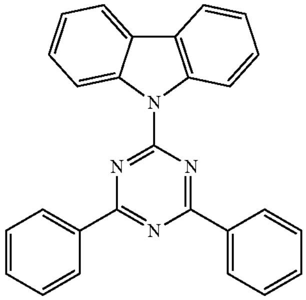
H2-2
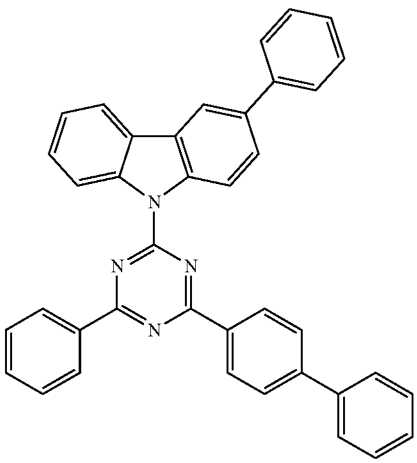
H2-3
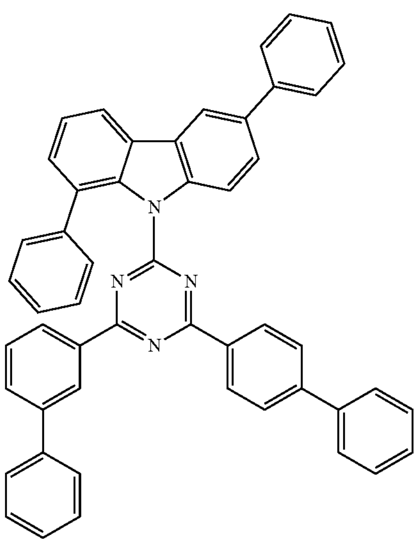
-continued
H2-4
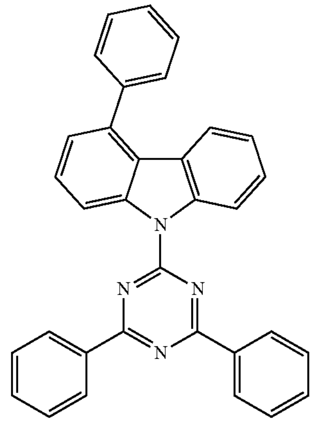
H2-5
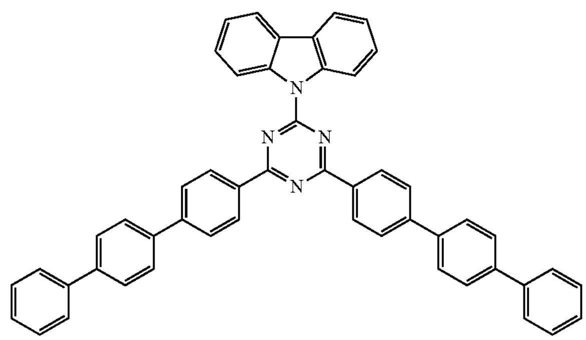
H2-6
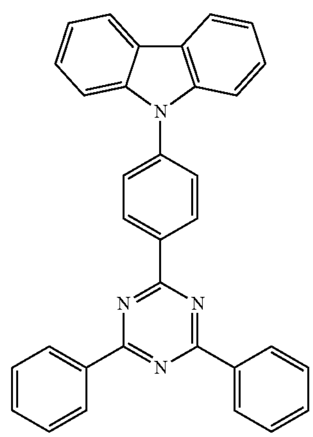

-continued
H2-7
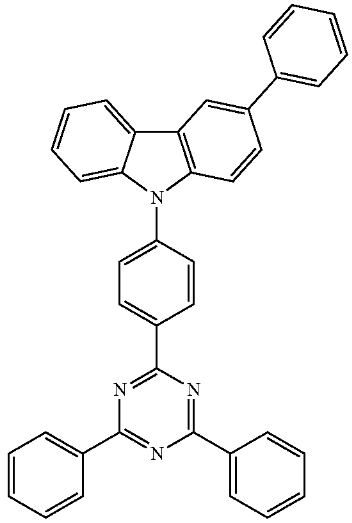
H2-8
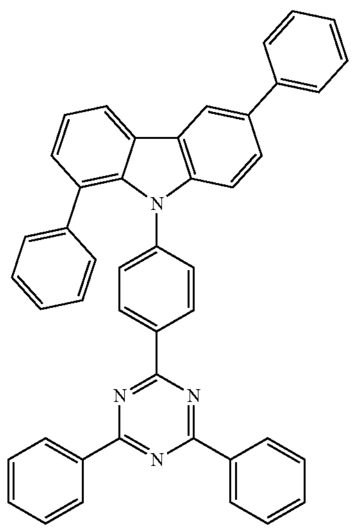
H2-9
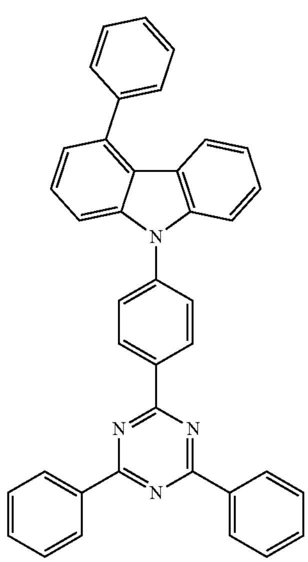
-continued
H2-10
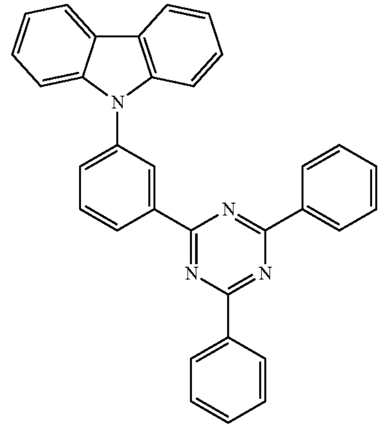
H2-11
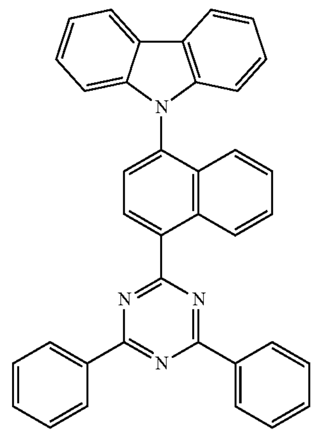
H2-12
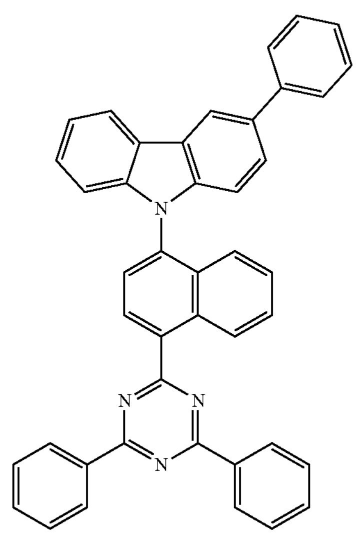

-continued
H2-13
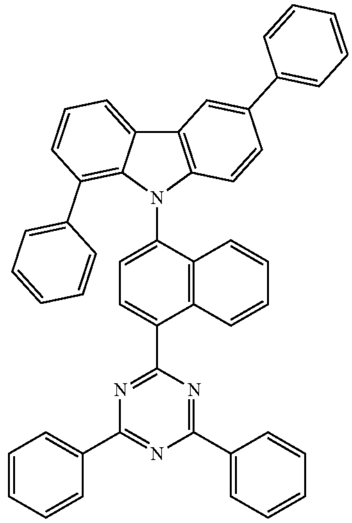
H2-14
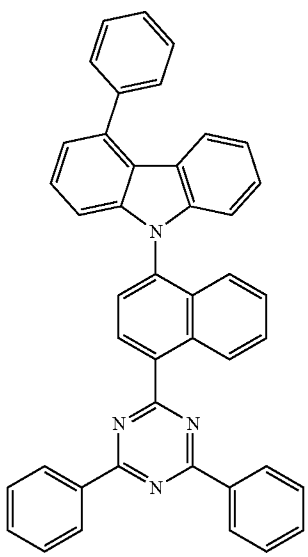
H2-15
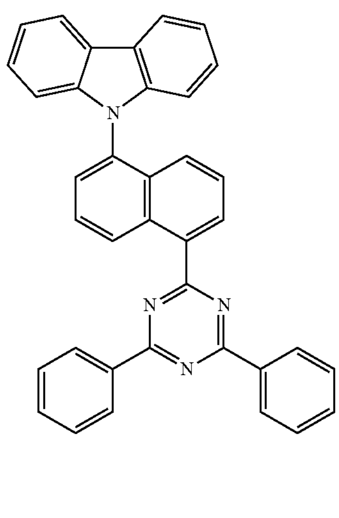
-continued
H2-16
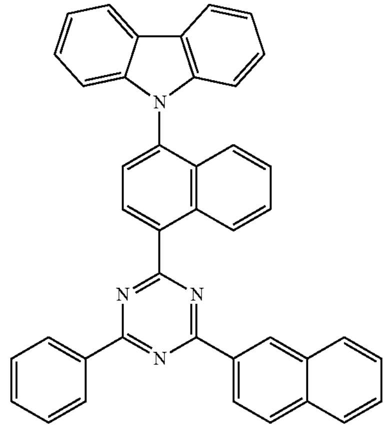
H2-17
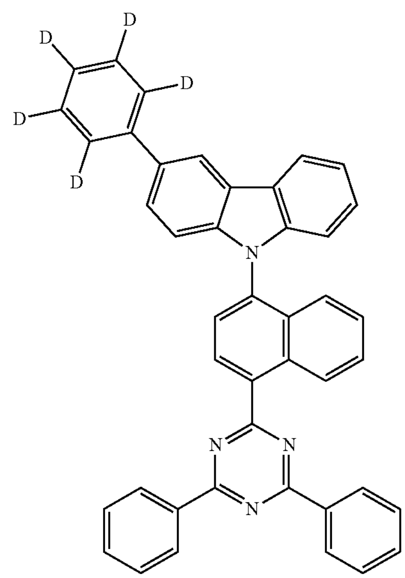
H2-18
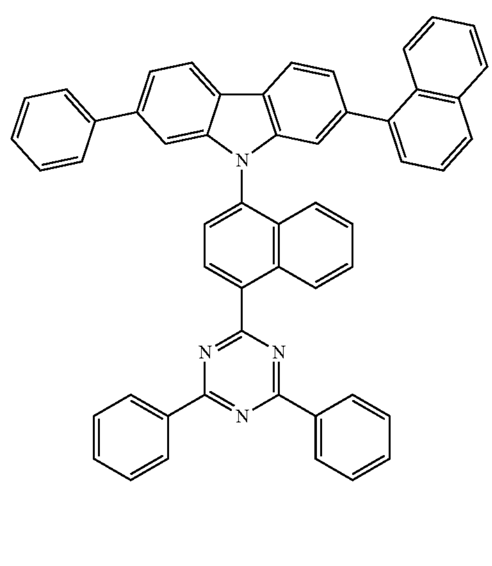

-continued
H2-19
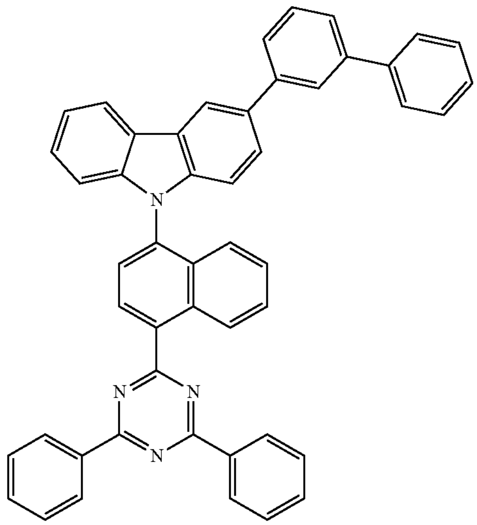
H2-20
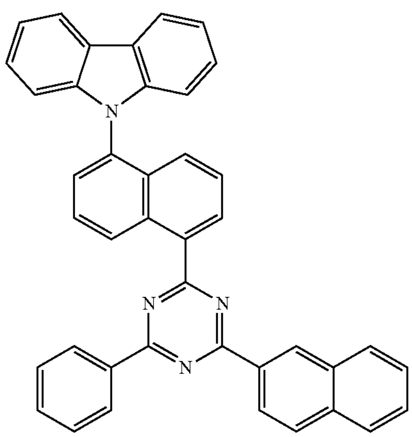
H2-21
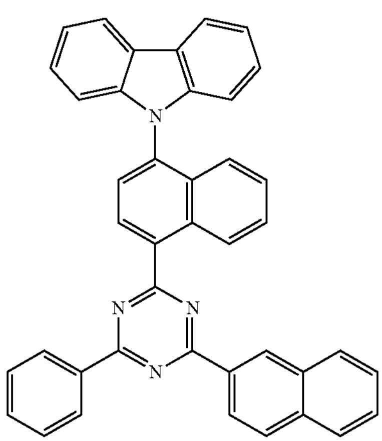
-continued
H2-22
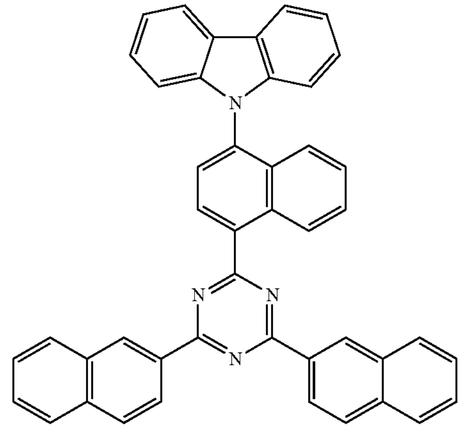
H2-23
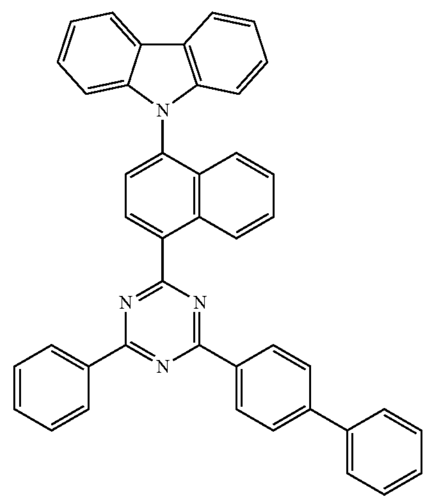
H2-24
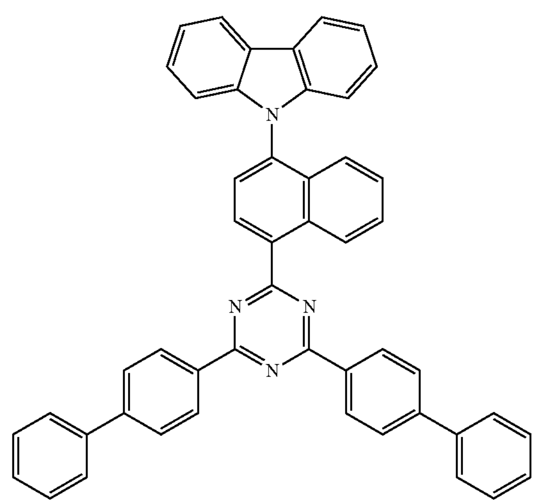

-continued
H2-25
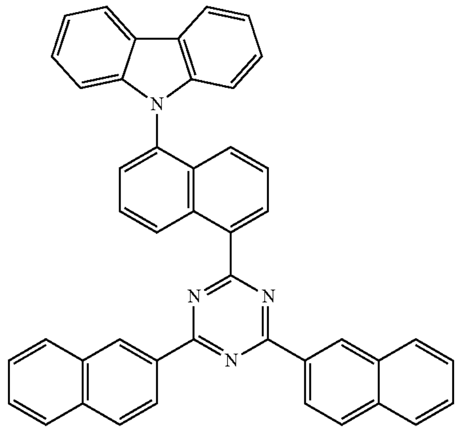
H2-26
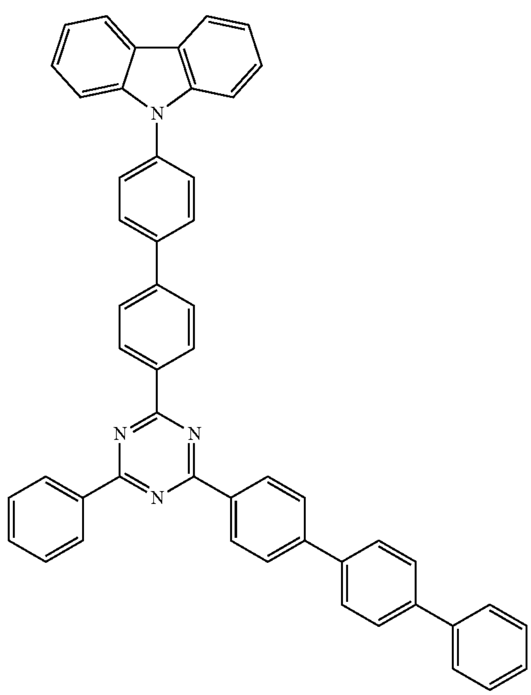
-continued
H2-27
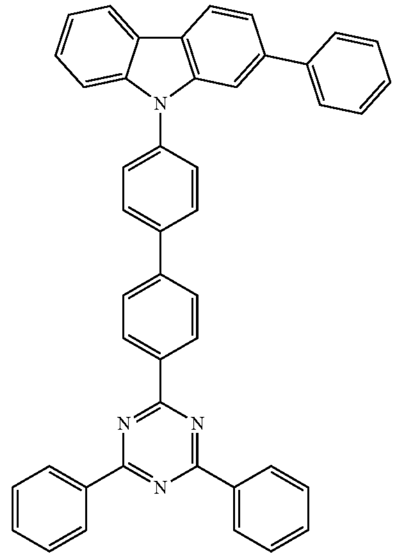
H2-28
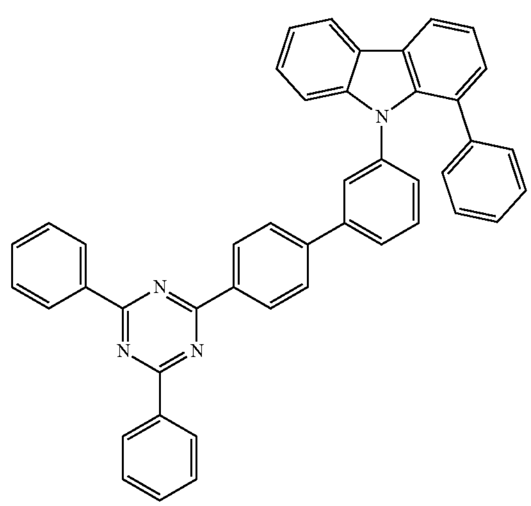

-continued
H2-29
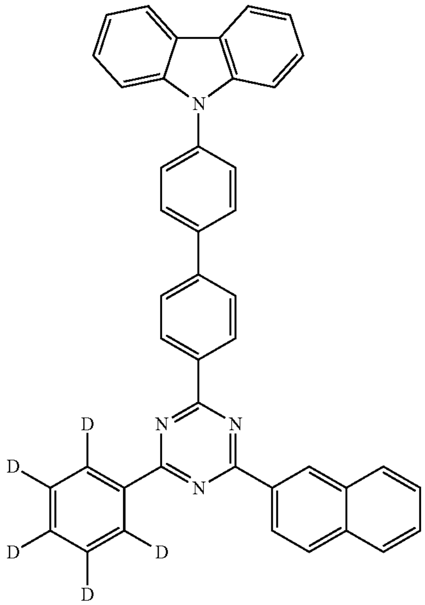
H2-30
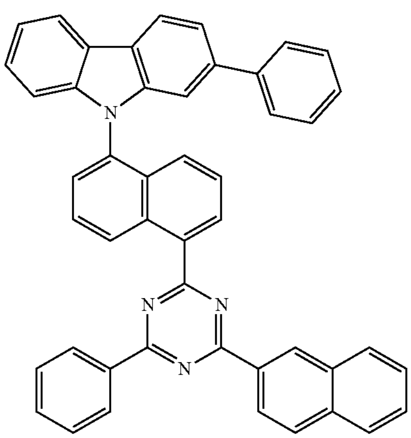
-continued
H2-31
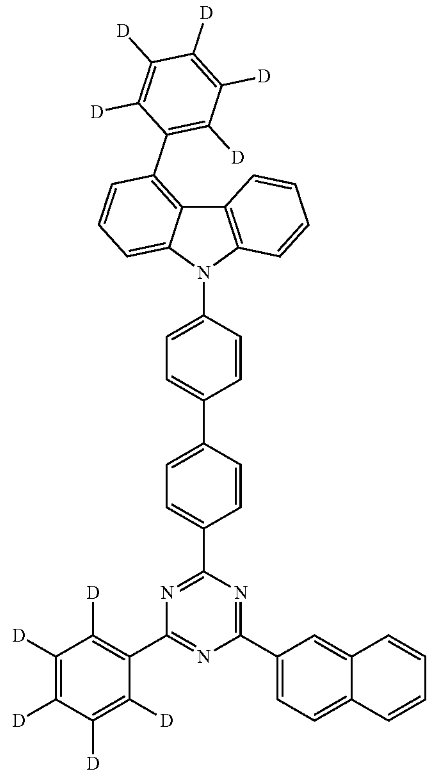
H2-32
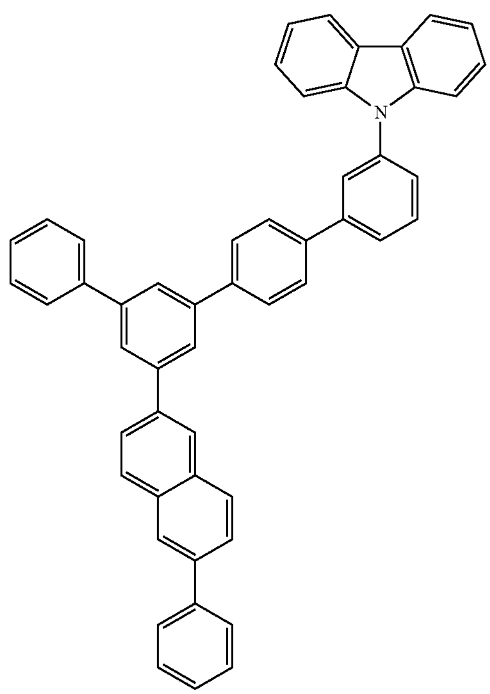

-continued
H2-33
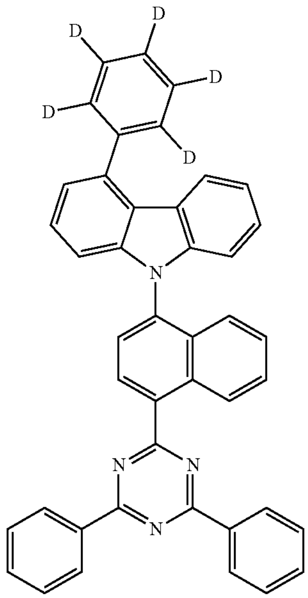
H2-34
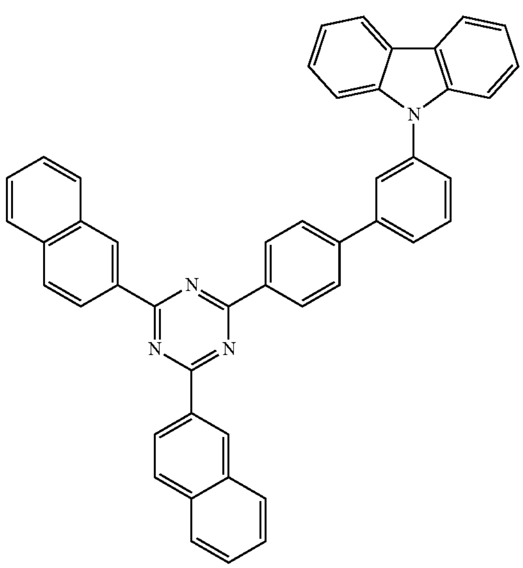
H2-35
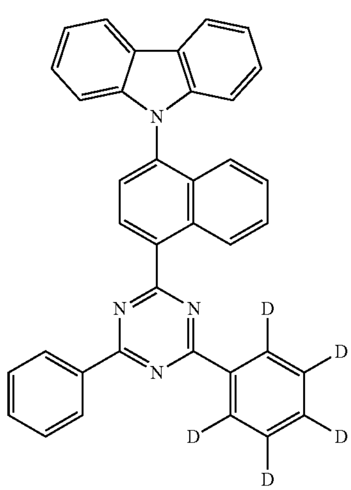
-continued
H2-36
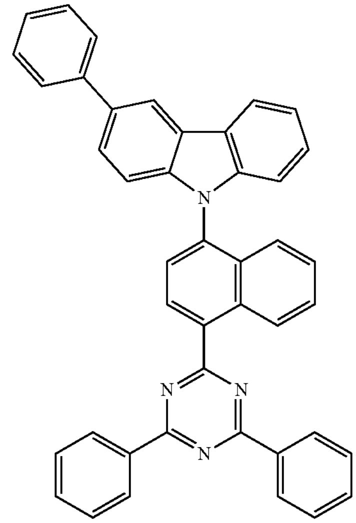
H2-37
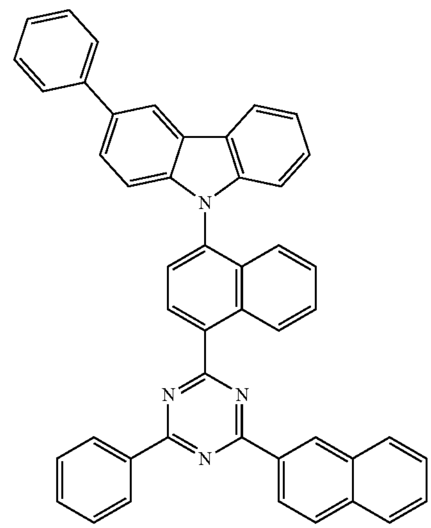
H2-38
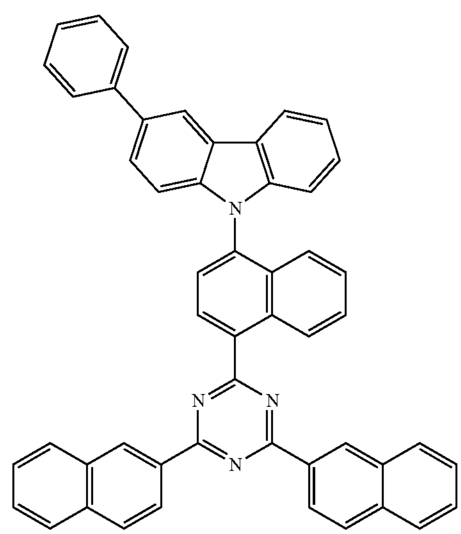

-continued
H2-39
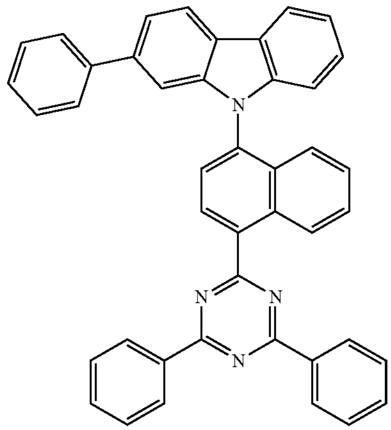
H2-40
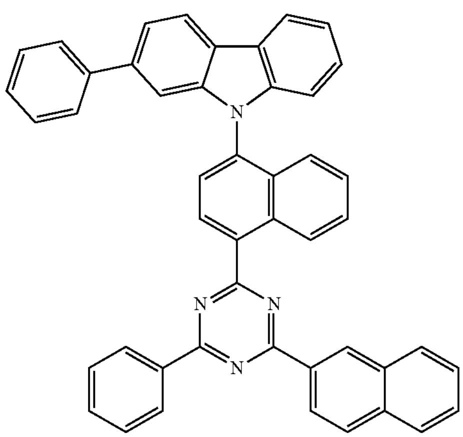
H2-41
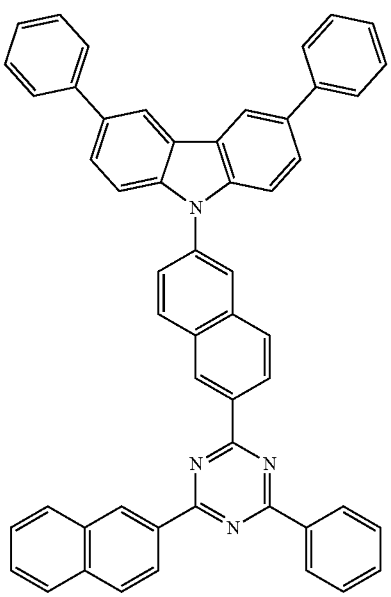
-continued
H2-42
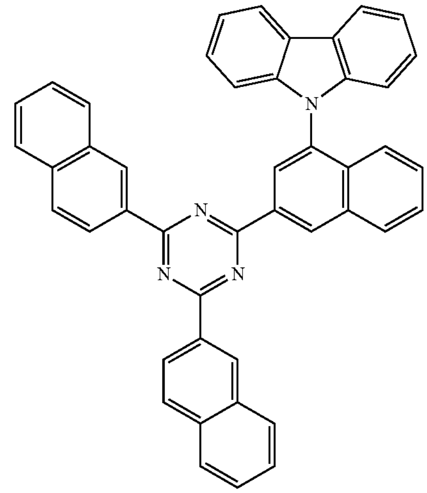
H2-43
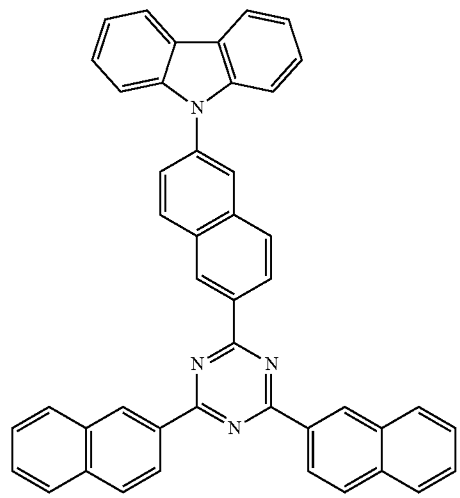
H2-44
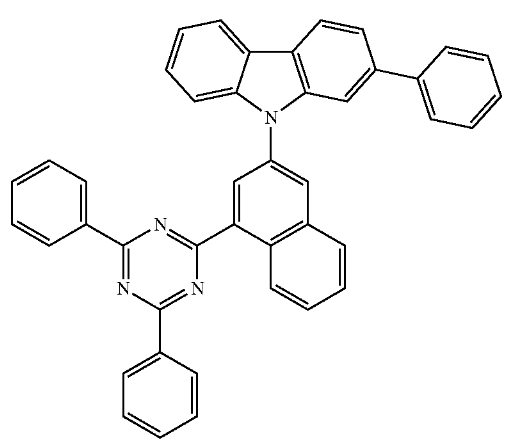

-continued
H2-45
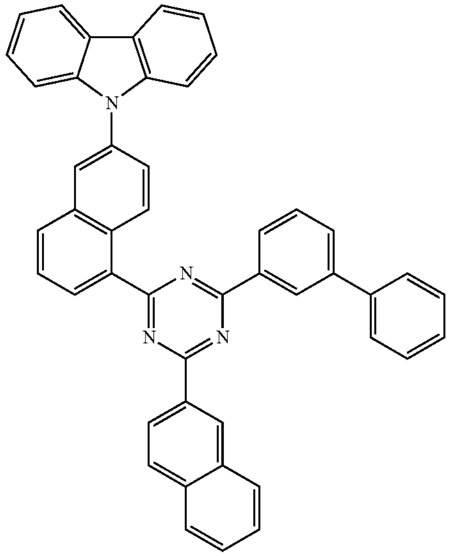
H2-46
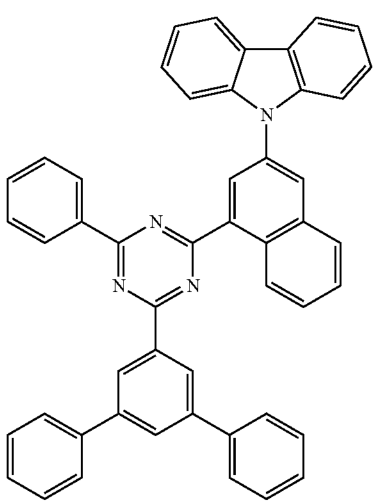
-continued
H2-47
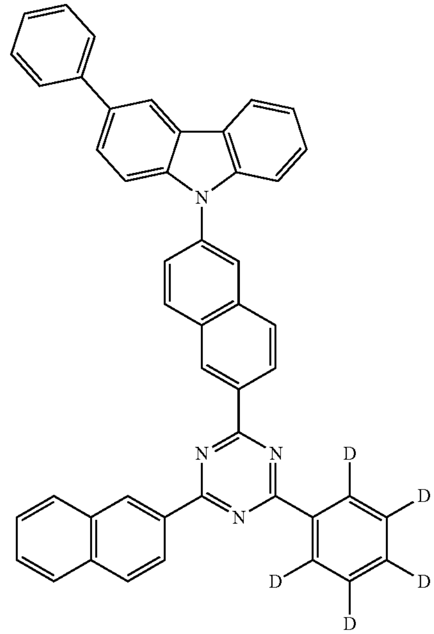
H2-48
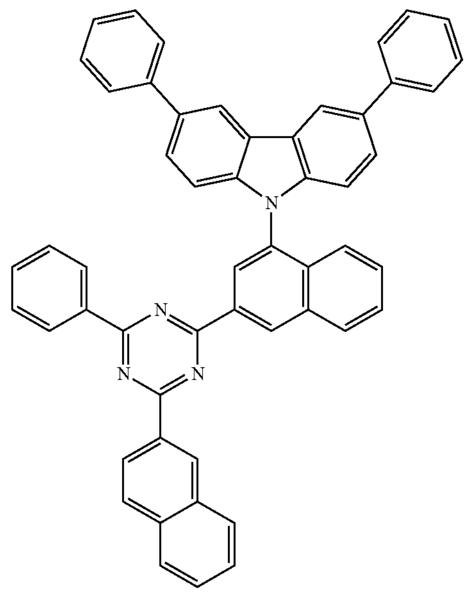
H2-49
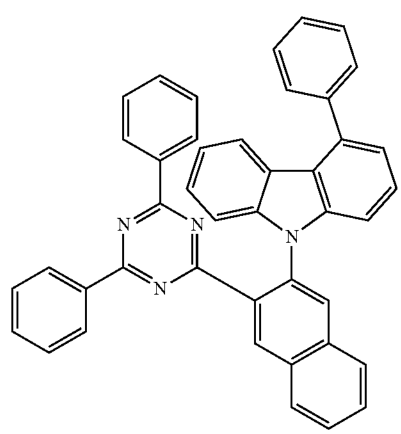

-continued
H2-50
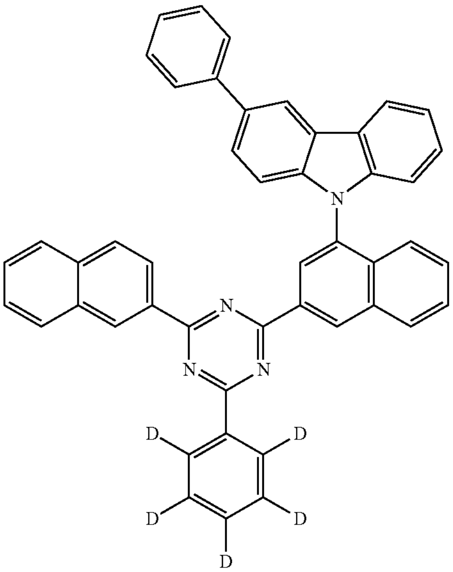
H2-51
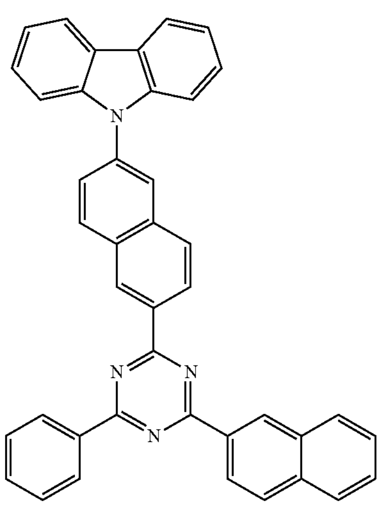
-continued
H2-52
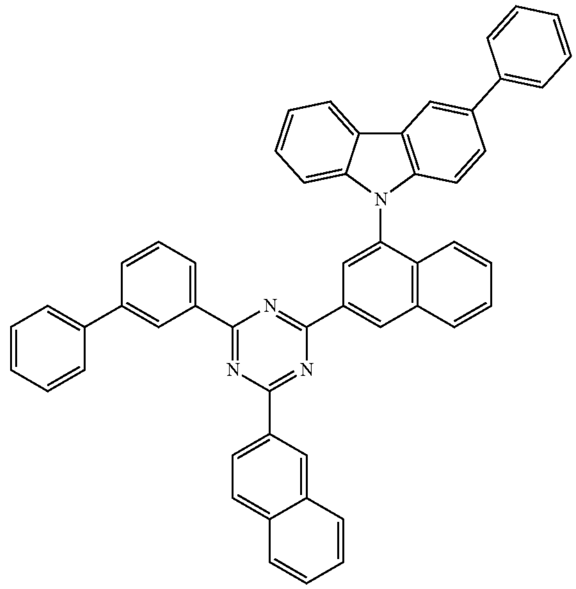
H2-53
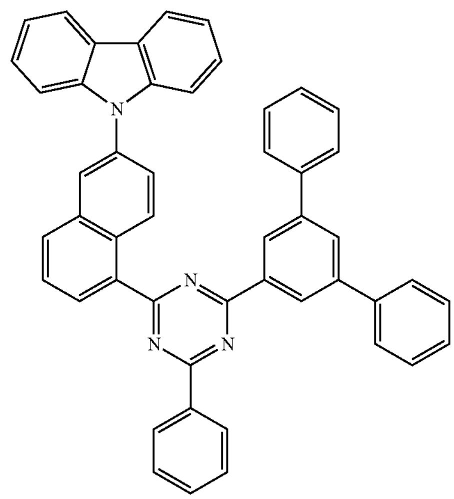
H2-54
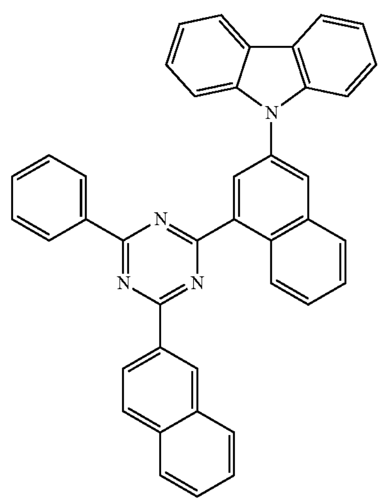

H2-55
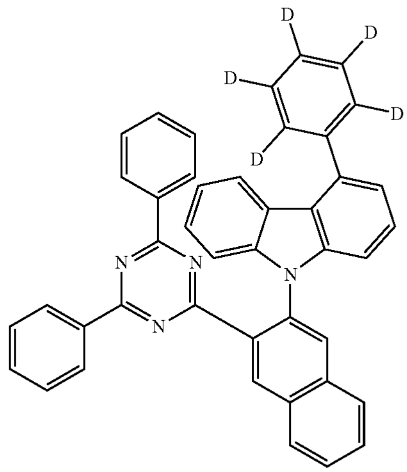
H2-56
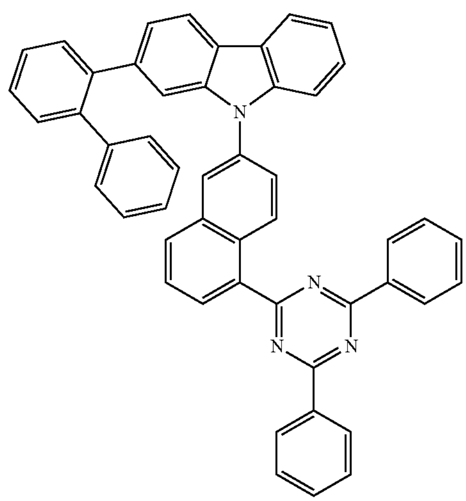
H2-57
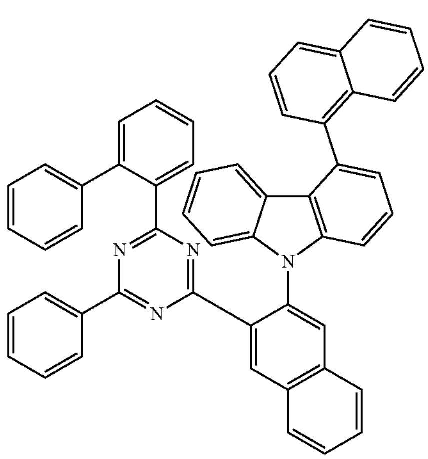
H2-58
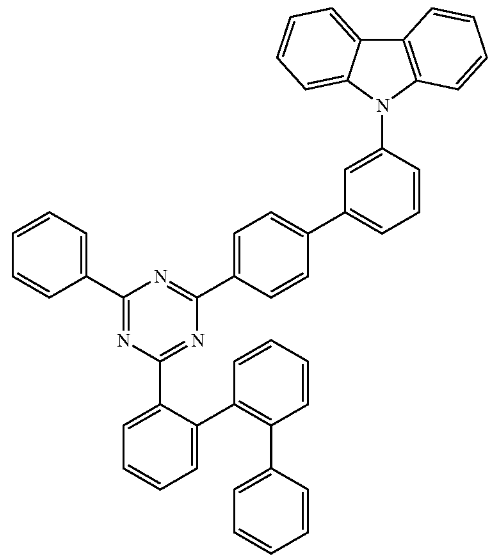
H2-59
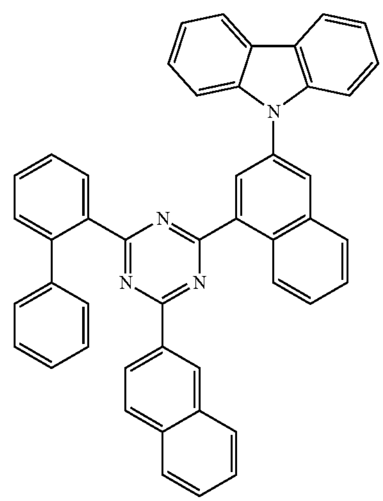
H2-60
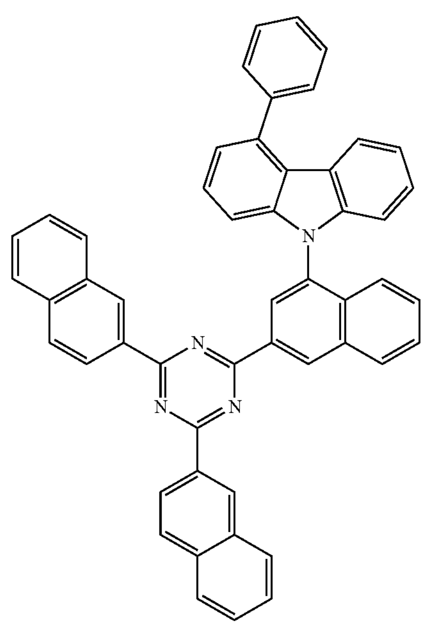

-continued
H2-61
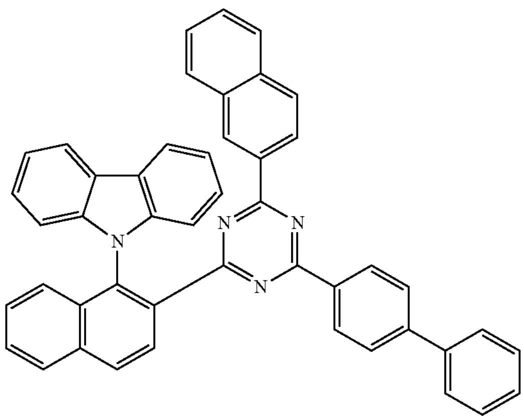
H2-62
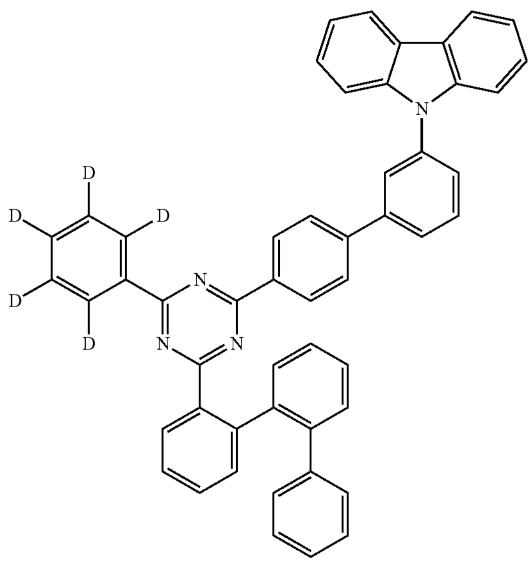
H2-63
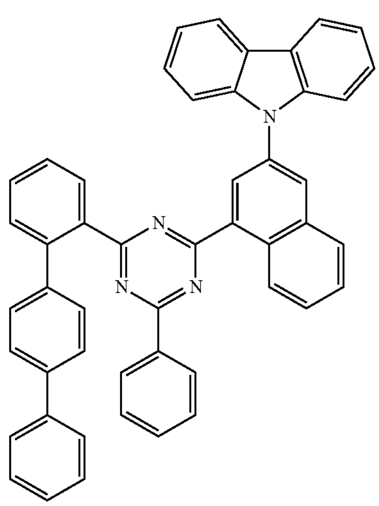
-continued
H2-64
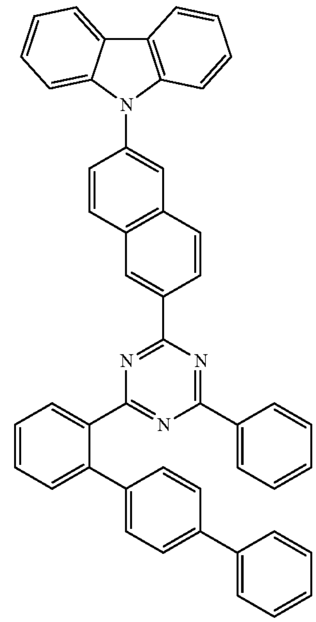
H2-65
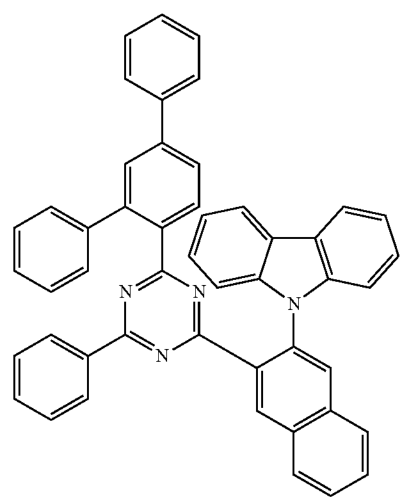
H2-66
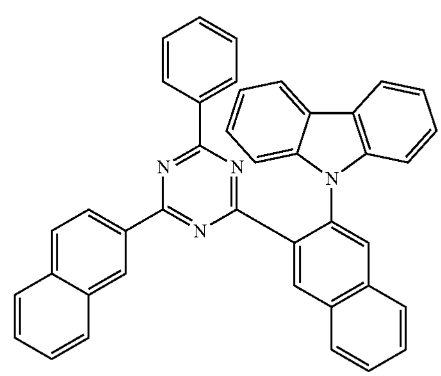

-continued
H2-67
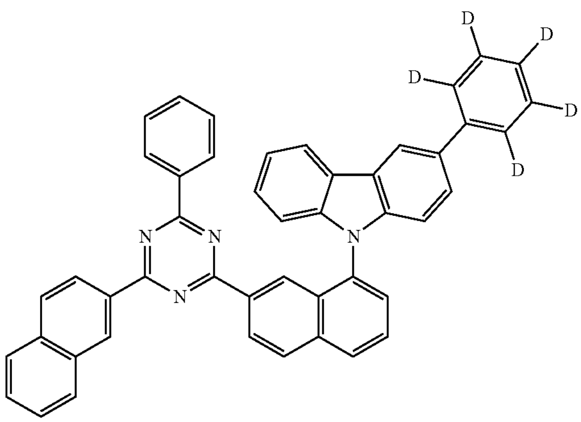
H2-68
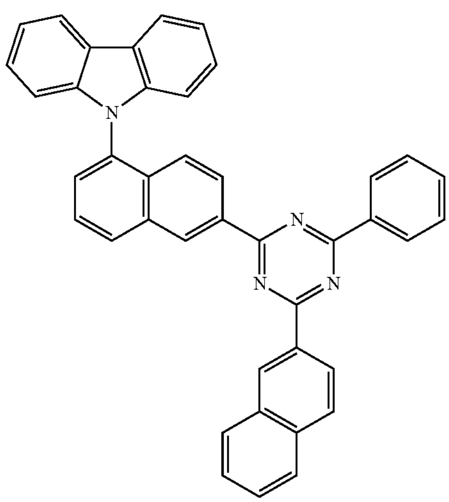
H2-69
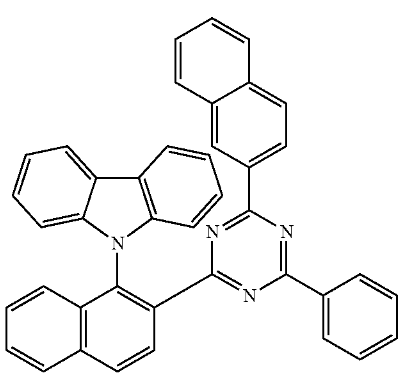
-continued
H2-70
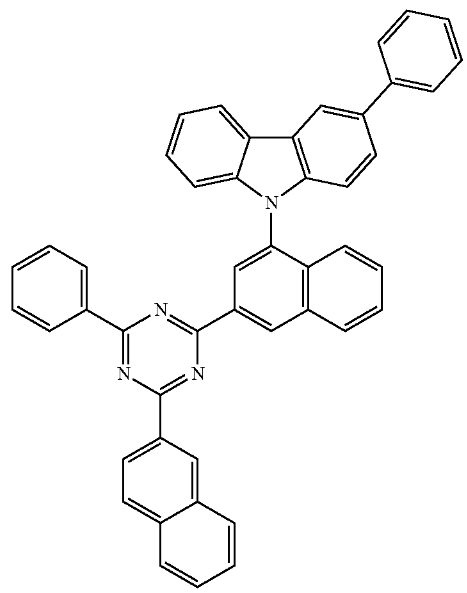
H2-71
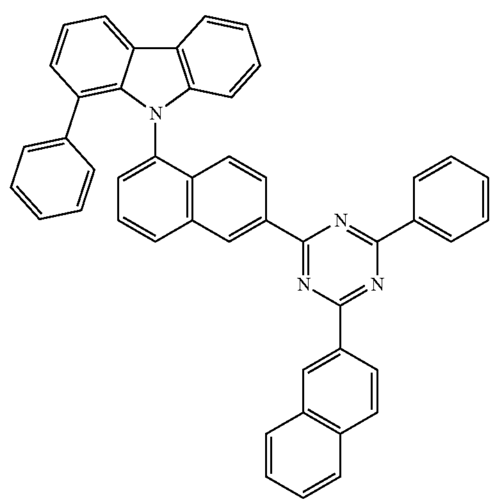
H2-72
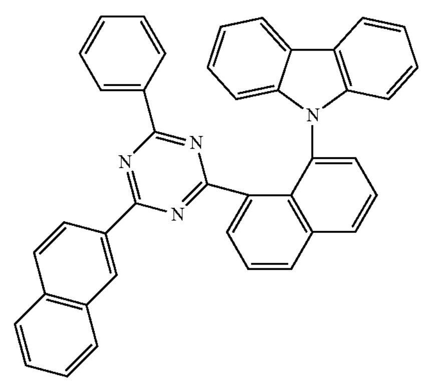

H2-73
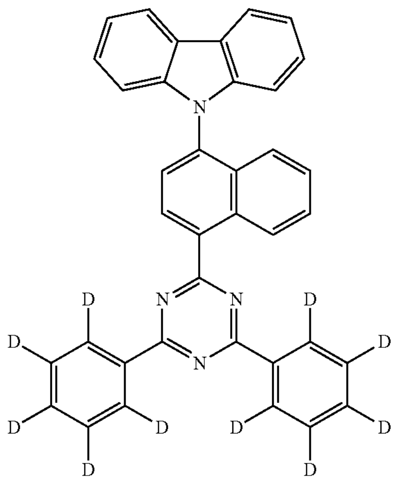
H2-74
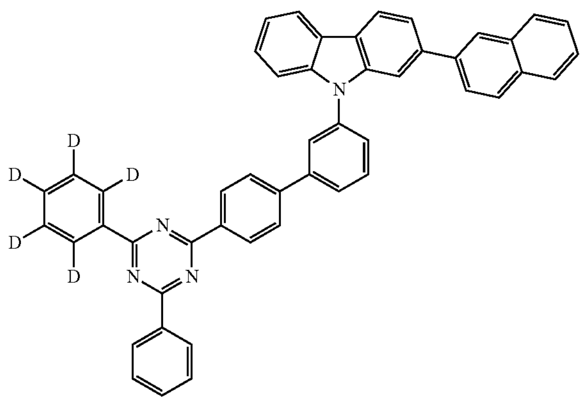
H2-75
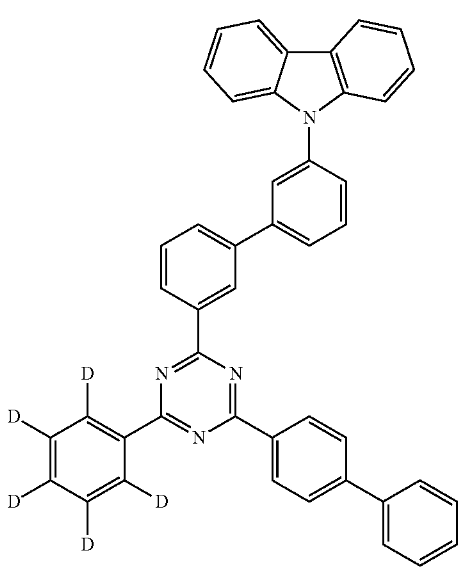
H2-76
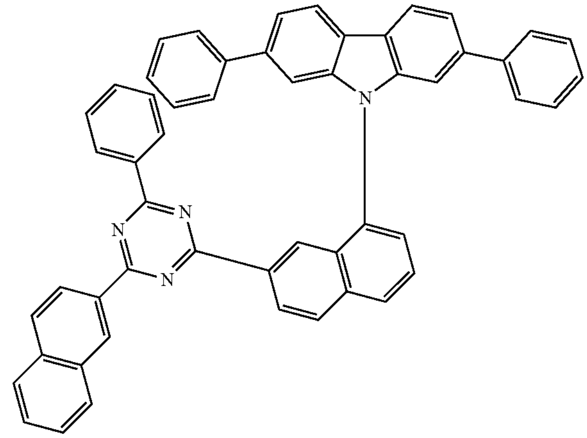
H2-77
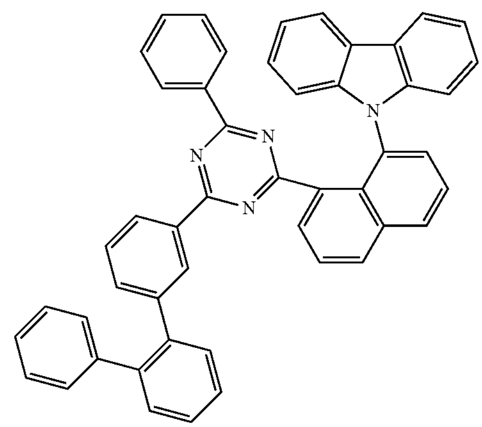
H2-78
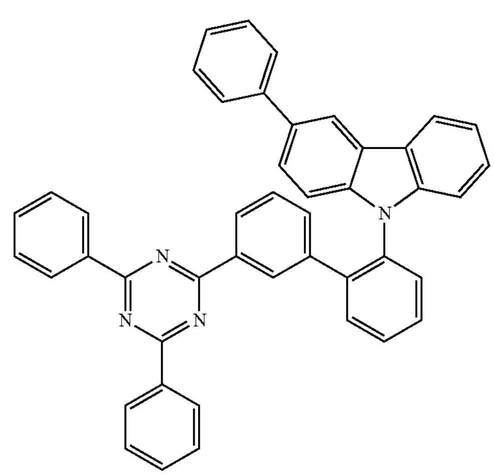

-continued
H2-79
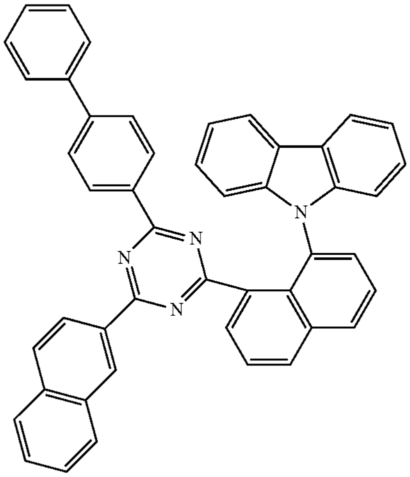
H2-80
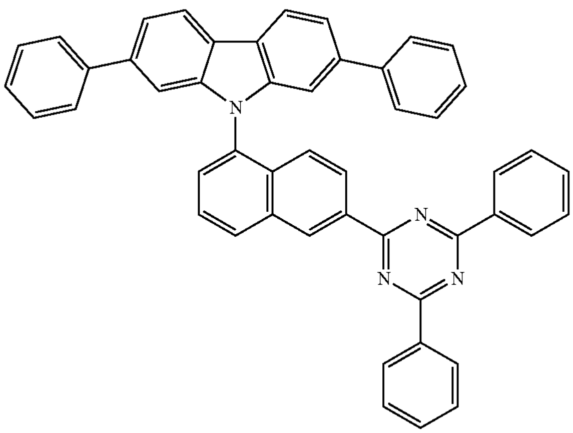
H2-81
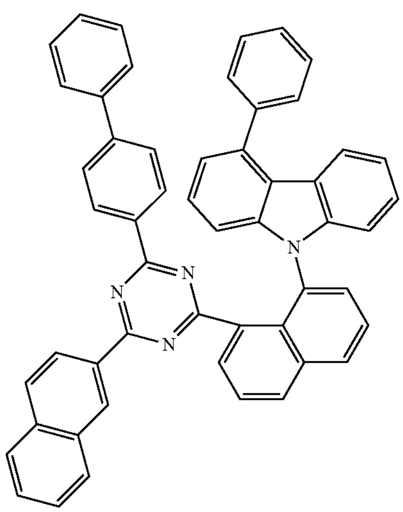
-continued
H2-82
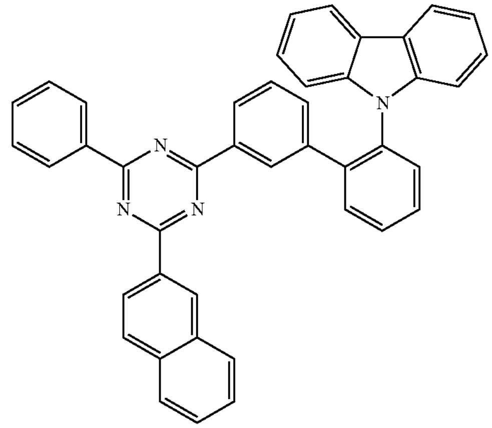
H2-83
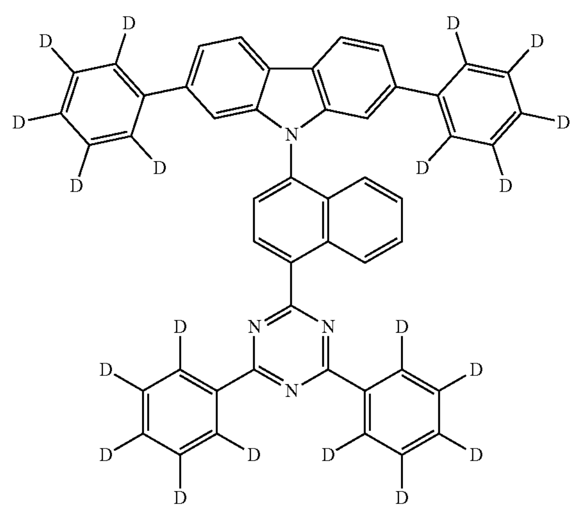
H2-84
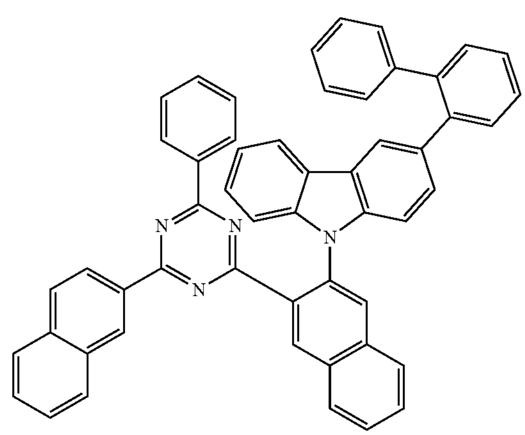

-continued
H2-85
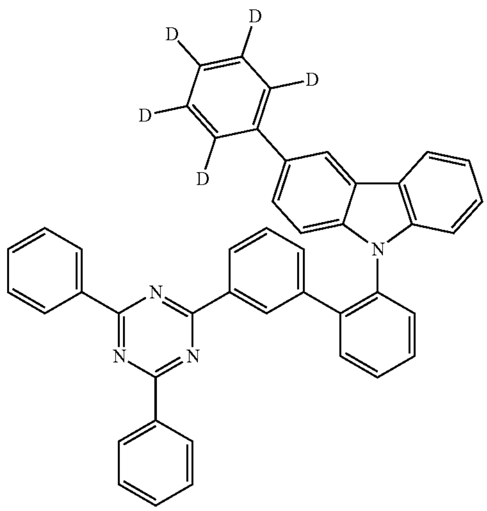
H2-86
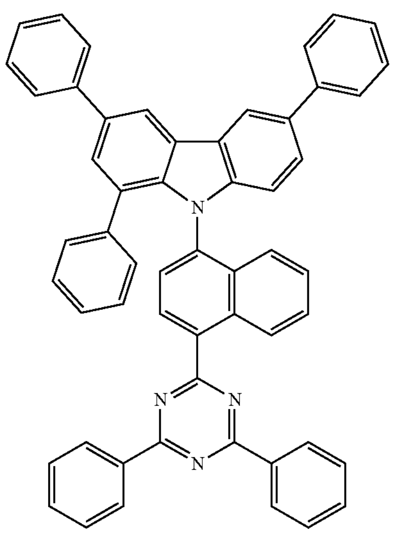
H2-87
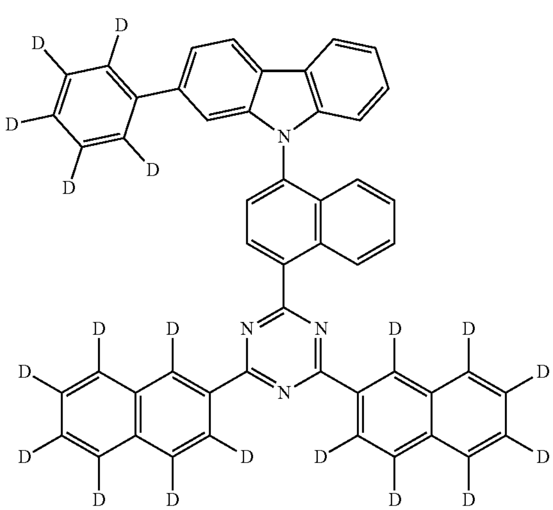
-continued
H2-88
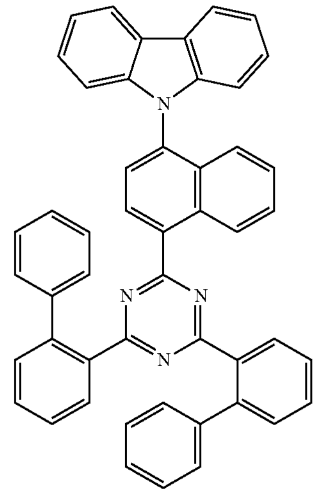
H2-89
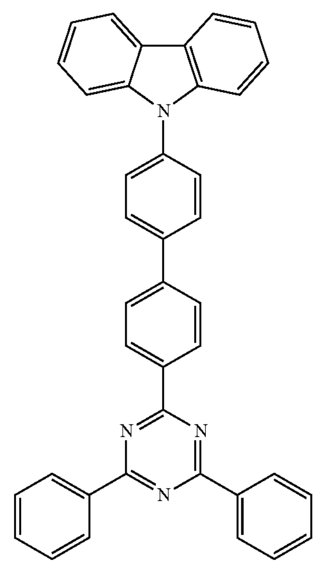
H2-90
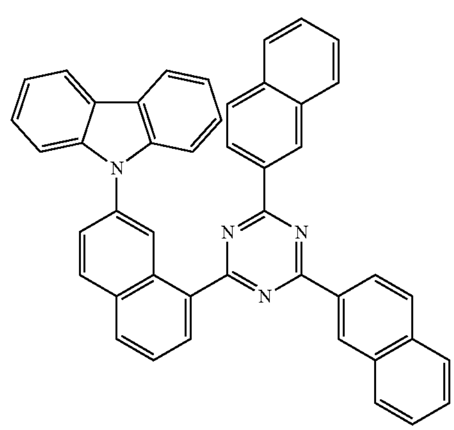

H2-91
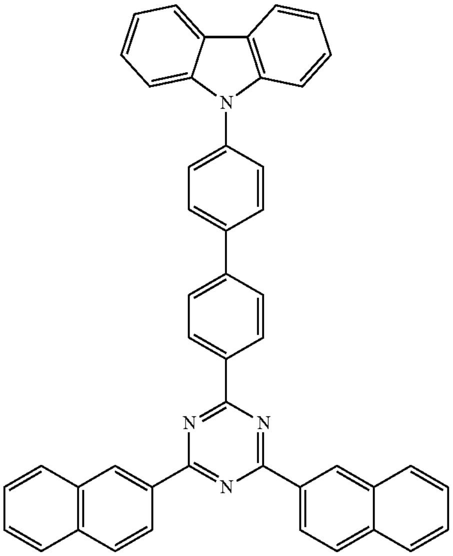
H2-92
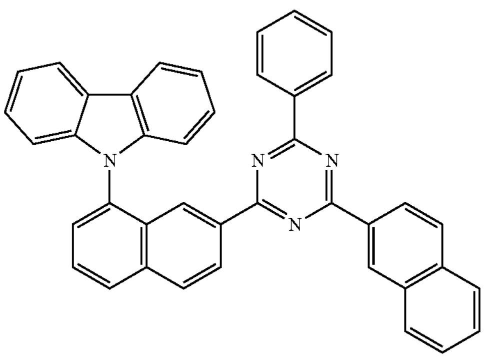
H2-93
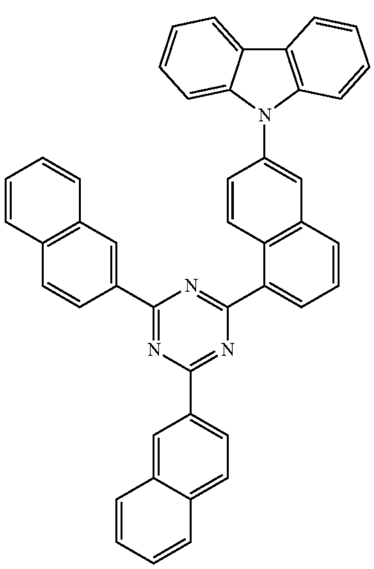
H2-94
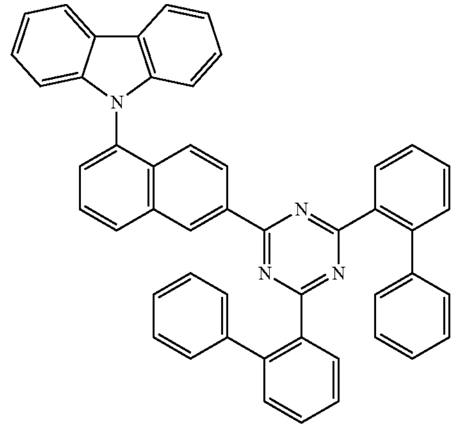
H2-95
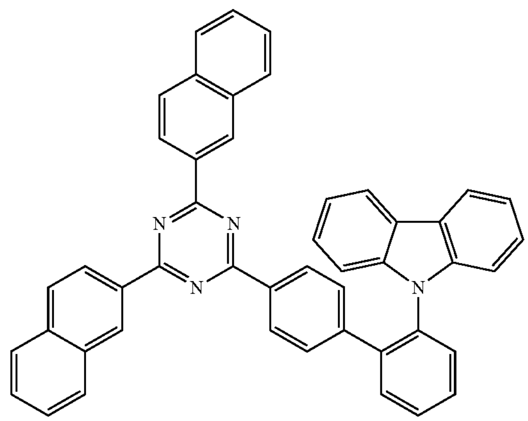
H2-96
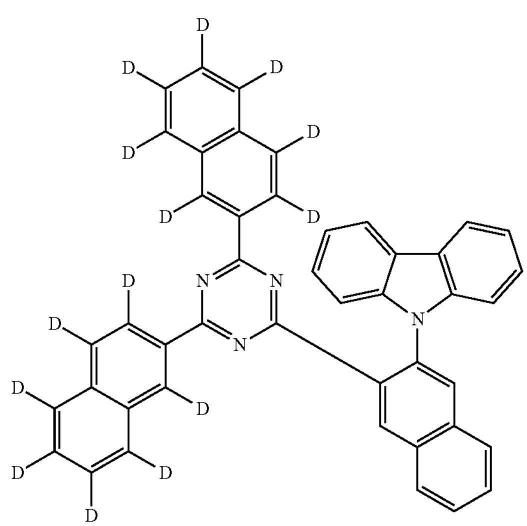

H2-97
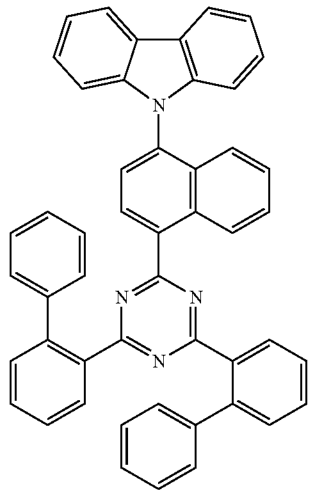
H2-98
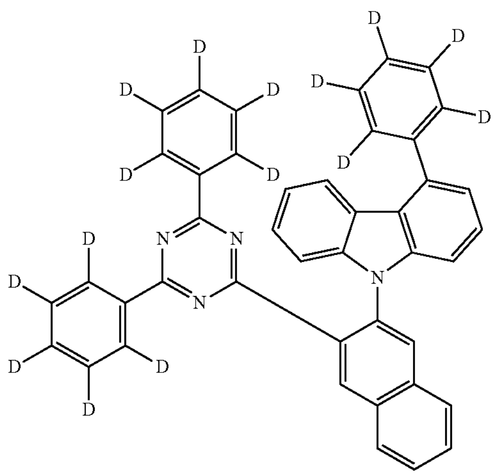
H2-99
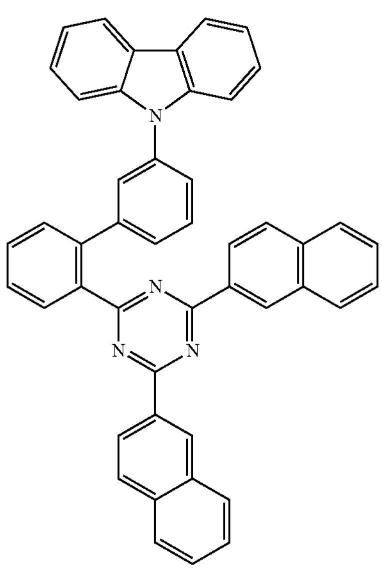
H2-100
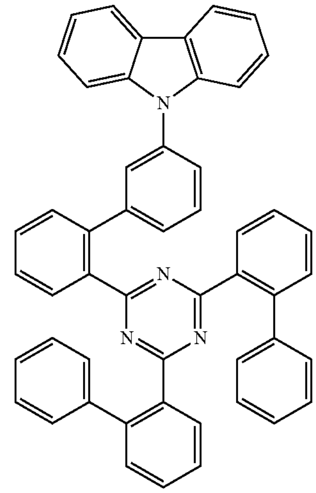
H2-101
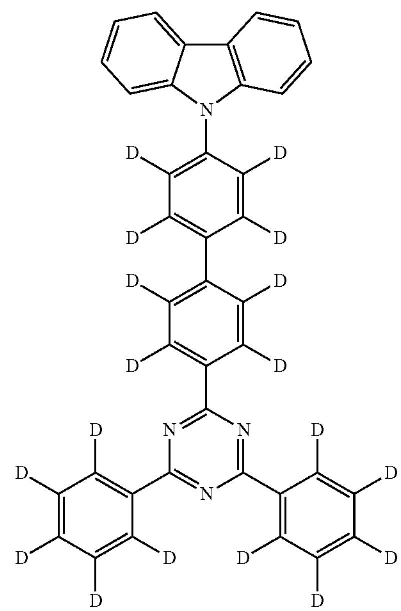
H2-102
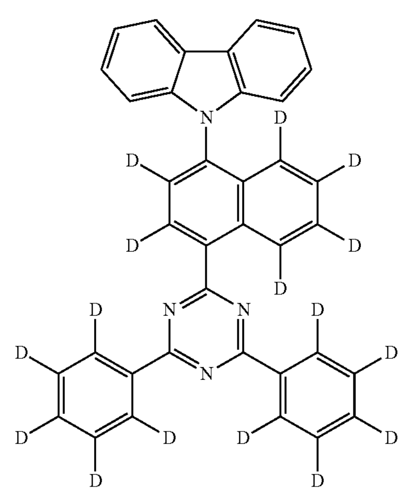

-continued
H2-103
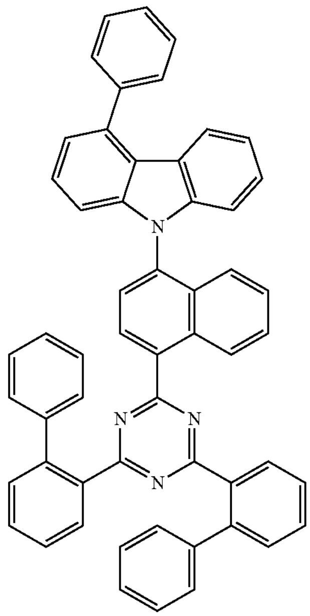
H2-104
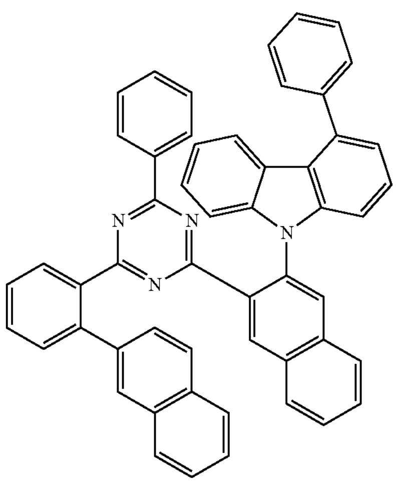
H2-105
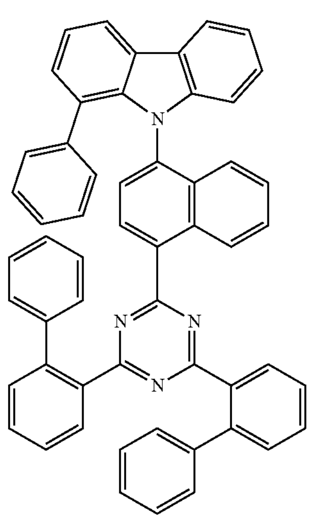
-continued
H2-106
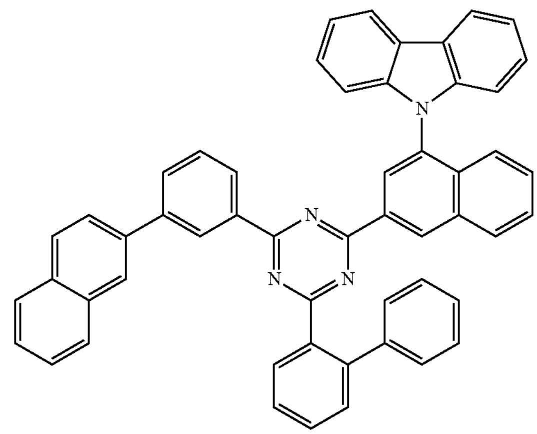
H2-107
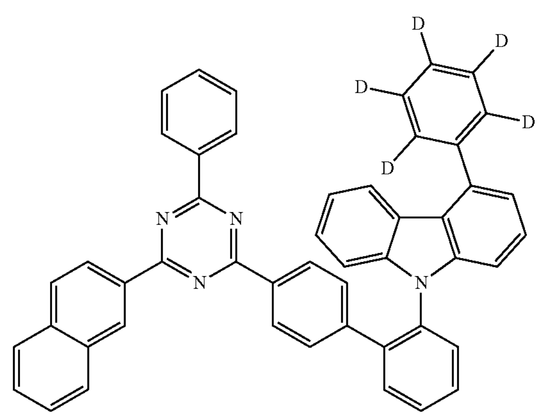
H2-108
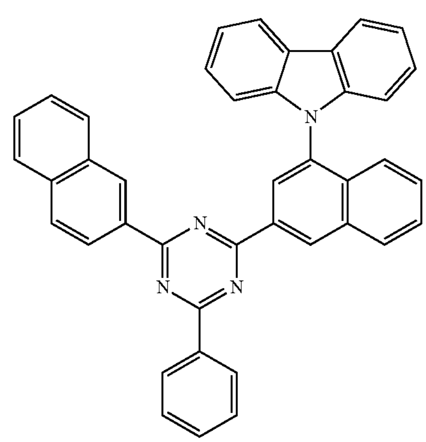

H2-109
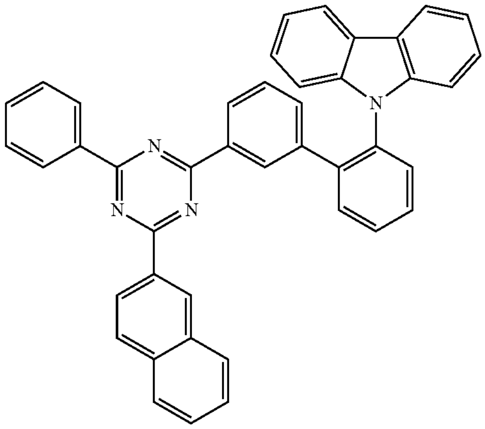
H2-110
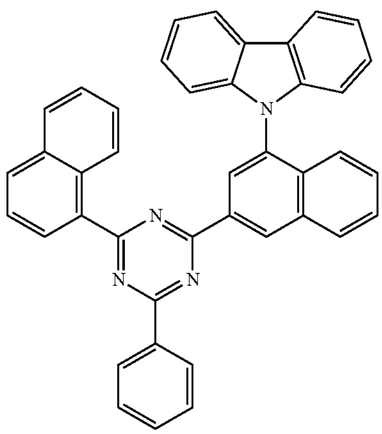
H2-111
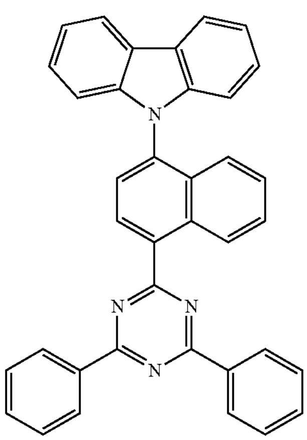
H2-112
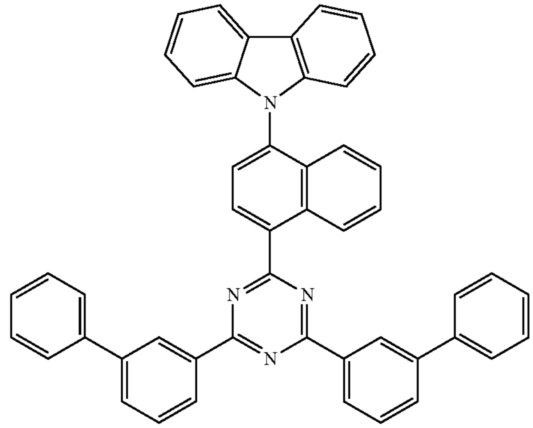
H2-113
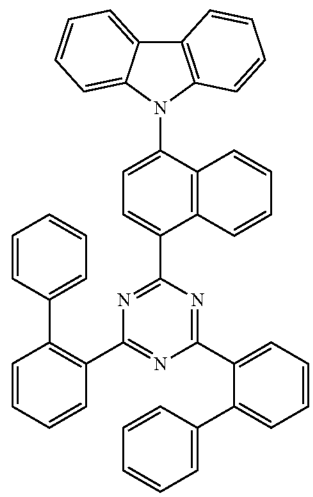
H2-114
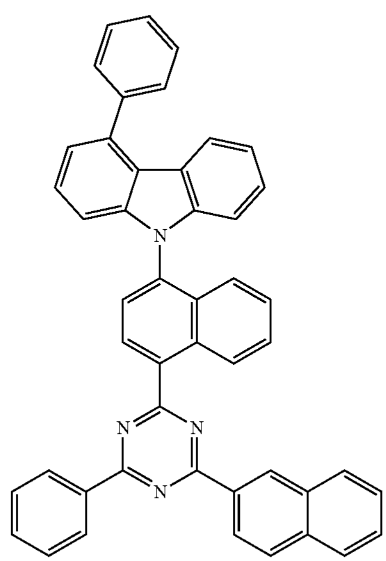

H2-115
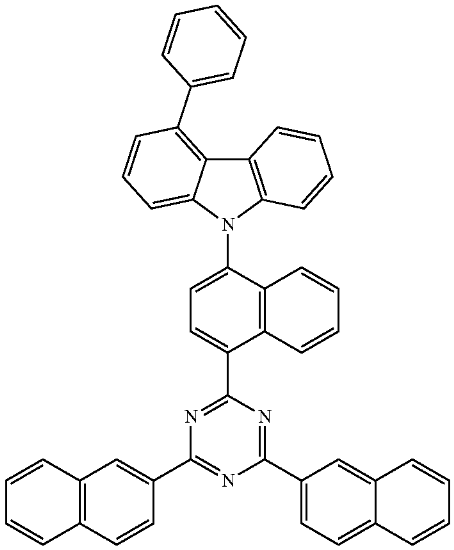
H2-116
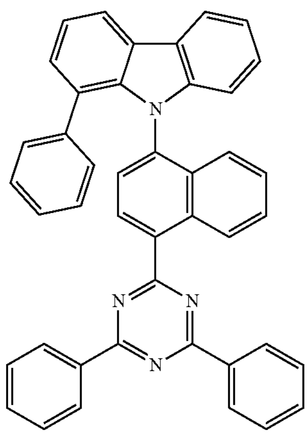
H2-117
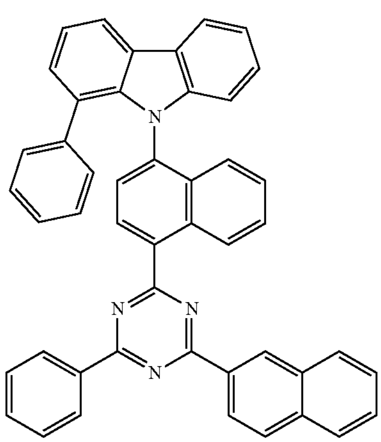
H2-118
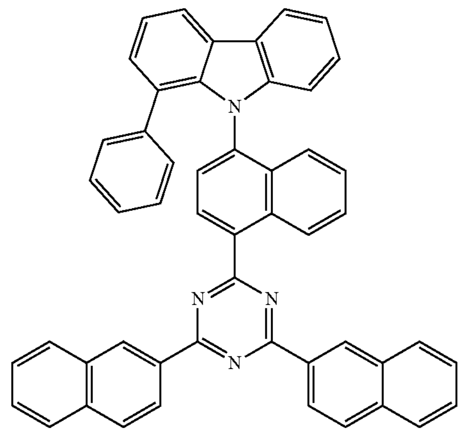
H2-119
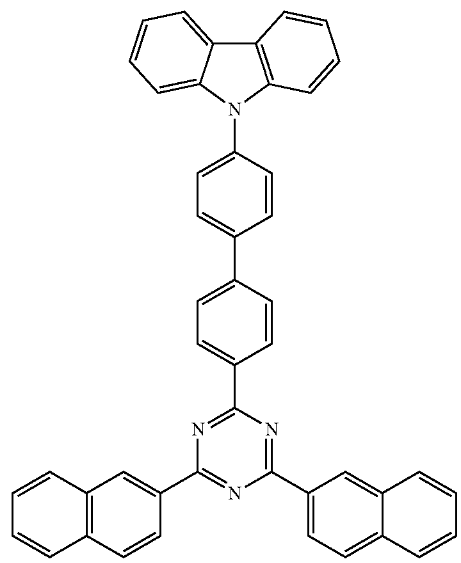
H2-120
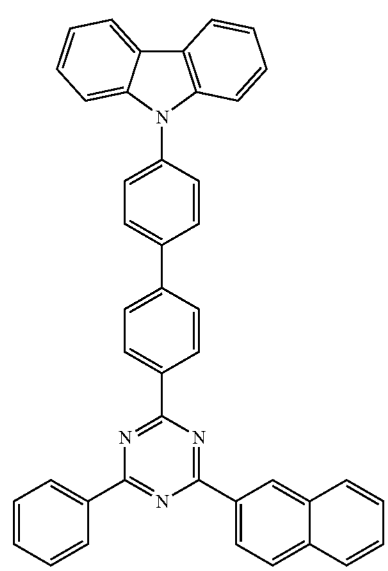

-continued
H2-121
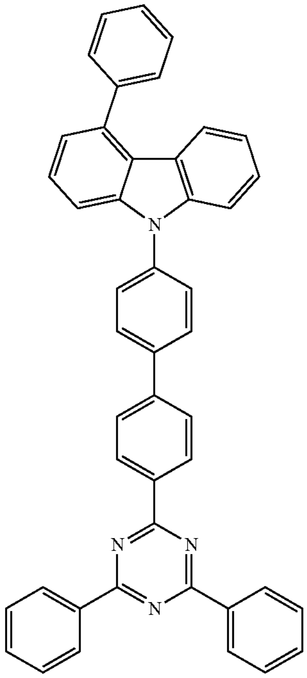
H2-122
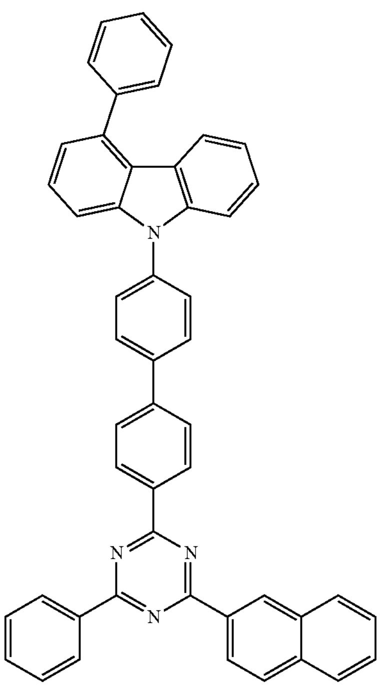
-continued
H2-123
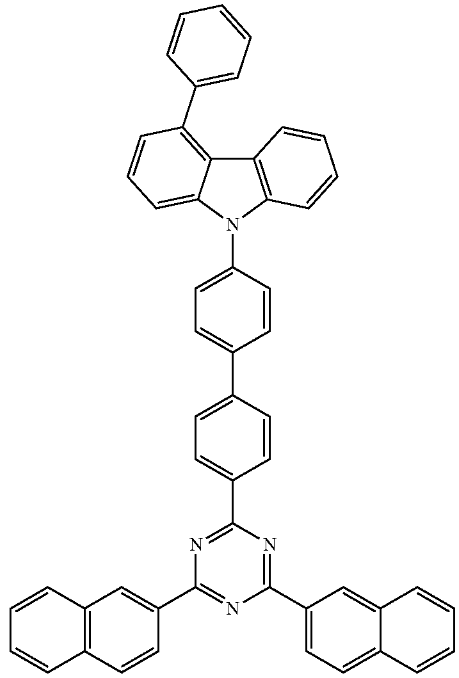
H2-124
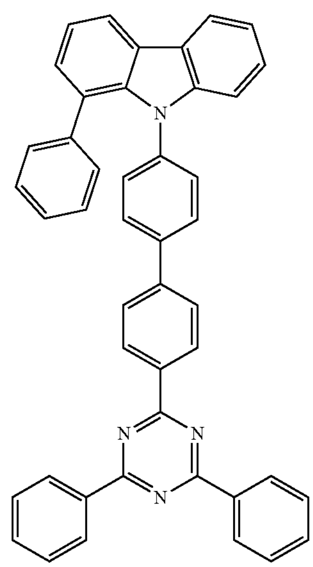

H2-125
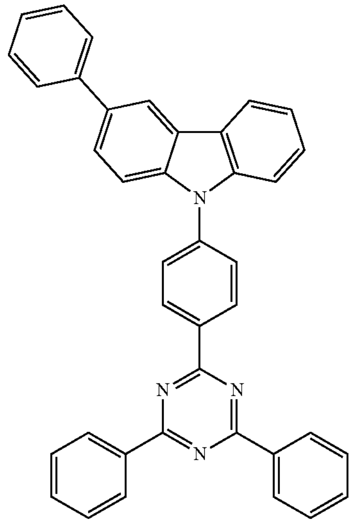
H2-126
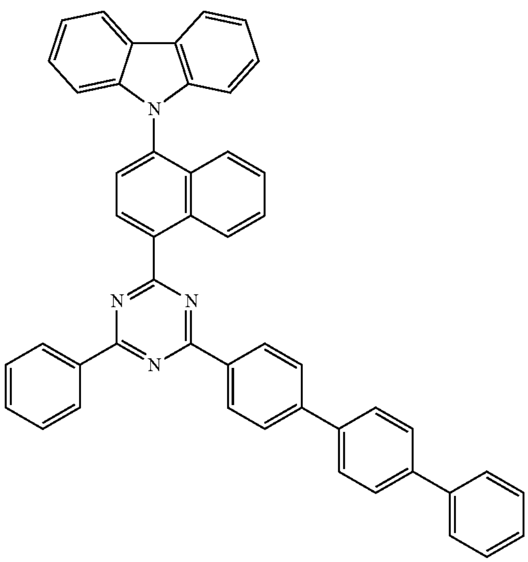
H2-127
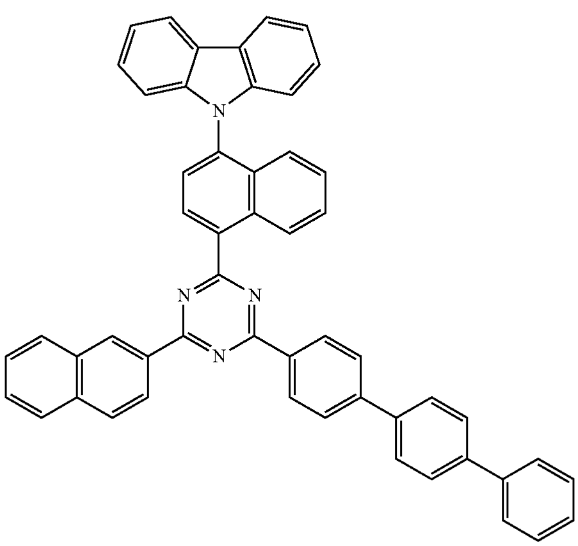
H2-128
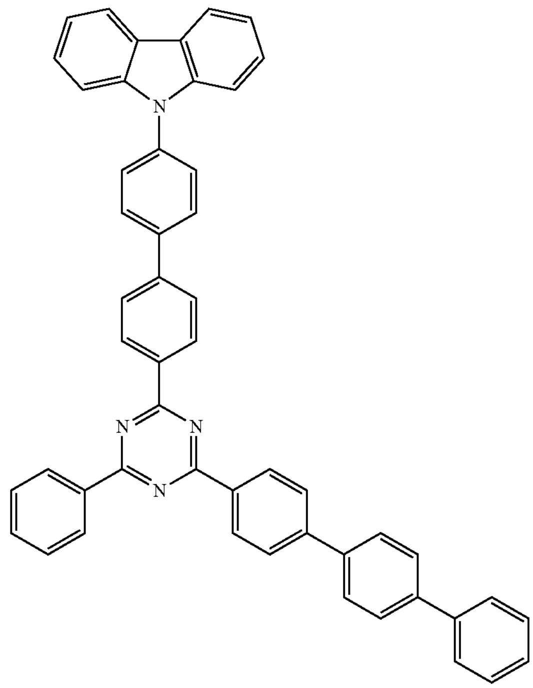
H2-129
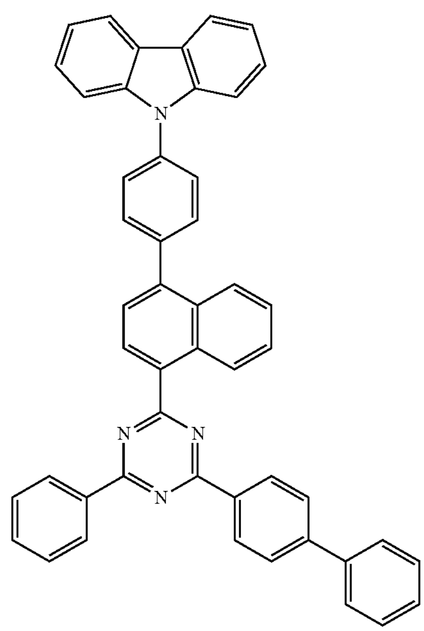

H2-130
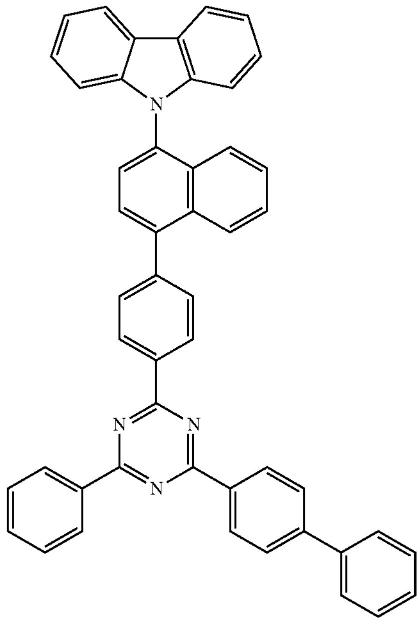
H2-131
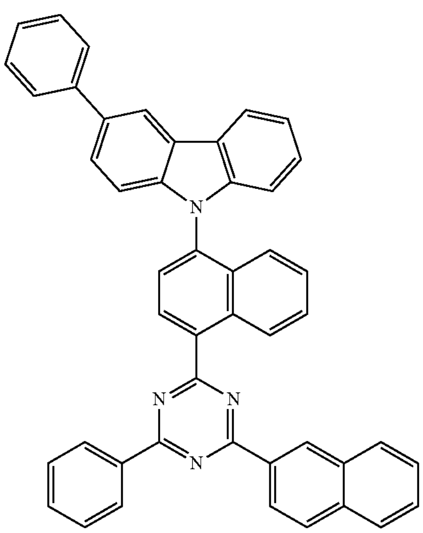
H2-132
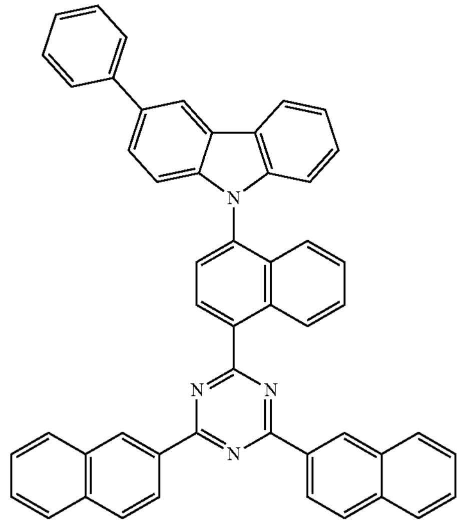
H2-133
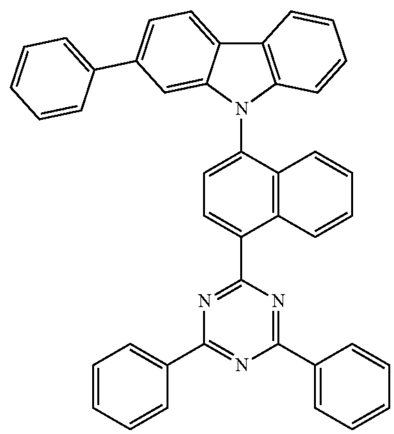
H2-134
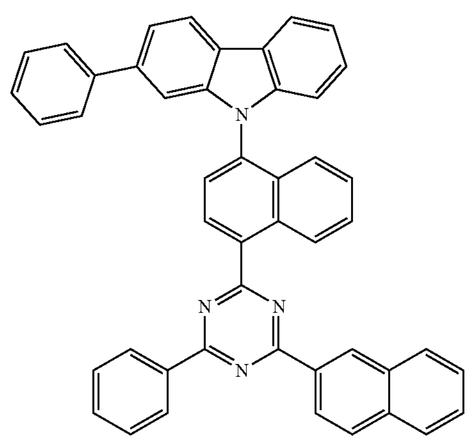

-continued
H2-135
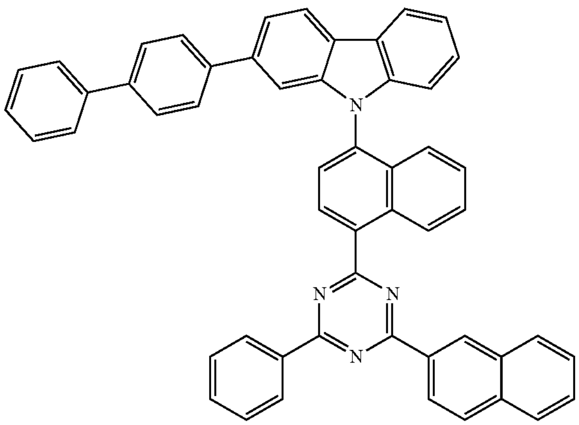
H2-136
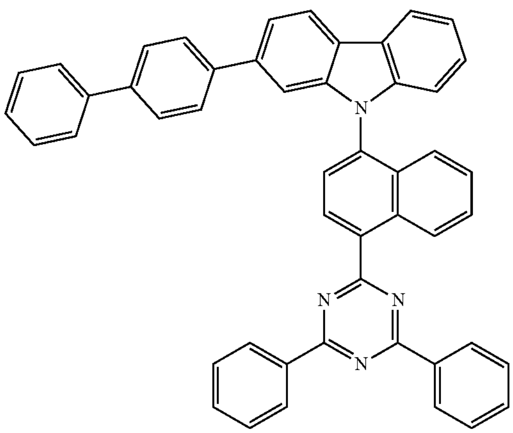
H2-137
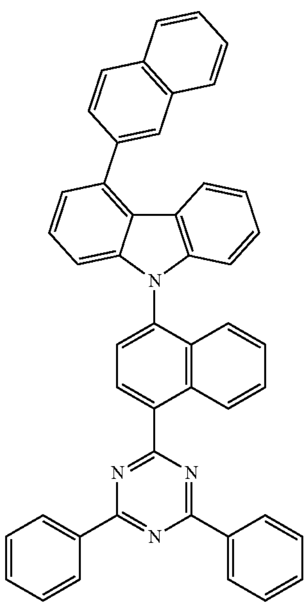
-continued
H2-138
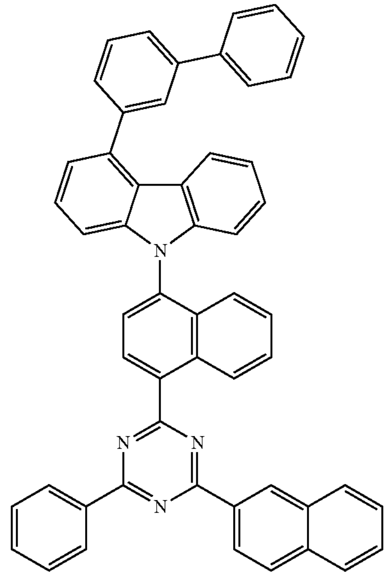
and
H2-139
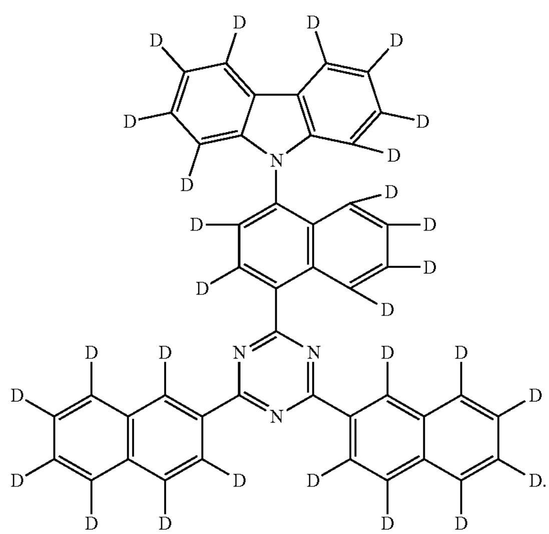
8. An organic electroluminescent device comprising an anode, a cathode, and at least one light-emitting layer between the anode and the cathode, wherein at least one of the light-emitting layers comprises the plurality of host materials according to claim 1.
* * * * *